United States Patent
Kim et al.

(10) Patent No.: US 10,361,380 B2
(45) Date of Patent: Jul. 23, 2019

(54) HETEROCYCLIC COMPOUND AND ORGANIC LIGHT-EMITTING DEVICE INCLUDING THE SAME

(71) Applicant: SAMSUNG DISPLAY CO., LTD., Yongin, Gyeonggi-do (KR)

(72) Inventors: So-Yeon Kim, Yongin (KR); Yoon-Hyun Kwak, Yongin (KR); Bum-Woo Park, Yongin (KR); Sun-Young Lee, Yongin (KR); Jong-Won Choi, Yongin (KR); Wha-Il Choi, Yongin (KR); Ji-Youn Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 1002 days.

(21) Appl. No.: 14/027,178

(22) Filed: Sep. 14, 2013

(65) Prior Publication Data
US 2014/0117331 A1    May 1, 2014

(30) Foreign Application Priority Data

Nov. 1, 2012 (KR) ................. 10-2012-0123093

(51) Int. Cl.
*H01L 51/00* (2006.01)
*H01L 51/50* (2006.01)

(52) U.S. Cl.
CPC ........ *H01L 51/0074* (2013.01); *H01L 51/006* (2013.01); *H01L 51/0059* (2013.01);
(Continued)

(58) Field of Classification Search
None
See application file for complete search history.

(56) References Cited

U.S. PATENT DOCUMENTS

| 5,635,308 A | 6/1997 | Inoue et al. |
| 5,645,948 A | 7/1997 | Shi et al. |

(Continued)

FOREIGN PATENT DOCUMENTS

| JP | 8-12600 A | 1/1996 |
| JP | 2000-003782 | 1/2000 |

(Continued)

OTHER PUBLICATIONS

Machine English translation of Kim et al. (KR 10-2012-0104067). Feb. 16, 2016.*

(Continued)

*Primary Examiner* — Jay Yang
(74) *Attorney, Agent, or Firm* — H.C. Park & Associates, PLC

(57) ABSTRACT

A heterocyclic compound represented by Formula 1 below, and an organic light-emitting device including the heterocyclic compound:

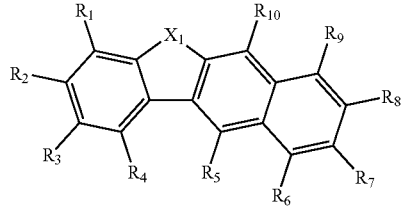

Formula 1 wherein $X_1$ and $R_1$ to $R_{10}$ are defined as in the specification.

22 Claims, 1 Drawing Sheet

(52) U.S. Cl.
CPC ...... *H01L 51/0067* (2013.01); *H01L 51/0072* (2013.01); *H01L 51/0073* (2013.01); *H01L 51/5016* (2013.01)

(56) References Cited

U.S. PATENT DOCUMENTS

| | | | |
|---|---|---|---|
| 5,972,247 | A | 10/1999 | Shi et al. |
| 6,465,115 | B2 | 10/2002 | Shi et al. |
| 6,596,415 | B2 | 7/2003 | Shi et al. |
| 2005/0221124 | A1 | 10/2005 | Hwang et al. |
| 2007/0224450 | A1* | 9/2007 | Kim ............. C09K 11/06 428/690 |
| 2011/0210318 | A1 | 9/2011 | Bae et al. |
| 2013/0048955 | A1* | 2/2013 | Lee ............ C07D 403/10 257/40 |

FOREIGN PATENT DOCUMENTS

| | | | | |
|---|---|---|---|---|
| KR | 10-2005-0097670 | B1 | 4/2006 | |
| KR | 10-2010-0023783 | A | 3/2010 | |
| KR | 10-2010-0064712 | A | 6/2010 | |
| KR | 10-2010-0108924 | A | 10/2010 | |
| KR | 10-2011-0127784 | A | 11/2011 | |
| KR | 10-2012-0104067 | | * 9/2012 | ........... C07D 209/82 |
| KR | 10-2012-0116879 | | * 10/2012 | ............. C07C 13/62 |
| KR | 10-2012-0116881 | | * 10/2012 | |
| WO | 20101064871 | A1 | 6/2010 | |
| WO | 20101114264 | A2 | 10/2010 | |
| WO | 20111145876 | A2 | 11/2011 | |

OTHER PUBLICATIONS

Machine English translation of Je et al. (KR 10-2012-0116879). Feb. 16, 2016.*
Wise et al. (Anal. Chem. 1983, 55, p. 1479).*
Tedjamulia et al. (J. Het. Chem. 1983, 20, p. 861) (abstract).*
Tu et al. (Mol. Divers. 2011, 15, p. 91).*
Machine English translation of Je et al. (KR 10-2012-0116881). Apr. 28, 2017.*
C.W. Tang and S.A. VanSlyke. "Organic electroluminescent diodes." Appl. Phys. Lett. 51 (12), Sep. 12, 1987.
Adachi, Tsutsui, and Saito. "Confinement of charge carriers and molecular excitons within 5-nm-thick emitter layer in organic electroluminescent devices with a double heterostructure." Appl. Phys. Lett. 57 (6), Aug. 6, 1990.
Sakamoto, Suzuki, Miura, Fujikawa, Tokito, and Taga. "Synthesis, characterization, and electron-transport property of perfluorinated phenylene dendrimers." J. Am. Chem. Soc. 122, pp. 1832-1833. 2000.
Yamaguchi, Endo, Uchida, Izumizawa, Furukawa, and Tamao. "Diphenylamino-substituted 2,5-diarylsiloles for single-layer organic electroluminescent devices." Chemistry Letters 2001.

* cited by examiner

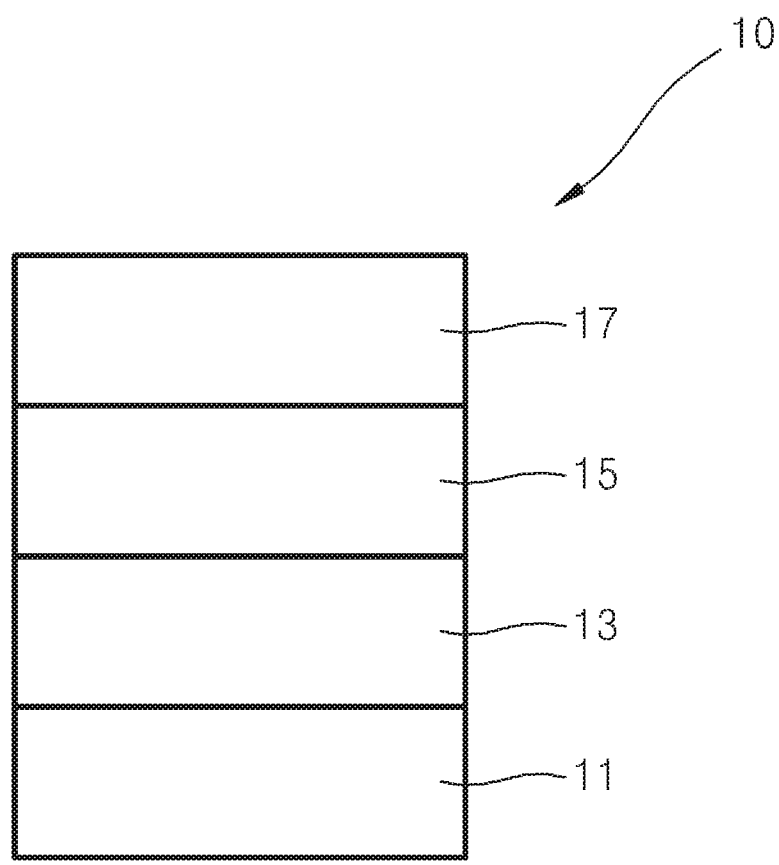

HETEROCYCLIC COMPOUND AND ORGANIC LIGHT-EMITTING DEVICE INCLUDING THE SAME

CLAIM OF PRIORITY

This application makes reference to, incorporates the same herein, and claims all benefits accruing under 35 U.S.C. § 119 from an application for HETEROCYCLIC COMPOUND AND ORGANIC LIGHT-EMITTING DEVICE INCLUDING THE SAME, earlier filed in the Korean Intellectual Property Office on Nov. 1, 2012 and there duly assigned Serial No. 10-2012-0123093.

BACKGROUND OF THE INVENTION

Field of the Invention

The present invention relates to a heterocyclic compound and an organic light-emitting device including the heterocyclic compound.

Description of the Related Art

Organic light-emitting devices (OLEDs), which are self-emitting devices, have advantages such as wide viewing angles, excellent contrast, quick response, high brightness, excellent driving voltage characteristics, and can provide multicolored images.

A typical OLED has a structure including a substrate, and an anode, a hole transport layer (HTL), an emission layer (EML), an electron transport layer (ETL), and a cathode which are sequentially stacked on the substrate. In this regard, the HTL, the EML, and the ETL are organic thin films formed of organic compounds.

An operating principle of an OLED having the above-described structure is as follows.

When a voltage is applied between the anode and the cathode, holes injected from the anode move to the EML via the HTL, and electrons injected from the cathode move to the EML via the ETL. The holes and electrons recombine in the EML to generate excitons. When the excitons drop from an excited state to a ground state, light is emitted.

SUMMARY OF THE INVENTION

The present invention relates to a novel heterocyclic compound and an organic light-emitting device including the same.

According to an aspect of the present invention, there is provided a heterocyclic compound represented by Formula 1 below:

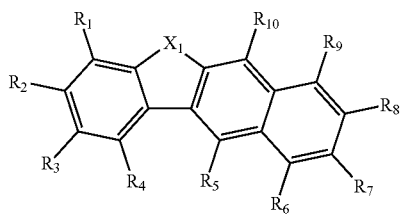

Formula 1 wherein, in Formula 1, $X_1$ is O or S; $R_6$ and $R_7$ are linked to each other to form a substituted or unsubstituted $C_3$-$C_{60}$ cyclic moiety, or a substituted or unsubstituted $C_2$-$C_{60}$ heterocyclic moiety; $R_1$ to $R_5$, and $R_8$ to $R_{10}$ are each independently hydrogen or a substituent represented by —(Ar$_1$)$_a$—(Ar$_{11}$) (where Ar$_{11}$ is not hydrogen when a is zero); or ii) $R_8$ and $R_9$ are linked to each other to form a substituted or unsubstituted $C_3$-$C_{60}$ cyclic moiety, or a substituted or unsubstituted $C_2$-$C_{60}$ heterocyclic moiety; and $R_1$ to $R_7$, and $R_{10}$ are each independently hydrogen or a substituent represented by —(Ar$_1$)$_a$—(Ar$_{11}$) (where Ar$_{11}$ is not hydrogen when a=0); Ar$_1$ is selected from among —O—, —S—, a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a $C_2$-$C_{10}$ heterocycloalkenylene group, a substituted or unsubstituted $C_6$-$C_{60}$ arylene group, and a substituted or unsubstituted $C_2$-$C_{60}$ heteroarylene group; Ar$_{11}$ is selected from among hydrogen, deuterium, a halogen atom, a hydroxyl group, a cyano group, a nitro group, an amino group, an amidino groups, hydrazine, hydrazone, a carboxylic group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a $C_2$-$C_{10}$ heterocycloalkenyl group, a substituted or unsubstituted $C_6$-$C_{60}$ aryl group, a substituted or unsubstituted $C_2$-$C_{60}$ heteroaryl group, —N(Q$_1$)(Q$_2$), and —Si(Q$_3$)(Q$_4$)(Q$_5$) (where Q$_1$ and Q$_2$ are each independently selected from among a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a $C_2$-$C_{10}$ heterocycloalkenyl group, a substituted or unsubstituted $C_6$-$C_{60}$ aryl group, and a substituted or unsubstituted $C_2$-$C_{60}$ heteroaryl group; and Q$_3$ to Q$_5$ are each independently selected from among hydrogen, deuterium, a halogen atom, a hydroxyl group, a cyano group, a nitro group, an amino group, an amidino groups, hydrazine, hydrazone, a carboxylic group or a salt thereof, a sulfonic acid group or a salt thereof, a phosphoric acid group or a salt thereof, a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, and a substituted or unsubstituted $C_2$-$C_{60}$ heteroaryl group); and a is an integer from 0 to 5.

According to another aspect of the present invention, there is provided an organic light-emitting device including: a first electrode; a second electrode disposed opposite to the first electrode; and an organic layer disposed between the first electrode and the second electrode and comprising an emission layer, wherein the organic layer includes at least one of the heterocyclic compounds of Formula 1 above.

BRIEF DESCRIPTION OF THE DRAWING

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein:

The FIGURE is a schematic view of a structure of an organic light-emitting device according to an embodiment of the present invention.

DETAILED DESCRIPTION OF THE INVENTION

The present invention will be described more fully with reference to the accompanying drawings, in which exemplary embodiments of the present invention are shown.

As used herein, the term "and/or" includes any and all combinations of one or more of the associated listed items. Expressions such as "at least one of," when preceding a list of elements, modify the entire list of elements and do not modify the individual elements of the list.

According to an aspect of the present invention, there is provided a heterocyclic compound represented by Formula 1 below:

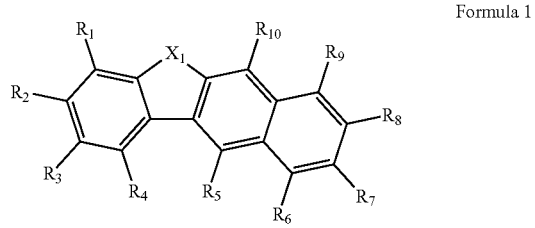

Formula 1

In Formula 1, $X_1$ may be O or S; and i) $R_6$ and $R_7$ may be linked to each other to form a substituted or unsubstituted $C_3$-$C_{60}$ cyclic moiety, or a substituted or unsubstituted $C_2$-$C_{60}$ heterocyclic moiety; $R_1$ to $R_5$, and $R_8$ to $R_{10}$ may be each independently hydrogen or a substituent represented by —$(Ar_1)_a$—$(Ar_{11})$ (where $Ar_{11}$ is not hydrogen when a is zero); or ii) $R_8$ and $R_9$ may be linked to each other to form a substituted or unsubstituted $C_3$-$C_{60}$ cyclic moiety, or a substituted or unsubstituted $C_2$-$C_{60}$ heterocyclic moiety; and $R_1$ to $R_7$, and $R_{10}$ may be each independently hydrogen or a substituent represented by —$(Ar_1)_a$—$(Ar_{11})$ (where $Ar_{11}$ is not hydrogen when a=0); $Ar_1$ may be selected from among —O—, —S—, a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a $C_2$-$C_{10}$ heterocycloalkenylene group, a substituted or unsubstituted $C_6$-$C_{60}$ arylene group, and a substituted or unsubstituted $C_2$-$C_{60}$ heteroarylene group; $Ar_{11}$ may be selected from among hydrogen, deuterium, a halogen atom, a hydroxyl group, a cyano group, a nitro group, an amino group, an amidino groups, a hydrazine, a hydrazone, a carboxylic group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a $C_2$-$C_{10}$ heterocycloalkenyl group, a substituted or unsubstituted $C_6$-$C_{60}$ aryl group, a substituted or unsubstituted $C_2$-$C_{60}$ heteroaryl group, —$N(Q_1)(Q_2)$, and —$Si(Q_3)(Q_4)(Q_5)$ (where $Q_1$ and $Q_2$ may be each independently selected from among a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a $C_2$-$C_{10}$ heterocycloalkenyl group, a substituted or unsubstituted $C_6$-$C_{60}$ aryl group, and a substituted or unsubstituted $C_2$-$C_{60}$ heteroaryl group; and $Q_1$ to $Q_5$ may be each independently selected from among hydrogen, deuterium, a halogen atom, a hydroxyl group, a cyano group, a nitro group, an amino group, an amidino groups, hydrazine, hydrazone, a carboxylic group or a salt thereof, a sulfonic acid group or a salt thereof, a phosphoric acid group or a salt thereof, a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, and a substituted or unsubstituted $C_2$-$C_{60}$ heteroaryl group); and a is an integer from 0 to 5.

In some embodiments of the present invention, the heterocyclic compound may be a compound represented by Formula 1A or 1B below:

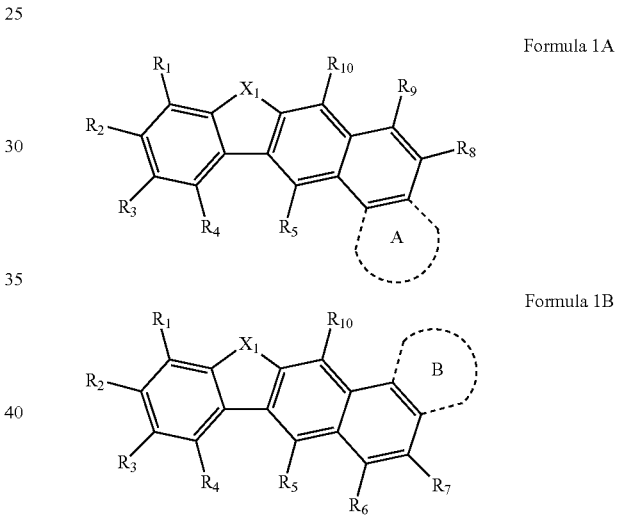

In Formulae 1A and 1B, $X_1$ and $R_1$ to $R_{10}$ may be as defined above.

In Formulae 1A and 1B, a A ring and a B ring may be each independently selected from among: i) cyclopropane, cyclobutane, cyclopentane, cyclohexane, cycloheptane, cyclooxane, cyclopentene, cyclopentadiene, cyclohexene, cyclohexadiene, cycloheptadiene, pyrrole, pyrazole, benzene, furan, thiophene, pyridine, pyrazine, pyrimidine, pyridazine, naphthalene, anthracene, fluorene, pyrrolizine, indolizine, isoindole, indole, indazole, purine, quinolizine, isoquinoline, quinoline, phthalazine, naphthyridin, quinoxaline, quinazoline, cinnoline, carbazole, phenanthridine, acridine, phenazine, benzofuran, benzothiophene, dibenzofuran, and dibenzothiophene; and ii) cyclopropane, cyclobutane, cyclopentane, cyclohexane, cycloheptane, cyclooxane, cyclopentene, cyclopentadiene, cyclohexene, cyclohexadiene, cycloheptadiene, pyrrole, pyrazole, benzene, furan, thiophene, pyridine, pyrazine, pyrimidine, pyridazine, naphthalene, anthracene, fluorene, pyrrolizine, indolizine, isoindole, indole, indazole, purine, quinolizine, isoquinoline, quinoline, phthalazine, naphthyridin, quinoxaline, quinazoline, cinnoline, carbazole, phenanthridine, acridine, phenazine, benzofuran, benzothiophene, dibenzofuran, and dibenzothiophene that are substituted with at least one substituent selected from among deuterium, a halogen atom, a hydroxyl group, a cyano group, a nitro group, an amino group, an amidino groups, hydrazine, hydrazone, a carboxylic group or a salt thereof, a sulfonic acid group or a salt thereof, a phosphoric acid group or a salt thereof, a $C_1$-$C_{20}$ alkyl group, and a $C_1$-$C_{20}$ alkoxy group; a $C_1$-$C_{20}$ alkyl group and a $C_1$-$C_{20}$ alkoxy group that are substituted with at least one of deuterium, a halogen atom, a hydroxyl group, a cyano group, a nitro group, an amino group, an amidino groups, hydrazine, hydrazone, a carboxylic group or a salt thereof, a sulfonic acid group or a salt thereof, and a phosphoric acid group or a salt thereof; a $C_6$-$C_{20}$ aryl group, a $C_6$-$C_{20}$ aryloxy group, a $C_6$-$C_{20}$ arylthio group, and a $C_2$-$C_{20}$ heteroaryl group; a $C_6$-$C_{20}$ aryl group, a $C_6$-$C_{20}$ aryloxy group, a $C_6$-$C_{20}$ arylthio group, and a $C_2$-$C_{20}$ heteroaryl group that are substituted with at least one of deuterium, a halogen atom, a hydroxyl group, a cyano group, a nitro group, an amino group, an amidino groups, hydrazine, hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; —N($Q_{11}$)($Q_{12}$); and —Si($Q_{13}$)($Q_{14}$)($Q_{15}$) (where $Q_{11}$ and $Q_{12}$ may be each independently a $C_6$-$C_{20}$ aryl group, or a $C_2$-$C_{20}$ heteroaryl group; and $Q_{13}$ to $Q_{15}$ may be each independently a $C_1$-$C_{20}$ alkyl group, a $C_1$-$C_{20}$ alkoxy group, a $C_6$-$C_{20}$ aryl group, or a $C_2$-$C_{20}$ heteroaryl group).

In some embodiments of the present invention, the A ring and the B ring may be each independently selected from among: i) benzene, pyridine, pyrazine, pyrimidine, pyridazine, naphthalene, fluorene, indole, isoquinoline, quinoline, carbazole, dibenzofuran, and dibenzothiophene; and ii) benzene, pyridine, pyrazine, pyrimidine, pyridazine, naphthalene, fluorene, indole, isoquinoline, quinoline, carbazole, dibenzofuran, and dibenzothiophene that are substituted with at least one of deuterium, a halogen atom, a hydroxyl group, a cyano group, a nitro group, an amino group, an amidino groups, hydrazine, hydrazone, a carboxylic group or a salt thereof, a sulfonic acid group or a salt thereof, a phosphoric acid group or a salt thereof, a $C_1$-$C_{20}$ alkyl group, and a $C_1$-$C_{20}$ alkoxy group; a $C_1$-$C_{20}$ alkyl group and a $C_1$-$C_{20}$ alkoxy group that are substituted with at least one of deuterium, a halogen atom, a hydroxyl group, a cyano group, a nitro group, an amino group, an amidino groups, hydrazine, hydrazone, a carboxylic group or a salt thereof, a sulfonic acid group or a salt thereof, and a phosphoric acid group or a salt thereof; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group that are substituted with at least one of deuterium, a halogen atom, a hydroxyl group, a cyano group, a nitro group, an amino group, an amidino groups, hydrazine, hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and —N($Q_{13}$)($Q_{12}$) (where $Q_{11}$ and $Q_{12}$ are each independently, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or isoquinolyl group), but are not limited thereto.

In some embodiments of the present invention, in Formula 1 all of $R_1$ to $R_4$ may be hydrogen atoms.

In some embodiments of the present invention, in Formulae 1A and 1B, all of $R_1$ to $R_4$ may be hydrogen atoms.

As used therein, in the substituent "—(Ar$_1$)$_a$—(Ar$_{11}$)", Ar$_{11}$ is not a hydrogen atom when a=0. That is, as used herein, "—(Ar$_1$)$_a$—(Ar$_{11}$)" may not be a hydrogen atom.

In some embodiments of the present invention, in Formula 1 above, i) $R_6$ and $R_7$ may be linked to each other to form a substituted or unsubstituted $C_3$-$C_{60}$ cyclic moiety, or a substituted or unsubstituted $C_2$-$C_{60}$ heterocyclic moiety, and at least one of $R_1$ to $R_5$, and $R_8$ to $R_{10}$ (for example, at least one of $R_5$, and $R_8$ to $R_{10}$ may be a substituent represented by —(Ar$_1$)$_a$—(Ar$_{11}$) (where Ar$_{11}$ is not hydrogen when a=0); or ii) $R_8$ and $R_9$ may be linked to each other to form a substituted or unsubstituted $C_3$-$C_{60}$ cyclic moiety, or a substituted or unsubstituted $C_2$-$C_{60}$ heterocyclic moiety, and at least one of $R_1$ to $R_7$, and $R_{10}$ (for example, at least one of $R_5$ to $R_7$, and $R_{10}$) may be a substituent represented by —(Ar$_1$)$_a$—(Ar$_{11}$) (where Ar$_{11}$ is not hydrogen when a=0).

In some embodiments of the present invention, the heterocyclic compound may be a compound represented by one of Formulae 1A-1 to 1A-14, and 1B-1 to 1B-14 below, but is not limited thereto:

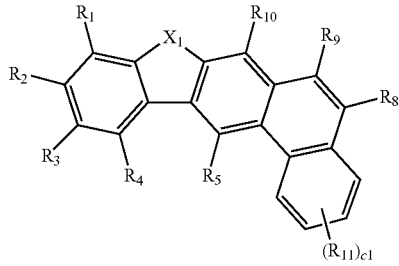

Formula 1A-1

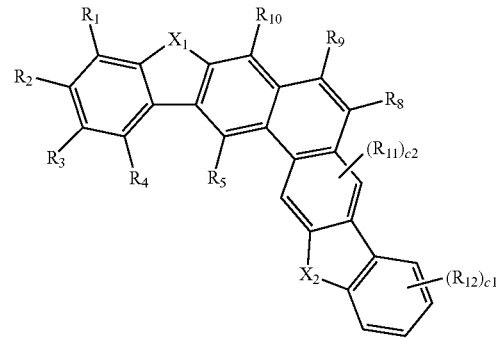

Formula 1A-2

-continued
Formula 1A-3
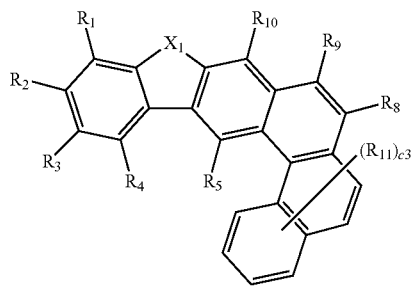
Formula 1A-4
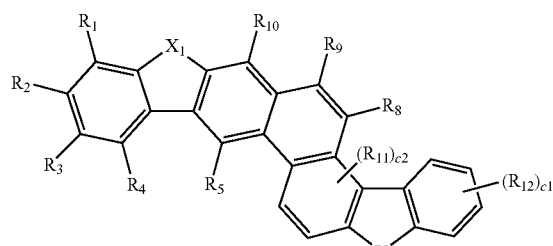
Formula 1A-5
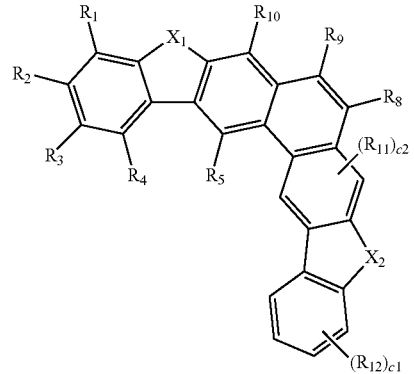
Formula 1A-6
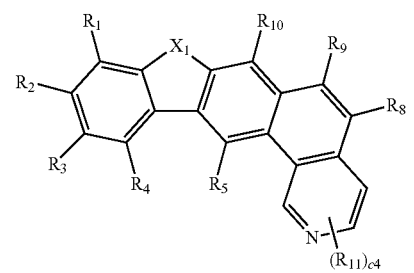
Formula 1A-7
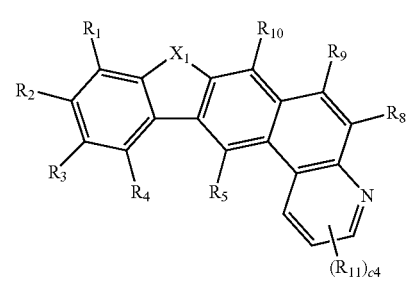
Formula 1A-8
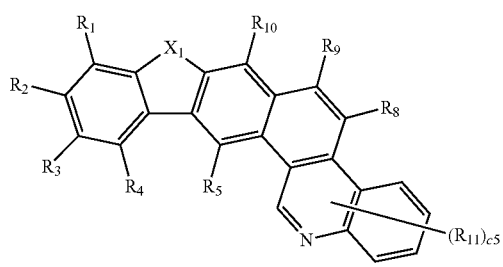
Formula 1A-9
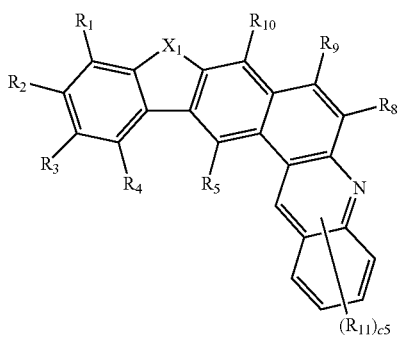
Formula 1A-10
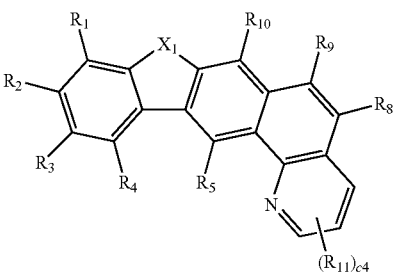
Formula 1A-11
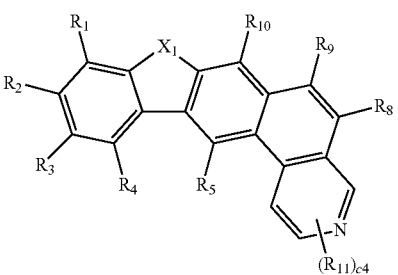
Formula 1A-12
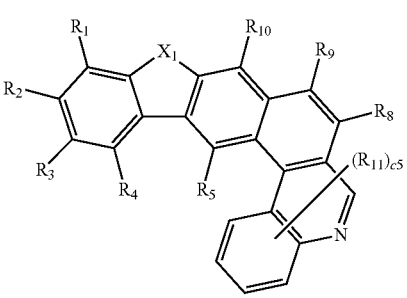

Formula 1A-13
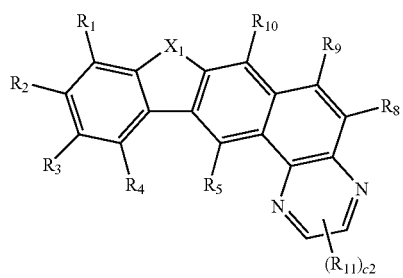
Formula 1A-14
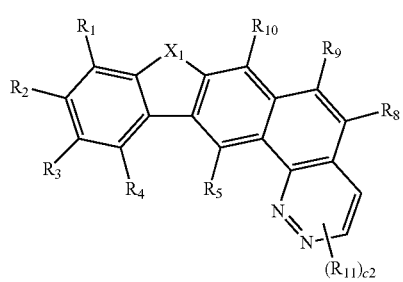
Formula 1B-1
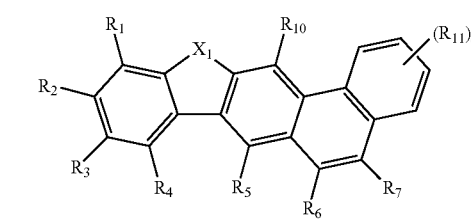
Formula 1B-2
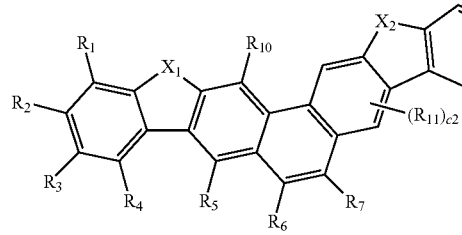
Formula 1B-3
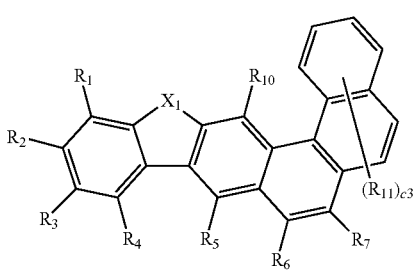
Formula 1B-4
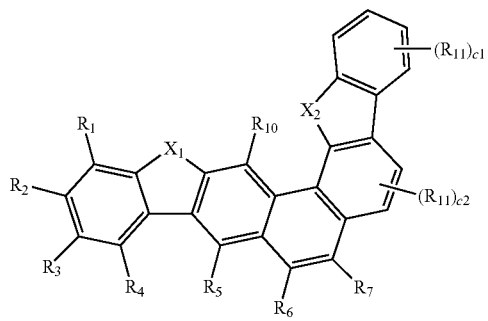
Formula 1B-5
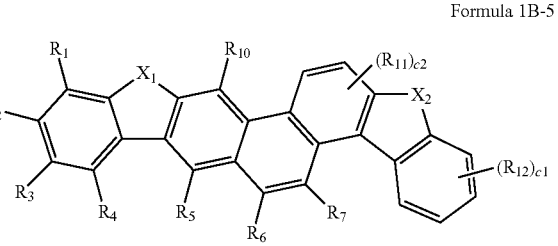
Formula 1B-6
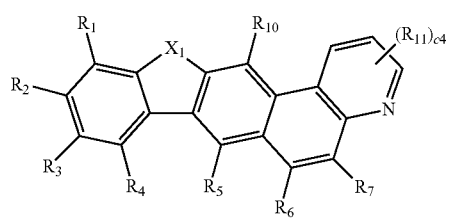
Formula 1B-7
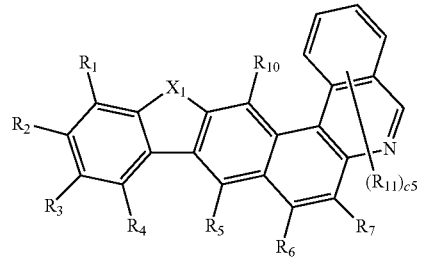
Formula 1B-8
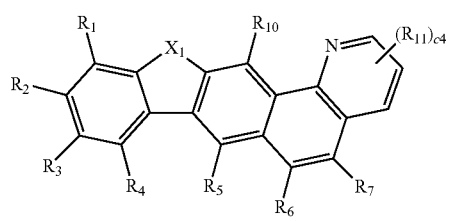
Formula 1B-9
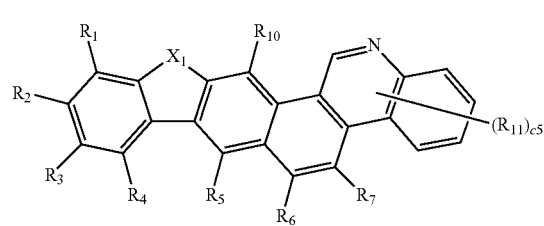

-continued

Formula 1B-10
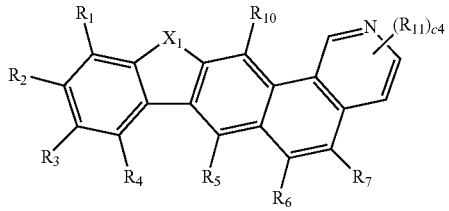

Formula 1B-11
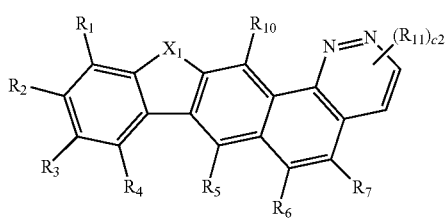

Formula 1B-12
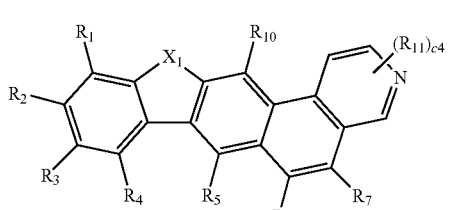

Formula 1B-13
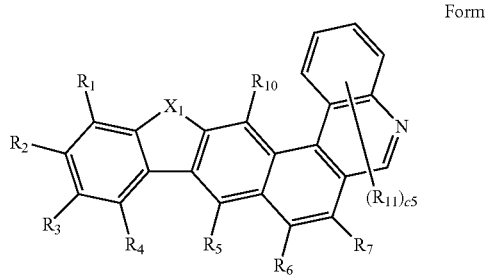

Formula 1B-14
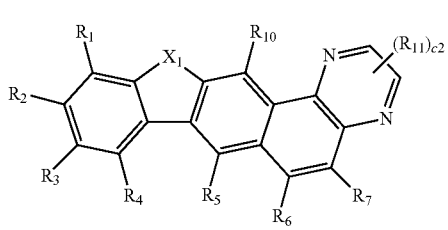

In Formula 1A-1 to 1A-14, and 1B-1 to 1B-14, $X_1$, and $R_1$ to $R_{10}$ may be as defined as above.

In Formulae 1A-1 to 1A-14, and 1B-1 to 1B-14, $X_2$ may be O, S, $C(R_{21})(R_{22})$, or $N(R_{23})$.

In Formulae 1A-1 to 1A-14, and 1B-1 to 1B-14, $R_{11}$, $R_{12}$, and $R_{21}$ to $R_{23}$ may be each independently selected from among hydrogen, deuterium, a halogen atom, a hydroxyl group, a cyano group, a nitro group, an amino group, an amidino groups, hydrazine, hydrazone, a carboxylic group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group; a $C_1$-$C_{60}$ alkyl group, a $C_2$-$C_{60}$ alkenyl group, a $C_2$-$C_{60}$ alkynyl group, and a $C_1$-$C_{60}$ alkoxy group that are substituted with at least one of deuterium, a halogen atom, a hydroxyl group, a cyano group, a nitro group, an amino group, an amidino groups, hydrazine, hydrazone, a carboxylic group or a salt thereof, a sulfonic acid group or a salt thereof, and a phosphoric acid group or a salt thereof; a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group; a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group that are substituted with at least one of deuterium, a halogen atom, a hydroxyl group, a cyano group, a nitro group, an amino group, an amidino groups, hydrazine, hydrazone, a carboxylic group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; —$N(Q_{11})(Q_{12})$; and —$Si(Q_{13})(Q_{14})(Q_{15})$ (where $Q_{11}$, and $Q_{12}$ may be each independently a $C_6$-$C_{60}$ aryl group, or a $C_2$-$C_{60}$ heteroaryl group; and $Q_{13}$ to $Q_{15}$ may be each independently a $C_1$-$C_{60}$ alkyl group, a $C_1$-$C_{60}$ alkoxy group, a $C_6$-$C_{60}$ aryl group, or a $C_2$-$C_{60}$ heteroaryl group).

In Formulae 1A-1 to 1A-14, and 1B-1 to 1B-14, c1 may be an integer from 1 to 4; c2 may be 1 or 2; c3 may be an integer from 1 to 6; c4 may be an integer from 1 to 3; and c5 may be an integer from 1 to 5.

In some embodiments of the present invention, in Formulae 1A-1 to 1A-14, and 1B-1 to 1B-14, $R_{11}$, $R_{12}$, and $R_{21}$ to $R_{23}$ may be each independently hydrogen, deuterium, a halogen atom, a hydroxyl group, a cyano group, a nitro group, an amino group, an amidino groups, hydrazine, hydrazone, a carboxylic group or a salt thereof, a sulfonic acid group or a salt thereof, a phosphoric acid group or a salt thereof, a $C_1$-$C_{20}$ alkyl group, and a $C_1$-$C_{20}$ alkoxy group; a $C_1$-$C_{20}$ alkyl group, and a $C_1$-$C_{20}$ alkoxy group that are substituted with at least one of deuterium, a halogen atom, a hydroxyl group, a cyano group, a nitro group, an amino group, an amidino groups, hydrazine, hydrazone, a carboxylic group or a salt thereof, a sulfonic acid group or a salt thereof, and a phosphoric acid group or a salt thereof; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group that are substituted with at least one of deuterium, a halogen atom, a hydroxyl group, a cyano group, a nitro group, an amino group, an amidino groups, hydrazine, hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; —$N(Q_{11})(Q_{12})$; and —$Si(Q_{13})(Q_{14})(Q_{15})$ (where $Q_{11}$, and $Q_{12}$ may be each independently, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group; and $Q_{13}$ to $Q_{15}$ may be each independently a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group), but are not limited thereto.

In the substituent —$(Ar_1)_a$—$(Ar_{11})$, $Ar_1$ may be —O—, —S—, a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a $C_2$-$C_{10}$ heterocycloalkenylene group, a substituted or unsubstituted $C_6$-$C_{60}$ arylene group, or a substituted or unsubstituted $C_2$-$C_{60}$ heteroarylene group.

In some embodiments of the present invention, $Ar_1$ may be a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted spiro-fluorenylene group, a substituted or unsubstituted phenalenylene group, a substituted or unsubstituted phenanthrenylene group, a substituted or unsubstituted anthrylene group, a substituted or unsubstituted fluoranthenylene group, a substituted or unsubstituted triphenylenylene group, a substituted or unsubstituted pyrenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted imidazolylene group, a substituted or unsubstituted pyrazolylene group, a substituted or unsubstituted pyridinylene group, a substituted or unsubstituted pyrazinylene group, a substituted or unsubstituted pyrimidinylene group, a substituted or unsubstituted pyridazinylene group, a substituted or unsubstituted isoindolylene group, a substituted or unsubstituted indolylene group, a substituted or unsubstituted indazolylene group, a substituted or unsubstituted purinylene group, a substituted or unsubstituted quinolinylene group, a substituted or unsubstituted benzoquinolinylene group, a substituted or unsubstituted phthalazinylene group, a substituted or unsubstituted naphthyridinylene group, a substituted or unsubstituted quinoxalinylene group, a substituted or unsubstituted quinazolinylene group, a substituted or unsubstituted cinnolinylene group, a substituted or unsubstituted carbazolylene group, a substituted or unsubstituted phenanthridinylene group, a substituted or unsubstituted acridinylene group, a substituted or unsubstituted phenanthrolinylene group, a substituted or unsubstituted phenazinylene group, a substituted or unsubstituted benzooxazolylene group, a substituted or unsubstituted benzoimidazolylene group, a substituted or unsubstituted furanylene group, a substituted or unsubstituted benzofuranylene group, a substituted or unsubstituted thiophenylene group, a substituted or unsubstituted benzothiophenylene group, a substituted or unsubstituted thiazolylene group, a substituted or unsubstituted isothiazolylene group, a substituted or unsubstituted benzothiazolylene group, a substituted or unsubstituted isoxazolylene group, a substituted or unsubstituted oxazolylene group, a substituted or unsubstituted triazolylene group, a substituted or unsubstituted tetrazolylene group, a substituted or unsubstituted oxadiazolylene group, a substituted or unsubstituted triazinylene group, a substituted or unsubstituted benzooxazolylene group, a substituted or unsubstituted dibenzofuranylene group, a substituted or unsubstituted dibenzothiophenylene group, or a benzocarbazolyl group, but is not limited thereto.

In some embodiments of the present invention, $Ar_1$ may be selected from among: i) a phenylene group, a naphthylene group, a fluorenylene group, a pyridinylene group, a pyrazinylene group, a pyrimidinylene group, a pyridazinylene group, a quinolinylene group, a carbazolylene group, a triazinylene group, a dibenzofuranylene group, and a dibenzothiophenylene group; and ii) a phenylene group, a naphthylene group, a fluorenylene group, a pyridinylene group, a pyrazinylene group, a pyrimidinylene group, a pyridazinylene group, a quinolinylene group, a carbazolylene group, a triazinylene group, a dibenzofuranylene group, and a dibenzothiophenylene group that are substituted with at least one of deuterium, a halogen atom, a hydroxyl group, a cyano group, a nitro group, an amino group, an amidino groups, hydrazine, hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group.

In some other embodiments of the present invention, $Ar_1$ may be a group represented by one selected from among Formulae 2-1 to 2-5:

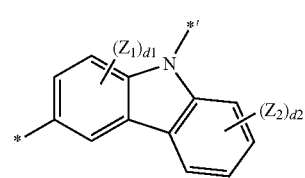

Formula 2-1

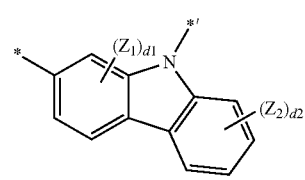

Formula 2-2

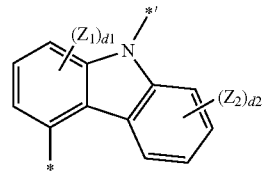

Formula 2-3

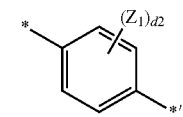

Formula 2-4

Formula 2-5

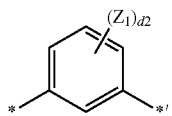

In Formulae 2-1 to 2-5, $Z_1$ and $Z_2$ may be each independently selected from among hydrogen, deuterium, a halogen atom, a hydroxyl group, a cyano group, a nitro group, an amino group, an amidino groups, hydrazine, hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; $d_1$ may be an integer from 1 to 3; $d_2$ may be an integer from 1 to 4; * may indicate a binding site with a core in Formula 1, or a binding site with another $Ar_1$ adjacent to the core in Formula 1; and *' may indicate a binding site with another $Ar_1$ spaced from the core in Formula 1, or a binding site with $Ar_{11}$, but not limited thereto.

In the substituent —$(Ar_1)_a$—$(Ar_{11})$, $Ar_{11}$ may be selected from among a substituted or unsubstituted phenyl group, a substituted or unsubstituted pentalenyl group, a substituted or unsubstituted indenyl group, a substituted or unsubstituted naphthyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted fluorenyl group, a substituted or unsubstituted spiro-fluorenyl group, a substituted or unsubstituted phenalenyl group, a substituted or unsubstituted phenanthrenyl group, a substituted or unsubstituted anthryl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pyrrolyl group, a substituted or unsubstituted imidazolyl group, a substituted or unsubstituted pyrazolyl group, a substituted or unsubstituted pyridinyl group, a substituted or unsubstituted pyrazinyl group, a substituted or unsubstituted pyrimidinyl group, a substituted or unsubstituted pyridazinyl group, a substituted or unsubstituted isoindolyl group, a substituted or unsubstituted indolyl group, a substituted or unsubstituted indazolyl group, a substituted or unsubstituted purinyl group, a substituted or unsubstituted quinolinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted cinnolinyl group, a substituted or unsubstituted carbazolyl group, a substituted or unsubstituted phenanthridinyl group, a substituted or unsubstituted acridinyl group, a substituted or unsubstituted phenanthrolinyl group, a substituted or unsubstituted phenazinyl group, a substituted or unsubstituted benzooxazolyl group, a substituted or unsubstituted benzoimidazolyl group, a substituted or unsubstituted furanyl group, a substituted or unsubstituted benzofuranyl group, a substituted or unsubstituted thiophenyl group, a substituted or unsubstituted benzothiophenyl group, a substituted or unsubstituted thiazolyl group, a substituted or unsubstituted isothiazolyl group, a substituted or unsubstituted benzothiazolyl group, a substituted or unsubstituted isoxazolyl group, a substituted or unsubstituted oxazolyl group, a substituted or unsubstituted triazolyl group, a substituted or unsubstituted tetrazolyl group, a substituted or unsubstituted oxadiazolyl group, a substituted or unsubstituted triazinyl group, a substituted or unsubstituted benzooxazolyl group, a substituted or unsubstituted dibenzofuranyl group, a substituted or unsubstituted dibenzothiophenyl group, a substituted or unsubstituted benzocarbazolyl group, and —$N(Q_1)(Q_2)$ (where $Q_1$ and $Q_2$ may be each independently a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group).

In some embodiments of the present invention, $Ar_{11}$ may be a group represented by one selected from among Formulae 3-1 to 3-14:

Formula 3-1

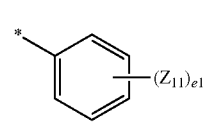

Formula 3-2

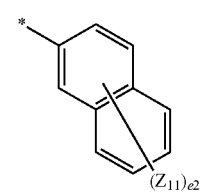

Formula 3-3

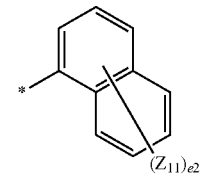

Formula 3-4

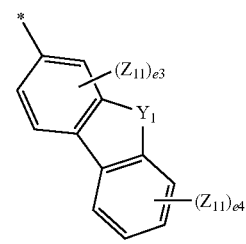

Formula 3-5

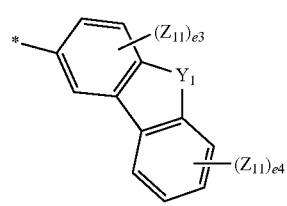

-continued

Formula 3-6
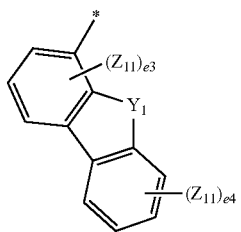

Formula 3-7
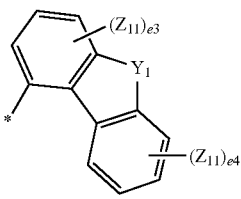

Formula 3-8
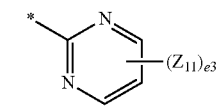

Formula 3-9
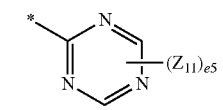

Formula 3-10
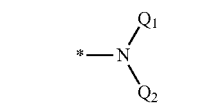

Formula 3-11
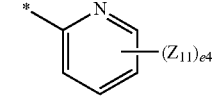

Formula 3-12
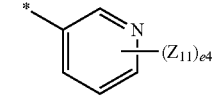

Formula 3-13
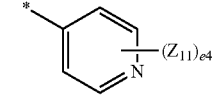

Formula 3-14
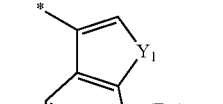

In Formulae 3-1 to 3-14, $Y_1$ may be O, S, $C(Z_{21})(Z_{22})$, or $N(Z_{23})$; $Z_{11}$, and $Z_{21}$ to $Z_{23}$ may be each independently selected from among hydrogen, deuterium, a halogen atom, a hydroxyl group, a cyano group, a nitro group, an amino group, an amidino groups, hydrazine, hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; $Q_1$ and $Q_2$ may be each independently selected from among a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; e1 may be an integer from 1 to 5; e2 may be an integer from 1 to 7; e3 may be an integer from 1 to 3; e4 may be an integer from 1 to 4; and e5 may be 1 or 2, but not limited thereto.

In —$(Ar_1)_a$—$(Ar_{11})$, a indicates the number of $Ar_1$s, which may be an integer from 0 to 5. When a=0, $Ar_{11}$ may be directly linked to the core of Formula 1. When a is 2 or greater, the two or more $Ar_1$s may be identical to or differ from each other.

In some embodiments of the present invention, the heterocyclic compound may be a compound represented by Formula 1A-1(1), 1A-7(1), 1A-9(1), 1A-11(1), 1B-1(1), 1B-6(1), or 1B-14(1):

1A-1(1)
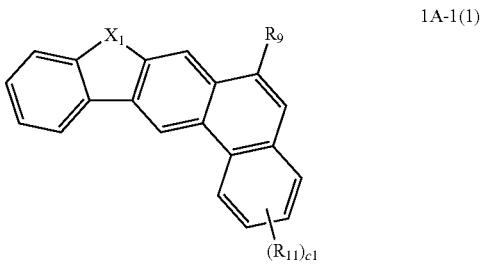

1A-7(1)
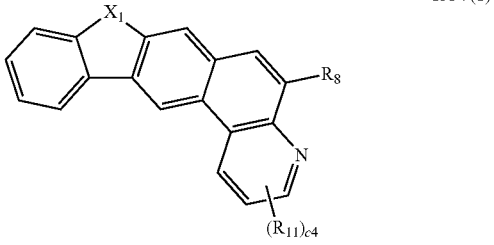

1A-9(1)
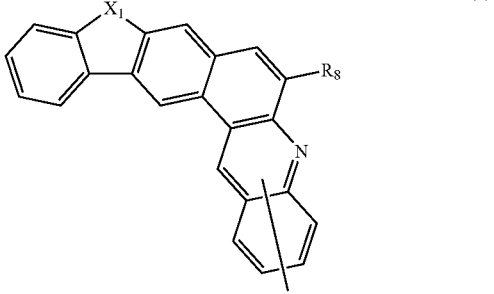

1A-11(1)
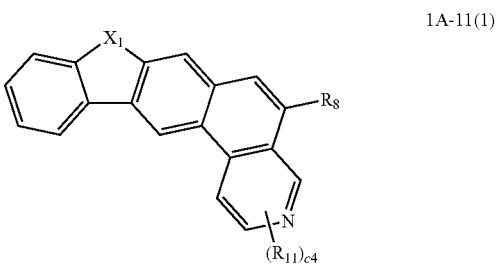

-continued

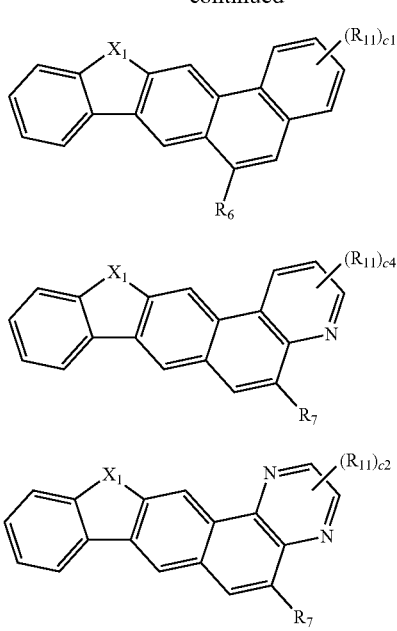

1B-1(1)

1B-6(1)

1B-14(1)

In Formulae 1A-1(1), 1A-7(1), 1A-9(1), 1A-11(1), 1B-1(1), 1B-6(1), and 1B-14(1) above, $X_1$ may be O or S; $R_{11}$ may be each independently selected from among hydrogen, deuterium, a halogen atom, a hydroxyl group, a cyano group, a nitro group, an amino group, an amidino groups, hydrazine, hydrazone, a carboxylic group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group; a $C_1$-$C_{60}$ alkyl group, a $C_2$-$C_{60}$ alkenyl group, a $C_2$-$C_{60}$ alkynyl group, and a $C_1$-$C_{60}$ alkoxy group that are substituted with at least one of deuterium, a halogen atom, a hydroxyl group, a cyano group, a nitro group, an amino group, an amidino groups, hydrazine, hydrazone, a carboxylic group or a salt thereof, a sulfonic acid group or a salt thereof, and a phosphoric acid group or a salt thereof; a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group; a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group that are substituted with at least one of deuterium, a halogen atom, a hydroxyl group, a cyano group, a nitro group, an amino group, an amidino groups, hydrazine, hydrazone, a carboxylic group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; —N($Q_{11}$)($Q_{12}$); and —Si($Q_{13}$)($Q_{14}$)($Q_{15}$) (where $Q_{11}$, and $Q_{12}$ are each independently a $C_6$-$C_{60}$ aryl group, or a $C_2$-$C_{60}$ heteroaryl group; and $Q_{13}$ to $Q_{15}$ may be each independently a $C_1$-$C_{60}$ alkyl group, a $C_1$-$C_{60}$ alkoxy group, a $C_6$-$C_{60}$ aryl group, or a $C_2$-$C_{60}$ heteroaryl group); c1 may be an integer from 1 to 4; c2 may be 1 or 2; c4 may be an integer from 1 to 3; c5 may be an integer from 1 to 5; and $R_6$ to $R_9$ may be each independently a substituent represented by —(Ar$_1$)$_a$—(Ar$_{11}$), wherein Ar$_1$, a, and Ar$_{11}$ are defined as above.

For examples, in Formulae 1A-1(1), 1A-7(1), 1A-9(1), 1A-11(1), 1B-1(1), 1B-6(1), and 1B-14(1) above, $R_6$ to $R_9$ may be each independently a substituent represented by —(Ar$_1$)$_a$—(Ar$_{11}$), wherein Ar$_1$ may be a group represented by one of Formulae 2-1 to 2-5, a may be an integer from 0 to 3, and Ar$_{11}$ may be a group represented by one of Formulae 3-1 to 3-14:

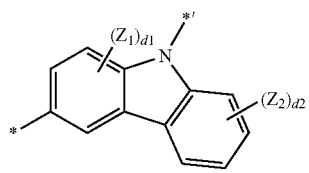

Formula 2-1

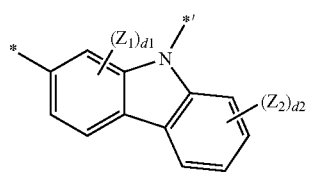

Formula 2-2

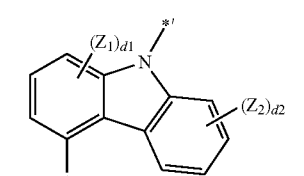

Formula 2-3

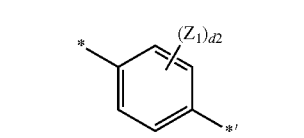

Formula 2-4

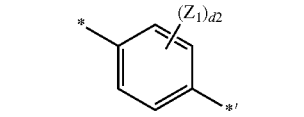

Formula 2-5

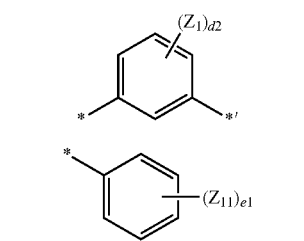

Formula 3-1

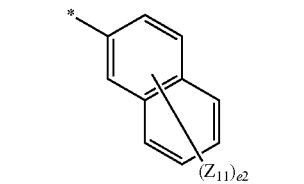

Formula 3-2

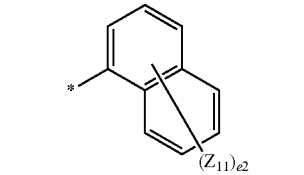

Formula 3-3

-continued

Formula 3-4

Formula 3-5

Formula 3-6

Formula 3-7

Formula 3-8

Formula 3-9

Formula 3-10

Formula 3-11

Formula 3-12

Formula 3-13

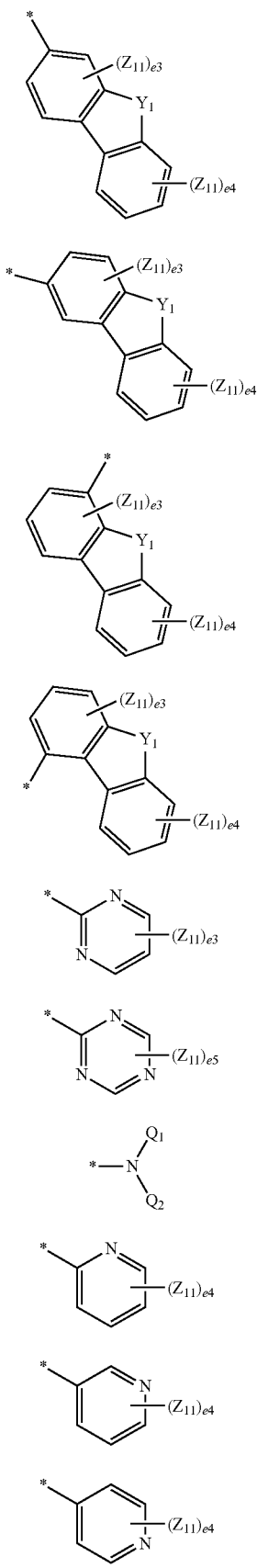

-continued

Formula 3-14

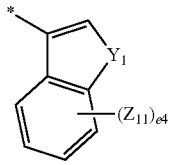

In Formulae 2-1 to 2-5, $Z_1$ and $Z_2$ may be each independently selected from among hydrogen, deuterium, a halogen atom, a hydroxyl group, a cyano group, a nitro group, an amino group, an amidino groups, hydrazine, hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group. $d_1$ may be an integer from 1 to 3; $d_2$ may be an integer from 1 to 4; * indicates a binding site with a core in Formulae 1A-1(1), 1A-7(1), 1A-9(1), 1A-11(1), 1B-1(1), 1B-6(1), and 1B-14(1), or a binding site with another $Ar_1$ adjacent to the core in Formulae 1A-1(1), 1A-7(1), 1A-9(1), 1A-11(1), 1B-1(1), 1B-6(1), and 1B-14(1); and *' indicates a binding site with another $Ar_t$ spaced from the core in Formulae 1A-1(1), 1A-7(1), 1A-9(1), 1A-11(1), 1B-1(1), 1B-6(1), and 1B-14(1), or a binding site with $Ar_{11}$.

In Formulae 3-1 to 3-14, $Y_1$ may be O, S, C($Z_{21}$)($Z_{22}$), or N($Z_{23}$); $Z_{11}$, and $Z_{21}$ to $Z_{23}$ may be each independently selected from among hydrogen, deuterium, a halogen atom, a hydroxyl group, a cyano group, a nitro group, an amino group, an amidino groups, hydrazine, hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; $Q_1$ and $Q_2$ may be each independently selected from among a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; e1 may be an integer from 1 to 5; e2 may be an integer from 1 to 7; e3 may be an integer from 1 to 3; e4 may be an integer from 1 to 4; and e5 may be 1 or 2.

In some other embodiments of the present invention, the heterocyclic compound may be a compound represented by Formula 1A-HTL1 or 1B-HTL1 below:

Formula 1A-HTL1

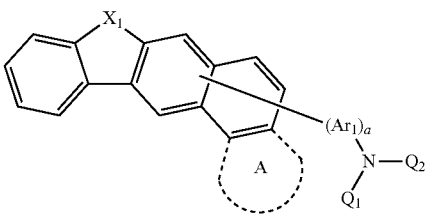

-continued

Formula 1B-HTL1

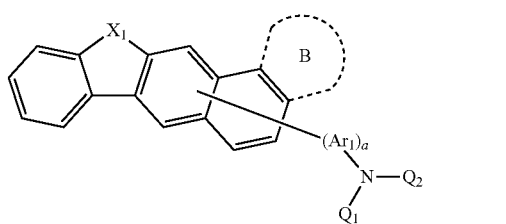

In Formulae 1A-HTL1 and 1B-HTL1, $X_1$, a A ring, a B ring, $Ar_1$, a, $Q_1$, and $Q_2$ may be as defined above.

For example, in Formulae 1A-HIL1 and 1B-HTL1, $X_1$ may be O, or S; the A ring and B ring may be each independently selected from among: i) benzene, pyridine, pyrazine, pyrimidine, pyridazine, naphthalene, fluorene, indole, isoquinoline, quinoline, carbazole, dibenzofuran, and dibenzothiophene; and ii) benzene, pyridine, pyrazine, pyrimidine, pyridazine, naphthalene, fluorene, indole, isoquinoline, quinoline, carbazole, dibenzofuran, and dibenzothiophene that are substituted with at least substituent selected from among deuterium, a halogen atom, a hydroxyl group, a cyano group, a nitro group, an amino group, an amidino groups, hydrazine, hydrazone, a carboxylic group or a salt thereof, a sulfonic acid group or a salt thereof, a phosphoric acid group or a salt thereof, a $C_1$-$C_{20}$ alkyl group, and a $C_1$-$C_{20}$ alkoxy group; a $C_1$-$C_{20}$ alkyl group, and a $C_1$-$C_{60}$ alkoxy group that are substituted with at least one of deuterium, a halogen atom, a hydroxyl group, a cyano group, a nitro group, an amino group, an amidino groups, hydrazine, hydrazone, a carboxylic group or a salt thereof, a sulfonic acid group or a salt thereof, and a phosphoric acid group or a salt thereof; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group that are substituted with at least one of deuterium, a halogen atom, a hydroxyl group, a cyano group, a nitro group, an amino group, an amidino groups, hydrazine, hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and —N($Q_{11}$)($Q_{12}$) (where $Q_{11}$, and $Q_{12}$ may be each independently, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group); a may be an integer from 1 to 3; $Q_1$ and $Q_2$ may be each independently selected from among a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and $Ar_1$ may be a group represented by one of Formulae 2-1 to 2-5 above, but not limited thereto:

Formula 2-1

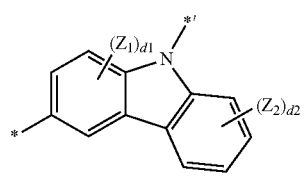

Formula 2-2

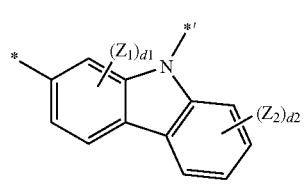

Formula 2-3

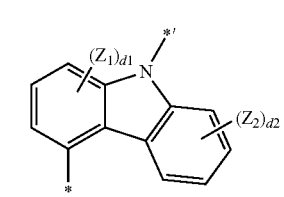

Formula 2-4

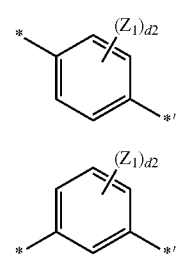

Formula 2-5

In Formulae 2-1 to 2-5 above, $Z_1$ and $Z_2$ maybe each independently selected from among hydrogen, deuterium, a halogen atom, a hydroxyl group, a cyano group, a nitro group, an amino group, an amidino groups, hydrazine, hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; $d_1$ is an integer from 1 to 3; and $d_2$ is an integer from 1 to 4; * indicates a binding site with a core in Formula 1A-HTL1 or Formula 1B-HTL1, or a binding site with another $Ar_1$ adjacent to the core in Formula 1A-HTL1 or Formula 1B-HTL1; and *' indicates a binding site with another $Ar_1$ spaced from the core in Formula 1A-HTL1 or Formula 1B-HTL1.

The compound of Formula 1A-HTL1 or 1B-HTL1 may be used, for example, in a hole injection layer, a hole transport layer, and/or a functional layer having both hole injection and holt transporting capabilities in an organic light-emitting device.

In some embodiments of the present invention, the heterocyclic compound may be a compound represented by Formula 1A-1(1), 1A-7(1), 1A-9(1), 1A-11(1), 1B-1(1), 1B-6(1), or 1B-14(1) above, wherein $X_1$ may be O, or S; $R_6$ to $R_9$ may be each independently a substituent represented by —(Ar$_1$)$_a$—(Ar$_{11}$), wherein i) Ar$_1$ may be a group represented by one selected from among Formulae 2-1 to 2-5; ii) a may be an integer from 0 to 3; iii) Ar$_{11}$ may be a group represented by —N(Q$_1$)(Q$_2$) (where Q$_1$, and Q$_2$ may be each independently phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group). The heterocyclic compound may be used, for example, in a hole injection layer, a hole transport layer, and/or a functional layer having both hoe injection and hole transporting capabilities in an organic light-emitting device.

The heterocyclic compound may be a compound represented by Formula 1A-H1, 1A-H2, 1A-H3, 1B-H1, 1B-H2, or 1B-H3 below:

Formula 1A-H1

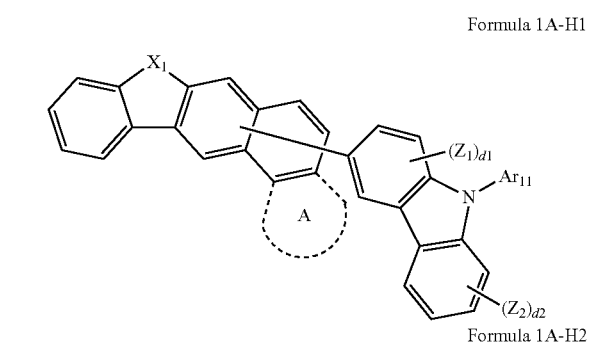

Formula 1A-H2

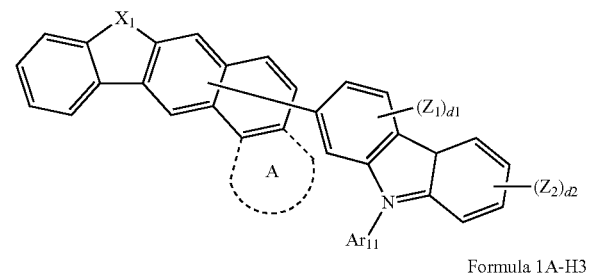

Formula 1A-H3

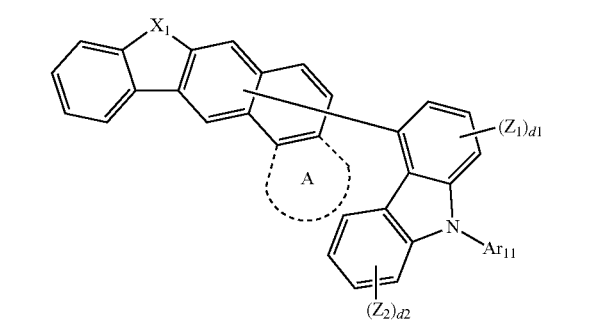

Formula 1B-H1

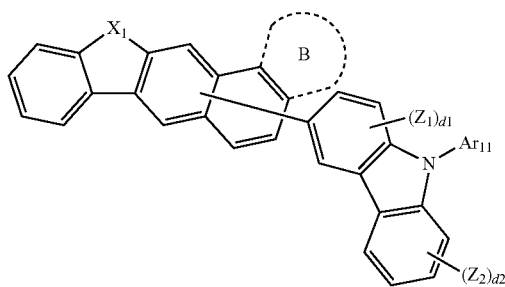

Formula 1B-H2

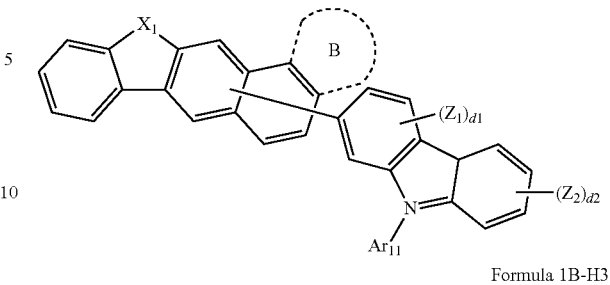

Formula 1B-H3

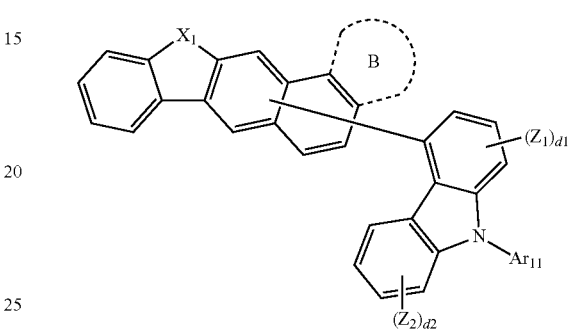

in Formulae 1A-H1, 1A-H2, 1A-H3, 1B-H1, 1B-H2, and 1B-H3, X$_1$, a A ring, a B ring, Z$_1$, Z$_2$, d$_1$, d$_2$, and Ar$_{11}$ may be as defined above.

For example, in Formulae 1A-H1, 1A-H2, 1A-H3, 1B-H1, 1B-H2, and 1B-H3, X$_1$ may be O, or S; the A ring and B ring may be each independently selected from among: i) benzene, pyridine, pyrazine, pyrimidine, pyridazine, naphthalene, fluorene, indole, isoquinoline, quinoline, carbazole, dibenzofuran, and dibenzothiophene; and ii) benzene, pyridine, pyrazine, pyrimidine, pyridazine, naphthalene, fluorene, indole, isoquinoline, quinoline, carbazole, dibenzofuran, and dibenzothiophene that are substituted with at least one substituent selected from among deuterium, a halogen atom, a hydroxyl group, a cyano group, a nitro group, an amino group, an amidino groups, hydrazine, hydrazone, a carboxylic group or a salt thereof, a sulfonic acid group or a salt thereof, a phosphoric acid group or a salt thereof, a C$_1$-C$_{20}$ alkyl group, and a C$_1$-C$_{20}$ alkoxy group; a C$_1$-C$_{20}$ alkyl group, and a C$_1$-C$_{20}$ alkoxy group that are substituted with at least one of deuterium, a halogen atom, a hydroxyl group, a cyano group, a nitro group, an amino group, an amidino groups, hydrazine, hydrazone, a carboxylic group or a salt thereof, a sulfonic acid group or a salt thereof, and a phosphoric acid group or a salt thereof; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group that are substituted with at least one of deuterium, a halogen atom, a hydroxyl group, a cyano group, a nitro group, an amino group, an amidino groups, hydrazine, hydrazone, a carboxylic group or a salt thereof, a sulfonic acid group or a salt thereof, phosphoric acid group or a salt thereof, a C$_1$-C$_{20}$ alkyl group, a C$_1$-C$_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and —N($Q_{11}$)($Q_{12}$) (where $Q_{11}$, and $Q_{12}$ may be each independently phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group); $Z_1$ and $Z_2$ may be each independently selected from among hydrogen, deuterium, a halogen atom, a hydroxyl group, a cyano group, a nitro group, an amino group, an amidino groups, hydrazine, hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; $d_1$ may be an integer from 1 to 3; $d_2$ may be an integer from 1 to 4; and $Ar_{11}$ may be a group represented by one of Formulae 3-1 to 3-14, but not limited thereto:

Formula 3-1
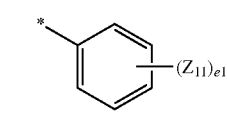

Formula 3-2
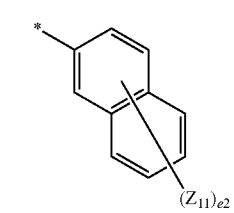

Formula 3-3
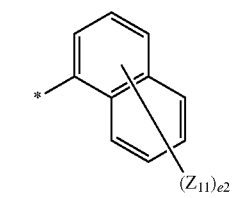

Formula 3-4
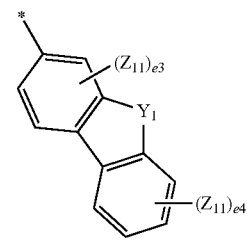

Formula 3-5
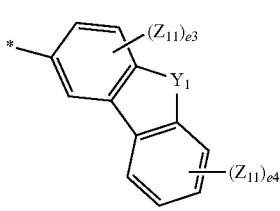

Formula 3-6
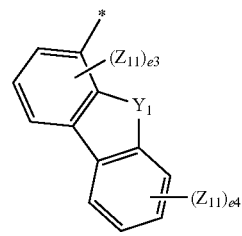

Formula 3-7
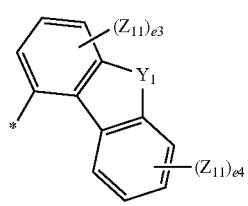

Formula 3-8
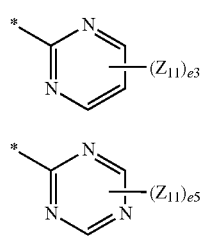

Formula 3-9
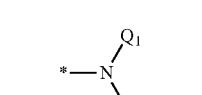

Formula 3-10
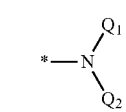

Formula 3-11
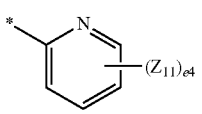

Formula 3-12
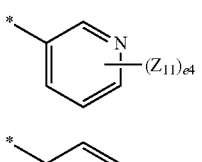

Formula 3-13
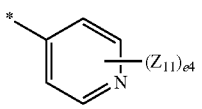

Formula 3-14
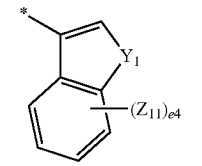

In Formulae 3-1 to 3-14 above, $Y_1$ may be O, S, C($Z_{21}$)($Z_{22}$), or N($Z_{23}$); $Z_{11}$, and $Z_{21}$ to $Z_{23}$ may be each independently selected from among hydrogen, deuterium, a halogen atom, a hydroxyl group, a cyano group, a nitro group, an amino group, an amidino groups, hydrazine, hydrazone, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group and an isoquinolyl group; $Q_1$ and $Q_2$ may be each independently selected from among a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; e1 may be an integer from 1 to 5; e2 may be an integer from 1 to 7; e3 may be an integer from 1 to 3; e4 may be an integer from 1 to 4; and e5 may be 1 or 2.

For example, the heterocyclic compound represented by Formula 1A-H1, 1A-H2, 1A-H3, 1B-H1, 1B-H2, or 1B-H3 may be used as a material (for example, as a host) for an emission layer of an organic light-emitting device.

In some other embodiments of the present invention, the heterocyclic compound may be a compound represented by Formula 1A-1(1), 1A-7(1), 1A-9(1), 1A-11(1), 1B-1(1), 1B-6(1), or 1B-14(1), wherein $R_6$ to $R_9$ may be each independently a substituent represented by $—(Ar_1)_a—(Ar_{11})$, wherein i) $Ar_1$ may be a group represented by one selected from among Formulae 2-1 to 2-5, ii) a may be an integer from 1 to 3, iii) $Ar_{11}$ may be a group represented by Formula 3-1, 3-8, 3-9, 3-11, 3-12, or 3-13. These heterocyclic compounds may be used as a material (for example, as a host) for an emission layer of an organic light-emitting device.

In some embodiments of the present invention, the heterocyclic compound may be one of Compounds 1 to 74, and 101 to 170, but is not limited thereto:

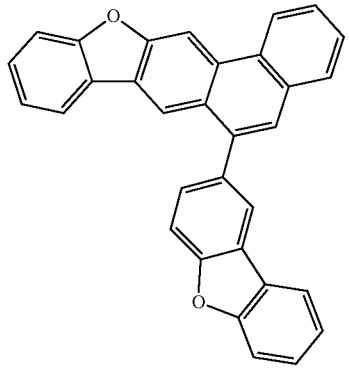

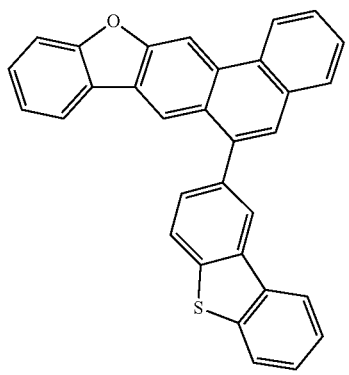

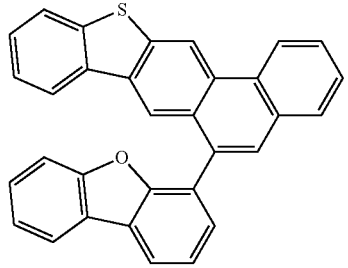

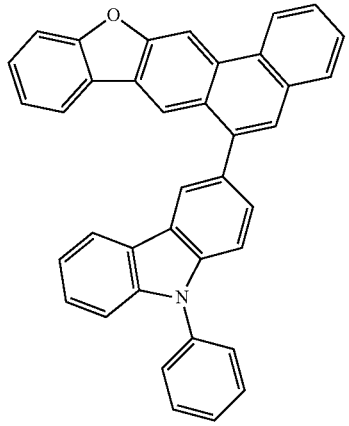

31
-continued
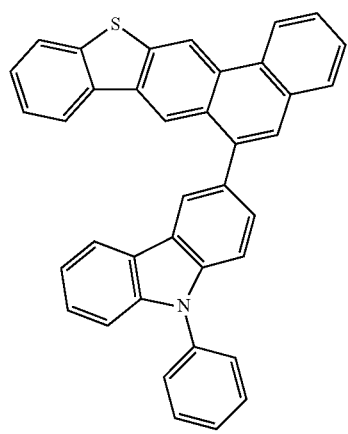
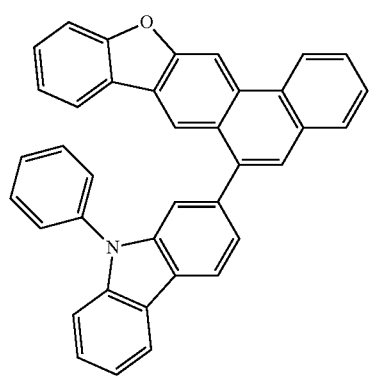
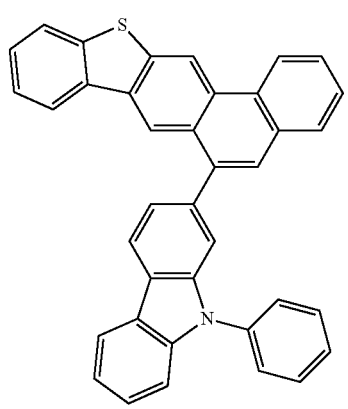
32
-continued
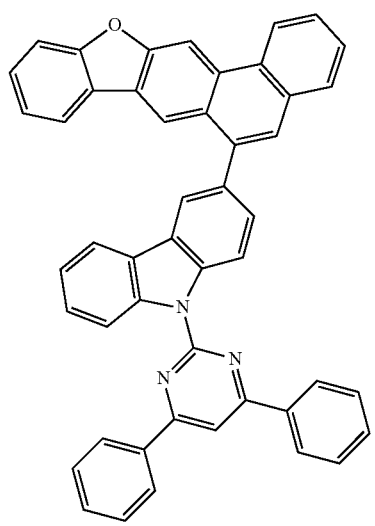
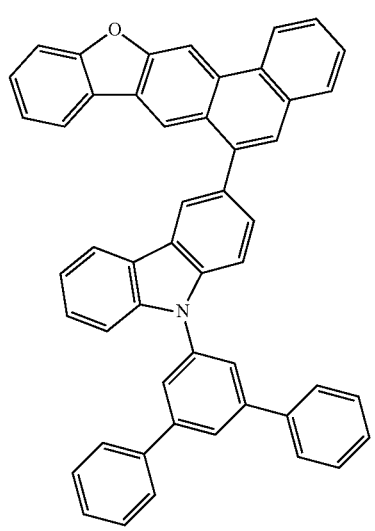

13
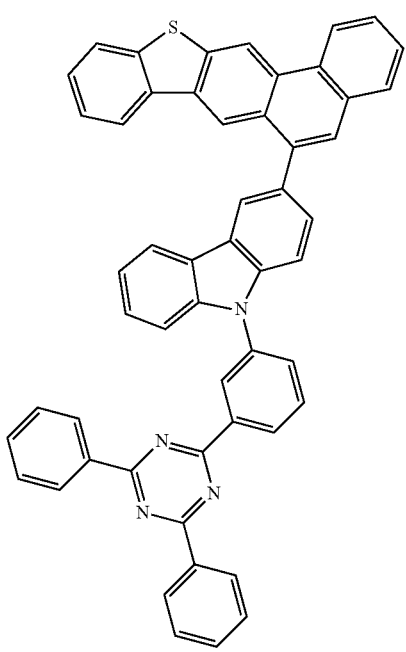
14
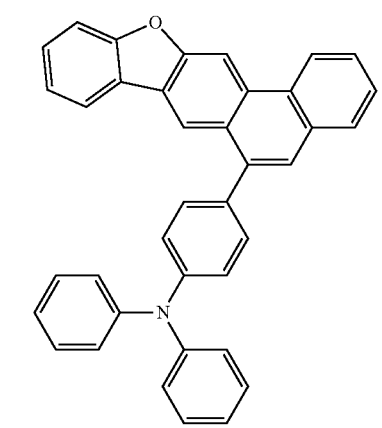
15
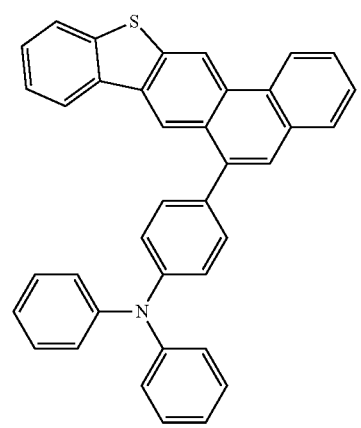
16
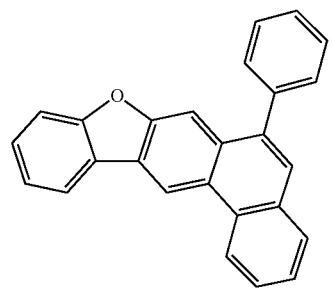
17
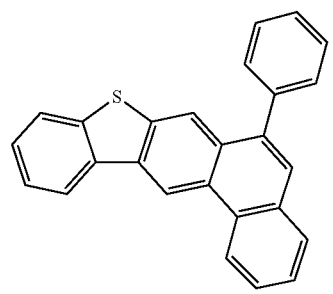
18
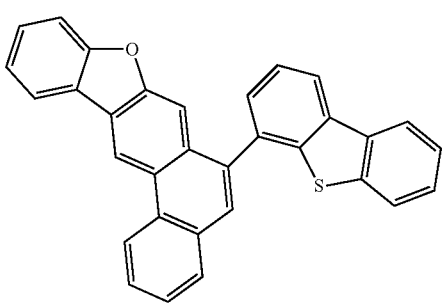
19
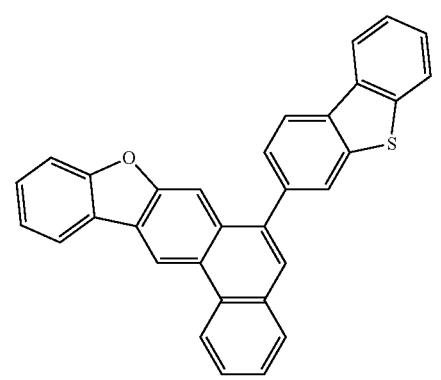
20
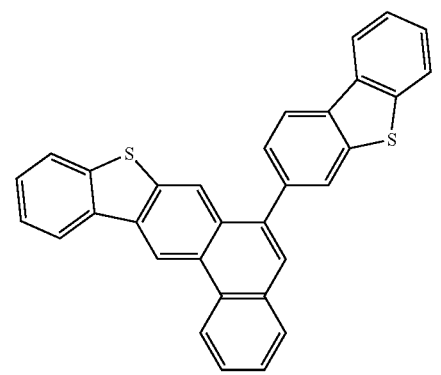

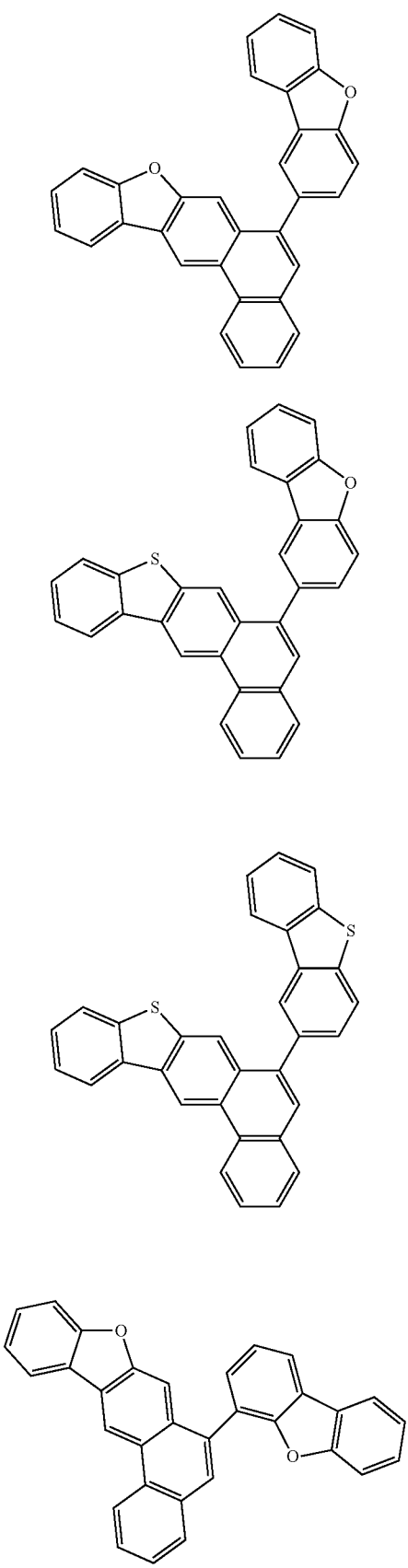
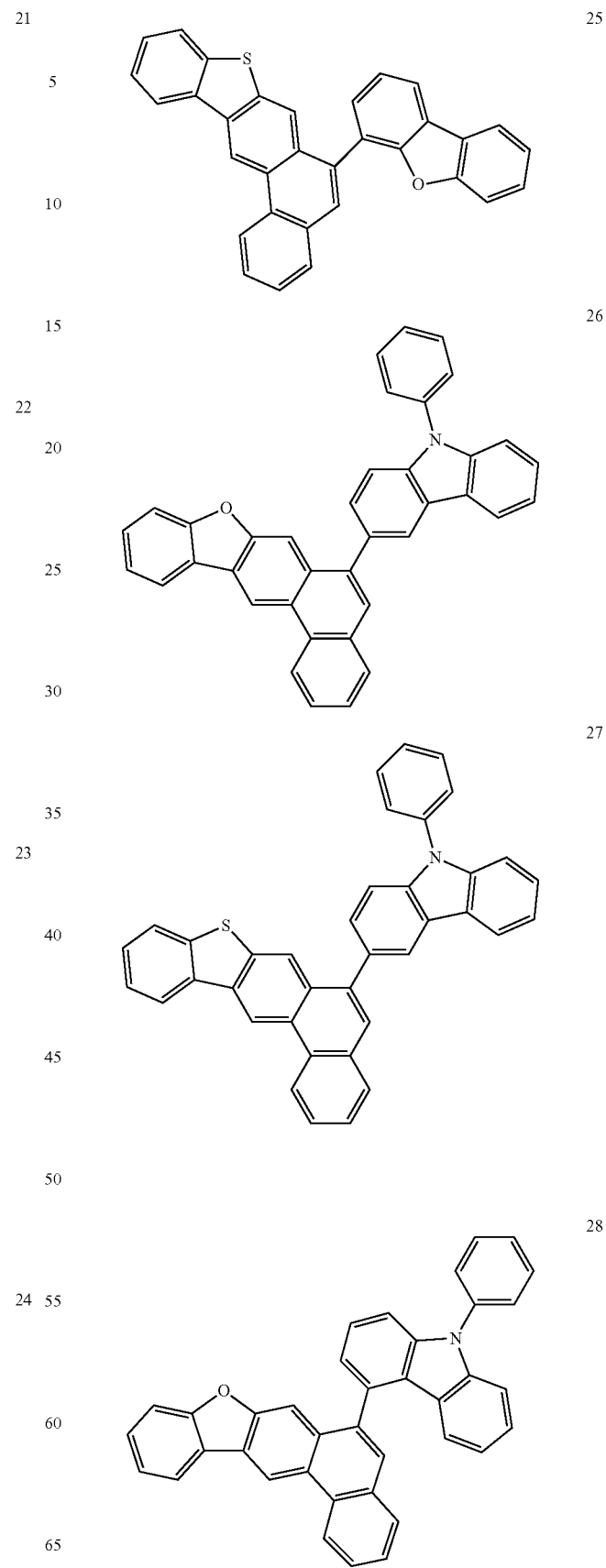

29
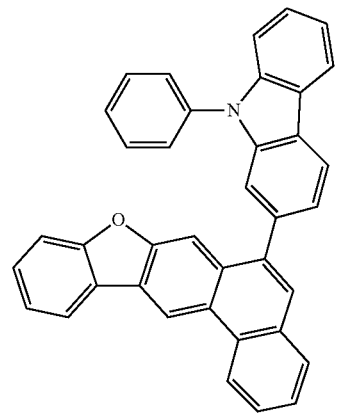
30
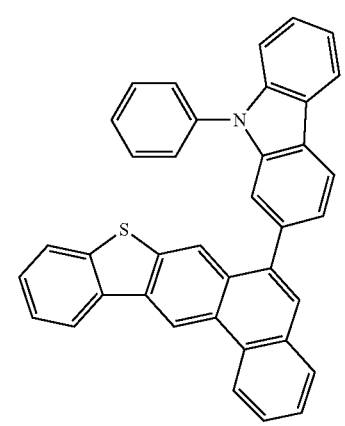
31
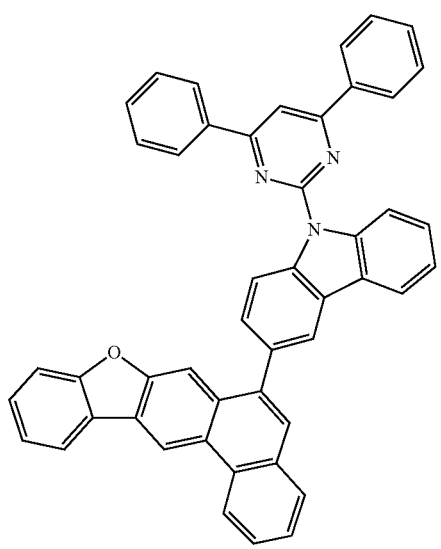
32
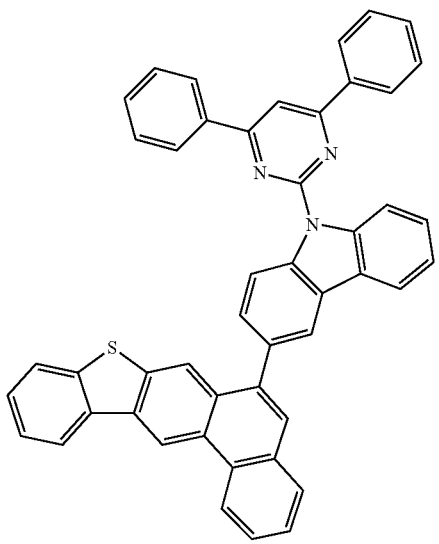
33
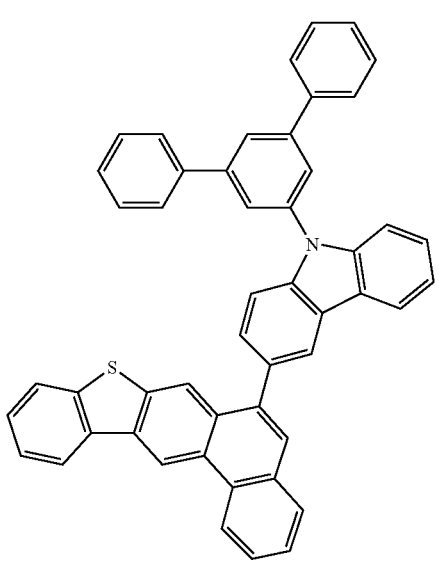

34
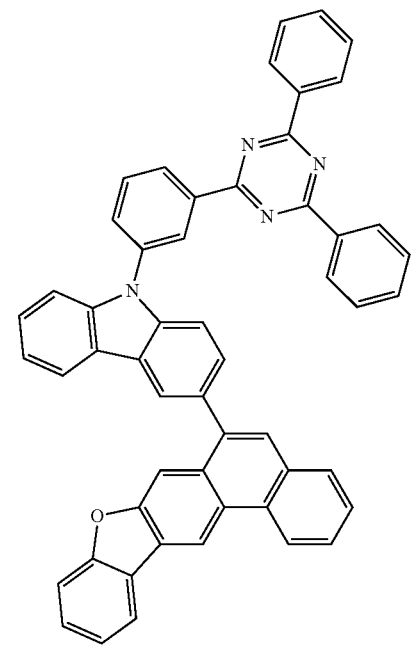
35
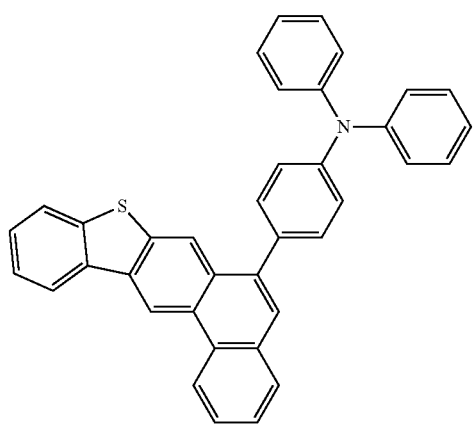
36
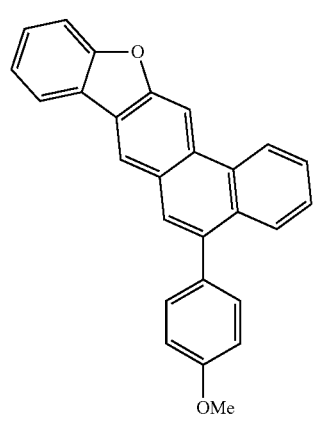
37
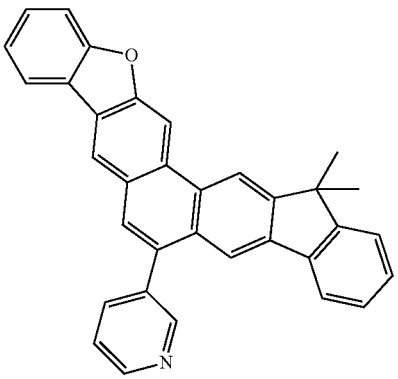
38
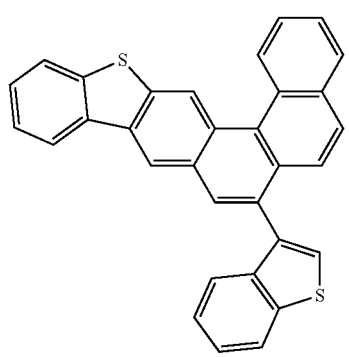
39
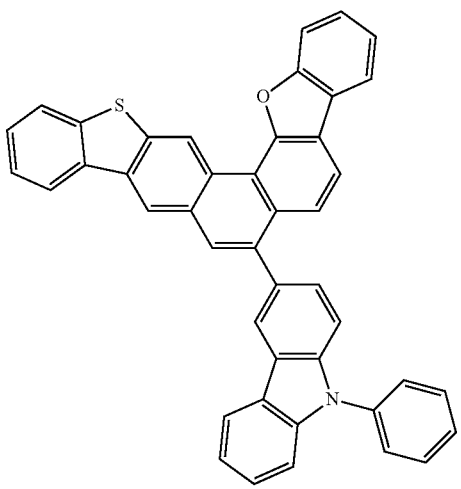

41
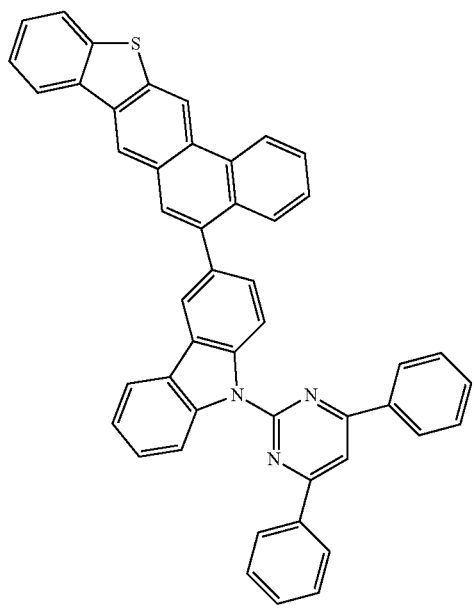
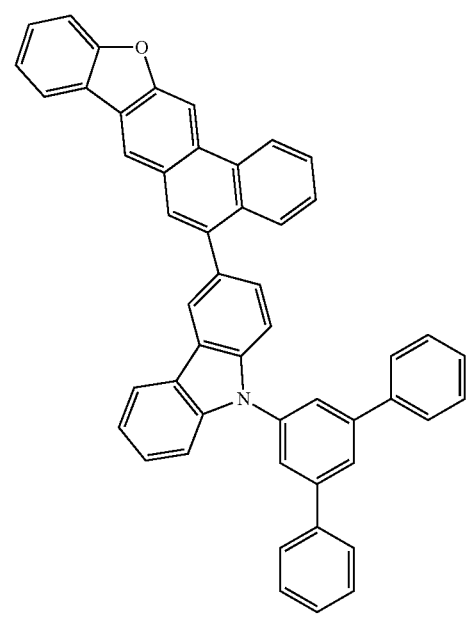
42
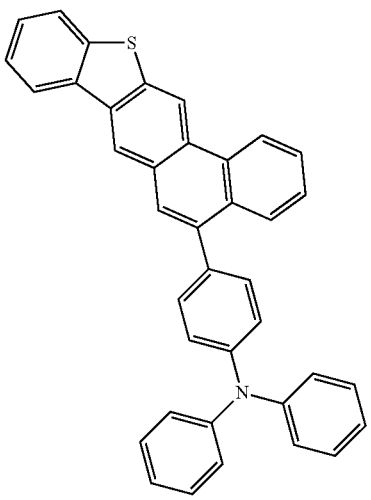
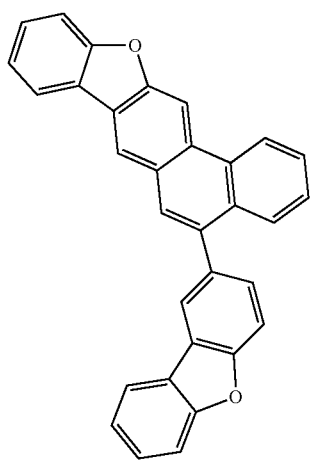
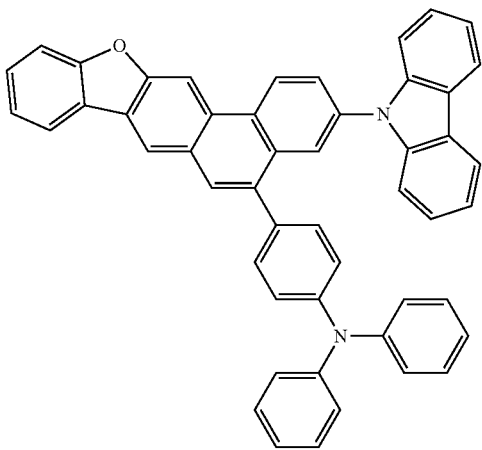

45
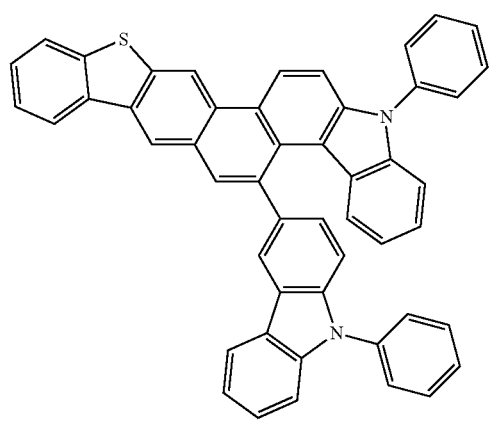
46
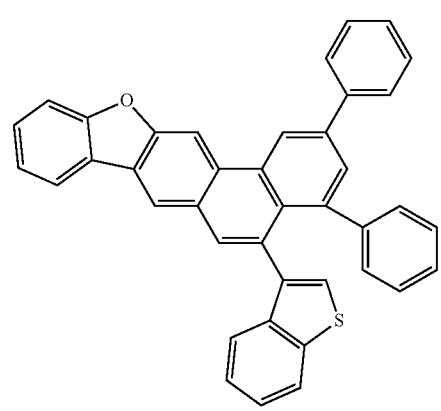
47
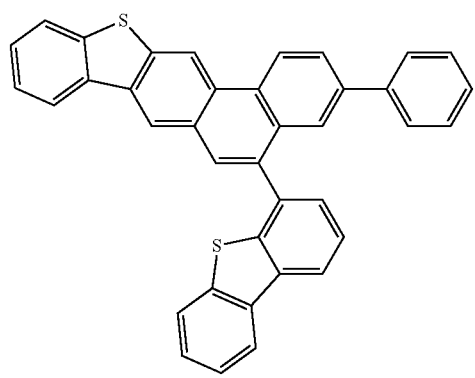
48
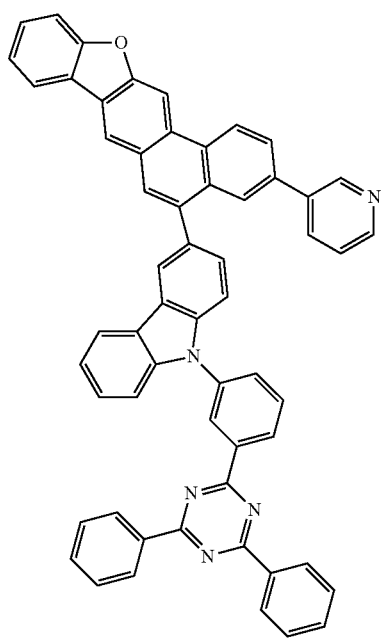
49
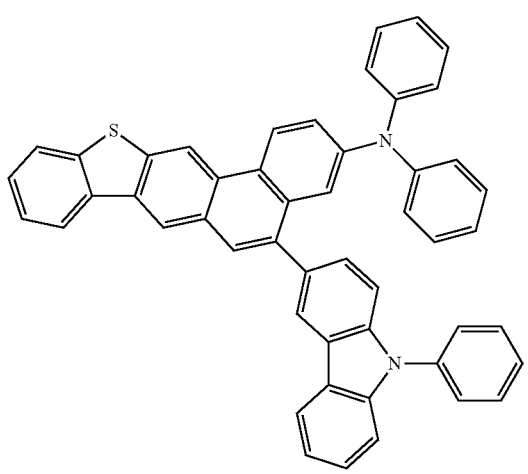
50
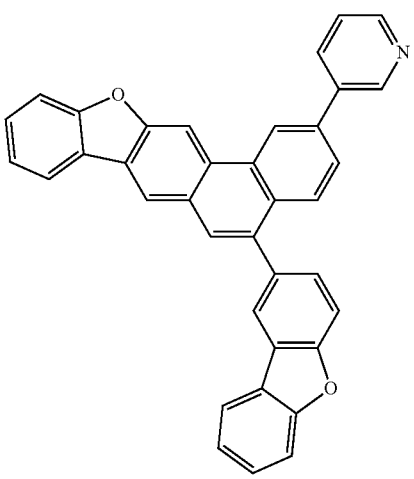

51
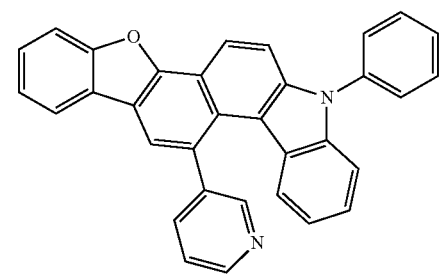
52
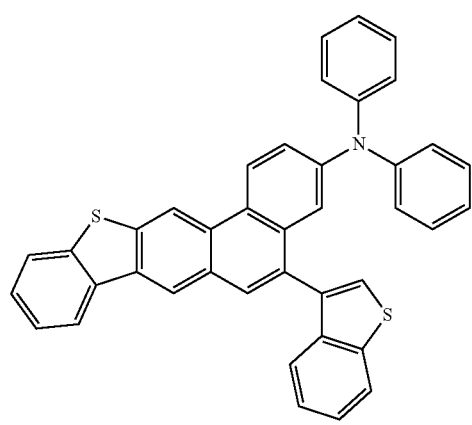
53
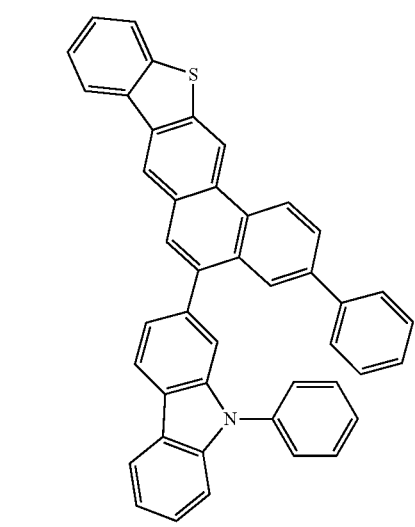
54
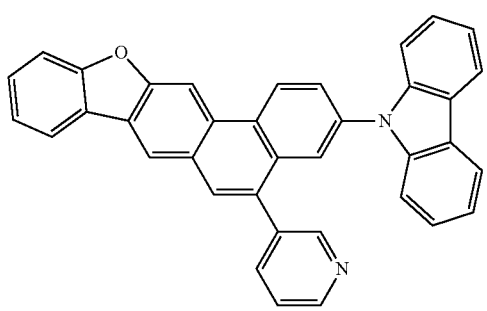
55
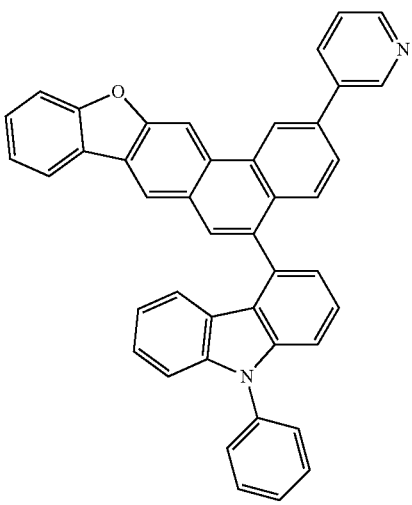
56
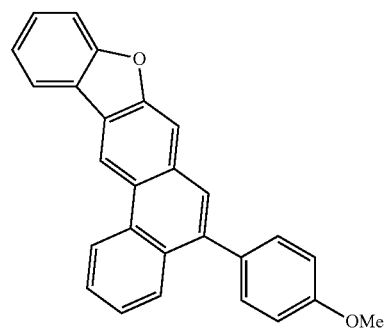
57
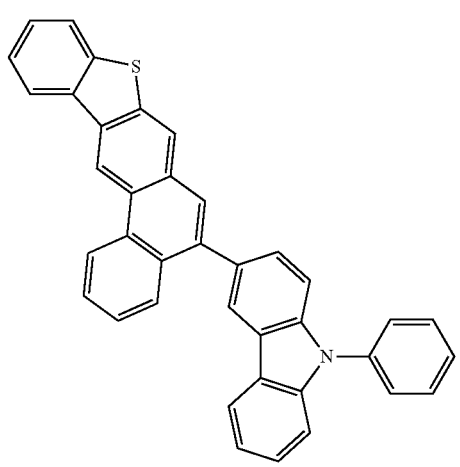

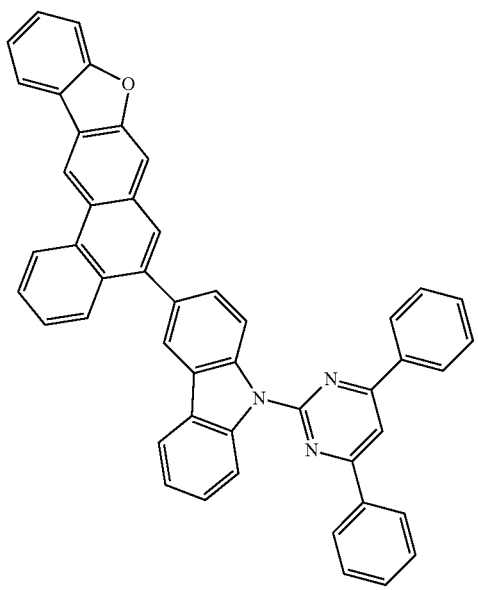
58
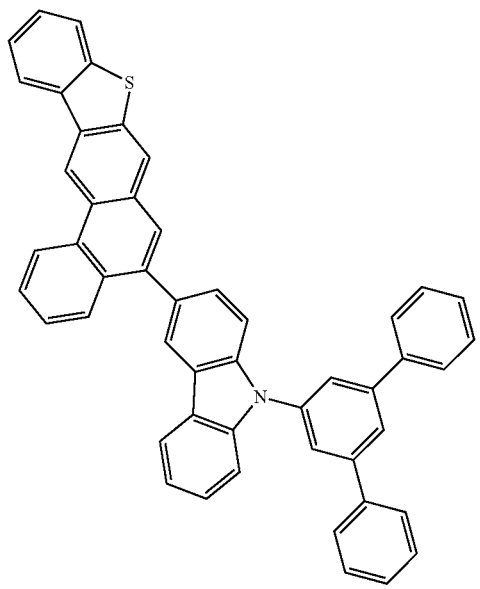
61
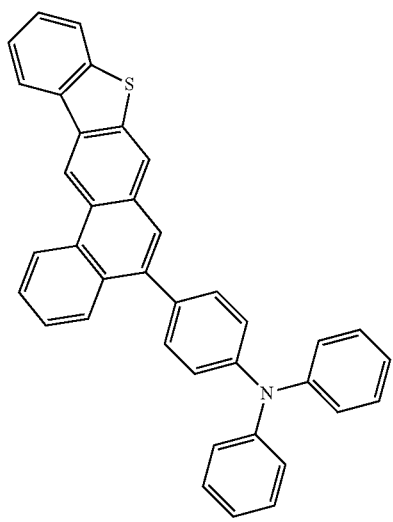
59
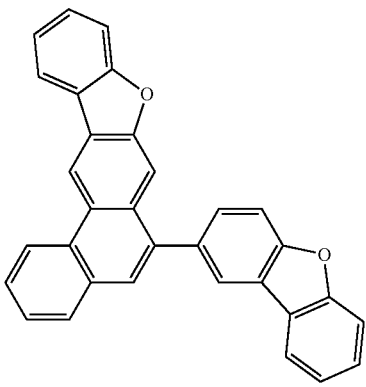
62
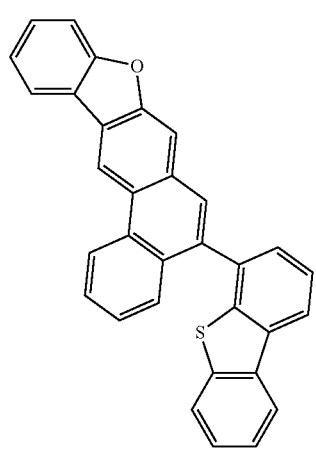
60
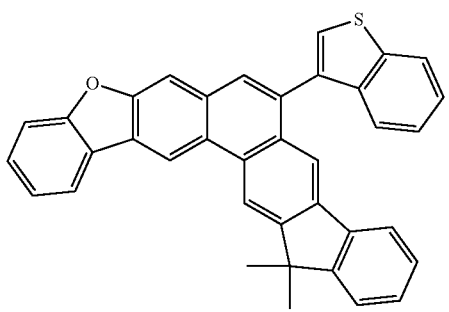
63

64
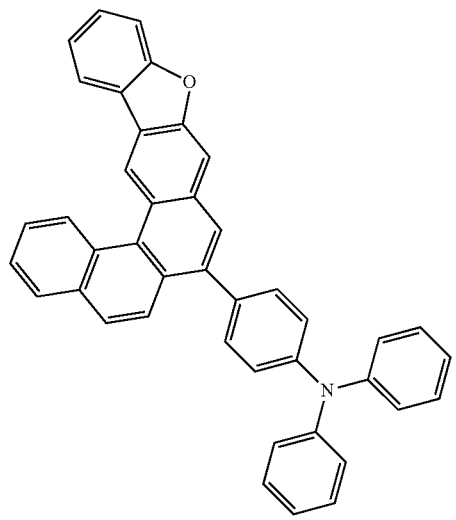
65
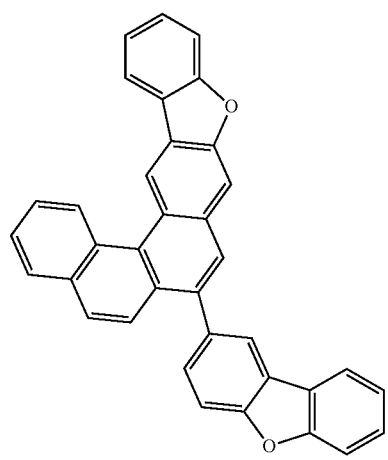
66
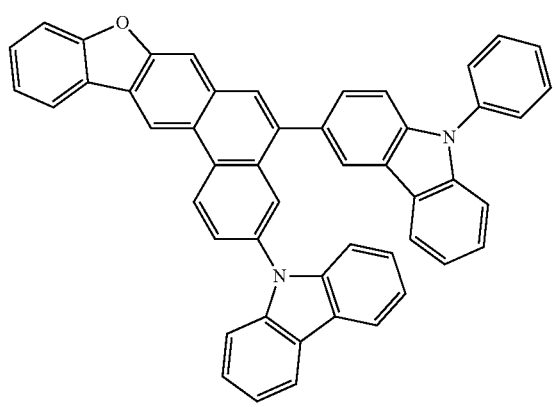
67
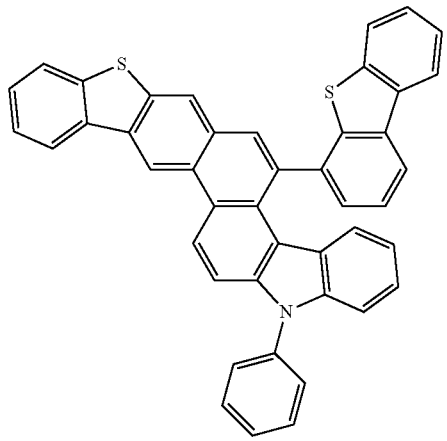
68
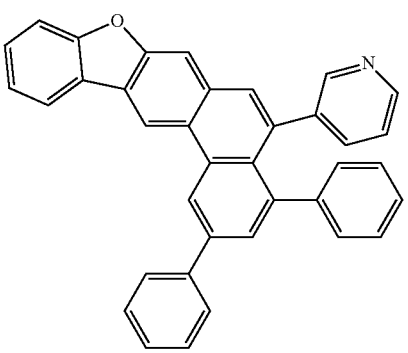
69
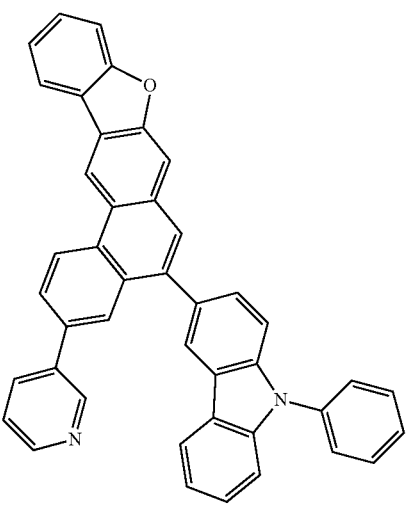

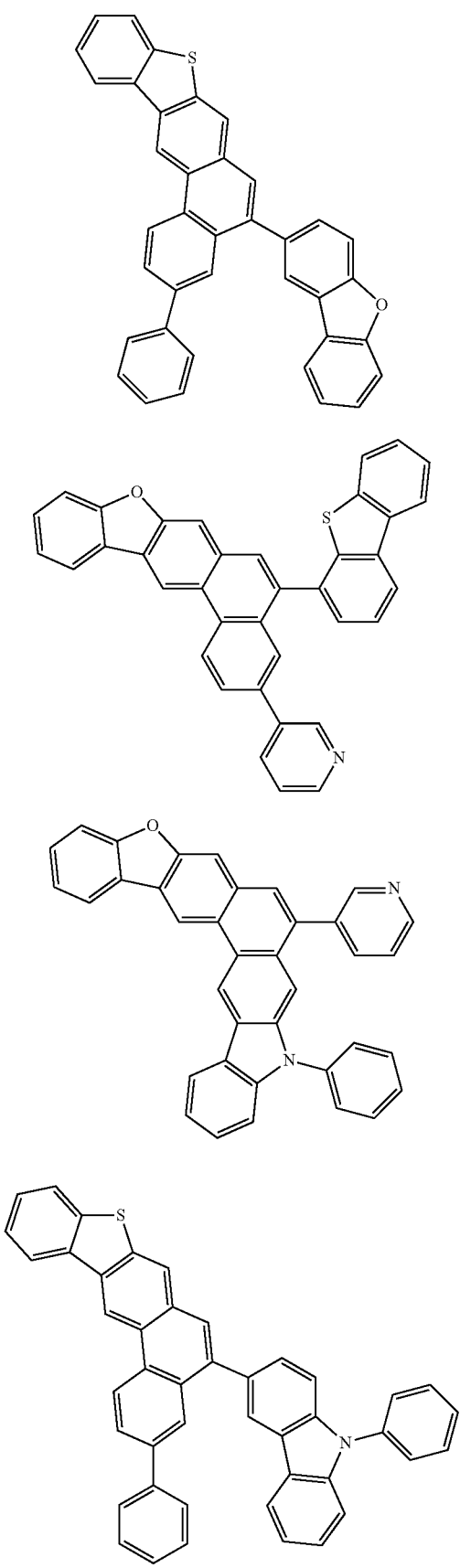
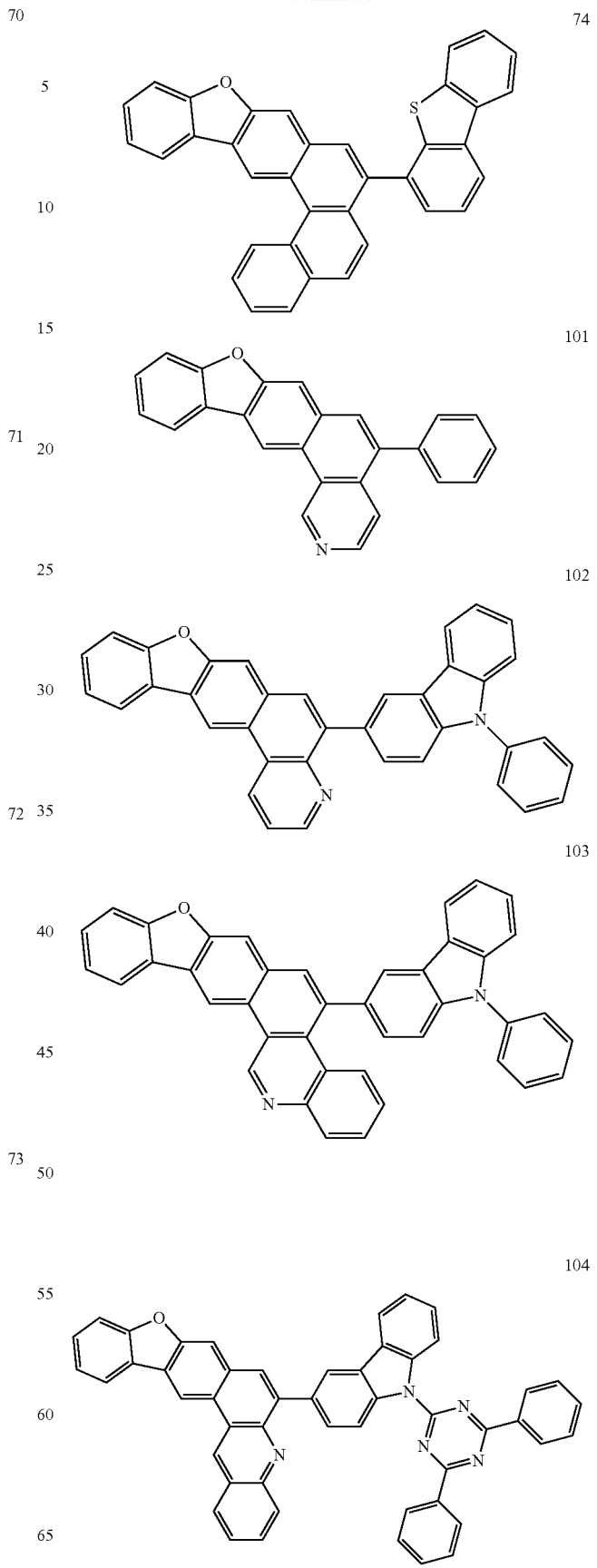

105
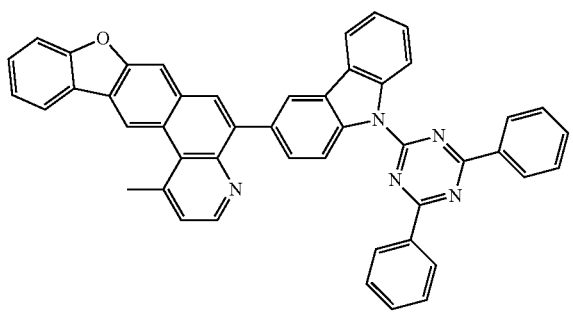
106
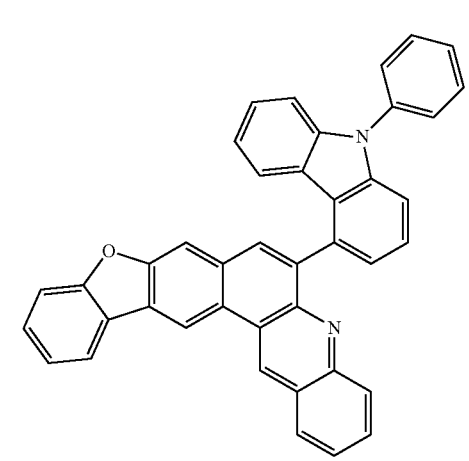
107
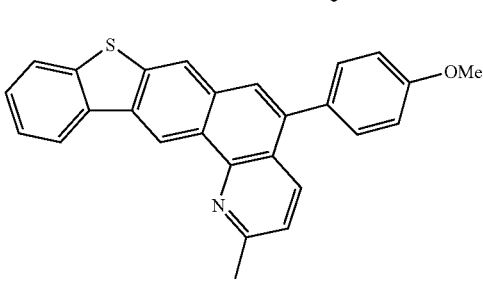
108
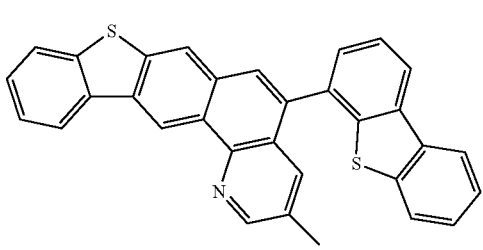
109
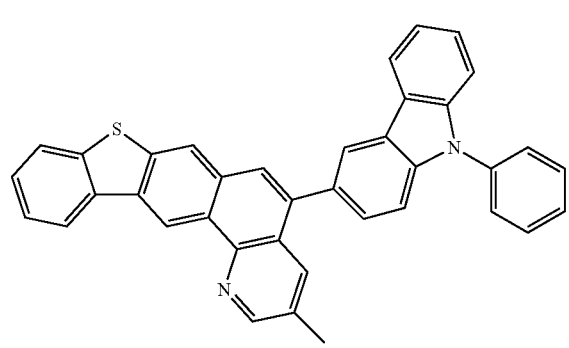
110
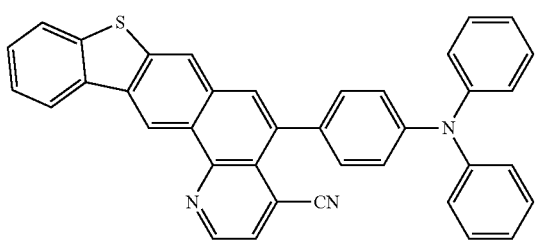
111
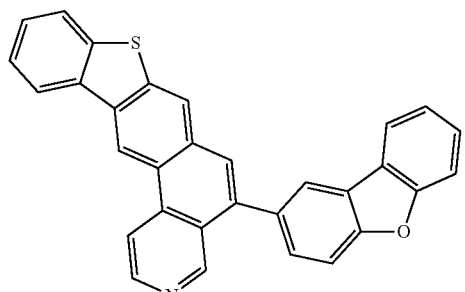
112
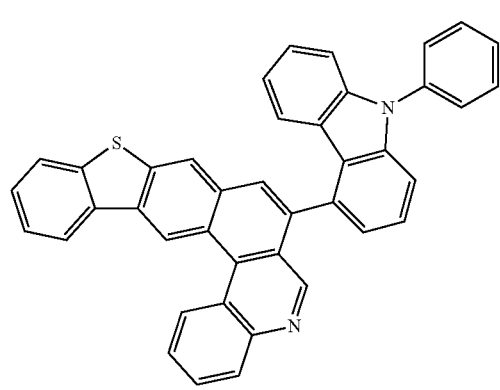
113
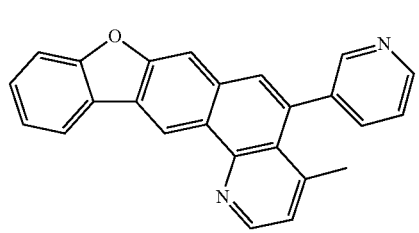
114
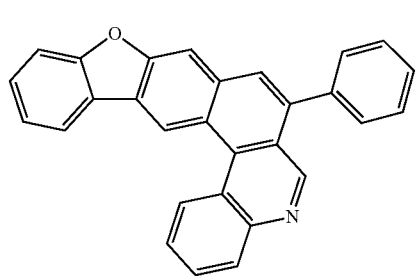

115
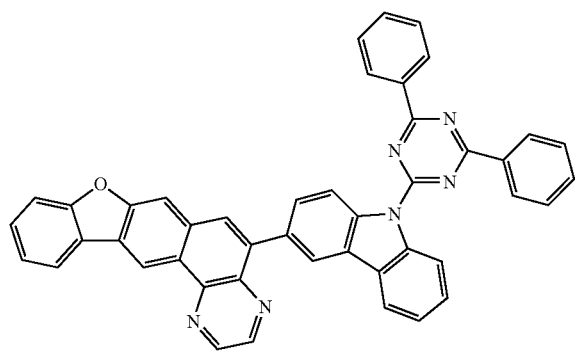
116
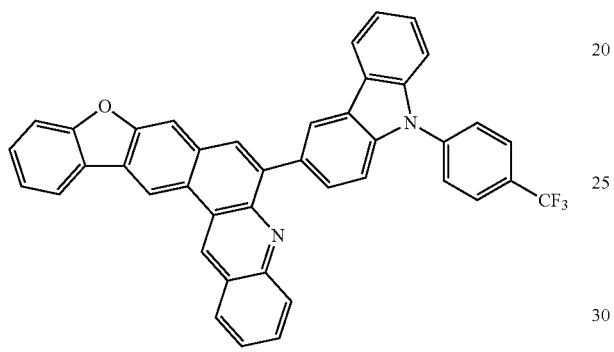
117
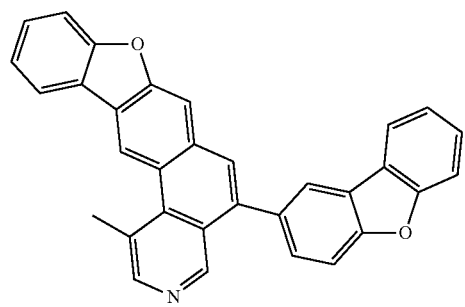
118
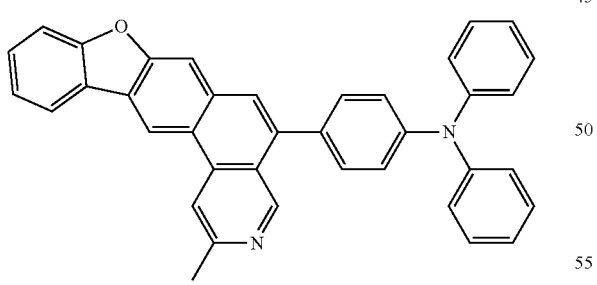
119
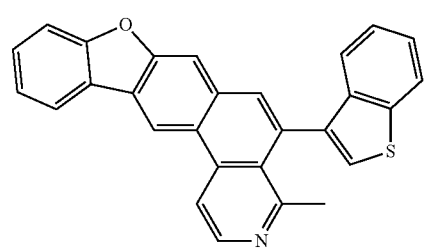
120
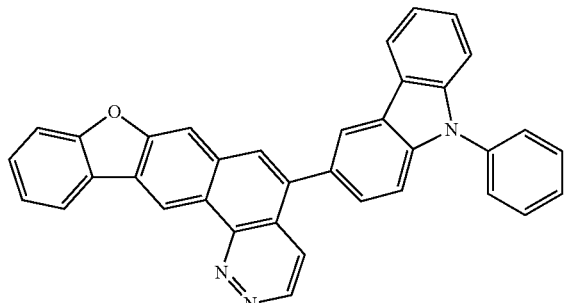
121
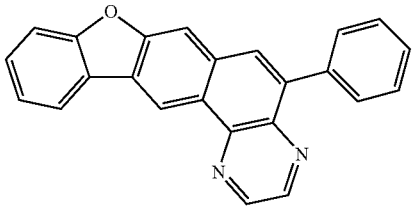
122
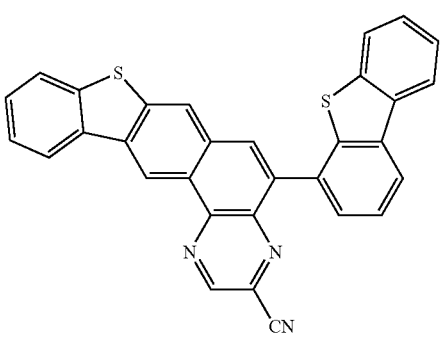
123
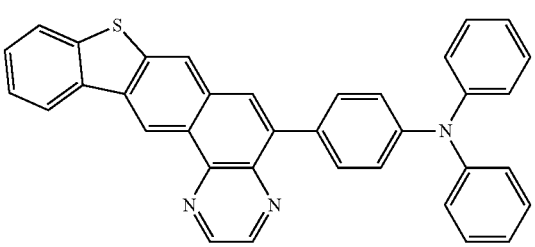
124
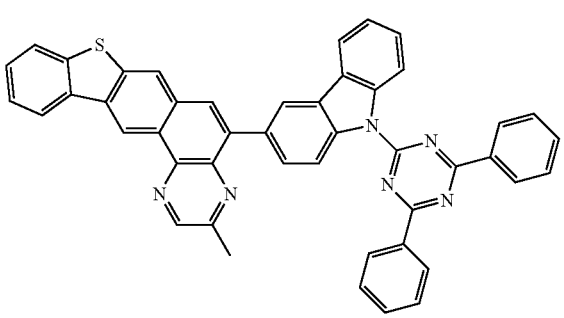

125
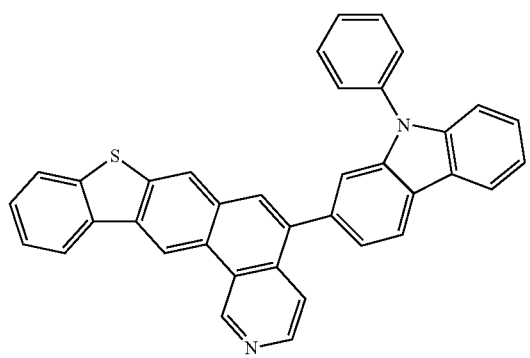
126
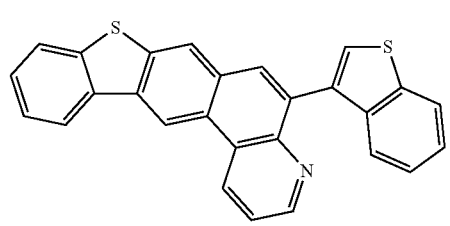
127
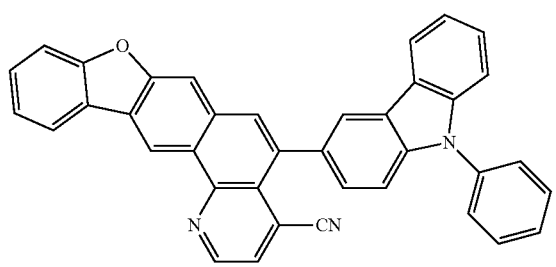
128
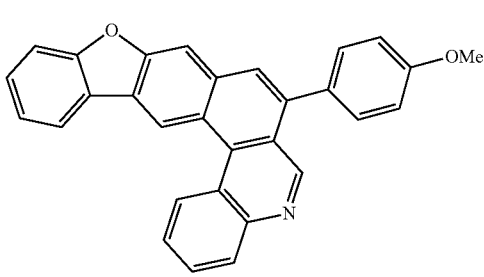
129
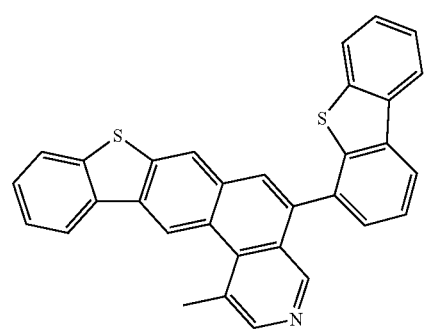
130
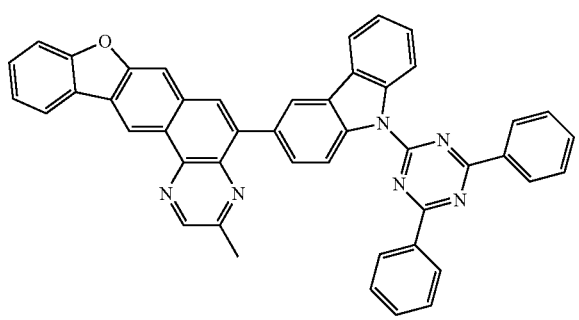
131
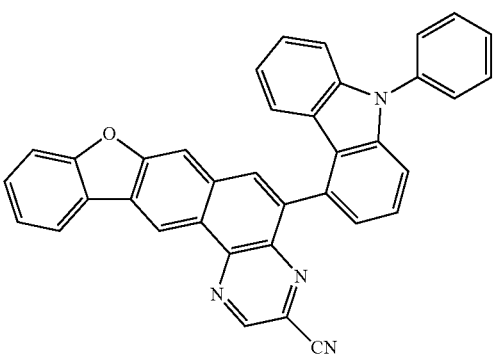
132
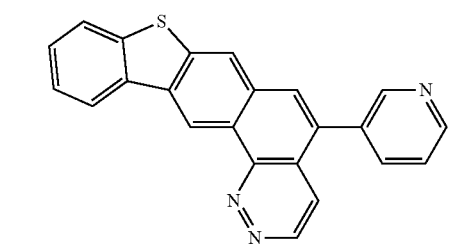
133
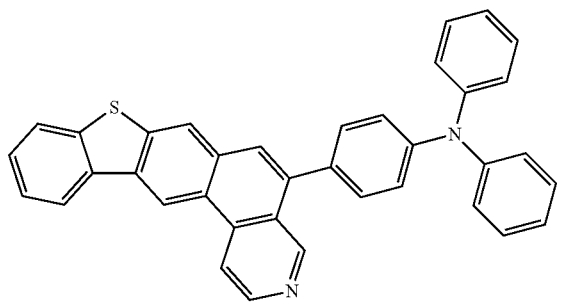

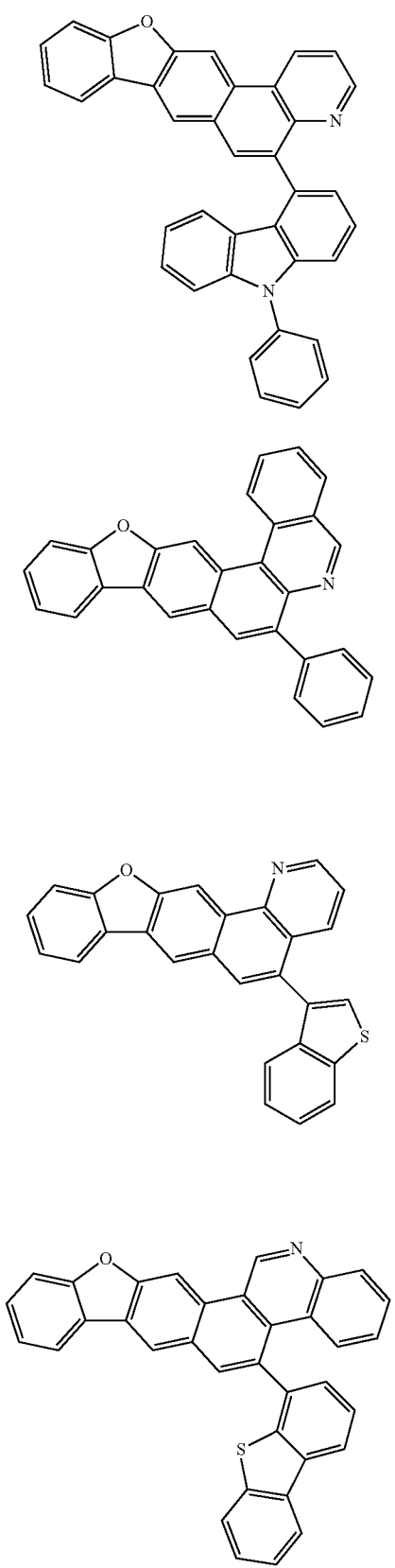
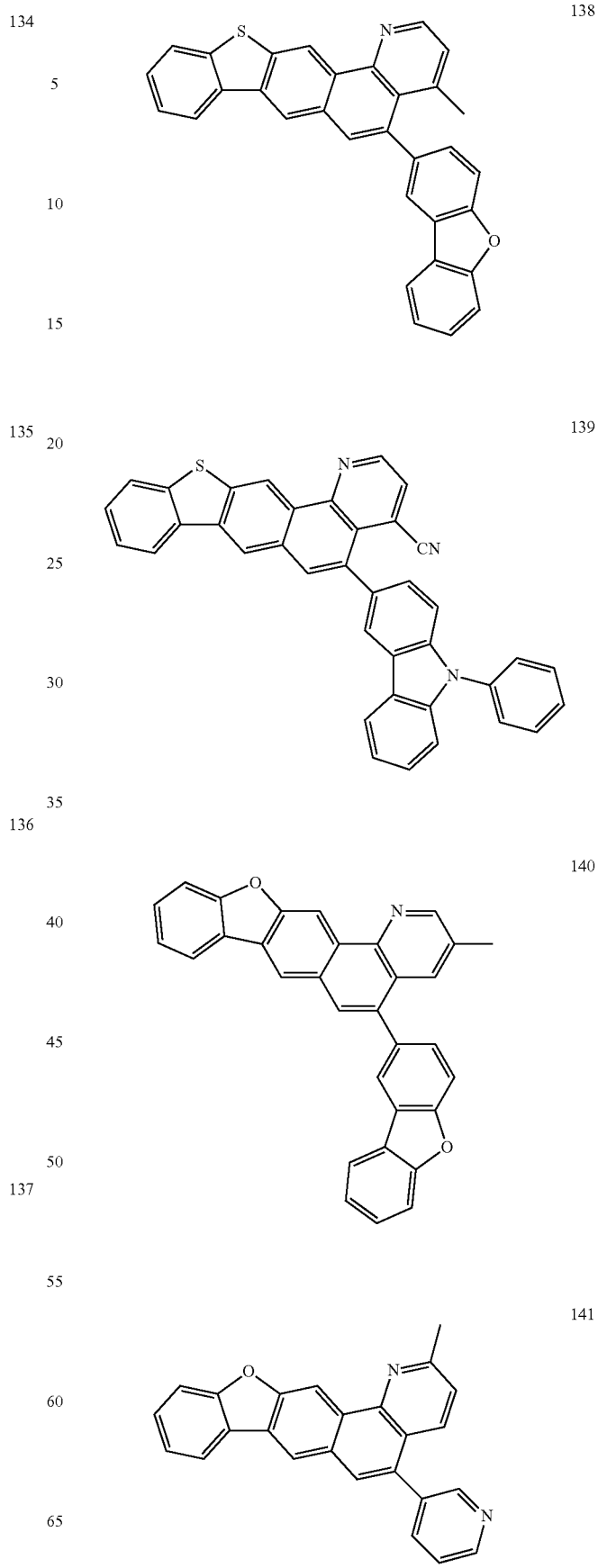

142
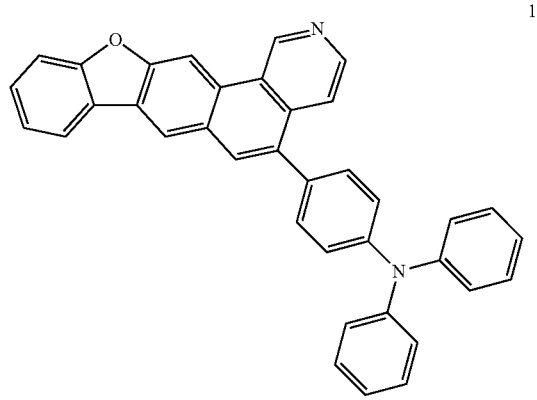
143
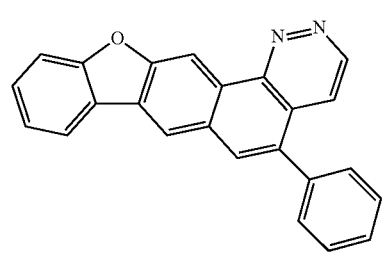
144
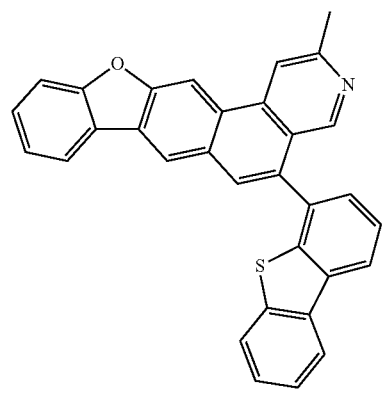
145
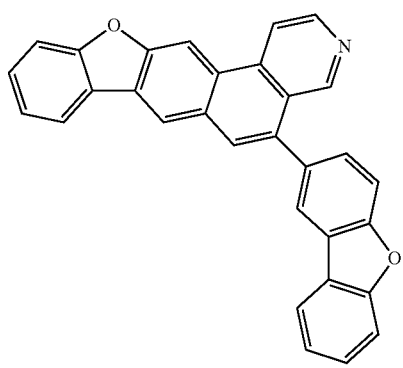
146
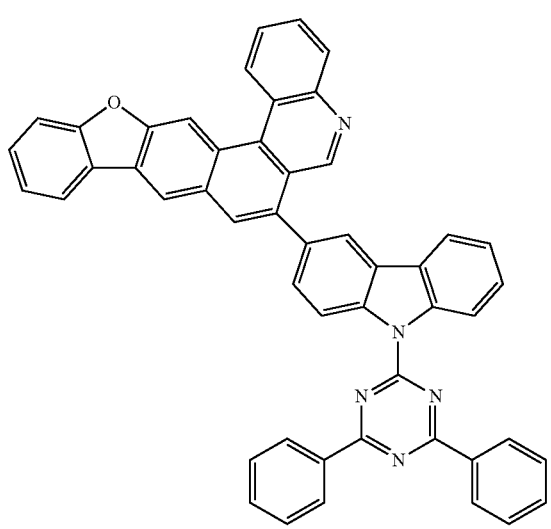
147
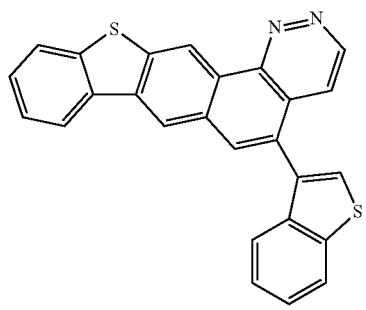
148
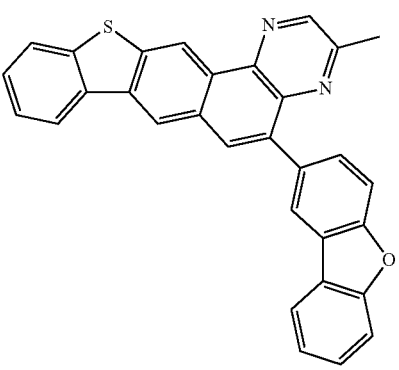
149
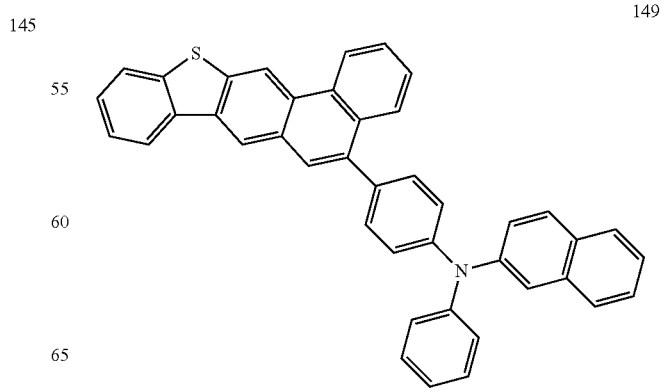

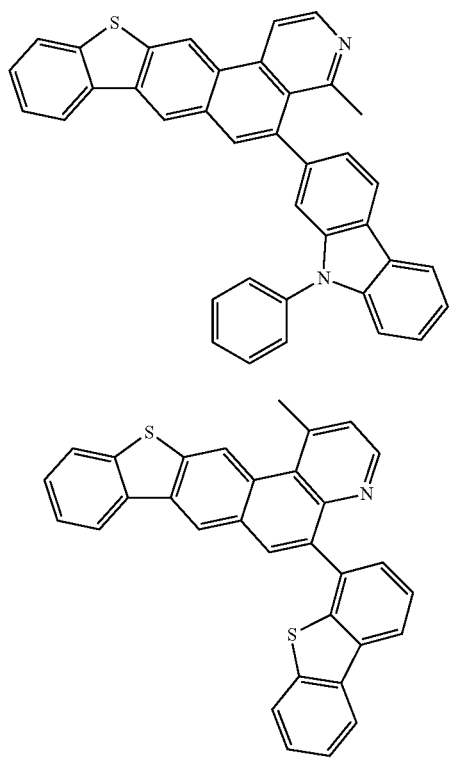
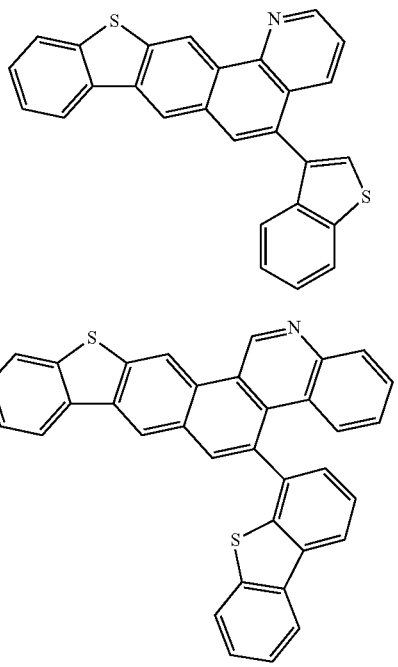
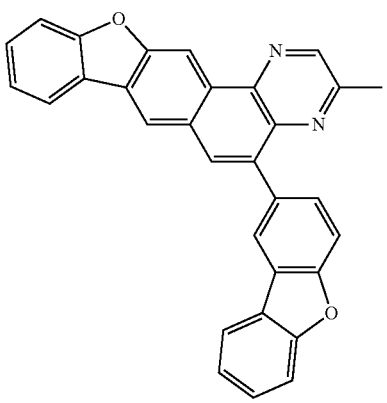

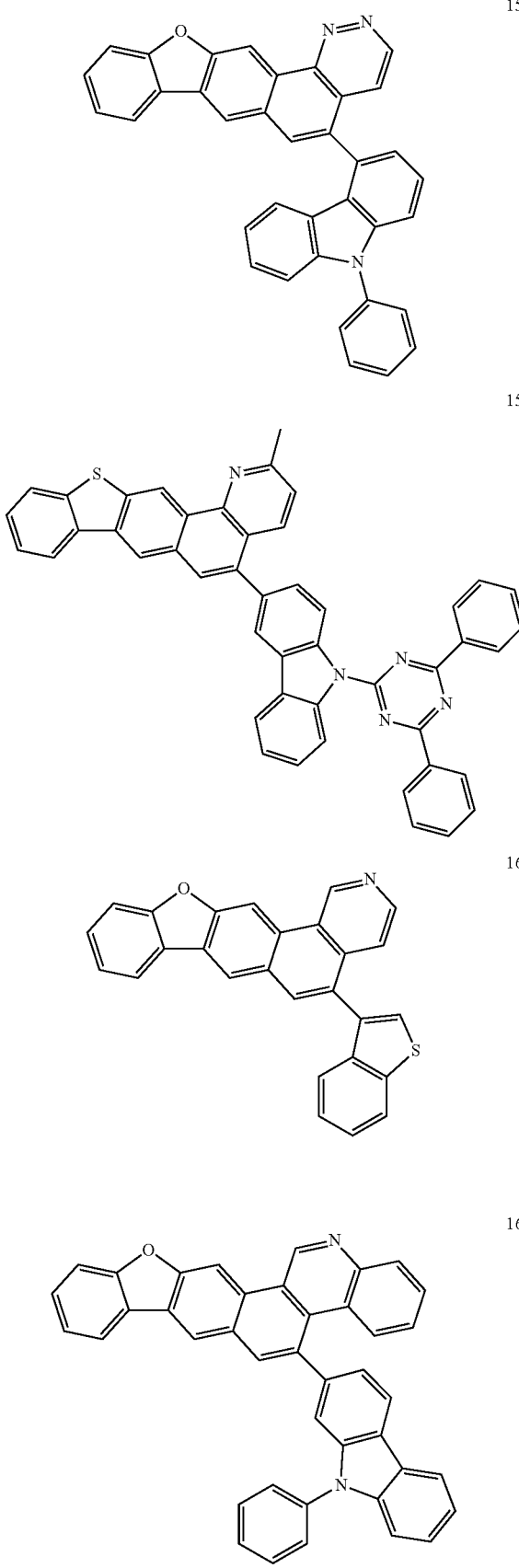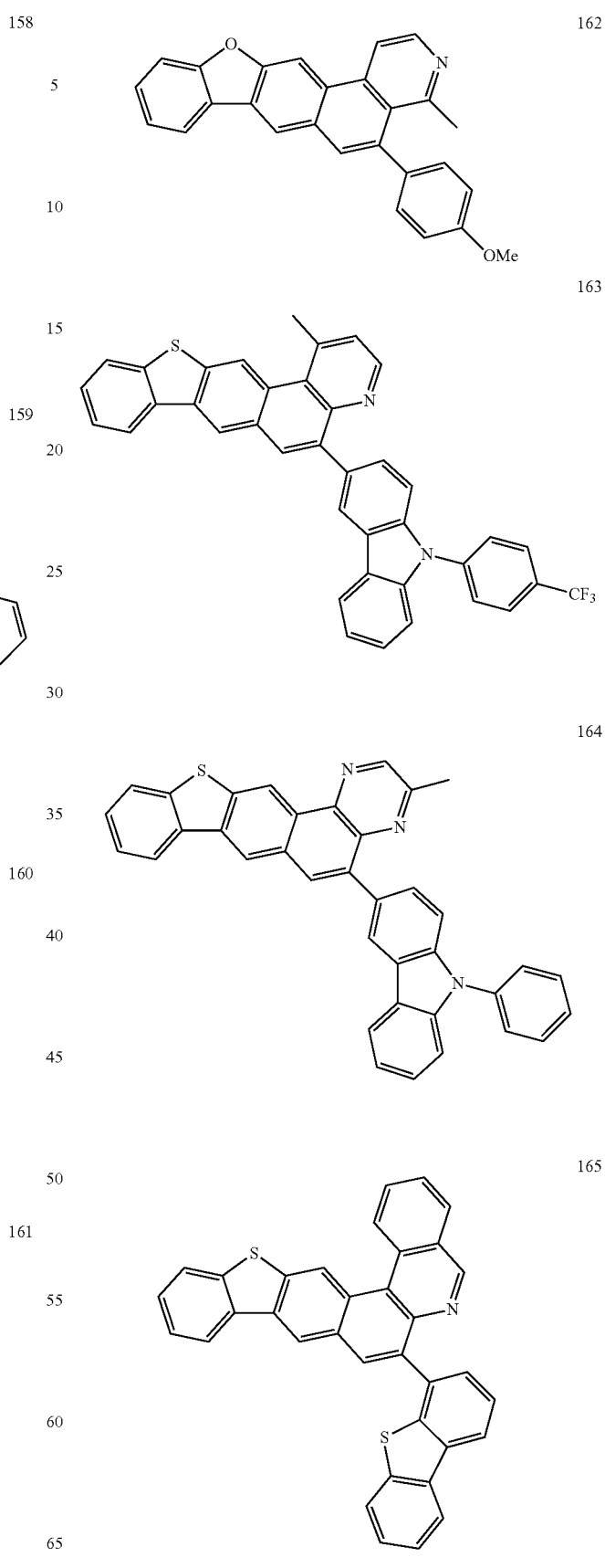

-continued

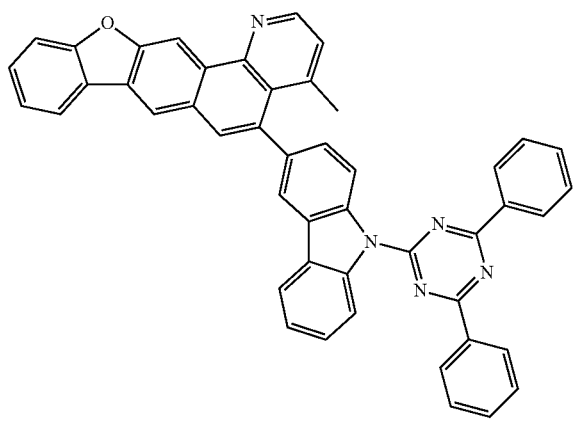
166

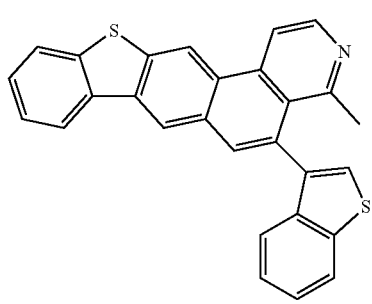
167

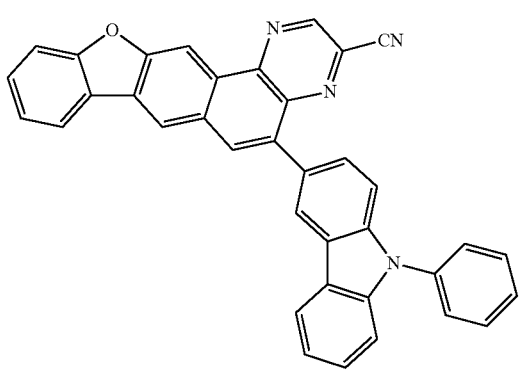
168

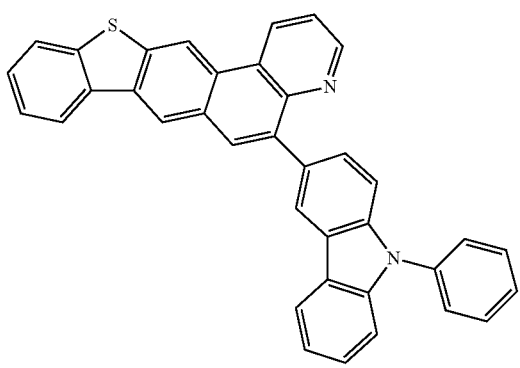
169

-continued

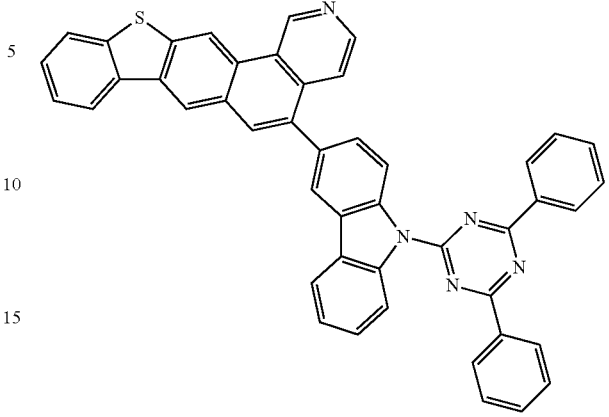
170

In Formula 1, at least one substituent of the substituted $C_3$-$C_{60}$ cyclic moiety, the substituted $C_2$-$C_{60}$ heterocyclic moiety, the substituted $C_3$-$C_{10}$ cycloalkylene group, the substituted $C_2$-$C_{10}$ heterocycloalkylene group, the substituted $C_3$-$C_{10}$ cycloalkenylene group, the substituted $C_2$-$C_{10}$ heterocycloalkenylene group, the substituted $C_6$-$C_{60}$ arylene group, the substituted $C_2$-$C_{60}$ heteroarylene group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_2$-$C_{60}$ heteroaryl group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_6$-$C_{60}$ aryloxy group, and the substituted $C_6$-$C_{60}$ arylthio group may be selected from among deuterium, a halogen atom, a hydroxyl group, a cyano group, a nitro group, an amino group, an amidino groups, hydrazine, hydrazone, a carboxylic group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group; a $C_1$-$C_{60}$ alkyl group, a $C_2$-$C_{60}$ alkenyl group, a $C_2$-$C_{60}$ alkynyl group, and a $C_1$-$C_{60}$ alkoxy group; a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group that may be substituted with at least one of deuterium, a halogen atom, a hydroxyl group, a cyano group, a nitro group, an amino group, an amidino groups, hydrazine, hydrazone, a carboxylic group or a salt thereof, a sulfonic acid group or a salt thereof, and a phosphoric acid group or a salt thereof; a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group that may be substituted with at least one of deuterium, a halogen atom, a hydroxyl group, a cyano group, a nitro group, an amino group, an amidino groups, hydrazine, hydrazone, a carboxylic group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and $-N(Q_{11})(Q_{12})$; and $-Si(Q_{13})(Q_{14})(Q_{15})$ (where $Q_{11}$ and $Q_{12}$ may be each independently a $C_6$-$C_{60}$ aryl group, or a $C_2$-$C_{60}$ heteroaryl group; and $Q_{13}$ to $Q_{15}$ may be each independently a $C_1$-$C_{60}$ alkyl group, a $C_1$-$C_{60}$ alkoxy group, a $C_6$-$C_{60}$ aryl group, or a $C_2$-$C_{60}$ heteroaryl group), but is not limited thereto.

Therefore, an organic light-emitting device including the heterocyclic compound of Formula 1 above may have a low driving voltage, a high efficiency, a high luminance, a high color purity, and a long lifetime.

The heterocyclic compound of Formula 1 may be synthesized by using organic synthesis. A synthesis method of the heterocyclic compound of Formula 1 may be understood by those of ordinary skill in the art from the examples that will be described below.

The heterocyclic compound of Formula 1 may be used between a pair of electrodes of an organic light-emitting device. For example, the heterocyclic compound may be used in at least one of a hole injection layer, a hole transport layer, and a functional layer having both hole injection and hole transporting capabilities, and/or an emission layer of an organic light-emitting device.

According to another aspect of the present invention, an organic light-emitting device may include a first electrode, a second electrode disposed opposite to the first electrode, and an organic layer disposed between the first electrode and the second electrode, wherein the organic layer includes at least one of the heterocyclic compounds of Formula 1 described above.

The organic layer may include: i) at least one layer of a hole injection layer, a hole transport layer, a functional layer having both hole injection and hole transport capabilities (hereinafter, "H-functional layer"), a buffer layer, an electron blocking layer between the first electrode and the emission layer; and ii) at least one layer of a hole blocking layer, an electron transport layer, and an electron injection layer between the emission layer and the second electrode.

As used herein, "(for example, the organic layer) including at least one heterocyclic compound" means that "(the organic layer) including one of the heterocyclic compounds of Formula 1 above, or at least two different heterocyclic compounds of Formula 1 above".

For example, the organic layer may include only Compound 8 above as the heterocyclic compound. Compound 8 may be only in an emission layer of the organic light-emitting device. In some embodiment of the present invention, the organic layer may include Compounds 8 and 35 as the heterocyclic compounds. Compounds 8 and 35 may be in the same layer (for example, both in the emission layer) or in different layers (for example, in the emission layer and in the hole transport layer, respectively).

The term "organic layer" as used herein refers to a single layer and/or a plurality of layers disposed between the first and second electrodes of the organic light-emitting device.

The organic layer of the organic light-emitting device may include a hole transport layer disposed between the first electrode and the emission layer, wherein the heterocyclic compound may be in the hole transport layer. Since the heterocyclic compound is described in detail above, detailed descriptions of the heterocyclic compound will not be repeated here. For example, the heterocyclic compound in the hole transport layer may be a compound represented by Formula 1A-HTL1 or 1B-HTL1 above.

In some embodiments of the present invention, the heterocyclic compound may be in the emission layer of the organic layer in the organic light-emitting device. Since the heterocyclic compound is described in detail above, detailed descriptions of the heterocyclic compound will not be repeated here. For example, the heterocyclic compound in the emission layer may serve as a host, and the emission layer may further include a dopant. The heterocyclic compound in the emission layer may be a compound represented by Formula 1A-H1, 1A-H2, 1A-H3, 1B-H1, 1B-H2, or 1B-H3. The dopant in the emission layer may include an organometallic compound including at least one of iridium (Ir), platinum (Pt), osmium (Os), titanium (Ti), zirconium (Zr), hafnium (Hf), europium (Eu), terbium (Tb), and thulium (Tm).

The FIGURE is a schematic sectional view of an organic light-emitting device 10 according to an embodiment of the present invention. Hereinafter, a structure of an organic light-emitting device 10 according to an embodiment of the present invention and a method of manufacturing the same will now be described with reference to the FIGURE.

The organic light-emitting device 10 sequentially includes a substrate 11, a first electrode 13, an organic layer 15, and a second electrode 17 in this stated order.

The substrate 11 may be any substrate that is used in existing organic light-emitting devices. In some embodiments, the substrate 11 may be a glass substrate or a transparent plastic substrate with strong mechanical strength, thermal stability, transparency, surface smoothness, ease of handling, and water resistance.

The first electrode 13 may be formed by depositing or sputtering a first electrode-forming material on the substrate 11. When the first electrode 13 constitutes an anode, a material having a high work function may be used as the first electrode-forming material to facilitate hole injection. The first electrode 13 may be a reflective electrode or a transmission electrode. Transparent and conductive materials such as ITO, IZO, $SnO_2$, and ZnO may be used to form the first electrode 13. The first electrode 13 may be formed as a reflective electrode using magnesium (Mg), aluminum (Al), aluminum-lithium (Al—Li), calcium (Ca), magnesium-indium (Mg—In), magnesium-silver (Mg—Ag), or the like.

The first electrode 13 may have a single-layer structure or a multi-layer structure including at least two layers. For example, the first electrode 13 may have a three-layered structure of ITO/Ag/ITO, but is not limited thereto.

The organic layer 15 may be disposed on the first electrode 13.

The organic layer 15 may include a hole injection layer (HIL), a hole transport layer (HTL), a buffer layer, an emission layer (EML), an electron transport layer (ETL), and an electron injection layer (EIL).

The HIL may be formed on the first electrode 13 by vacuum deposition, spin coating, casting, Langmuir-Blodgett (LB) deposition, or the like.

When the HIL is formed using vacuum deposition, vacuum deposition conditions may vary according to the compound that is used to form the HIL, and the desired structure and thermal properties of the HIL to be formed. For example, vacuum deposition may be performed at a temperature of about 100° C. to about 500° C., a pressure of about $10^{-8}$ torr to about $10^{-3}$ torr, and a deposition rate of about 0.01 to about 100 Å/sec. However, the deposition conditions are not limited thereto.

When the HIL is formed using spin coating, the coating conditions may vary according to the compound that is used to form the HIL, and the desired structure and thermal properties of the HIL to be formed. For example, the coating rate may be in the range of about 2000 rpm to about 5000 rpm, and a temperature at which heat treatment is performed to remove a solvent after coating may be in the range of about 80° C. to about 200° C. However, the coating conditions are not limited thereto.

The HIL may be formed of any material that is commonly used to form a HIL. Non-limiting examples of the material that can be used to form the HIL are N,N'-diphenyl-N,N'-bis-[4-(phenyl-m-tolyl-amino)-phenyl]-biphenyl-4,4'-diamine, (DNTPD), a phthalocyanine compound such as copperphthalocyanine, 4,4',4"-tris(3-methylphenylphenylamino) triphenylamine (m-MTDATA), N,N'-di(1-naphthyl)-N,N'-diphenylbenzidine (NPB), TDATA, 2-TNATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline)/poly(4-styrenesulfonate (PANI/PSS).

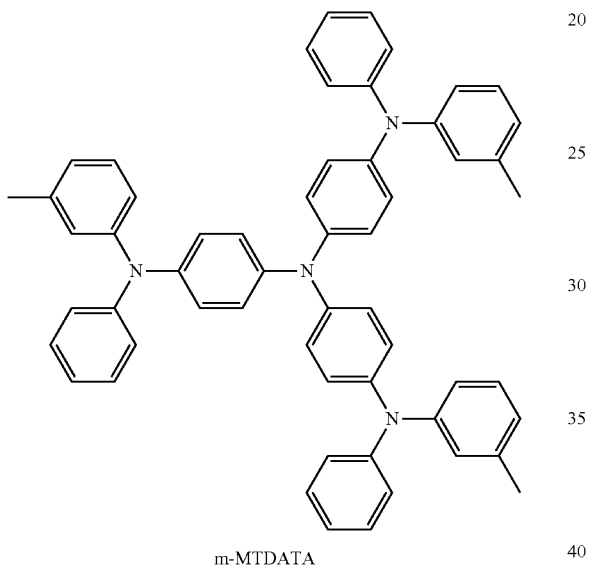

m-MTDATA

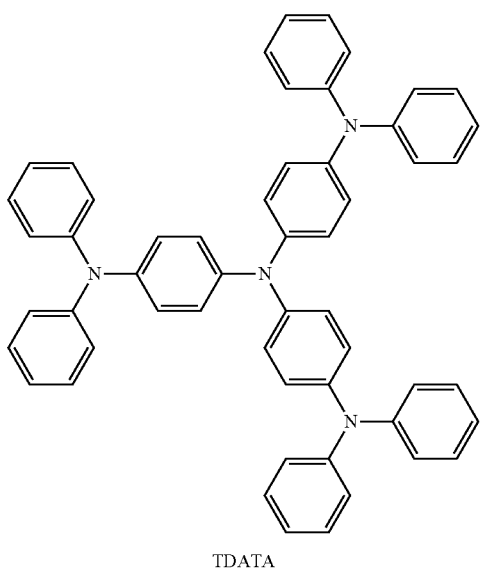

TDATA

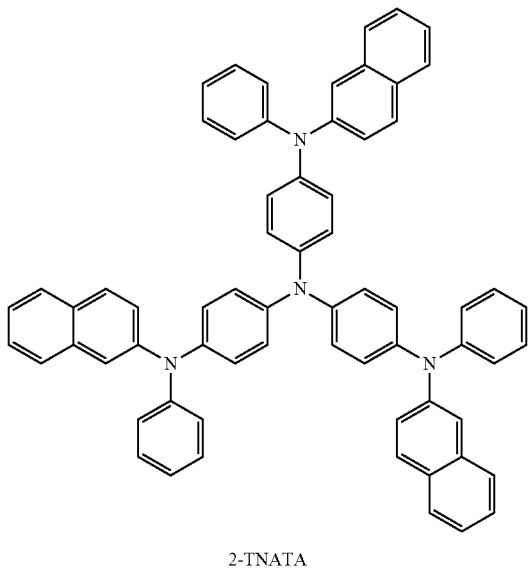

2-TNATA

For example, the HIL may include the heterocyclic compound of Formula 1 above, but is not limited thereto.

The thickness of the HIL may be about 100 Å to about 10000 Å, and in some embodiments, may be from about 100 Å to about 1000 Å. When the thickness of the HIL is within these ranges, the HIL may have good hole injecting ability without a substantial increase in driving voltage.

Then, a HTL may be formed on the HIL by using vacuum deposition, spin coating, casting, Langmuir-Blodgett (LB) deposition, or the like. When the HTL is formed using vacuum deposition or spin coating, the conditions for deposition and coating may be similar to those for the formation of the HIL, though the conditions for the deposition and coating may vary according to the material that is used to form the HTL.

Non-limiting examples of suitable known HTL forming materials are carbazole derivatives, such as N-phenylcarbazole or polyvinylcarbazole, N,N-bis(3-methylphenyl)-N,N-diphenyl-[1,1-biphenyl]-4,4'-diamine (TPD), 4,4',4"-tris(N-carbazolyl)triphenylamine (TCTA), and N,N'-di(1-naphthyl)-N,N'-diphenylbenzidine) (NPB).

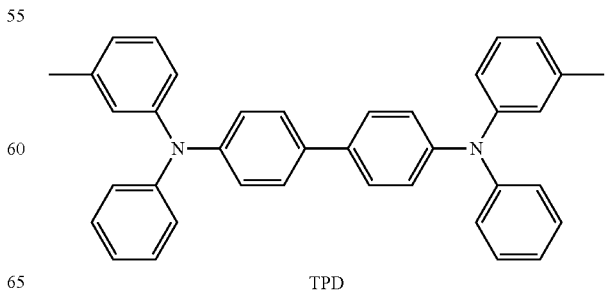

TPD

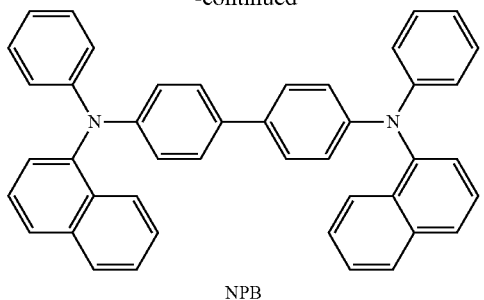

NPB

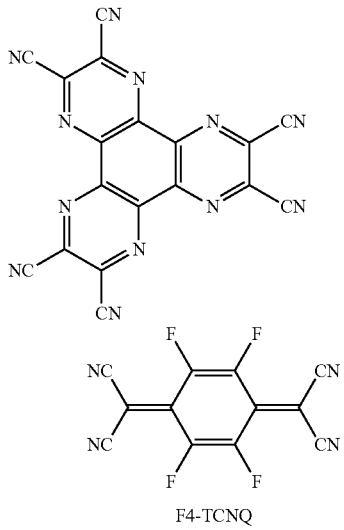

Compound 200

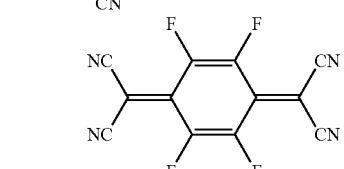

F4-TCNQ

For example, the HTL may include the heterocyclic compound of Formula 1 above, but is not limited thereto. For example, the HTL may include the heterocyclic compound represented by Formula 1A-HTL1 or 1B-HTL2 above.

The thickness of the HTL may be from about 50 Å to about 2000 Å, and in some embodiments, may be from about 100 Å to about 1500 Å. When the thickness of the HTL is within these ranges, the HTL may have good hole transporting ability without a substantial increase in driving voltage.

The H-functional layer (having both hole injection and hole transport capabilities) may contain at least one material from each group of the hole injection layer materials and hole transport layer materials. The thickness of the H-functional layer may be from about 500 Å to about 10,000 Å, and in some embodiments, may be from about 100 Å to about 1,000 Å. When the thickness of the H-functional layer is within these ranges, the H-functional layer may have good hole injection and transport capabilities without a substantial increase in driving voltage.

For example, the H-functional layer may include the heterocyclic compound of Formula 1 above, but is not limited thereto. For example, the H-functional layer may include the heterocyclic compound of Formula 1A-HTL1 or 1B-HTL2 above.

At least one of the HIL, HTL, and H-functional layer may further include a charge-generating material for improved layer conductivity, in addition to a known hole injecting material, hole transport material, and/or material having both hole injection and hole transport capabilities as described above.

The charge-generating material may be, for example, a p-dopant. The p-dopant may be one of quinine derivatives, metal oxides, and compounds with a cyano group, but are not limited thereto. Non-limiting examples of the p-dopant are quinone derivatives such as tetracyanoquinonedimethane (TCNQ), 2,3,5,6-tetrafluoro-tetracyano-1,4-benzoquinonedimethane (F4-TCNQ), and the like: Metal oxides such as tungsten oxide, molybdenum oxide, and the like; and cyano-containing compounds such as Compound 200 below.

When the hole injection layer, hole transport layer, or H-functional layer further includes a charge-generating material, the charge-generating material may be homogeneously dispersed or inhomogeneously distributed in the layer.

A buffer layer may be disposed between at least one of the HIL, HTL, and H-functional layer. The buffer layer may compensate for an optical resonance distance of light according to a wavelength of the light emitted from the EML, and thus may increase efficiency. The butter layer may include any hole injecting material or hole transporting material that are widely known. In some other embodiments, the buffer layer may include the same material as one of the materials included in the HIL, HTL, and H-functional layer that underlie the buffer layer.

Then, an EML may be formed on the HTL, H-functional layer, or buffer layer by vacuum deposition, spin coating, casting, Langmuir-Blodget (LB) deposition, or the like. When the EML is formed using vacuum deposition or spin coating, the deposition and coating conditions may be similar to those for the formation of the HIL, though the conditions for deposition and coating may vary according to the material that is used to form the EML.

The EML may include a host, and a dopant, for example, the dopant may include a fluorescent dopant and/or a phosphorescent dopant. In some embodiments, the phosphorescent dopant may be an organic metal compound including at least one element of iridium (Ir), platinum (Pt), osmium (Os), titanium (Ti), zirconium (Zr), hafnium (Hf), europium (Eu), terbium (Tb) and thulium (Tm).

The host of the EML may be the heterocyclic compound of Formula 1 above. For example, the EML may include the heterocyclic compound represented by Formula 1A-H1, 1A-H2, 1A-H3, 1B-H1, 1B-H2, or 1B-H3.

When the organic light-emitting device is a full color organic light-emitting device, the emission layer (EML) may be patterned into a red emission layer, a green emission layer, and a blue emission layer. In some embodiments, the emission layer may include at least two of the red emission layer, the green emission layer and/or the blue emission layer that are stacked upon one another, and thus may emit white light, but is not limited thereto.

At least one of the red EML, the green EML, and the blue EML may include a dopant below (ppy=phenylpyridine).
Non-limiting examples of the blue dopant are compounds represented by the following formulae.
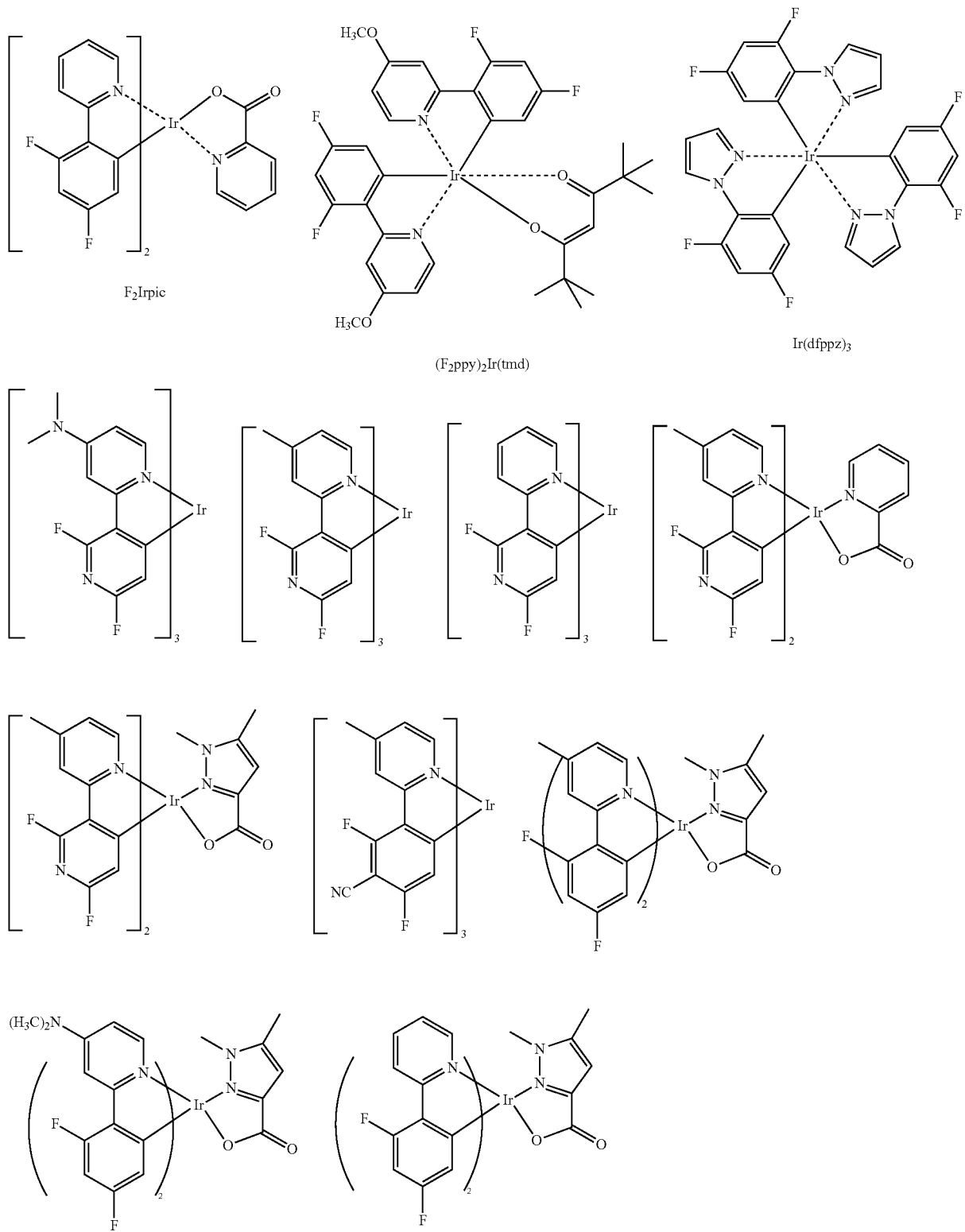

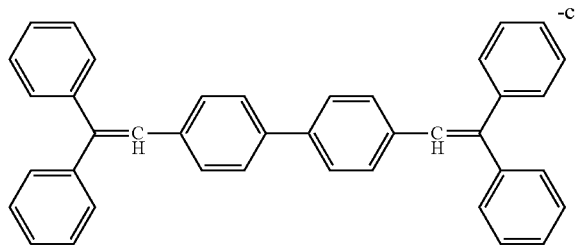
DPVBi
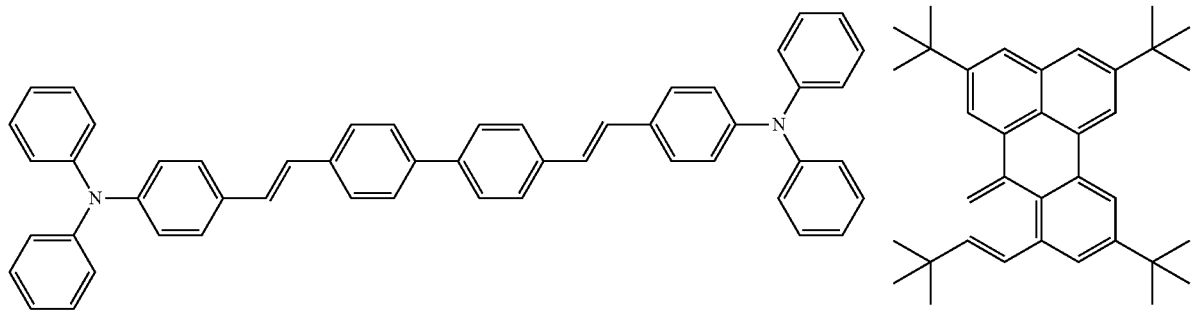
DPAVBi
TBPe
Non-limiting examples of the red dopant are compounds represented by the following formulae. In some embodiments, the red dopant may be DCM or DCJTB, which will be described later.
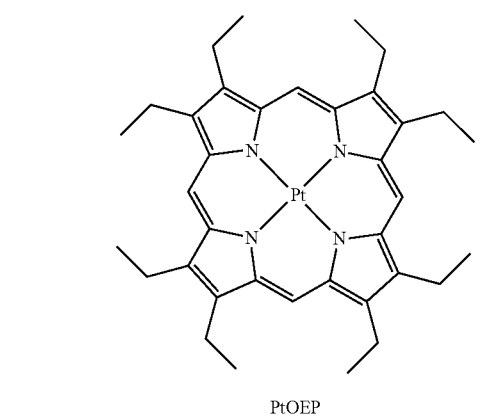
PtOEP
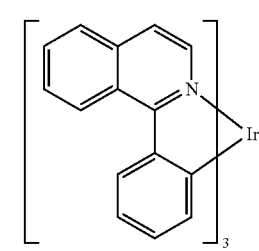
Ir(piq)₃
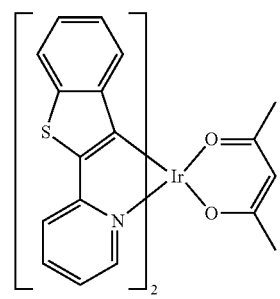
Btp₂Ir(acac)
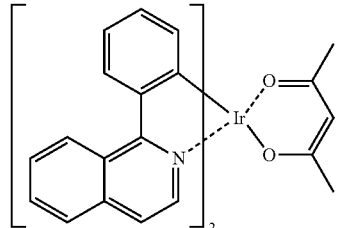
Ir(pq)₂(acac)
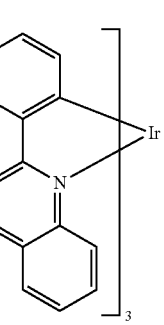
Ir(2-phq)₃
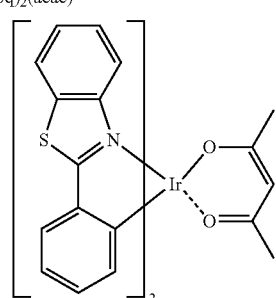
Ir(BT)₂(acac)

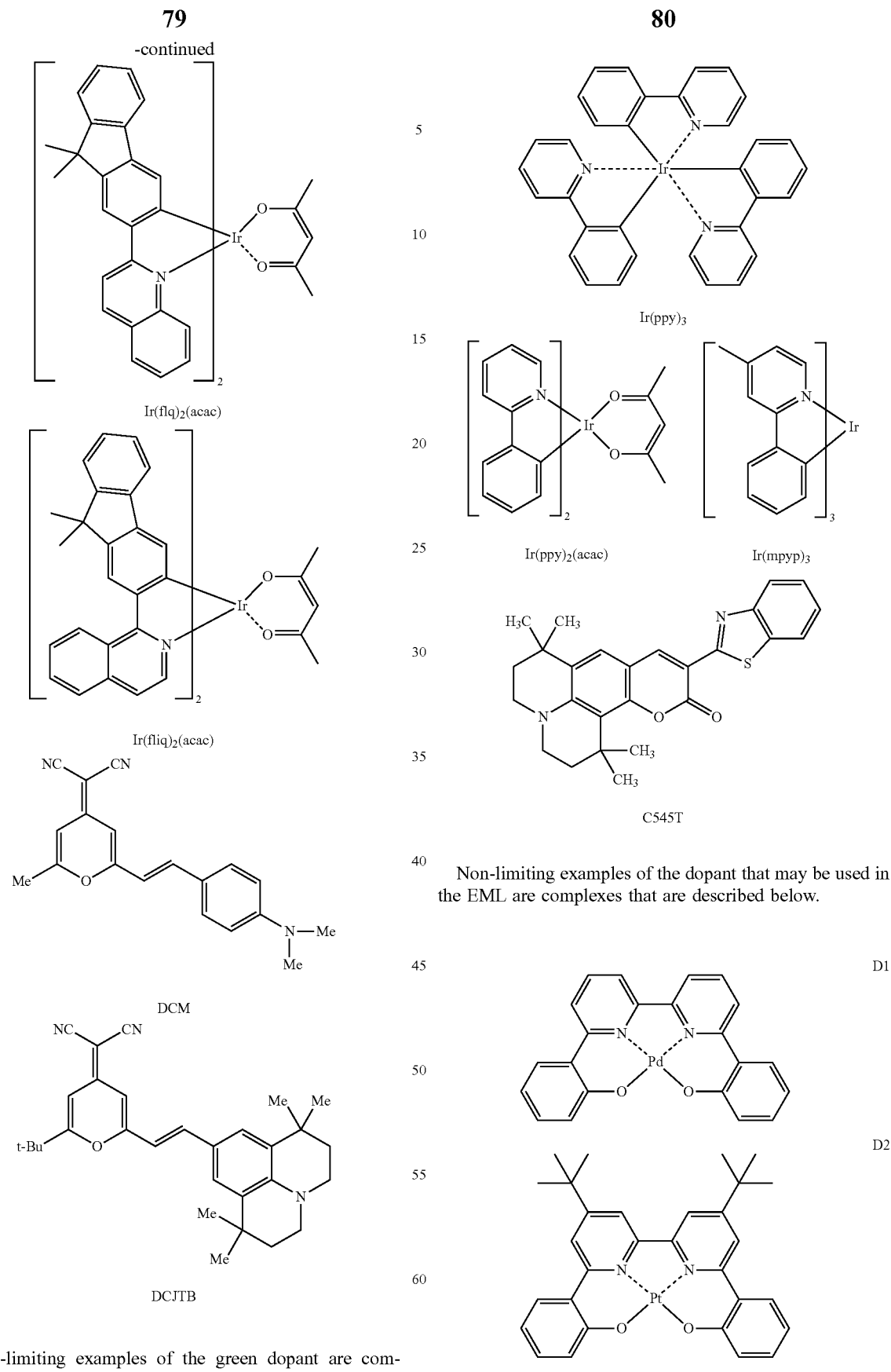
Non-limiting examples of the green dopant are compounds represented by the following formulae. In an embodiment, the green dopant may be C545T represented below.
Non-limiting examples of the dopant that may be used in the EML are complexes that are described below.

-continued
D3
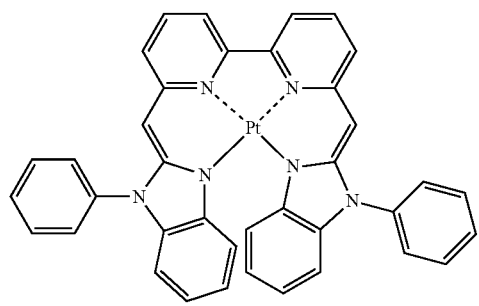
D4
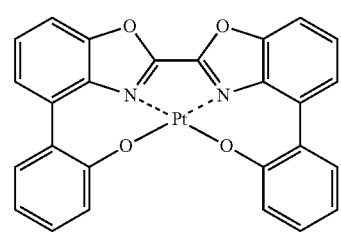
D5
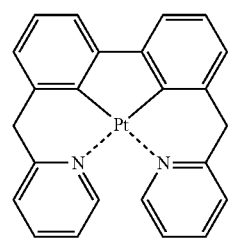
D6
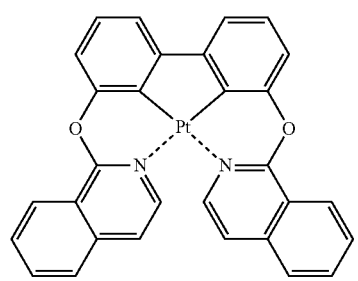
D7
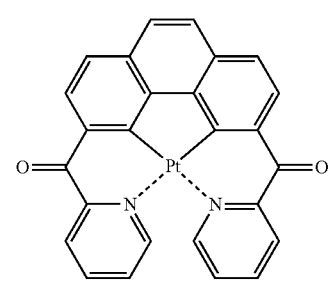
D8
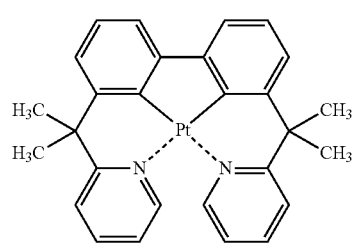
-continued
D9
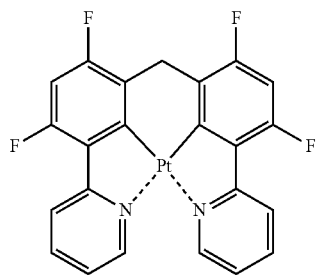
D10
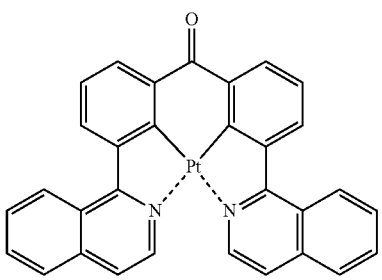
D11
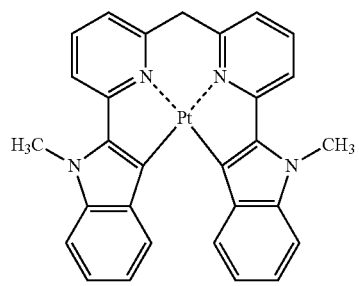
D12
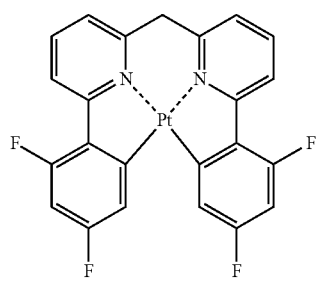
D13
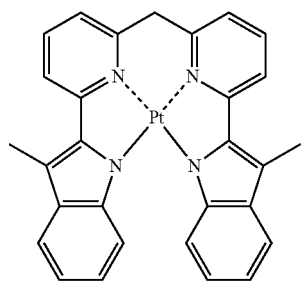

D14
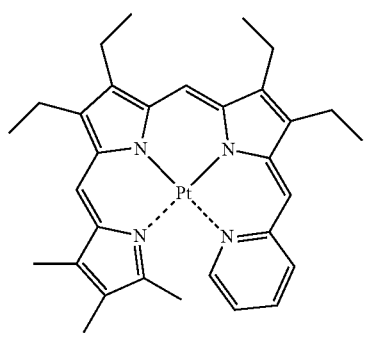
D15
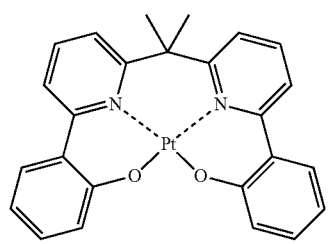
D16
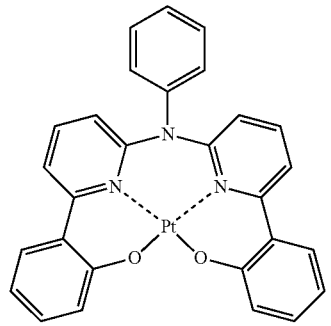
D17
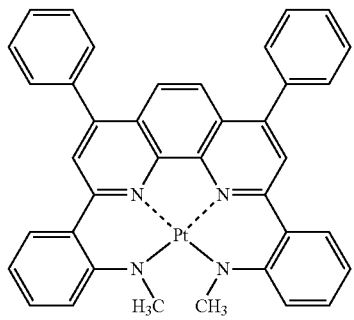
D18
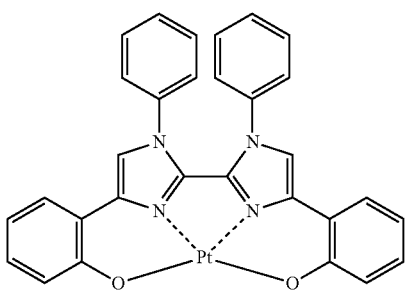
D19
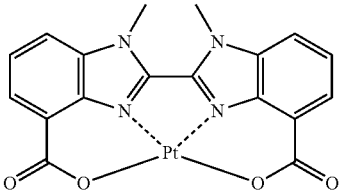
D20
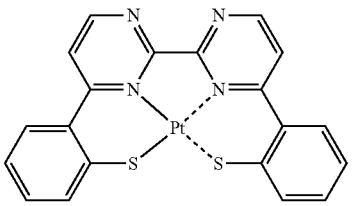
D21
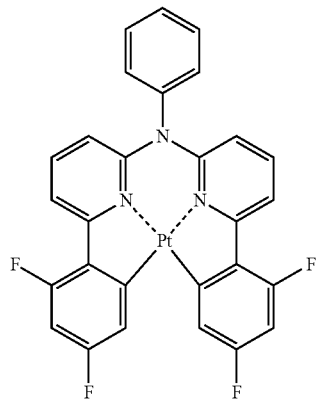
D22
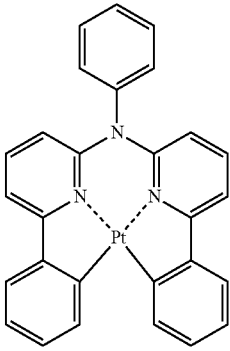
D23
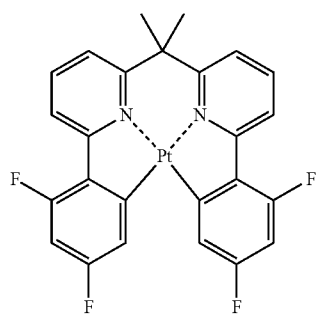

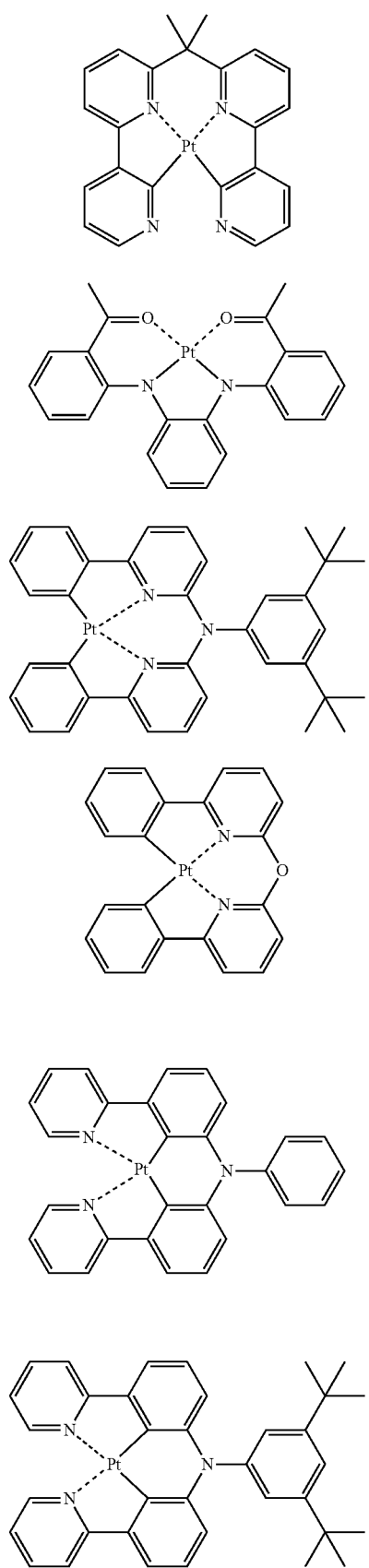
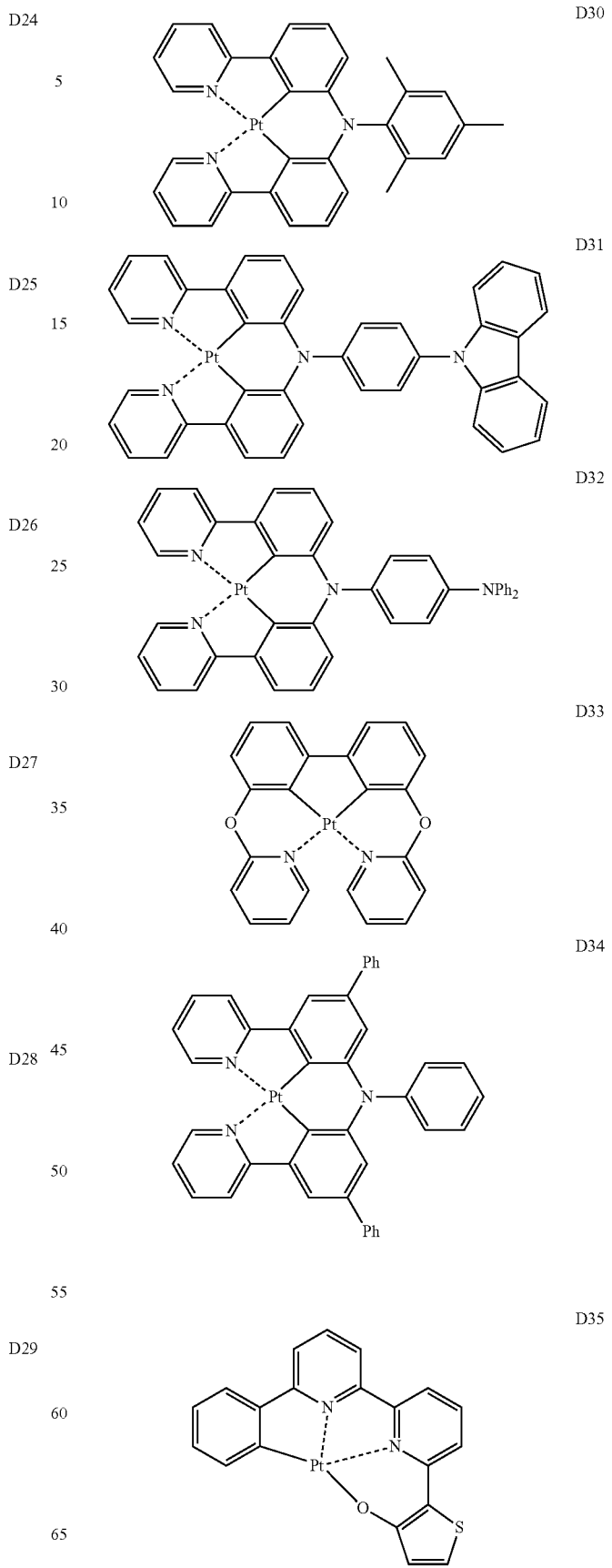

-continued
D36
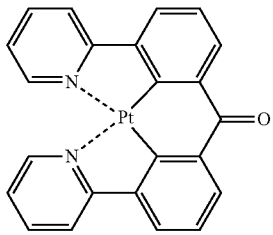
D37
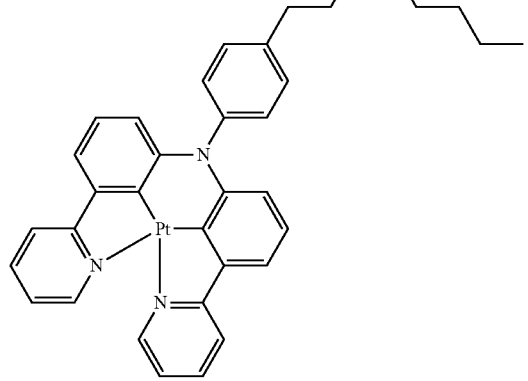
D38
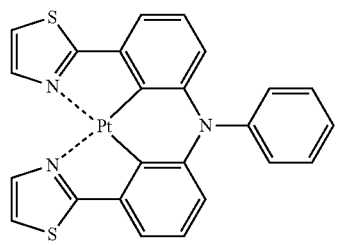
D39
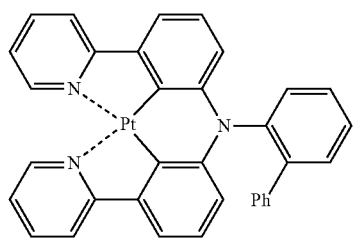
D40
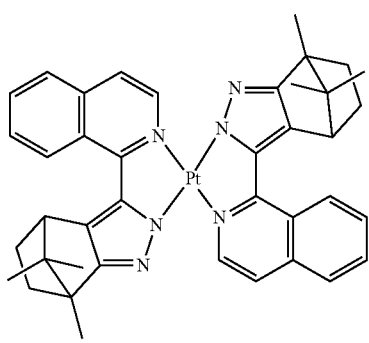
-continued
D41
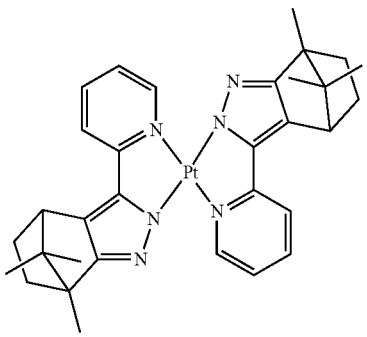
D42
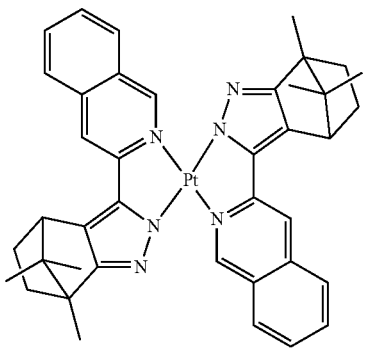
D43
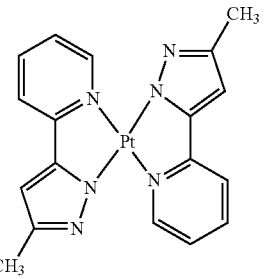
D44
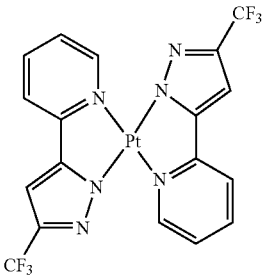
D45
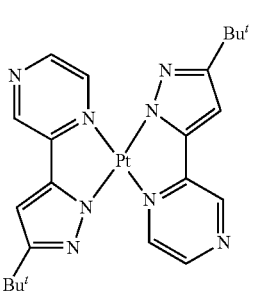

-continued
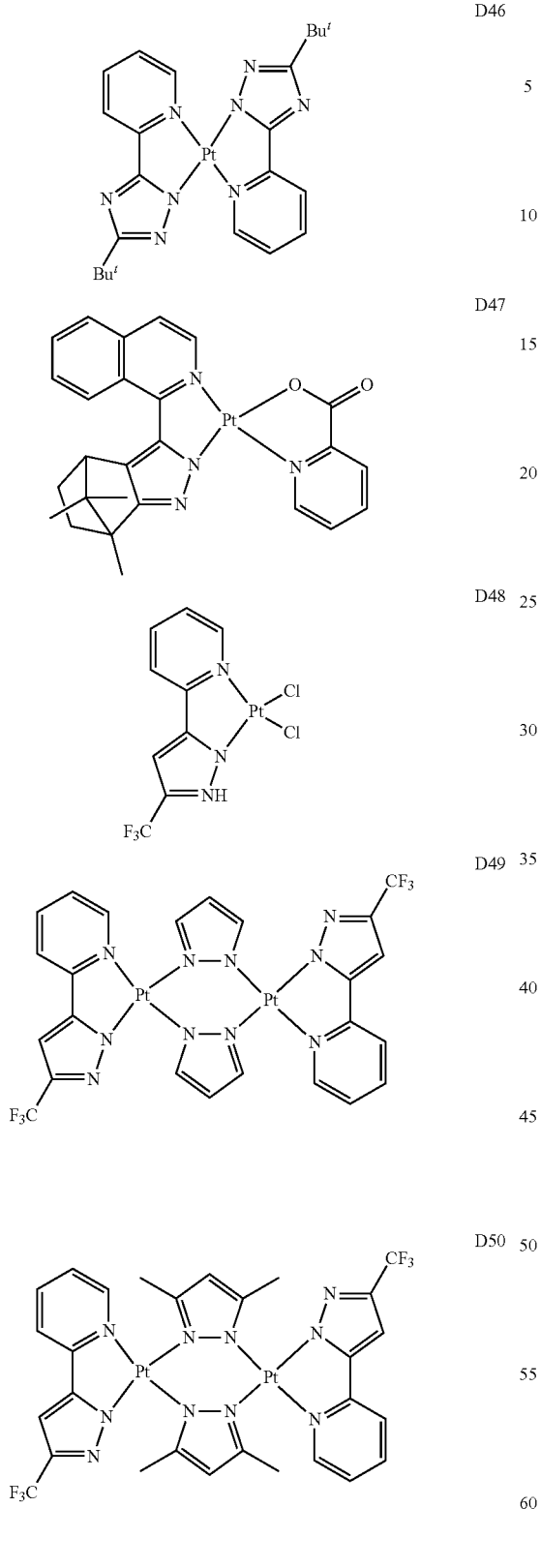
D46
D47
D48
D49
D50
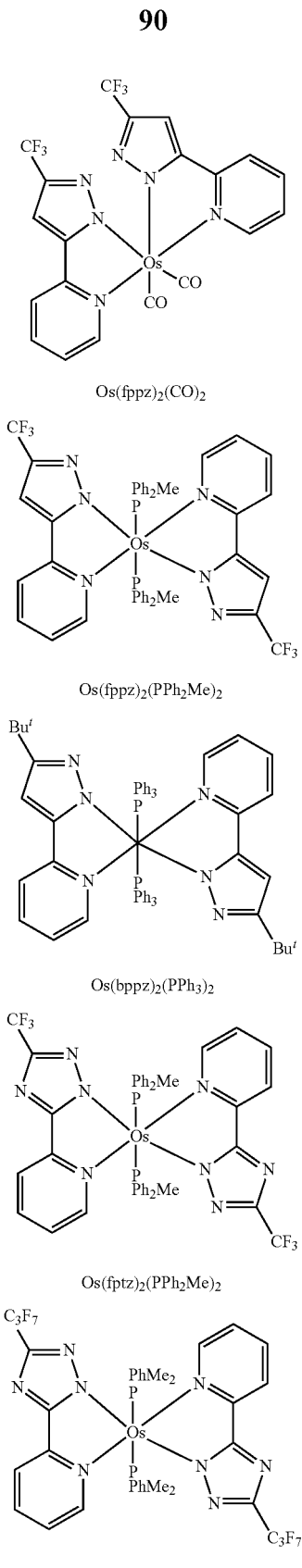
Os(fppz)$_2$(CO)$_2$
Os(fppz)$_2$(PPh$_2$Me)$_2$
Os(bppz)$_2$(PPh$_3$)$_2$
Os(fptz)$_2$(PPh$_2$Me)$_2$
Os(hptz)$_2$(PPhMe$_2$)$_2$
Non-limiting examples of the dopant that may be used in the EML are Os complexes represented by the following formulae.
When the EML includes both a host and a dopant, the amount of the dopant may be from about 0.01 to about 15 parts by weight based on 100 parts by weight of the host. However, the amount of the dopant is not limited to this range.

The thickness of the EML may be about 100 Å to about 1000 Å, and in some embodiments, may be from about 200 Å to about 600 Å. When the thickness of the EML is within these ranges, the EML may have good light emitting ability without a substantial increase in driving voltage.

Then, an ETL may be formed on the EML by vacuum deposition, spin coating, casting, or the like. When the ETL is formed using vacuum deposition or spin coating, the deposition and coating conditions may be similar to those for the formation of the HIL, though the deposition and coating conditions may vary according to a compound that is used to form the ETL. A material for forming the ETL may be any known material that can stably transport electrons injected from an electron injecting electrode (cathode). Non-limiting examples of materials for forming the ETL are a quinoline derivative, such as tris(8-quinolinorate)aluminum (Alq3), TAZ, BAlq, beryllium bis(benzoquinolin-10-olate (Bebq$_2$), 9,10-di(naphthalene-2-yl)anthracene (ADN), Compound 201, and Compound 202, but are not limited thereto.

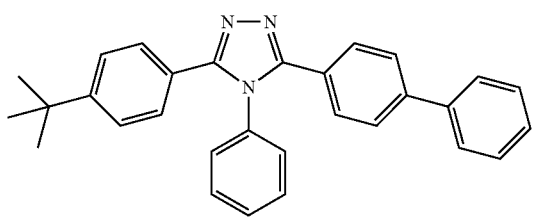

TAZ

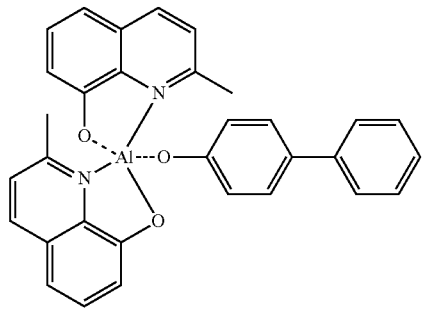

BAlq

Compound 201

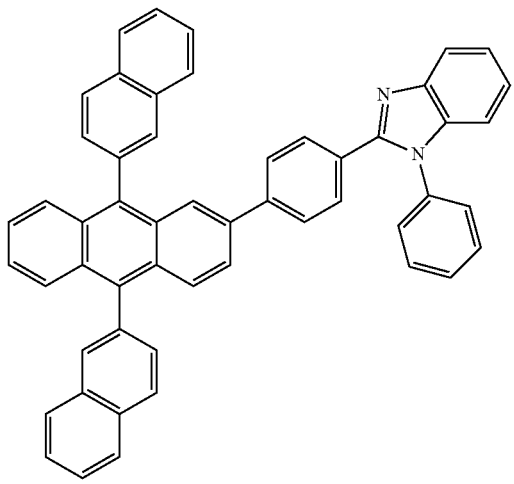

Compound 202

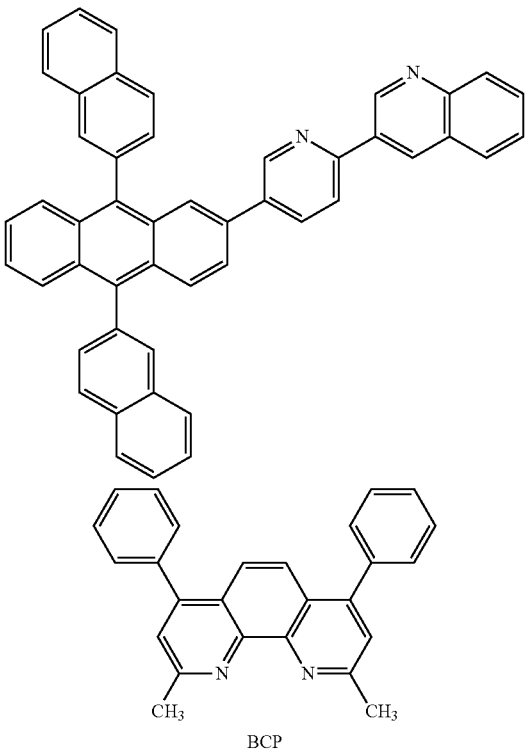

BCP

The thickness of the ETL may be from about 100 Å to about 1,000 Å, and in some embodiments, may be from about 150 Å to about 500 Å. When the thickness of the ETL is within these ranges, the ETL may have satisfactory electron transporting ability without a substantial increase in driving voltage.

In some embodiments, the ETL may further include a metal-containing material, in addition to any known electron-transporting organic compound.

The metal-containing material may include a lithium (Li) complex. Non-limiting examples of the Li complex are lithium quinolate (LiQ) and Compound 203 below:

Compound 203

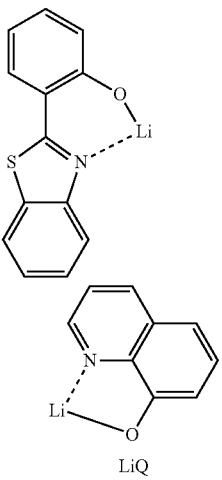

LiQ

Then, an EIL, which facilitates injection of electrons from the cathode, may be formed on the ETL. Any suitable electron-injecting material may be used to form the EIL.

Non-limiting examples of materials for forming the EIL are LiF, NaCl, CsF, Li$_2$O, and BaO, which are known in the art. The deposition and coating conditions for forming the EIL may be similar to those for the formation of the HIL, though the deposition and coating conditions may vary according to the material that is used to form the EIL.

The thickness of the EIL may be from about 1 Å to about 100 Å, and in some embodiments, may be from about 3 Å to about 90 Å. When the thickness of the EIL is within these ranges, the EIL may have satisfactory electron injection ability without a substantial increase in driving voltage.

The second electrode 17 is disposed on the organic layer 15. The second electrode 17 may be a cathode that is an electron injection electrode. A metal material for forming the second electrode 17 may be a metal, an alloy, an electro-conductive compound, which have a low work function, or a mixture thereof. In this regard, the second electrode 9 may be formed of lithium (Li), magnesium (Mg), aluminum (Al), aluminum (Al)-lithium (Li), calcium (Ca), magnesium (Mg)-indium (In), magnesium (Mg)-silver (Ag), or the like, and may be formed as a thin film type transmission electrode. In some embodiments, to manufacture a top-emission light-emitting device, the transmission electrode may be formed of indium tin oxide (ITO) or indium zinc oxide (IZO).

Although the organic light-emitting device of the FIGURE is described above, the present invention is not limited thereto.

When a phosphorescent dopant is used in the EML, a HBL may be formed between the HTL and the EML or between the H-functional layer and the EML by using vacuum deposition, spin coating, casting, Langmuir-Blodgett (LB) deposition, or the like, in order to prevent diffusion of triplet excitons or holes into the ETL. When the HBL is formed using vacuum deposition or spin coating, the conditions for deposition and coating may be similar to those for the formation of the HIL, although the conditions for deposition and coating may vary according to the material that is used to form the HBL. Any known hole-blocking material may be used. Non-limiting examples of hole-blocking materials are oxadiazole derivatives, triazole derivatives, and phenanthroline derivatives. For example, bathocuproine (BCP) represented by the following formula may be used as a material for forming the HBL.

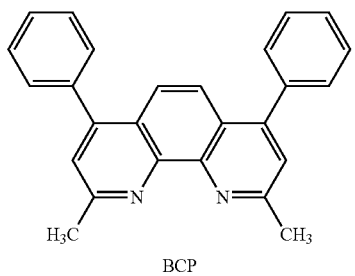

BCP

The thickness of the HBL may be from about 20 Å to about 1000 Å, and in some embodiments, may be from about 30 Å to about 300 Å. When the thickness of the HBL is within these ranges, the HBL may have improved hole blocking ability without a substantial increase in driving voltage.

As used herein, examples of the unsubstituted $C_1$-$C_{60}$ alkyl group (or $C_1$-$C_{60}$ alkyl group) may be linear or branched $C_1$-$C_{60}$ alkyl groups, such as methyl, ethyl, propyl, isobutyl, sec-butyl, pentyl, iso-amyl, or hexyl. Examples of the substituted $C_1$-$C_{60}$ alkyl group may be the unsubstituted $C_1$-$C_{60}$ alkyl group of which at least one hydrogen atom is substituted with one of deuterium, a halogen atom, a hydroxy group, a nitro group, a cyano group, an amino group, an amidino group, hydrazine, hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group; a $C_1$-$C_{60}$ alkyl group, a $C_2$-$C_{60}$ alkenyl group, a $C_2$-$C_{60}$ alkynyl group, and a $C_1$-$C_{60}$ alkoxy group; a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group that are substituted with at least one of deuterium, a halogen atom, a hydroxyl group, a cyano group, a nitro group, an amino group, an amidino groups, hydrazine, hydrazone, a carboxylic group or a salt thereof, a sulfonic acid group or a salt thereof, and a phosphoric acid group or a salt thereof; a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group that are substituted with at least one of deuterium, a halogen atom, a hydroxyl group, a cyano group, a nitro group, an amino group, an amidino groups, hydrazine, hydrazone, a carboxylic group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; —N($Q_{11}$)($Q_{12}$); and —Si($Q_{13}$)($Q_{14}$)($Q_{15}$) (where $Q_{11}$, and $Q_{12}$ may be each independently a $C_6$-$C_{60}$ aryl group, or a $C_2$-$C_{60}$ heteroaryl group, and $Q_{13}$ to $Q_{15}$ may be each independently, a $C_1$-$C_{60}$ alkyl group, a $C_1$-$C_{60}$ alkoxy group, a $C_6$-$C_{60}$ aryl group, or a $C_2$-$C_{60}$ heteroaryl group), but not limited thereto.

As used herein, the unsubstituted $C_1$-$C_{60}$ alkoxy group (or $C_1$-$C_{60}$ alkoxy group) may be represented by the formula of -OA (wherein A is an unsubstituted $C_1$-$C_{60}$ alkyl group as described above). Examples of the unsubstituted $C_1$-$C_{60}$ alkoxy group may be methoxy, ethoxy, and isopropyloxy groups. At least one hydrogen atom of the unsubstituted $C_1$-$C_{60}$ alkoxy group may be substituted with those substituents described above in conjunction with the substituted $C_1$-$C_{60}$ alkyl group. As used herein, the unsubstituted $C_2$-$C_{60}$ alkenyl group (or a $C_2$-$C_{60}$ alkenyl group) may be a hydrocarbon chain having a carbon-carbon double bond in the center or at a terminal of the unsubstituted $C_2$-$C_{60}$ alkyl group. Examples of the unsubstituted $C_2$-$C_{60}$ alkenyl group may be ethenyl, prophenyl, and butenyl groups. At least one hydrogen atom of the unsubstituted $C_2$-$C_{60}$ alkenyl group may be substituted with those substituents described above in conjunction with the substituted $C_1$-$C_{60}$ alkyl group.

As used herein, the unsubstituted $C_2$-$C_{60}$ alkynyl group (or a $C_2$-$C_{60}$ alkynyl group) may be a hydrocarbon chain having a carbon-carbon triple bond in the center or at a terminal of the above-defined $C_2$-$C_{60}$ alkyl group. Examples of the unsubstituted $C_2$-$C_{60}$ alkynyl group may be ethynyl and propynyl groups. At least one hydrogen atom of the unsubstituted $C_2$-$C_{60}$ alkynyl group may be substituted with those substituents described above in conjunction with the substituted $C_1$-$C_{60}$ alkyl group.

As used herein, the unsubstituted $C_6$-$C_{60}$ aryl group may be a monovalent group having a carbocyclic aromatic system having 6 to 60 carbon atoms including at least one aromatic group. The unsubstituted $C_6$-$C_{60}$ arylene group is a divalent group having a carbocyclic aromatic system having 6 to 60 carbon atoms including at least one aromatic group. When the aryl group and the arylene group, respectively, have at least two rings, they may be fused to each other. At least one hydrogen atom of the aryl group and the arylene group may be substituted with those substituents described above in conjunction with the substituted $C_1$-$C_{60}$ alkyl group.

Examples of the substituted or unsubstituted $C_6$-$C_{60}$ aryl group may be a phenyl group, a $C_1$-$C_{10}$ alkylphenyl group (for example, ethylphenyl group), a $C_1$-$C_{10}$ alkylbiphenyl group (for example, ethylbiphenyl group), a halophenyl group (for example, o-, m- and p-fluorophenyl groups, a dichlorophenyl group), a dicyanophenyl group, a trifluoromethoxyphenyl group, o-, m-, and p-tolyl groups, o-, m- and p-cumenyl groups, a mesityl group, a phenoxyphenyl group, a (α,α-dimethylbenzene)phenyl group, a (N,N'-dimethyl)aminophenyl group, a (N,N'-diphenyl)aminophenyl group, a pentalenyl group, an indenyl group, a naphthyl group, a halonaphthyl group (for example, a fluoronaphthyl group), a $C_1$-$C_{10}$ alkylnaphthyl group (for example, a methylnaphthyl group), a $C_1$-$C_{10}$ alkoxynaphthyl group (for example, a methoxynaphthyl group), an anthracenyl group, an azrenyl group, a heptalenyl group, an acenaphthylenyl group, a phenalenyl group, a fluorenyl group, an anthraquinolyl group, a methylanthryl group, a phenanthryl group, a triphenylenyl group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenylgroup, a coroneryl group, a trinaphthylenyl group, a heptaphenyl group, a heptacenyl group, a piranthrenyl group, and an obarenyl group.

Examples of the substituted $C_6$-$C_{60}$ aryl group may be understood based on the above-described examples of the unsubstituted $C_6$-$C_{60}$ aryl group and substituents of the substituted $C_1$-$C_{60}$ alkyl group. Examples of the substituted or unsubstituted $C_6$-$C_{60}$ arylene group may be understood based on the above-described examples of the substituted or unsubstituted $C_6$-$C_{60}$ aryl group.

As used herein, the unsubstituted $C_2$-$C_{60}$ heteroaryl group may be a monovalent group having at least one aromatic group having at least one of the heteroatoms selected from the group consisting of N, O, P, and S, and at least one carbon atom. The unsubstituted $C_2$-$C_{60}$ hetero arylene group is a divalent group having at least one aromatic group having at least one of the heteroatoms selected from the group consisting of N, O, P, and S and at least one carbon atom. In this regard, when the heteroaryl group and the heteroarylene group, respectively, have at least two rings, they may be fused to each other. At least one hydrogen atom of the heteroaryl group and the hetero arylene group may be substituted with those substituents described above in conjunction with the substituted $C_1$-$C_{60}$ alkyl group.

Examples of the unsubstituted $C_2$-$C_{60}$ heteroaryl group may be a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a benzoimidazolyl group, an imidazopyridinyl group, and an imidazopyrimidinyl group. Examples of the unsubstituted $C_2$-$C_{60}$ hetero arylene group may be understood based on the above-described examples of the substituted or unsubstituted $C_2$-$C_{60}$ arylene group.

The substituted or unsubstituted $C_6$-$C_{60}$ aryloxy group may be represented by -$OA_2$ (where $A_2$ is a substituted or unsubstituted $C_6$-$C_{60}$ aryl group as described above). The substituted or unsubstituted $C_6$-$C_{60}$ arylthio group may be -$SA_3$ (where $A_3$ is a substituted or unsubstituted $C_6$-$C_{60}$ aryl group as described above).

Hereinafter, the present invention will be described in detail with reference to the following synthesis examples and other examples. However, these examples are for illustrative purposes only and are not intended to limit the scope of the present invention. In the following synthesis examples, when a compound B, instead of a compound A, was used, the amounts of the compounds A and B were the same based on mole equivalent.

EXAMPLES

Intermediates 1-1 to 1-14, and Intermediates 2-1 to 2-4

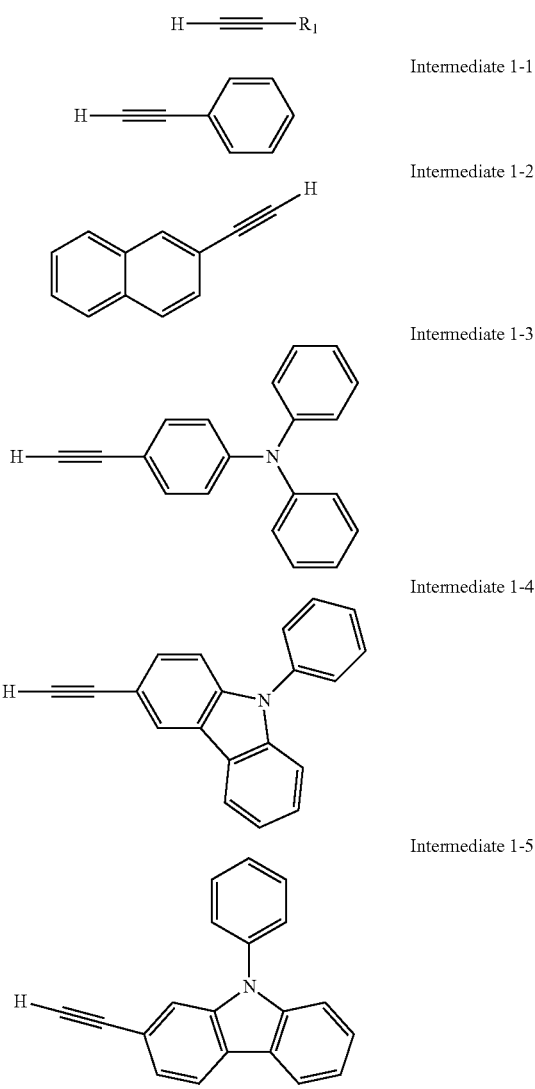

Intermediate 1-6
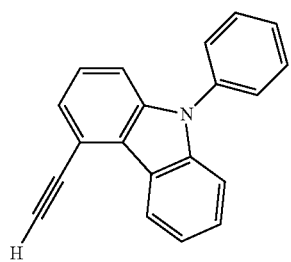
Intermediate 1-7
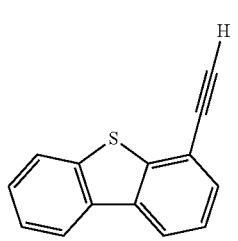
Intermediate 1-8
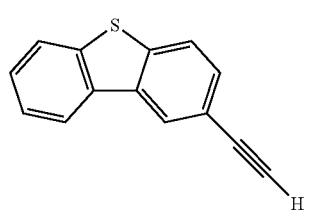
Intermediate 1-9
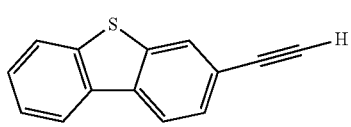
Intermediate 1-10
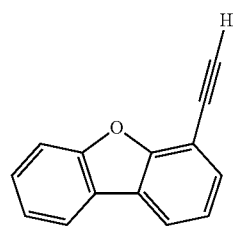
Intermediate 1-11
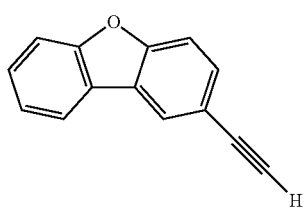
Intermediate 1-12
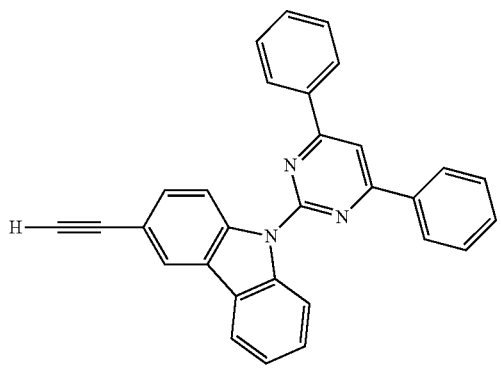
Intermediate 1-13
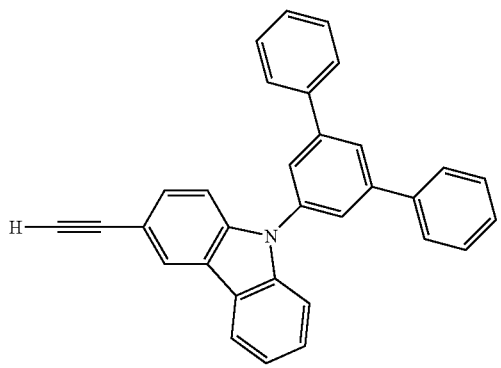
Intermediate 1-14
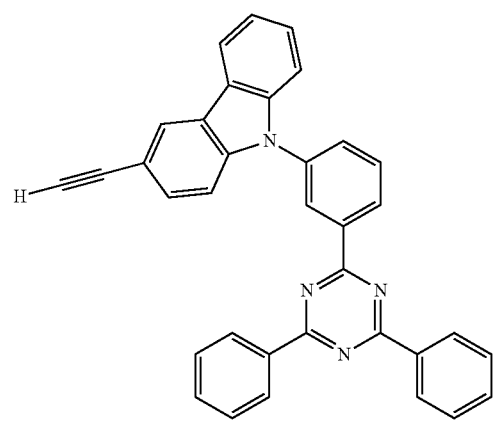
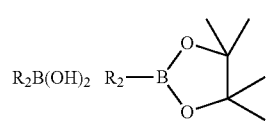
Intermediate 2-1
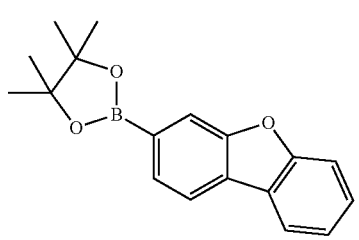

Intermediate 2-2

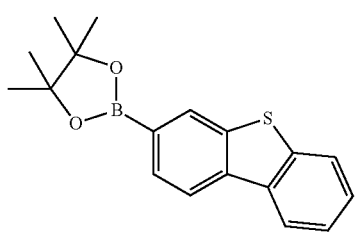

Intermediate 2-3

Intermediate 2-4

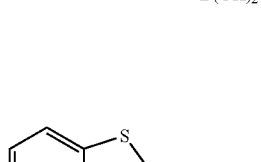

Synthesis Example 1: Synthesis of Compound 14

Compound 14 was synthesized according to Reaction Scheme 1 below:

Reaction Scheme 1

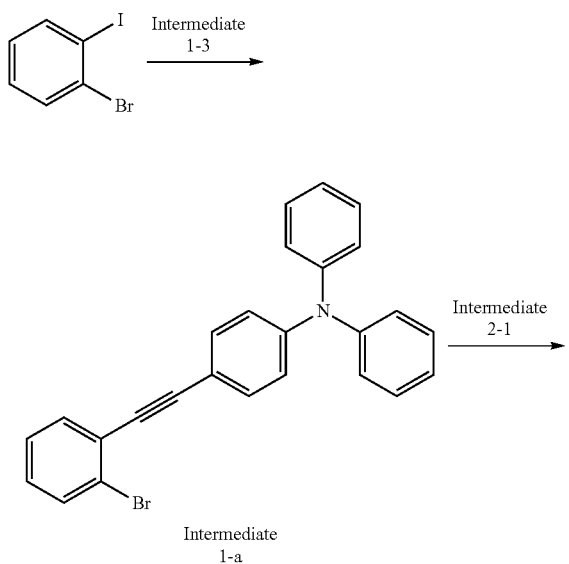

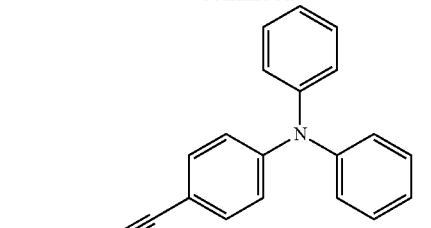

Intermediate 1-b

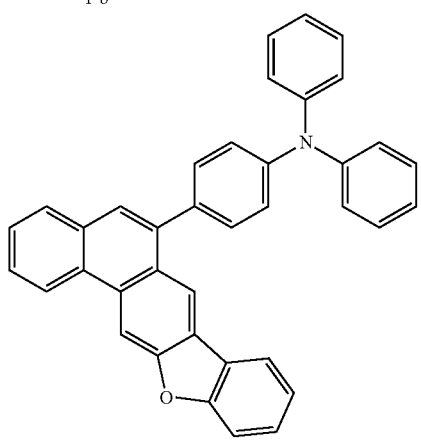

14

Synthesis of Intermediate 1-a 7.5 g (1.2 eq) of 2-bromoiodobenzene, 780 mg (0.05 eq) of bis(chloro(triphenylphosphine))palladium ($PdCl_2(PPh_3)_2$), and 250 mg (0.06 eq) of CuI were mixed together in a flask, which was then supplied with $N_2$ gas in a vacuum, followed by an addition of 70 mL of THF into the mixture and stirring. Afterward, 13 mL (8 eq) of triethylamine and 6 g (1 eq) of Intermediate 1-3 were slowly dropwise added thereto and stirred in $N_2$ atmosphere at room temperature for about 2 hours. The resulting product was evaporated using a rotary evaporator to remove the solvent. After an addition of 50 mL of water, the reaction solution was extracted three times with 50 mL of ethylether. The organic layer was collected and dried using magnesium sulfate to evaporate the solvent. The residue was separated and purified using silica gel column chromatography to obtain 5 g of Intermediate 1-a (Yield: 55%). This compound was identified using LC-MS.

$C_{26}H_{18}BrN$: M+ 423.16

Synthesis of Intermediate 1-b 5.0 g of Intermediate 1-a, 4.2 g (1.2 eq) of Intermediate 2-1, 950 mg (0.07 eq) of $Pd(PPh_3)_4$, and 2.8 g (1.7 eq) of $K_2CO_3$ were mixed with 30 mL of THF and 15 mL of distilled water to obtain a mixture, which was heated to about 70° C. and stirred for about 24 hours under reflux. The resulting mixture was cooled to room temperature and then extracted three times with 100 mL of water and 100 mL of diethylether. The organic layer was collected and dried using magnesium sulfate to evaporate the solvent. The residue was separated and purified using silica gel column chromatography to obtain 3.6 g of Intermediate 1-b (Yield: 60%). This compound was identified using LC-MS.

$C_{38}H_{25}NO$: M+ 511.29

Synthesis of Compound 14

After 3.6 g of Intermediate 1-b was mixed with 500 ml of methylene chloride, 20 mL (40 eq) of trifluoroacetic acid was slowly dropwise added thereto and stirred at room temperature for about 1 hour. After completion of the reaction, the reaction solution was extracted three times with 100 mL of water and 100 mL of diethyleter. The organic layer was collected and dried using magnesium sulfate to evaporate the solvent. The residue was separated and purified using silica gel column chromatography to obtain 3.2 g of Compound 14 (Yield: 90%). This compound was identified using LC-MS and nuclear magnetic resonance (NMR).

$C_{38}H_{25}NO$: M+ 511.29

1H NMR (CDCl3, 400 MHz) δ (ppm) 8.93 (s 2H), 8.12 (d, 2H), 7.93 (s, 1H), 7.82-7.88 (m, 2H), 7.49 (s, 1H), 7.42 (s, 1H), 7.23 (d, 2H), 7.13-7.19 (m, 2H), 7.00-7.10 (m, 4H), 6.62 (m, 2H), 6.52 (d, 2H), 6.45-6.48 (m, 4H)

Synthesis Example 2: Synthesis of Compound 8

3.0 g of Compound 8 (Yield: 89%) was synthesized in the same manner as in Synthesis Example 1, except that Intermediate 1-4, instead of Intermediate 1-3, was used in synthesizing Intermediate 1-a, and Intermediate 2-2, instead of Intermediate 2-1, was used in synthesizing Intermediate 1-b. This compound was identified using LC-MS and NMR.

$C_{38}H_{23}NS$: M+ 526.16

1H NMR (CDCl3, 400 MHz) δ (ppm) 8.93 (s, 1H), 8.90 (d, 2H), 8.12 (s, 1H), 8.10 (d, 2H), 7.93 (s, 1H), 7.86 (d, 1H), 7.88 (m, 1H), 7.82 (m, 1H), 7.77-7.78 (m, H), 7.55 (d, 1H), 7.46 (d, 1H), 7.40 (d, 1H), 7.30-7.33 (m, 3H), 7.27-7.29 (m, 5H), 7.08 (m, 1H), 7.00 (m, 1H)

Synthesis Example 3: Synthesis of Compound 9

3.3 g of Compound 9 (Yield: 92%) was synthesized in the same manner as in Synthesis Example 1, except that Intermediate 1-5, instead of Intermediate 1-3, was used in synthesizing Intermediate 1-a. This compound was identified using LC-MS and NMR.

$C_{38}H_{23}NO$: M+ 510.18

1H NMR (CDCl3, 400 MHz) δ (ppm) 8.93 (s, 1H), 8.90 (d, 1H), 8.12 (s, 1H), 8.10 (d, 1H), 7.93 (s, 1H), 7.88 (m, 1H), 7.82 (m, 1H), 7.63 (s, 1H), 7.61 (d, 1H), 7.55 (d, 1H), 7.49 (d, 1H), 7.42 (d, 1H), 7.40 (s, 1H), 7.30-7.33 (m, 5H), 7.22 (d, 1H), 7.19 (m, 1H), 7.13 (m, 1H), 7.08 (m, 1H), 7.00 (m, 1H)

Synthesis Example 4: Synthesis of Compound 12

2.8 g of Compound 12 (Yield: 90%) was synthesized in the same manner as in Synthesis Example 1, except that Intermediate 1-13, instead of Intermediate 1-3, was used in synthesizing Intermediate 1-a. This compound was identified using LC-MS and NMR.

$C_{52}H_{36}NO$: M+ 691.28

1H NMR (CDCl3, 400 MHz) δ (ppm) 8.93 (s, 1H), 8.92 (d, 1H), 8.13 (s, 1H), 8.12 (d, 1H), 7.93 (s, 1H), 7.88 (m, 1H), 7.82 (m, 1H), 7.77 (s, 1H), 7.70 (s, 1H), 7.55 (d, 1H), 7.46-7.48 (m, 6H), 7.42 (s, 2H), 7.40 (d, 1H), 7.30-7.32 (m, 5H), 7.22 (m, 2H), 7.19 (m, 1H), 7.13 (m, 1H), 7.08 (m, 1H), 7.00 (m, 1H)

Synthesis Example 5: Synthesis of Compound 16

Compound 16 was synthesized according to Reaction Scheme 2 below:

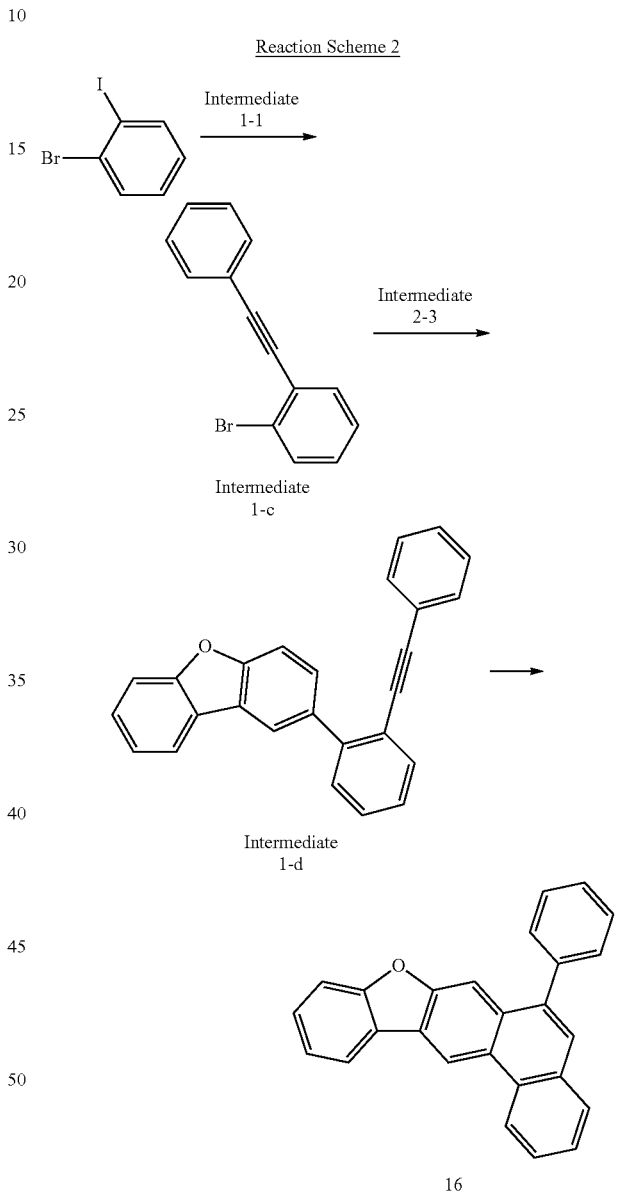

Synthesis of Intermediate 1-c 7.5 g (1.2 eq), of 1-bromo-2-iodo-benzene, 780 mg (0.05 eq) of bis(chloro(triphenylphosphine))palladium ($PdCl_2$ $(PPh_3)_2$), and 250 mg (0.06 eq) of CuI were mixed together in a flask, which was then supplied with $N_2$ gas in a vacuum, followed by an addition of 70 mL of THF into the mixture and stirring. Afterward, 13 mL (8 eq) of triethylamine and 2.2 g (1 eq) of Intermediate 1-1 were slowly dropwise added thereto and stirred in $N_2$ atmosphere at room temperature for about 2 hours. The resulting product was evaporated using a rotary evaporator to remove the solvent. After an addition of 50 mL of water, the reaction solution was extracted three times with 50 mL of ethylether. The organic layer was collected and dried using magnesium sulfate to evaporate the solvent. The residue was separated and purified using silica gel column chromatography to obtain 3.1 g of Intermediate 1-c (Yield: 55%). This compound was identified using LC-MS.

$C_{14}H_9Br$: M+ 256.99

Synthesis of Intermediate 1-d 3.1 g of Intermediate 1-c, 3.1 g (1.2 eq) of Intermediate 2-3, 950 mg (0.07 eq) of $Pd(PPh_3)_4$, and 2.8 g (1.7 eq) of $K_2CO_3$ were mixed with 30 mL of THF and 15 mL of distilled water to obtain a mixture, which was heated to about 70° C. and stirred for about 24 hours under reflux. The resulting mixture was cooled to room temperature and then extracted three times with 100 mL of water and 100 mL of diethylether. The organic layer was collected and dried using magnesium sulfate to evaporate the solvent. The residue was separated and purified using silica gel column chromatography to obtain 2.4 g of Intermediate 1-d (Yield: 57%). This compound was identified using LC-MS.

$C_{26}H_{16}O$: M+ 345.12

Synthesis of Compound 16

2.4 g of Intermediate 1-d was mixed with 500 ml of methylene chloride, 20 mL (40 eq) of trifluoroacetic acid was slowly dropwise added thereto and stirred at room temperature for about 1 hour. After completion of the reaction, the reaction solution was extracted three times with 100 mL of water and 100 mL of diethyleter. The organic layer was collected and dried using magnesium sulfate to evaporate the solvent. The residue was separated and purified using silica gel column chromatography to obtain 2.1 g of Compound 16 (Yield: 87%). This compound was identified using LC-MS and NMR.

$C_{26}H_{16}O$: M+ 345.12

1H NMR (CDCl3, 400 MHz) δ (ppm) 8.93 (s, 1H), 8.90 (d. 1H), 8.13 (s, 1H), 8.12 (d, 1H), 7.93 (s, 1H), 7.88 (m, 1H), 7.82 (m, 1H), 7.48-7.49 (m, 3H), 7.42 (d, 1H), 7.32 (m, 2H), 7.22 (m, 1H), 7.19 (m, 1H), 7.13 (m, 1H)

Synthesis Example 6: Synthesis of Compound 18

2.5 g of Compound 18 (Yield: 85%) was synthesized in the same manner as in Synthesis Example 5, except that Intermediate 1-7, instead of Intermediate 1-1, was used in synthesizing Intermediate 1-c, and Intermediate 2-4, instead of Intermediate 2-3, was used in synthesizing Intermediate 1-d. This compound was identified using LC-MS and NMR.

$C_{34}H_{20}OS$: M+ 477.12

1H NMR (CDCl3, 400 MHz) δ (ppm) 8.93 (s, 1H), 8.92 (d, 1H), 8.12 (s, 1H), 8.10 (d, 1H), 7.93 (s. 1H), 7.86-7.87 (m, 2H), 7.82 (m, 1H), 7.74 (d, 1H), 7.53 (d, 1H), 7.49 (d, 1H), 7.42 (d, 1H), 7.39 (m, 1H), 7.31-7.32 (m, 2H), 7.19 (m, 1H), 7.13 (m, 1H)

Synthesis Example 7: Synthesis of Compound 22

3.2 g of Compound 22 (Yield: 88%) was synthesized in the same manner as in Synthesis Example 5, except that Intermediate 1-11, instead of Intermediate 1-1, was used in synthesizing Intermediate 1-c, and Intermediate 2-4, instead of Intermediate 2-3, was used in synthesizing Intermediate 1-d. This compound was identified using LC-MS and NMR.

$C_{32}H_{18}OS$: M+ 451.11

1H NMR (CDCl3, 400 MHz) δ (ppm) 8.94 (s, 1H), 8.93 (d, 1H), 8.13 (s, 1H), 8.12 (d, 1H), 7.93 (s, 1H), 7.86-7.88 (m, 2H), 7.82 (m, 1H), 7.78 (d, 1H), 7.71 (s, 1H), 7.48-7.49 (m, 2H), 7.41-7.42 (m, 2H), 7.31-7.32 (m, 2H), 7.19 (m, 1H), 7.13 (m, 1H)

Synthesis Example 8: Synthesis of Compound 28

2.6 g of Compound 28 (Yield: 90%) was synthesized in the same manner as in Synthesis Example 5, except that Intermediate 1-6, instead of Intermediate 1-1, was used in synthesizing Intermediate 1-c. This compound was identified using LC-MS and NMR.

$C_{38}H_{23}NO$: M+ 510.18

1H NMR (CDCl3, 400 MHz) δ (ppm) 8.94 (s, 1H), 8.93 (s, 1H), 8.12 (m, 2H), 7.88-7.90 (m, 2H), 7.82 (m, 1H), 7.55 (d, 1H), 7.49 (d, 1H), 7.40 (d, 1H), 7.42 (d, 1H), 7.36 (d, 1H), 7.30-7.35 (m, 5H), 7.22 (d, 1H), 7.19 (m, 1H), 7.13-7.16 (m, 2H), 7.08 (m, 1H), 7.00 (m, 1H)

Synthesis Example 9: Synthesis of Compound 32

2.7 g of Compound 32 (Yield: 89%) was synthesized in the same manner as in Synthesis Example 5, except that Intermediate 1-12, instead of Intermediate 1-1, was used in synthesizing Intermediate 1-c, and Intermediate 2-4, instead of Intermediate 2-3, was used in synthesizing Intermediate 1-d. This compound was identified using LC-MS and NMR.

$C_{48}H_{29}N_3S$: M+ 680.21

1H NMR (CDCl3, 400 MHz) δ (ppm) 8.94 (s, 1H), 8.92 (d, 1H), 8.15 (s, 1H), 8.13 (d, 1H), 7.93 (s, 1H), 7.86-7.87 (m, 2H), 7.82 (m, 1H), 7.78 (d, 1H), 7.70 (s, 1H), 7.55 (d, 1H), 7.45-7.49 (m, 5H), 7.40 (d, 1H), 7.28-7.37 (m, 7H), 7.18-7.22 (m, 2H), 7.00-7.15 (m, 2H)

Synthesis Example 10: Synthesis of Compound 35

2.4 g of Compound 35 (Yield: 90%) was synthesized in the same manner as in Synthesis Example 5, except that Intermediate 1-3, instead of Intermediate 1-1, was used in synthesizing Intermediate 1-c, and Intermediate 2-4, instead of Intermediate 2-3, was used in synthesizing Intermediate 1-d. This compound was identified using LC-MS and NMR.

$C_{38}H_{25}NS$: M+ 528.17

1H NMR (CDCl3, 400 MHz) δ (ppm) 8.95 (s, 1H), 8.93 (d, 1H), 7.93 (s, 1H), 7.86-7.89 (m, 2H), 7.78 (d, 1H), 7.31-7.34 (m, 2H), 7.23 (dd, 2H), 7.00-7.06 (m, 4H), 6.62-6.66 (m, 2H), 6.52 (d, 2H), 6.45-6.50 (m, 4H)

Intermediates 2-5 to 2-18, and Intermediates 1-15 to 1-17

$R_2B(OH)_2$

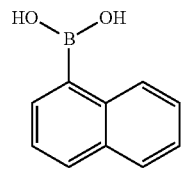

Intermediate 2-5

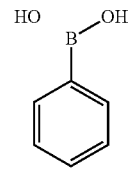

Intermediate 2-6

Intermediate 2-7
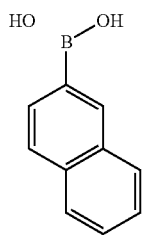
Intermediate 2-8
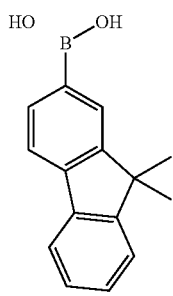
Intermediate 2-9
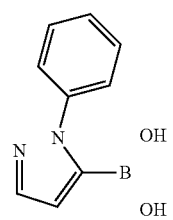
Intermediate 2-10
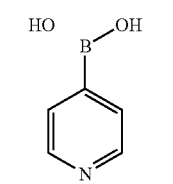
Intermediate 2-11
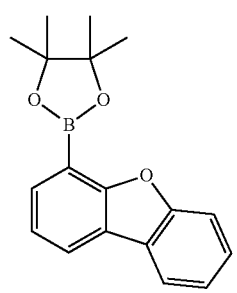
Intermediate 2-12
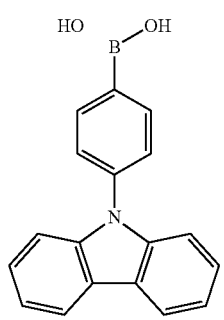
Intermediate 2-13
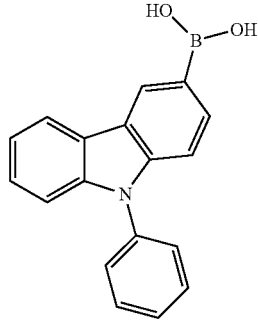
Intermediate 2-14
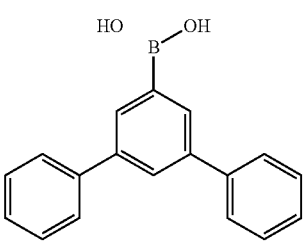
Intermediate 2-15
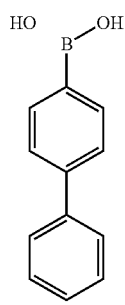
Intermediate 2-16
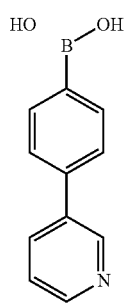
Intermediate 2-17
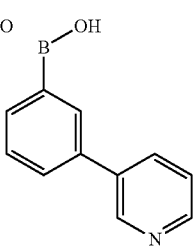

Intermediate 2-18

Intermediate 1-15

Intermediate 1-16

Intermediate 1-17

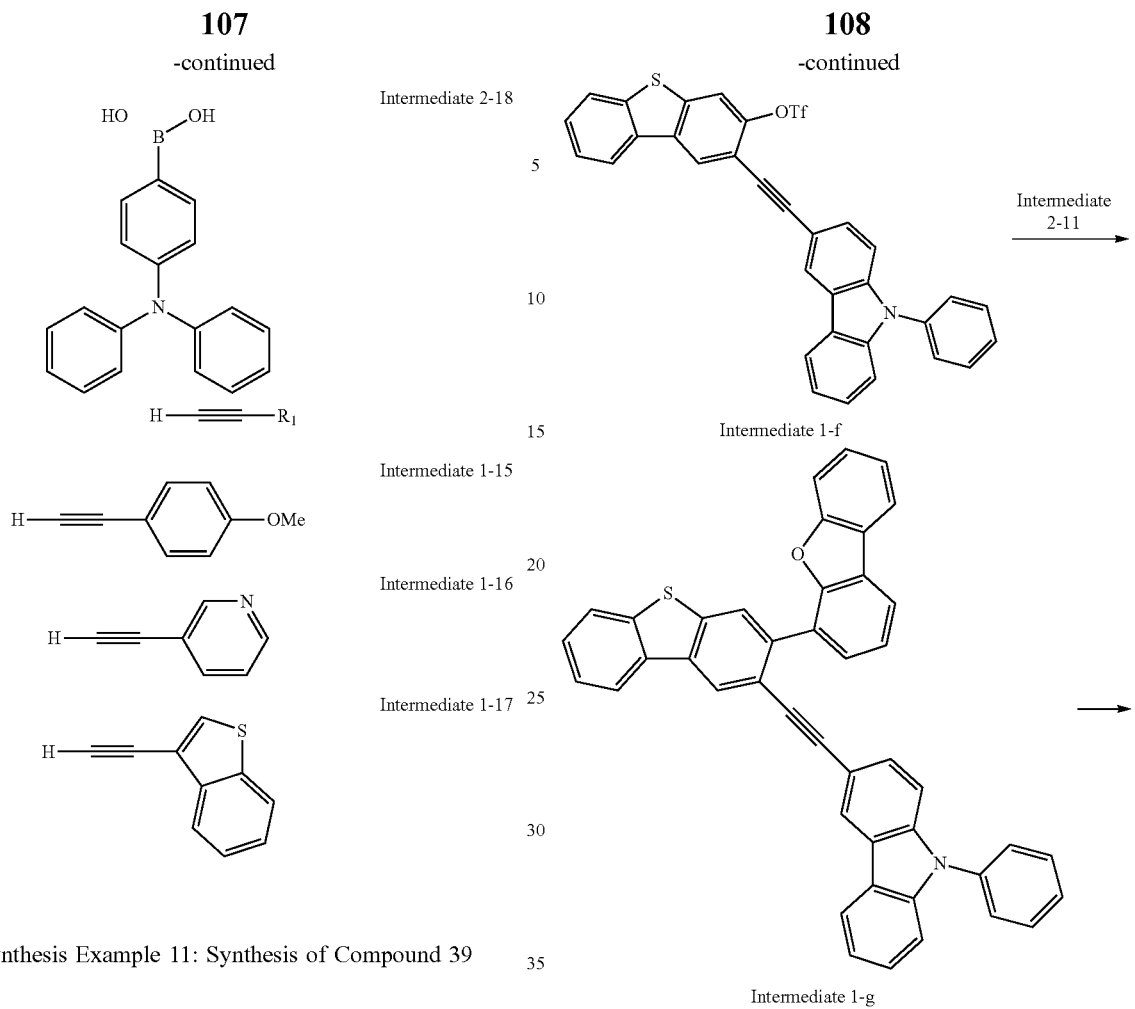

Synthesis Example 11: Synthesis of Compound 39

Compound 39 was synthesized according to Reaction Scheme 3 below:

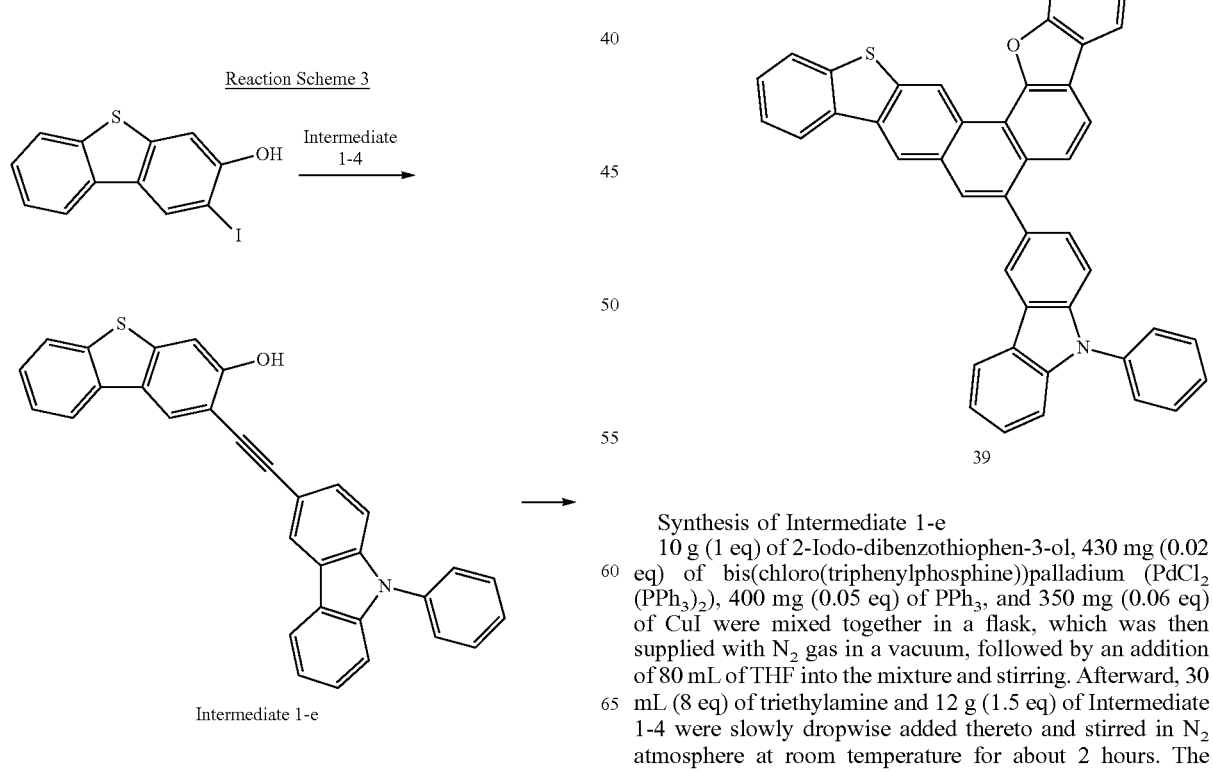

Synthesis of Intermediate 1-e 10 g (1 eq) of 2-Iodo-dibenzothiophen-3-ol, 430 mg (0.02 eq) of bis(chloro(triphenylphosphine))palladium (PdCl$_2$(PPh$_3$)$_2$), 400 mg (0.05 eq) of PPh$_3$, and 350 mg (0.06 eq) of CuI were mixed together in a flask, which was then supplied with N$_2$ gas in a vacuum, followed by an addition of 80 mL of THF into the mixture and stirring. Afterward, 30 mL (8 eq) of triethylamine and 12 g (1.5 eq) of Intermediate 1-4 were slowly dropwise added thereto and stirred in N$_2$ atmosphere at room temperature for about 2 hours. The resulting product was evaporated using a rotary evaporator to remove the solvent. After an addition of 100 mL of water, the reaction solution was extracted three times with 100 mL of ethylether. The organic layer was collected and dried using magnesium sulfate to evaporate the solvent. The residue was separated and purified using silica gel column chromatography to obtain 7.1 g of Intermediate 1-e (Yield: 50%). This compound was identified using LC-MS.

$C_{32}H_{19}NOS$: M+ 466.12

Synthesis of Intermediate 1-f

After 7.1 g of Intermediate 1-e and 3.7 mL (3 eq) of pyridine were mixed with 60 mL of $CH_2Cl_2$, 3.8 mL (1.5 eq) of trifluoromethane sulfonic anhydride was slowly dropwise added thereto at about 0° C. in a cooling bath, and stirred at room temperature for about 2 hours. The resulting mixture was neutralized with 1N HCl, and then extracted three times with 100 ml of water and 100 ml of $CH_2Cl_2$. The organic layer was collected and dried using magnesium sulfate to evaporate the solvent. The residue was separated and purified using silica gel column chromatography to obtain 7.3 g of Intermediate 1-f (Yield: 80%). This compound was identified using LC-MS.

$C_{33}H_{18}F_3NO_3S_2$: M+ 598.07

Synthesis of Intermediate 1-g 7.3 g of Intermediate 1-f, 4.3 g (1.2 eq) of Intermediate 2-11, 988 mg (0.07 eq) of $Pd(PPh_3)_4$, and 2.8 g (1.7 eq) of $K_2CO_3$ were mixed with 35 mL of THF and 18 mL of distilled water to obtain a mixture, which was then heated to about 70° C. and stirred for about 26 hours under reflux. The resulting mixture was cooled to room temperature and then extracted three times with 100 mL of water and 100 mL of diethylether. The organic layer was collected and dried using magnesium sulfate to evaporate the solvent. The residue was separated and purified using silica gel column chromatography to obtain 4.5 g of Intermediate 1-g (Yield: 60%). This compound was identified using LC-MS.

$C_{44}H_{25}NOS$: M+ 616.17

Synthesis of Compound 39

After 4.5 g of Intermediate 1-g was mixed with 500 mL of methylene chloride, 20 mL (40 eq) of trifluoroacetic acid was slowly dropwise added thereto and stirred at room temperature for about 1 hour. After completion of the reaction, the reaction solution was extracted three times with 100 mL of water and 100 mL of diethylether. The organic layer was collected and dried using magnesium sulfate to evaporate the solvent. The residue was separated and purified using silica gel column chromatography to obtain 4.0 g of Compound 39 (Yield: 90%). This compound was identified using LC-MS and NMR.

$C_{38}H_{25}NO$: M+ 511.29

1H NMR (CDCl3, 400 MHz) δ (ppm) 8.93 (s, 1H), 8.15 (s, 1H), 8.12 (d, 1H), 7.93 (s, 1H), 7.77-7.86 (m, 4H), 7.55 (d, 1H), 7.40-7.49 (m, 4H), 7.30-7.36 (m, 8H), 7.19 (m, 1H), 7.13 (m, 1H), 7.00-7.02 (m, 2H)

Synthesis Example 12: Synthesis of Compound 41

3.5 g of Compound 41 (Yield: 91%) was synthesized in the same manner as in Synthesis Example 11, except that 2-bromo-dibenzofuran-3-ol and Intermediate 1-13, instead of 2-iododibenzothiophene-3-ol and intermediate 1-4, were used in synthesizing Intermediate 1-2, and Intermediate 2-6, instead of Intermediate 2-11, was used in synthesizing Intermediate 1-g. This compound was identified using LC-MS and NMR.

$C_{50}H_{31}NO$: M+ 662.24

1H NMR (CDCl3, 400 MHz) δ (ppm) 8.93 (s, 1H), 8.90 (d, 1H), 8.15 (s, 1H), 8.12 (d, 1H), 7.93 (s, 1H), 7.88 (m, 1H), 7.77-7.82 (m, 3H), 7.55 (d, 1H), 7.40-7.7.49 (m, 10H), 7.30-7.34 (m, 3H), 7.19-7.22 (m, 3H), 7.08-7.13 (m, 2H), 7.00 (m, 1H)

Synthesis Example 13: Synthesis of Compound 44

3.0 g of Compound 44 (Yield: 89%) was synthesized in the same manner as in Synthesis Example 11, except that 2-bromo-dibenzofuran-3-ol and Intermediate 1-3, instead of 2-iodo-dibenzothiophene-3-ol and Intermediate 1-4, were used in synthesizing Intermediate 1-e, and Intermediate 2-12, instead of Intermediate 2-11, was used in synthesizing Intermediate 1-g. This compound was identified using LC-MS and NMR.

$C_{50}H_{32}N_2O$: M+ 526.16

1H NMR (CDCl3, 400 MHz) δ (ppm) 8.90 (s, 2H), 8.10 (s, 2H), 7.90 (d, 2H), 7.55 (d, 2H), 7.49 (d, 1H), 7.40-7.44 (d, 3H), 7.23 (d, 2H), 7.13-7.19 (m, 2H), 7.00-7.09 (m, 8H), 6.62 (m, 2H), 6.52 (d, 2H), 6.43-6.47 (m, 4H)

Synthesis Example 14: Synthesis of Compound 48

3.4 g of Compound 48 (Yield: 88%) was synthesized in the same manner as in Synthesis Example 11, except that 2-bromo-dibenzofuran-3-ol and Intermediate 1-14, instead of 2-iodo-dibenzothiophene-3-ol and Intermediate 1-4, were used in synthesizing Intermediate 1-e, and Intermediate 2-16, instead of Intermediate 2-11, was used in synthesizing Intermediate 1-g. This compound was identified using LC-MS and NMR.

$C_{59}H_{39}N_5O$: M+ 834.32

1H NMR (CDCl3, 400 MHz) δ (ppm) 8.99 (d, 1H), 8.93 (s, 1H), 8.81 (s, 1H), 8.55 (d, 1H), 8.34 (s, 1H), 8.14 (s, 1H), 8.10 (d, 1H), 7.97 (d, 1H), 7.93 (s, 1H), 7.77 (s, 1H), 7.55 (d, 1H), 7.40-7.51 (m, 10H), 7.30-7.35 (m, 6H), 7.19-7.23 (m, 4H), 7.08-7.13 (m, 2H), 7.00 (m, 1H)

Synthesis Example 15: Synthesis of Compound 52

3.4 g of Compound 52 (Yield: 90%) was synthesized in the same manner as in Synthesis Example 11, except that Intermediate 1-17, instead of Intermediate 1-4, was used in synthesizing Intermediate 1-e, and Intermediate 2-18, instead of Intermediate 2-11, was used in synthesizing Intermediate 1-g. This compound was identified using LC-MS and NMR.

$C_{40}H_{25}NS_2$: M+ 584.14

1H NMR (CDCl3, 400 MHz) δ (ppm) 8.93 (s, 1H), 8.68 (d, 1H), 8.12 (s, 1H), 7.93 (s, 1H), 7.86-7.90 (d, 2H), 7.78-7.83 (m, 2H), 7.30-7.38 (m, 5H), 7.00-7.08 (m, 5H), 6.62 (m, 2H), 6.45-6.50 (m, 4H)

Synthesis Example 16: Synthesis of Compound 54

2.2 g of Compound 54 (Yield: 87%) was synthesized in the same manner as in Synthesis Example 11, except that 2-bromo-dibenzofuran-3-ol and Intermediate 1-16, instead of 2-iodo-dibenzothiophene-3-ol and Intermediate 1-4, were used in synthesizing Intermediate 1-e, and Intermediate 2-12, instead of Intermediate 2-11, was used in synthesizing Intermediate 1-g. This compound was identified using LC-MS and NMR.

$C_{37}H_{22}N_2S$: M+ 511.17

1H NMR (CDCl3, 400 MHz) δ (ppm) 8.95 (s, 1H), 8.90 (d, 1H), 8.81 (s, 1H), 8.55 (d, 1H), 8.10 (s, 2H), 7.90-7.95

(m, 3H), 7.40-7.55 (m, 6H), 7.19 (m, 1H), 7.13 (m, 1H), 7.07-7.10 (m, 2H), 7.00-7.05 (m, 2H)

Synthesis Example 17: Synthesis of Compound 58

Compound 58 was synthesized according to Reaction Scheme 4 below:

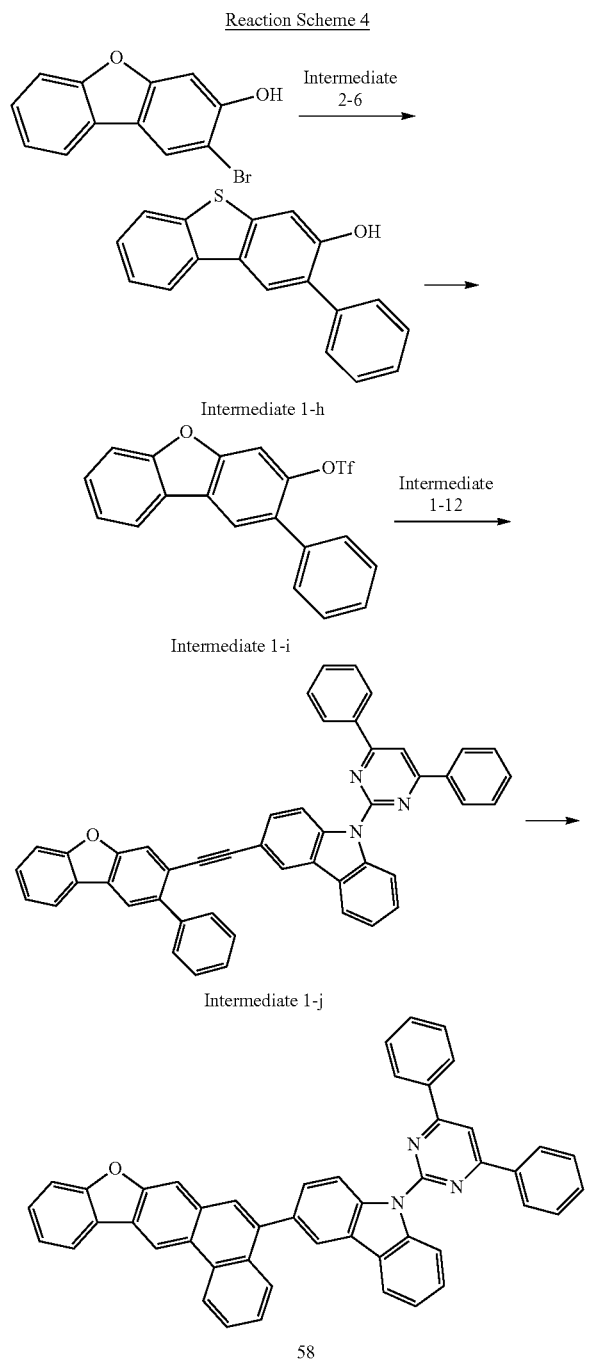

Synthesis of Intermediate 1-h 8 g of 2-bromo-dibenzofuran-3-ol, 4.5 g (1.2 eq) of Intermediate 2-6, 2.4 g (0.07 eq) of Pd(PPh$_3$)$_4$, and 7.1 g (1.7 eq) of K$_2$CO$_3$ were mixed with 90 ml of THF and 45 mL of distilled water to obtain a mixture, which was heated to about 70° C. and stirred for about 24 hours under reflux. The resulting mixture was cooled to room temperature and then extracted three times with 100 mL of water and 100 mL of diethylether. The organic layer was collected and dried using magnesium sulfate to evaporate the solvent. The residue was separated and purified using silica gel column chromatography to obtain 4.1 g of Intermediate 1-h (Yield: 52%). This compound was identified using LC-MS.

$C_{18}H_{12}O_2$: M+ 261.08

Synthesis of Intermediate 1-i

After 4.1 g of Intermediate 1-h and 3.8 mL (3 eq) of puridine were mixed with 60 mL of CH$_2$Cl$_2$, 4.0 mL (1.5 eq) of trifluoromethane sulfonic anhydride was slowly dropwise added thereto at about 0° C. in a cooling bath, and stirred at room temperature for about 2 hours. The resulting mixture was neutralized with 1N HCl, and then extracted three times with 100 ml of water and 100 ml of CH$_2$Cl$_2$. The organic layer was collected and dried using magnesium sulfate to evaporate the solvent. The residue was separated and purified using silica gel column chromatography to obtain 5.1 g of Intermediate 1-i (Yield: 83%). This compound was identified using LC-MS.

$C_{19}H_{11}F_3O_4S$: M+ 393.03

Synthesis of Intermediate 1-j 5.1 g (1 eq) of Intermediate 1-i, 182 mg (0.02 eq) of bis(chloro(triphenylphosphine))palladium (PdCl$_2$(PPh$_3$)$_2$), 146 mg (0.06 eq) of CuI were mixed together in a flask, which was then supplied with N$_2$ gas in a vacuum, followed by an addition of 40 mL of THF into the mixture and stirring. Afterward, 15 mL (8 eq) of triethylamine and 8.2 g (1.5 eq) of Intermediate 1-12 were slowly dropwise added thereto and stirred in N$_2$ atmosphere at room temperature for about 8 hours. The resulting product was evaporated using a rotary evaporator to remove the solvent. After an addition of 100 mL of water, the reaction solution was extracted three times with 100 mL of ethylether. The organic layer was collected and dried using magnesium sulfate to evaporate the solvent. The residue was separated and purified using silica gel column chromatography to obtain 5.1 g of Intermediate 1-j (Yield: 60%). This compound was identified using LC-MS.

$C_{48}H_{29}N_3O$: M+ 664.23

Synthesis of Compound 58

After 5.1 g of Intermediate 1-j was dissolved in 500 mL of methylene chloride, 23 mL (40 eq) of trifluoroacetic acid was slowly dropwise added thereto and stirred slowly at room temperature for about 1 hour. After completion of the reaction, the reaction solution was extracted three times with 100 mL of water and 100 mL of diethyleter. The organic layer was collected and dried using magnesium sulfate to evaporate the solvent. The residue was separated and purified using silica gel column chromatography to obtain 6.7 g of Compound 58 (Yield: 88%). This compound was identified using LC-MS and NMR.

$C_{38}H_{25}NO$: M+ 664.23

1H NMR (CDCl3, 400 MHz) δ (ppm) 8.95 (s, 1H), 8.92 (d, 1H), 8.15 (s, 1H), 8.11 (d, 1H), 7.88-7.92 (m, 2H), 7.77-7.82 (m, 3H), 7.46-7.55 (m, 7H), 7.40-7.43 (m, 2H), 7.30-7.35 (m, 5H), 7.19-7.24 (m, 3H), 7.08-7.13 (m, 2H), 7.00 (m, 1H)

Synthesis Example 18: Synthesis of Compound 59

3.5 g of Compound 59 (Yield: 89%) was synthesized in the same manner as in Synthesis Example 17, except that 2-iodo-dibenzothiophene-3-ol, instead of 2-bromo-dibenzofuran-3-ol, was used in synthesizing Intermediate 1-h, and Intermediate 1-3, instead of Intermediate 1-12, was used in synthesizing Intermediate 1-j. This compound was identified using LC-MS and NMR.

$C_{38}H_{25}NS$: M+ 528.17

1H NMR (CDCl3, 400 MHz) δ (ppm) 8.95 (s, 1H), 8.91 (d, 1H), 8.12 (s, 1H), 8.09 (d, 1H), 7.86-7.93 (m, 3H), 7.78-7.82 (m, 2H), 7.30-7.35 (m, 2H), 7.20-7.25 (m, 2H), 7.00-7.10 (m, 4H), 6.60-6.64 (m, 2H), 6.45-6.52 (m, 6H)

Synthesis Example 19: Synthesis of Compound 61

3.6 g of Compound 61 (Yield: 90%) was synthesized in the same manner as in Synthesis Example 17, except that 2-iodo-dibenzothiophene-3-ol, instead of 2-bromo-dibenzofuran-3-ol, was used in synthesizing Intermediate 1-h, and Intermediate 1-13, instead of Intermediate 1-12, was used in synthesizing Intermediate 1-j. This compound was identified using LC-MS and NMR.

$C_{50}H_{31}NS$: M+ 678.22

1H NMR (CDCl3, 400 MHz) δ (ppm) 8.94 (s, 1H), 8.90 (d, 1H), 8.15 (s, 1H), 8.10 (d, 1H), 7.86-7.93 (m, 3H), 7.77-7.2 (m, 4H), 7.43-7.55 (m, 9H), 7.30-7.35 (m, 4H), 7.20-7.23 (m, 2H), 7.00-7.05 (m, 2H)

Synthesis Example 20: Synthesis of Compound 63

3.3 g of Compound 63 (Yield: 89%) was synthesized in the same manner as in Synthesis Example 17, except that Intermediate 2-8, instead of Intermediate 2-6, was used in synthesizing Intermediate 1-h, and Intermediate 1-17, instead of Intermediate 1-12, was used in synthesizing Intermediate 1-j. This compound was identified using LC-MS and NMR.

$C_{37}H_{24}OS$: M+ 517.15

1H NMR (CDCl3, 400 MHz) δ (ppm) 8.93 (s, 1H), 8.86 (s, 1H), 8.26 (s, 1H), 8.12 (s, 1H), 8.06 (d, 1H), 7.93 (s, 1H), 7.90 (d, 1H), 7.85 (d, 1H), 7.61 (d, 1H), 7.42-7.49 (m, 3H), 7.30-7.35 (m, 2H), 7.24 (m, 1H), 7.19 (m, 1H), 7.13 (m, 1H)

Synthesis Example 21: Synthesis of Compound 66

2.7 g of Compound 66 (Yield: 91%) was synthesized in the same manner as in Synthesis Example 17, except that Intermediate 2-12, instead of Intermediate 2-6, was used in synthesizing Intermediate 1-h, and Intermediate 1-4, instead of Intermediate 1-12, was used in synthesizing Intermediate 1-j. This compound was identified using LC-MS and NMR.

$C_{50}H_{30}N_2O$: M+ 675.24

1H NMR (CDCl3, 400 MHz) δ (ppm) 8.95 (s, 1H), 8.90 (d, 1H), 8.13 (s, 1H), 8.10 (s, 1H), 7.90-7.95 (m, 2H), 7.77 (s, 1H), 7.55-7.60 (m, 3H), 7.46-7.49 (m, 2H), 7.40-7.45 (m, 4H), 7.30-7.37 (m, 6H), 7.08-7.15 (m, 5H), 7.00-7.05 (m, 3H)

Synthesis Example 22: Synthesis of Compound 68

2.5 g of Compound 68 (Yield: 87%) was synthesized in the same manner as in Synthesis Example 17, except that Intermediate 2-14, instead of Intermediate 2-6, was used in synthesizing Intermediate 1-h, and Intermediate 1-16, instead of Intermediate 1-12, was used in synthesizing Intermediate 1-j. This compound was identified using LC-MS and NMR.

$C_{37}H_{23}NO$: M+ 498.18

1H NMR (CDCl3, 400 MHz) δ (ppm) 9.11 (s, 1H), 8.93 (s, 1H), 8.81 (s, 1H), 8.55 (d, 1H), 8.26 (s, 1H), 8.12 (s, 1H), 7.93-7.97 (m, 2H), 7.42-7.49 (m, 7H), 7.30-7.35 (m, 4H), 7.19-7.22 (m, 4H)

Synthesis Example 23: Synthesis of Compound 71

3.1 g of Compound 71 (Yield: 90%) was synthesized in the same manner as in Synthesis Example 17, except that Intermediate 2-16, instead of Intermediate 2-6, was used in synthesizing Intermediate 1-h, and Intermediate 1-7, instead of Intermediate 1-12, was used in synthesizing Intermediate 1-j. This compound was identified using LC-MS and NMR.

$C_{37}H_{21}NOS$ M+528.13

1H NMR (CDCl3, 400 MHz) δ (ppm) 8.99 (d, 1H), 8.93 (s, 1H), 8.81 (s, 1H), 8.55 (d, 1H), 8.34 (s, 1H), 8.10-8.12 (m, 2H), 7.93-7.97 (m, 2H), 7.86 (d, 1H), 7.78 (d, 1H), 7.71 (d, 1H), 7.49 (d, 1H), 7.39-7.44 (m, 3H), 7.31-7.34 (m, 2H), 7.19 (m, 1H), 7.13 (m, 1H)

Synthesis Example 24: Synthesis of Compound 73

2.6 g of Compound 73 (Yield: 89%) was synthesized in the same manner as in Synthesis Example 17, except that 2-iodo-dibenzothiophene-3-ol and Intermediate 2-15, instead of 2-bromo-dibenzofuran-3-ol and Intermediate 2-6, were used in synthesizing Intermediate 1-h, and Intermediate 1-4, instead of Intermediate 1-12, was used in synthesizing Intermediate 1-j. This compound was identified using LC-MS and NMR.

$C_{44}H_{27}NS$: M+ 602.19

1H NMR (CDCl3, 400 MHz) δ (ppm) 8.95 (d, 1H), 8.93 (s, 1H), 8.16 (d, 1H), 8.12 (s, 1H), 7.86 (d, 1H), 7.80 (s, 1H), 7.77 (s, 1H), 7.70-7.75 (m, 2H), 7.55 (d, 1H), 7.40-7.46 (m, 4H), 7.30-7.38 (m, 8H), 7.22 (m, 1H), 7.03-7.08 (m, 2H)

Intermediates 2-19 to 2-37, and Intermediates 1-18 to 1-19

R₂B(OH)₂

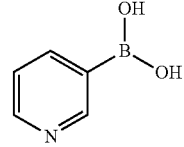

Intermediate 2-19

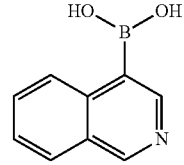

Intermediate 2-20

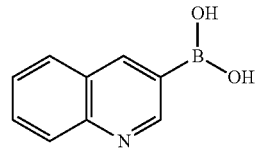

Intermediate 2-21

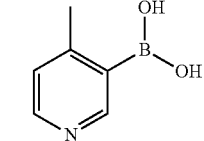

Intermediate 2-22

Intermediate 2-23
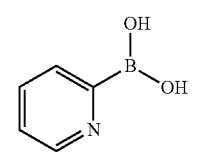
Intermediate 2-24
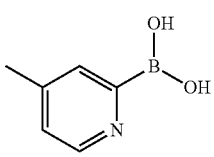
Intermediate 2-25
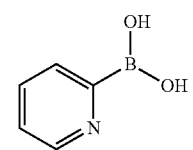
Intermediate 2-26
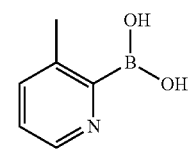
Intermediate 2-27
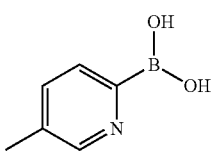
Intermediate 2-28
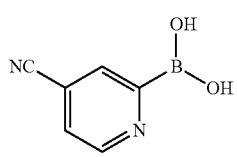
Intermediate 2-29
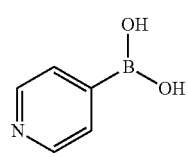
Intermediate 2-30
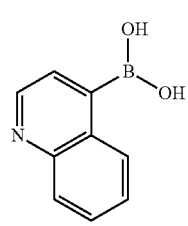
Intermediate 2-31
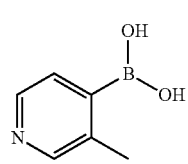
Intermediate 2-32
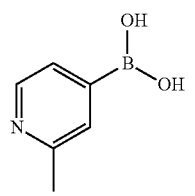
Intermediate 2-33
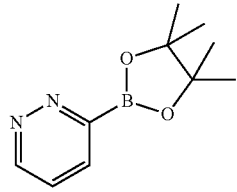
Intermediate 2-34
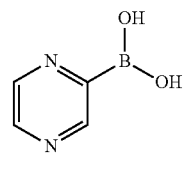
Intermediate 2-35
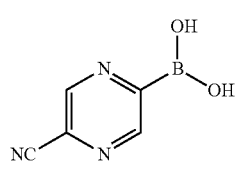
Intermediate 2-36
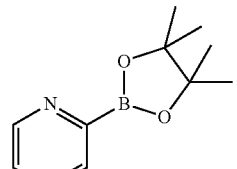
Intermediate 2-37
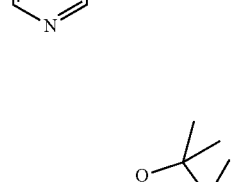
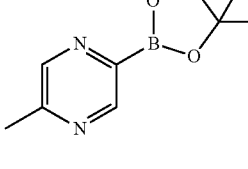
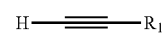
Intermediate 1-18
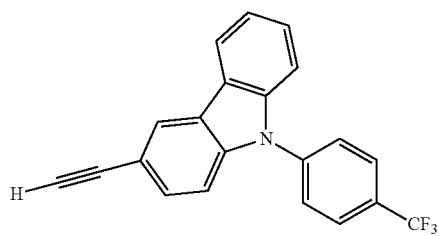

Intermediate 1-19

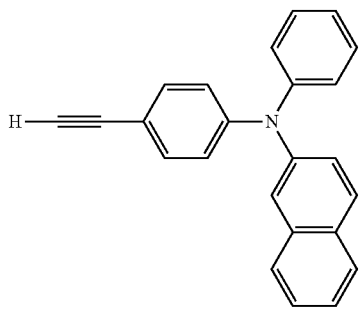

Synthesis Example 25: Synthesis of Compound 105

3.5 g of Compound 105 (Yield: 90%) was synthesized in the same manner as in Synthesis Example 17, except that Intermediate 2-22, instead of Intermediate 2-6, was used in synthesizing Intermediate 1-h, and Intermediate 1-14, instead of Intermediate 1-12, was used in synthesizing Intermediate 1-j. This compound was identified using LC-MS and NMR.

$C_{47}H_{29}N_5O$: M+ 680.24

1H NMR (CDCl3, 400 MHz) δ (ppm) 8.68 (d, 1H), 7.77 (s, 1H), 7.46-7.55 (m, 8H), 7.40-7.45 (m, 3H), 7.30-7.35 (m, 5H), 7.19-7.22 (m, 3H), 7.13 (m, 1H), 7.08 (m, 1H), 7.04 (d, 1H), 7.00 (m, 1H), 2.37 (s, 3H)

Synthesis Example 26: Synthesis of Compound 106

2.7 g of Compound 106 (Yield: 88%) was synthesized in the same manner as in Synthesis Example 17, except that Intermediate 2-20, instead of Intermediate 2-6, was used in synthesizing Intermediate 1-h, and Intermediate 1-6, instead of Intermediate 1-12, was used in synthesizing Intermediate 1-j. This compound was identified using LC-MS and NMR.

$C_{41}H_{24}N_2O$: M+ 531.19

1H NMR (CDCl3, 400 MHz) δ (ppm) 8.05 (d, 1H), 8.00 (s, 1H), 7.83 (s, 1H), 7.64-7.68 (m, 2H), 7.55 (d, 1H), 7.40-7.49 (m, 6H), 7.36 (d, 1H), 7.24-7.33 (m, 7H), 7.08-7.14 (m, 4H), 7.00 (m, 1H)

Synthesis Example 27: Synthesis of Compound 111

2.9 g of Compound 111 (Yield: 91%) was synthesized in the same manner as in Synthesis Example 17, except that 2-iodo-dibenzothiophene-3-ol and Intermediate 2-29, instead of 2-bromo-dibenzofuran-3-ol and Intermediate 2-6, were used in synthesizing Intermediate 1-h, and Intermediate 1-11, instead of Intermediate 1-12, was used in synthesizing Intermediate 1-j. This compound was identified using LC-MS and NMR.

$C_{31}H_{17}NOS$: M+ 452.10

1H NMR (CDCl3, 400 MHz) δ (ppm) 9.15 (s, 1H), 8.45 (d, 1H), 7.86 (s, 2H), 7.75-7.79 (m, 2H), 7.73 (s, 1H), 7.71 (s, 1H), 7.47-7.50 (m, 2H), 7.40-7.44 (m, 2H), 7.31-7.34 (m, 2H), 7.19 (m, 1H), 7.13 (m, 1H)

Synthesis Example 28: Synthesis of Compound 113

3.5 g of Compound 113 (Yield: 87%) was synthesized in the same manner as in Synthesis Example 17, except that Intermediate 2-24, instead of Intermediate 2-6, was used in synthesizing Intermediate 1-h, and Intermediate 1-16, instead of Intermediate 1-12, was used in synthesizing Intermediate 1-j. This compound was identified using LC-MS and NMR.

$C_{25}H_{16}N_2O$: M+ 361.13

1H NMR (CDCl3, 400 MHz) δ (ppm) 8.81 (s, 1H), 8.68 (d, 1H), 8.55 (d, 1H), 7.97 (d, 1H), 7.64 (s, 1H), 7.42-7.49 (m, 5H), 7.19 (m, 1H), 7.13 (m, 1H), 7.04 (m, 1H)

Synthesis Example 29: Synthesis of Compound 115

4.0 g of Compound 115 (Yield: 89%) was synthesized in the same manner as in Synthesis Example 17, except that Intermediate 2-34, instead of Intermediate 2-6, was used in synthesizing Intermediate 1-h, and Intermediate 1-14, instead of Intermediate 1-12, was used in synthesizing Intermediate 1-j. This compound was identified using LC-MS and NMR.

$C_{45}H_{26}N_6O$: M+ 667.22

1H NMR (CDCl3, 400 MHz) δ (ppm) 8.74 (d, 2H), 7.90 (s, 1H), 7.77 (s, 1H), 7.46-7.55 (m, 8H), 7.40-7.43 (m, 3H), 7.30-7.36 (m, 5H), 7.13-7.22 (m, 4H), 7.08 (m, 1H), 7.00 (m, 1H)

Synthesis Example 30: Synthesis of Compound 118

2.8 g of Compound 118 (Yield: 89%) was synthesized in the same manner as in Synthesis Example 17, except that Intermediate 2-32, instead of Intermediate 2-6, was used in synthesizing Intermediate 1-h, and Intermediate 1-3, instead of Intermediate 1-12, was used in synthesizing Intermediate 1-j. This compound was identified using LC-MS and NMR.

$C_{38}H_{26}N_2O$: M+ 527.20

1H NMR (CDCl3, 400 MHz) δ (ppm) 9.90 (s, 1H), 7.68 (s, 1H), 7.52 (s, 1H), 7.49 (d, 1H), 7.45 (s, 1H), 7.42 (d, 1H), 7.29 (s, 1H), 7.23 (d, 2H), 7.15-7.19 (m, 2H), 7.00-7.06 (m, 3H), 6.60-6.65 (m, 2H), 6.52 (d, 2H), 6.45-6.50 (m, 4H), 2.55 (s, 3H)

Synthesis Example 31: Synthesis of Compound 120

3.3 g of Compound 120 (Yield: 90%) was synthesized in the same manner as in Synthesis Example 17, except that Intermediate 2-33, instead of Intermediate 2-6, was used in synthesizing Intermediate 1-h, and Intermediate 1-4, instead of Intermediate 1-12, was used in synthesizing Intermediate 1-j. This compound was identified using LC-MS and NMR.

$C_{36}H_{21}N_3O$: M+ 517.15

1H NMR (CDCl3, 400 MHz) δ (ppm) 9.10 (d, 1H), 7.73-78 (m, 3H), 7.48-7.54 (m, 4H), 7.40-7.43 (m, 3H), 7.30-7.36 (m, 6H), 7.15-7.19 (m, 2H), 7.00-7.05 (m, 2H)

Synthesis Example 32: Synthesis of Compound 122

3.3 g of Compound 122 (Yield: 88%) was synthesized in the same manner as in Synthesis Example 17, except that 2-iodo-dibenzothiophene-3-ol and Intermediate 2-35, instead of 2-bromo-dibenzofuran-3-ol and intermediate 2-6, were used in synthesizing Intermediate 1-h, and Intermediate 1-7, instead of Intermediate 1-12, was used in synthesizing Intermediate 1-j. This compound was identified using LC-MS and NMR.

$C_{31}H_{15}N_3S_2$: M+ 494.07

1H NMR (CDCl3, 400 MHz) δ (ppm) 8.70 (s, 1H), 7.85-7.89 (m, 3H), 7.78-7.81 (m, 3H), 7.53 (d, 1H), 7.39 (m, 1H), 7.30-7.33 (m, 2H)

Synthesis Example 33: Synthesis of Compound 123

3.5 g of Compound 123 (Yield: 90%) was synthesized in the same manner as in Synthesis Example 17, except that 2-iodo-dibenzothiophene-3-ol and Intermediate 2-34, instead of 2-bromo-dibenzofuran-3-ol and Intermediate 2-6, were used in synthesizing Intermediate 1-h, and Intermediate 1-3, instead of Intermediate 1-12, was used in synthesizing Intermediate 1-j. This compound was identified using LC-MS and NMR.

$C_{36}H_{23}N_3S$: M+ 530.16

1H NMR (CDCl3, 400 MHz) δ (ppm) 8.74 (d, 2H), 7.86-7.89 (m, 3H), 7.78-7.80 (m, 2H), 7.31-7.33 (m, 2H), 7.23-7.25 (m, 2H), 7.01-7.05 (m, 4H), 6.62-6.65 (m, 2H), 6.46-6.52 (m, 6H)

Synthesis Example 34: Synthesis of Compound 127

3.0 g of Compound 127 (Yield: 86%) was synthesized in the same manner as in Synthesis Example 17, except that Intermediate 2-28, instead of Intermediate 2-6, was used in synthesizing Intermediate 1-h, and Intermediate 1-4, instead of Intermediate 1-12, was used in synthesizing Intermediate 1-j. This compound was identified using LC-MS and NMR.

$C_{38}H_{21}N_3O$: M+ 536.17

1H NMR (CDCl3, 400 MHz) δ (ppm) 8.93 (d, 1H), 7.94 (s, 1H), 7.74 (d, 1H), 7.46-7.55 (m, 4H), 7.40-7.43 (m, 3H), 7.30-7.37 (m, 6H), 7.15-7.19 (m, 2H), 7.05-7.09 (m, 2H)

Synthesis Example 35: Synthesis of Compound 129

3.2 g of Compound 129 (Yield: 89%) was synthesized in the same manner as in Synthesis Example 17, except that 2-iodo-dibenzothiophene-3-ol and Intermediate 2-31, instead of 2-bromo-dibenzofuran-3-ol and Intermediate 2-6, were used in synthesizing Intermediate 1-h, and Intermediate 1-7, instead of Intermediate 1-12, was used in synthesizing Intermediate 1-j. This compound was identified using LC-MS and NMR.

$C_{32}H_{19}NS_2$: M+ 482.10

1H NMR (CDCl3, 400 MHz) δ (ppm) 8.99 (s, 1H), 8.23 (s, 1H), 7.78-7.86 (m, 6H), 7.74 (d, 1H), 7.69 (s, H), 7.53 (d, 1H), 7.39 (m, 1H), 7.31-7.34 (m, 3H)

Synthesis Example 36: Synthesis of Compound 131

3.3 g of Compound 131 (Yield: 90%) was synthesized in the same manner as in Synthesis Example 17, except that Intermediate 2-35, instead of Intermediate 2-6, was used in synthesizing Intermediate 1-h, and Intermediate 1-6, instead of Intermediate 1-12, was used in synthesizing Intermediate 1-j. This compound was identified using LC-MS and NMR.

$C_{37}H_{20}N_4O$: M+ 537.16

1H NMR (CDCl3, 400 MHz) δ (ppm) 8.75 (s, 1H), 7.95 (s, 1H), 7.55 (d, 1H), 7.40-7.48 (m, 5H), 7.36 (d, 1H), 7.28-7.34 (m, 5H), 7.22 (d, 1H), 7.15-7.19 (m, 3H), 7.04-7.08 (m, 2H)

Synthesis Example 37: Synthesis of Compound 133

3.3 g of Compound 1339 (Yield: 90%) was synthesized in the same manner as in Synthesis Example 17, except that 2-iodo-dibenzothiophene-3-ol and Intermediate 2-29, instead of 2-bromo-dibenzofuran-3-ol and Intermediate 2-6, were used in synthesizing Intermediate 1-h, and Intermediate 1-3, instead of Intermediate 1-12, was used in synthesizing Intermediate 1-j. This compound was identified using LC-MS and NMR.

$C_{37}H_{24}N_2S$: M+ 529.17

1H NMR (CDCl3, 400 MHz) δ (ppm) 9.15 (s, 1H), 8.45 (d, 1H), 7.88 (s, 1H), 7.86 (d, 1H), 7.72-7.78 (m, 3H), 7.50 (d, 1H), 7.31-7.34 (m, 2H), 7.23 (d, 2H), 7.00-7.06 (m, 4H), 6.62-6.65 (m, 2H), 6.52-6.59 (m, 2H), 6.46-6.50 (m, 4H)

Synthesis Example 38: Synthesis of Compound 136

3.2 g of Compound 136 (Yield: 91%) was synthesized in the same manner as in Synthesis Example 11, except that 2-bromo-dibenzofuran-3-ol and Intermediate 1-17, instead of 2-iodo-dibenzothiophene-3-ol and Intermediate 1-4, were used in synthesizing Intermediate 1-e, and Intermediate 2-23, instead of Intermediate 2-11, was used in synthesizing Intermediate 1-g. This compound was identified using LC-MS and NMR.

$C_{27}H_{15}NOS$: M+ 402.09

1H NMR (CDCl3, 400 MHz) δ (ppm) 8.81 (s, 1H), 8.00 (d, 1H), 7.95 (d, 1H), 7.83 (d, 1H), 7.65 (s, 1H), 7.45-7.49 (m, 2H), 7.40-7.45 (m, 3H), 7.25-7.30 (m, 3H), 7.13-7.19 (m, 2H)

Synthesis Example 39: Synthesis of Compound 139

3.2 g of Compound 139 (Yield: 91%) was synthesized in the same manner as in Synthesis Example 11, except that Intermediate 2-28, instead of Intermediate 2-11, was used in synthesizing Intermediate 1-g. This compound was identified using LC-MS and NMR.

$C_{38}H_{21}N_3S$: M+ 552.15

1H NMR (CDCl3, 400 MHz) δ (ppm) 8.93 (s, 1H). 7.94 (s, 1H), 7.85-7.83 (m, 2H), 7.74-7.79 (m, 4H), 7.55 (d, 1H), 7.46 (d, 1H), 7.40 (d, 1H), 7.30-7.39 (m, 8H), 7.08 (m, 1H), 7.00 (m, 1H)

Synthesis Example 40: Synthesis of Compound 142

3.5 g of Compound 142 (Yield: 90%) was synthesized in the same manner as in Synthesis Example 11, except that 2-bromo-dibenzofuran-3-ol and Intermediate 2-19, instead of 2-iodo-dibenzothiophene-3-ol and Intermediate 1-4, were used in synthesizing Intermediate 1-e, and Intermediate 2-19, instead of Intermediate 2-11, was used in synthesizing Intermediate 1-g. This compound was identified using LC-MS and NMR.

$C_{32}H_{24}N_2O$: M+ 513.19

1H NMR (CDCl3, 400 MHz) δ (ppm) 9.15 (s, 1H), 8.45 (d, 1H), 7.79 (s, 1H), 7.42-7.50 (m, 5H), 7.15-7.22 (m, 4H), 7.01-7.06 (m, 4H), 6.60-6.65 (m, 2H), 6.46-6.64 (m, 6H)

Synthesis Example 41: Synthesis of Compound 144

3.2 g of Compound 144 (Yield: 90%) was synthesized in the same manner as in Synthesis Example 11, except that 2-bromo-dibenzofuran-3-ol and Intermediate 1-7, instead of 2-iodo-dibenzothiophene-3-ol and Intermediate 1-4, were used in synthesizing Intermediate 1-e, and Intermediate 2-32, instead of Intermediate 2-11, was used in synthesizing Intermediate 1-g. This compound was identified using LC-MS and NMR.

$C_{32}H_{19}NOS$: M+ 466.12

1H NMR (CDCl3, 400 MHz) δ (ppm) 9.09 (s, 1H), 7.86 (d, 1H), 7.68-7.74 (m, 3H), 7.40-7.49 (m, 6H), 7.29-7.32 (m, 2H), 7.19 (m, 1H), 7.13 (m, 1H)

Synthesis Example 42: Synthesis of Compound 146

3.0 g of Compound 146 (Yield: 89%) was synthesized in the same manner as in Synthesis Example 11, except that 2-bromo-dibenzofuran-3-ol and Intermediate 1-12, instead of 2-iodo-dibenzothiophene-3-ol and Intermediate 1-4, were used in synthesizing Intermediate 1-e, and Intermediate 2-30, instead of Intermediate 2-11, was used in synthesizing Intermediate 1-g. This compound was identified using LC-MS and NMR.

$C_{50}H_{29}N_5O$: M+ 716.24

1H NMR (CDCl3, 400 MHz) δ (ppm) 8.81 (s, 1H), 8.05 (d, 1H), 7.68-7.72 (m, 3H). 7.46-7.52 (m, 8H), 7.40-7.43 (m, 4H), 7.30-7.35 (m, 5H), 7.19 (m, 1H), 7.13 (m, 1H), 7.03-7.06 (m, 2H)

Synthesis Example 43: Synthesis of Compound 149

2.8 g of Compound 149 (Yield: 88%) was synthesized in the same manner as in Synthesis Example 11, except that Intermediate 1-19, instead of Intermediate 1-4, was used in synthesizing Intermediate 1-e, and Intermediate 2-6, instead of Intermediate 2-11, was used in synthesizing Intermediate 1-g. This compound was identified using LC-MS and NMR.

$C_{42}H_{27}NS$: M+ 578.19

1H NMR (CDCl3, 400 MHz) δ (ppm) 8.95 (s, 1H), 8.92 (d, 1H), 8.10-8.12 (m, 2H), 7.82-7.88 (m, 5H), 7.44-7.51 (m, 3H), 7.30-7.33 (m, 2H), 7.20-7.25 (m, 3H), 7.09 (m, 1H), 7.00-7.05 (m, 2H), 6.76-6.79 (m, 2H), 6.62 (m, 1H), 6.46-6.52 (m, 4H)

Synthesis Example 44: Synthesis of Compound 152

2.5 g of Compound 152 (Yield: 90%) was synthesized in the same manner as in Synthesis Example 11, except that Intermediate 1-18, instead of Intermediate 1-4, was used in synthesizing Intermediate 1-e, and Intermediate 2-36, instead of Intermediate 2-11, was used in synthesizing Intermediate 1-g. This compound was identified using LC-MS and NMR.

$C_{37}H_{20}F_3N_3S$ M+596.13

1H NMR (CDCl3, 400 MHz) δ (ppm) 8.73-8.75 (d, 2H), 7.86-7.90 (m, 3H), 7.77-7.80 (m, 3H), 7.55 (d, 1H), 7.45-7.49 (m, 4H), 7.30-7.32 (m, 2H), 7.25-7.28 (m, 2H), 7.08 (m, 1H), 7.00 (m, 1H)

Synthesis Example 45: Synthesis of Compound 153

3.3 g of Compound 153 (Yield: 90%) was synthesized in the same manner as in Synthesis Example 11, except that Intermediate 1-6, instead of Intermediate 1-4, was used in synthesizing Intermediate 1-e, and Intermediate 2-35, instead of Intermediate 2-11, was used in synthesizing Intermediate 1-g. This compound was identified using LC-MS and NMR.

$C_{37}H_{20}N_4S$: M+ 553.14

1H NMR (CDCl3, 400 MHz) δ (ppm) 8.78 (s, 1H), 7.86-7.90 (m, 3H), 7.78-7.82 (m, 2H), 7.55 (d, 1H), 7.30-7.40 (m, 10H), 7.14 (m, 1H), 7.08 (m, 1H), 7.00 (m, 1H)

Synthesis Example 46: Synthesis of Compound 156

3.2 g of Compound 156 (Yield: 90%) was synthesized in the same manner as in Synthesis Example 11, except that Intermediate 1-12, instead of Intermediate 1-4, was used in synthesizing Intermediate 1-e, and Intermediate 2-34, instead of Intermediate 2-11, was used in synthesizing Intermediate 1-g. This compound was identified using LC-MS and NMR.

$C_{45}H_{26}N_6S$: M+ 683.19

1H NMR (CDCl3, 400 MHz) δ (ppm) 8.74-8.76 (d, 2H), 7.86-7.89 (m, 3H), 7.77-7.80 (m, 3H), 7.65 (d, 1H), 7.46-7.50 (m, 5H), 7.40 (d, 1H), 7.30-7.33 (m, 5H), 7.22 (m, 2H), 7.05-7.08 (m, 2H)

Synthesis Example 47: Synthesis of Compound 161

3.1 g of Compound 161 (Yield: 90%) was synthesized in the same manner as in Synthesis Example 11, except that 2-bromo-dibenzofuran-3-ol and Intermediate 1-5, instead of 2-iodo-dibenzothiophene-3-ol and Intermediate 1-4, were used in synthesizing Intermediate 1-e, and Intermediate 2-21, instead of Intermediate 2-11, was used in synthesizing Intermediate 1-g. This compound was identified using LC-MS and NMR.

$C_{41}H_{24}N_2O$: M+ 561.19

1H NMR (CDCl3, 400 MHz) δ (ppm) 8.81 (s, 1H), 8.05 (d, 1H), 7.79 ( )s, 1H), 7.61-7.65 (m, 4H), 7.55 (d, 1H), 7.42-7.49 (m, 6H), 7.30-7.38 (m, 5H), 7.13-7.19 (m, 3H), 7.04-7.08 (m, 2H)

Synthesis Example 48: Synthesis of Compound 165

3.0 g of Compound 165 (Yield: 90%) was synthesized in the same manner as in Synthesis Example 11, except that Intermediate 1-7, instead of Intermediate 1-4, was used in synthesizing Intermediate 1-e, and Intermediate 2-20, instead of Intermediate 2-11, was used in synthesizing Intermediate 1-g. This compound was identified using LC-MS and NMR.

$C_{35}H_{19}NS_2$: M+ 518.10

1H NMR (CDCl3, 400 MHz) δ (ppm) 8.81 (s, 1H), 7.83-7.89 (m, 5H), 7.077-7.80 (m, 3H), 7.70-7.74 (m, 2H), 7.50-7.54 (m, 3H), 7.33-7.38 (m, 5H)

Synthesis Example 49: Synthesis of Compound 168

3.2 g of Compound 168 (Yield: 90%) was synthesized in the same manner as in Synthesis Example 11, except that 2-bromo-dibenzofuran-3-ol, instead of 2-iodo-dibenzothiophene-3-ol, was used in synthesizing Intermediate 1-e, and Intermediate 2-35, instead of Intermediate 2-11, was used in synthesizing Intermediate 1-g. This compound was identified using LC-MS and NMR.

$C_{37}H_{20}N_4O$: M+ 537.16

1H NMR (CDCl3, 400 MHz) δ (ppm) 8.75 (s, 1H), 7.92 (s, 1H), 7.77 (s, 1H), 7.48-7.54 (m, 4H), 7.40-7.43 (m, 3H), 7.30-7.38 (m, 6H), 7.15-7.19 (m, 2H), 7.03-7.06 (m, 2H)

Example 1

To manufacture an anode, a glass substrate with deposited ITO/Ag/ITO layers (70 Å/1000 Å/70 Å) was cut to a size of 50 mm×50 mm×0.5 mm and then ultrasonicated in isopropyl alcohol and pure water each for five minutes, and then cleaned by irradiation of ultraviolet rays for 30 minutes and exposure to ozone. The resulting glass substrate was loaded into a vacuum deposition device. 2-TNATA was deposited on the anode to form an HIL having a thickness of 60 nm, and then NPB was deposited on the HIL to form a HTL having a thickness of 100 nm. Compound 8 (host) and Ir(ppy)3 (dopant) were co-deposited in a weight ratio of about 91:9 on the HTL to form an EML having a thickness of about 25 nm, followed by depositing BCP on the EML to form a HBL having a thickness of about 5 nm. After deposition of Alq3 on the HBL to form an ETL having a thickness of about 35 nm, LiF was deposited on the ETL to form an EIL having a thickness of about 1 nm, followed by co-depositing Mg and Al in a weight ratio of 9:1 on the EIL to form a cathode having a thickness of about 12 nm, thereby completing the manufacture of the organic light-emitting device.

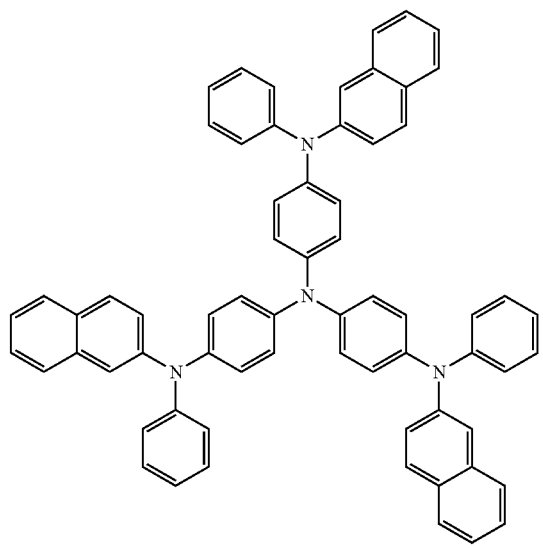

2-TNATA

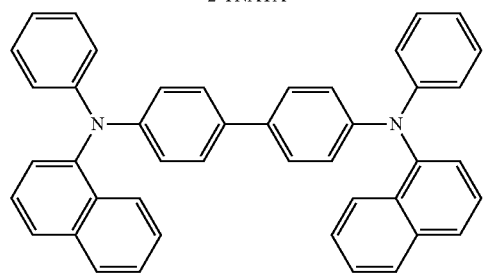

NPB

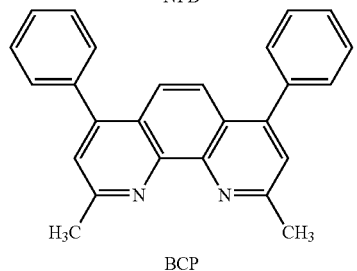

BCP

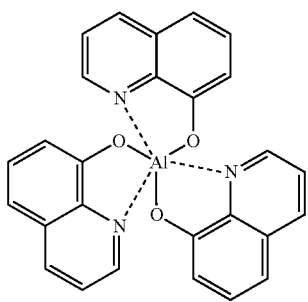

Alq₃

Example 2

An organic light-emitting device was manufactured in the same manner as in Example 1, except that Compound 9, instead of Compound 8, was used to form the EML.

Example 3

An organic light-emitting device was manufactured in the same manner as in Example 1, except that Compound 35, instead of NBP, was used to form the HTL, and CBP, instead of Compound 8, was used to form the ETL.

Comparative Example 1

An organic light-emitting device was manufactured in the same manner as in Example 1, except that CBP, instead of Compound 8, was used to form the EML.

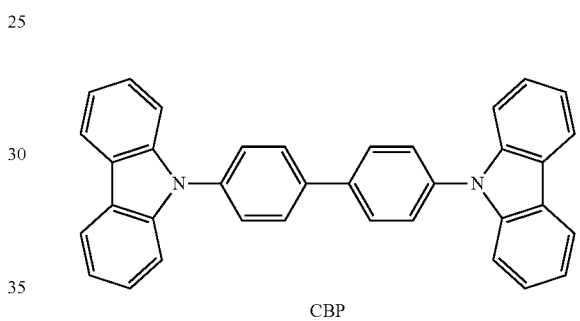

CBP

Evaluation Example 1

Driving voltages, current densities, luminances, efficiencies, color coordinates, and lifetimes ($LT_{97}$) of the organic light-emitting devices of Examples 1 to 3 and Comparative Example 1 were evaluated using the following methods. The results are shown in Tables 1 and 2 below.

Color coordinates were measured using a PR650 (Spectroscan) Source Measurement Unit. (available from Photo Research, Inc.) with a supply of power using a Kethley Source-Measure Unit (SMU 236).

Luminances were measured using a PR650 (Spectroscan) Source Measurement Unit. (available from Photo Research, Inc.) with a supply of power using a Kethley Source-Measure Unit (SMU 236).

Efficiencies were measured using a PR650 (Spectroscan) Source Measurement Unit. (available from Photo Research, Inc.) with a supply of power using a Kethley Source-Measure Unit (SMU 236).

In Table 2, LT97 lifetime indicates the time taken until an initial luminance (assumed as 100%) measured at a current density of about 10 mA/cm² is reduced to 97%.

TABLE 1

| | HTL material | Host | Dopant | Driving voltage (V) | Current density (mA/cm$^2$) | Luminance (cd/m$^2$) | Efficiency (cd/A) |
|---|---|---|---|---|---|---|---|
| Example 1 | NPB | Compound 8 | Ir(ppy)$_3$ | 5.7 | 10 | 6,523 | 65.2 |
| Example 2 | NPB | Compound 9 | Ir(ppy)$_3$ | 5.5 | 10 | 6,485 | 64.8 |
| Example 3 | Compound 35 | CBP | Ir(ppy)$_3$ | 5.4 | 10 | 6,535 | 65.3 |
| Comparative Example 1 | NPB | CBP | Ir(ppy)$_3$ | 6.8 | 10 | 4,766 | 47.7 |

TABLE 2

| | HTL material | Host material | Dopant | Emission color | Color coordinates | LT97 (hr/@ 10 mA/cm$^2$) |
|---|---|---|---|---|---|---|
| Example 1 | NPB | Compound 8 | Ir(ppy)$_3$ | Green | 0.25, 0.71 | 76 |
| Example 2 | NPB | Compound 9 | Ir(ppy)$_3$ | Green | 0.25, 0.71 | 73 |
| Example 3 | Compound 35 | CBP | Ir(ppy)$_3$ | Green | 0.24, 0.70 | 78 |
| Comparative Example 1 | NPB | CBP | Ir(ppy)$_3$ | Green | 0.25, 0.70 | 61 |

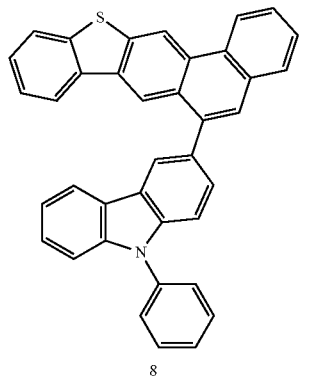 [SMILES: c1ccc(-n2c3ccccc3c3cc(-c4cc5ccccc5c5cc6sc7ccccc7c6cc45)ccc32)cc1]

8

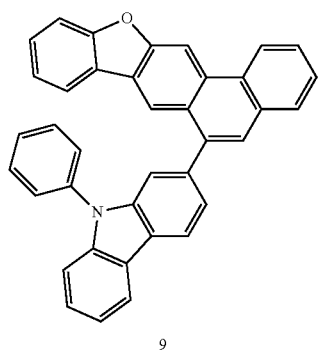 [SMILES: c1ccc(-n2c3ccccc3c3ccc(-c4cc5ccccc5c5cc6oc7ccccc7c6cc45)cc32)cc1]

9

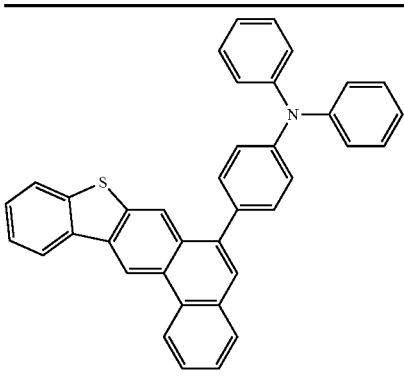

35

Referring to Tables 1 and 2, the organic light-emitting devices of Examples 1 to 3 were found to have lower driving voltages, higher efficiencies, higher luminances, higher color coordinates, and longer lifetimes, than the organic light-emitting devices of Comparative Example 1.

Example 11

To manufacture an anode, a glass substrate with deposited ITO/Ag/ITO layers (70 Å/1000 Å/70 Å) was cut to a size of 50 mm×50 mm×0.5 mm and then ultrasonicated in isopropyl alcohol and pure water each for five minutes, and then cleaned by irradiation of ultraviolet rays for 30 minutes and exposure to ozone. The resulting glass substrate was loaded into a vacuum deposition device. 2-TNATA was deposited on the anode to form an HIL having a thickness of 60 nm, and then NPB was deposited on the HIL to form a HTL having a thickness of 100 nm. Compound 105 (host) and Ir(ppy)$_3$ (dopant) were co-deposited in a weight ratio of about 91:9 on the HTL to form an EML having a thickness of about 25 nm, followed by depositing BCP on the EML to form a HBL having a thickness of about 5 nm. After deposition of Alq$_3$ on the HBL to form an ETL having a thickness of about 35 nm, LiF was deposited on the ETL to form an EIL having a thickness of about 1 nm, followed by co-depositing Mg and Al in a weight ratio of 9:1 on the EIL to form a cathode having a thickness of about 12 nm, thereby completing the manufacture of the organic light-emitting device.

Example 12

An organic light-emitting device was manufactured in the same manner as in Example 11, except that Compound 139, instead of Compound 105, was used to form the EML.

Example 13

An organic light-emitting device was manufactured in the same manner as in Example 11, except that Compound 133, instead of NPB, was used to form the HTL, and CBP, instead of Compound 105, was used as a host in forming the ETL.

Example 14

To manufacture an anode, a glass substrate with deposited ITO/Ag/ITO layers (70 Å/1000 Å/70 Å) was cut to a size of 50 mm×50 mm×0.5 mm and then ultrasonicated in isopropyl alcohol and pure water each for five minutes, and then cleaned by irradiation of ultraviolet rays for 30 minutes and exposure to ozone. The resulting glass substrate was loaded into a vacuum deposition device. 2-TNATA was deposited on the anode to form an HIL having a thickness of 60 nm, and then NPB was deposited on the HIL to form a HTL having a thickness of 135 nm. Compound 106 (host) and PtOEP (dopant) were co-deposited in a weight ratio of about 94:9 on the HTL to form an EML having a thickness of about 40 nm, followed by depositing BCP on the EML to form a HBL having a thickness of about 5 nm. After deposition of $Alq_3$ on the HBL to form an ETL having a thickness of about 35 nm, LiF was deposited on the ETL to form an EIL having a thickness of about 1 nm, followed by co-depositing Mg and Al in a weight ratio of 9:1 on the EIL to form a cathode having a thickness of about 12 nm, thereby completing the manufacture of the organic light-emitting device.

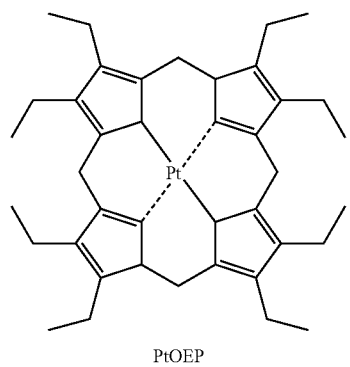

PtOEP

Example 15

An organic light-emitting device was manufactured in the same manner as in Example 14, except that Compound 156, instead of Compound 106, was used as a host in forming the EML.

Example 16

An organic light-emitting device was manufactured in the same manner as in Example 14, except that Compound 149, instead of NPB, was used to form the HTL, and CBP, instead of Compound 106, was used as a host in forming the EML.

Comparative Example 2

An organic light-emitting device was manufactured in the same manner as in Example 14, except that CBP, instead of Compound 106, was used as a host in forming the EML.

Evaluation Example 2

Driving voltages, current densities, luminances, efficiencies, color coordinates, and lifetimes ($LT_{97}$) of the organic light-emitting devices of Examples 11 to 16 and Comparative Example 2 were evaluated using the same methods as used in Evaluation Example 1. The results are shown in Tables 3 and 4 below (Date of Comparative Example 1 were also included for comparison).

TABLE 3

| | HTL material | Host | Dopant | Driving voltage (V) | Current density (mA/cm$^2$) | Luminance (cd/m$^2$) | Efficiency (cd/A) |
|---|---|---|---|---|---|---|---|
| Example 11 | NPB | Compound 105 | Ir(ppy)$_3$ | 5.7 | 10 | 6,523 | 65.2 |
| Example 12 | NPB | Compound 139 | Ir(ppy)$_3$ | 5.5 | 10 | 6,485 | 64.8 |
| Example 13 | Compound 133 | CBP | Ir(ppy)$_3$ | 5.4 | 10 | 6,535 | 65.3 |
| Example 14 | NPB | Compound 106 | PtOEP | 6.1 | 10 | 3,092 | 30.9 |
| Example 15 | NPB | Compound 156 | PtOEP | 6.0 | 10 | 2,837 | 28.3 |
| Example 16 | Compound 149 | CBP | PtOEP | 5.9 | 10 | 2,792 | 27.9 |
| Comparative Example 1 | NPB | CBP | Ir(ppy)$_3$ | 6.8 | 10 | 4,766 | 47.7 |
| Comparative Example 2 | NPB | CBP | PtOEP | 7.3 | 10 | 2,212 | 22.1 |

TABLE 4

| | HTL material | Host material | Dopant | Emission color | Color coordinates | LT97 (hr/@ 10 mA/cm$^2$) |
|---|---|---|---|---|---|---|
| Example 11 | NPB | Compound 105 | Ir(ppy)$_3$ | Green | 0.25, 0.71 | 76 |
| Example 12 | NPB | Compound 139 | Ir(ppy)$_3$ | Green | 0.25, 0.71 | 73 |
| Example 13 | Compound 133 | CBP | Ir(ppy)$_3$ | Green | 0.24, 0.70 | 78 |
| Example 14 | NPB | Compound 106 | PtOEP | Red | 0.67, 0.31 | 95 |
| Example 15 | NPB | Compound 156 | PtOEP | Red | 0.68, 0.32 | 97 |
| Example 16 | Compound 149 | CBP | PtOEP | Red | 0.66, 0.32 | 98 |
| Comparative Example 1 | NPB | CBP | Ir(ppy)$_3$ | Green | 0.25, 0.70 | 61 |

TABLE 4-continued

| | HTL material | Host material | Dopant | Emission color | Color coordinates | LT97 (hr/@ 10 mA/cm²) |
|---|---|---|---|---|---|---|
| Comparative Example 2 | NPB | CBP | PtOEP | Red | 0.67, 0.32 | 89 |

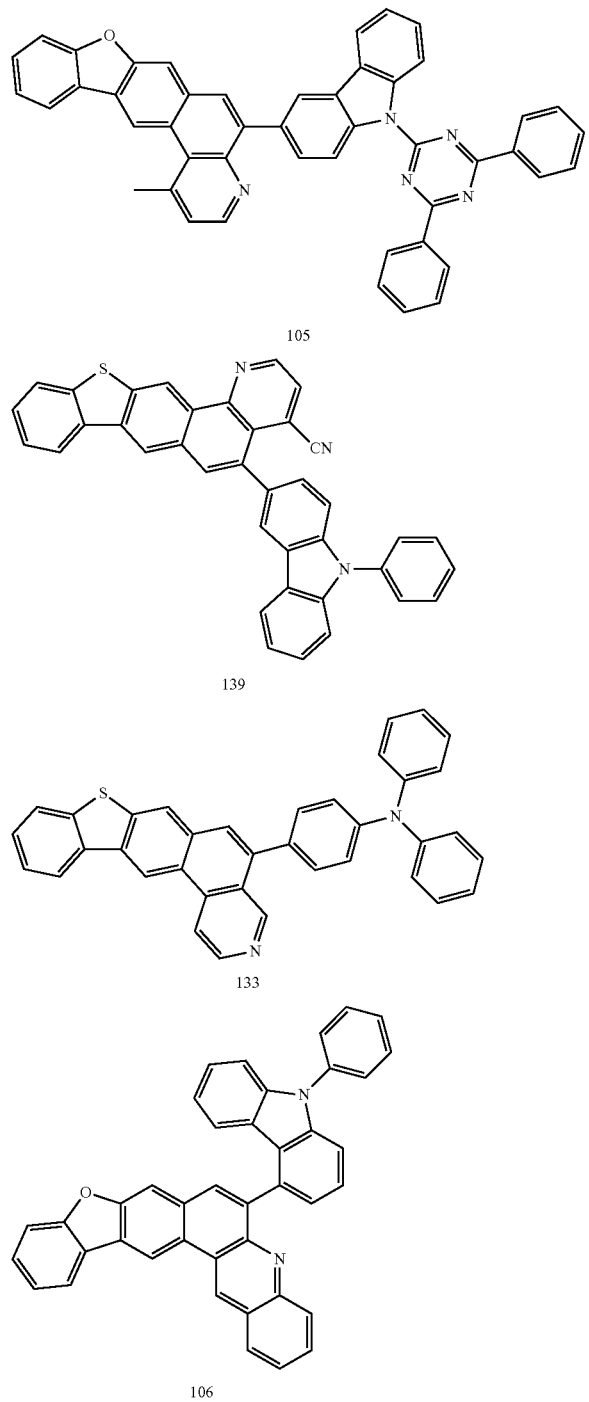

Referring to Tables 3 and 4, the organic light-emitting devices of Examples 11 to 13 were found to have lower driving voltages, higher efficiencies, higher luminances, higher color coordinates, and longer lifetimes, than the organic light-emitting device of Comparative Example 1. The organic light-emitting devices of Examples 14 to 16 were found to have lower driving voltages, higher efficiencies, higher luminances, higher color coordinates, and longer lifetimes, than the organic light-emitting device of Comparative Example 2.

As described above, according to the one or more embodiments of the present invention, an organic light-emitting device including any of the heterocyclic compounds of Formula 1 above may have a low driving voltage, a high efficiency, a high luminance, a high color purity, and a long lifetime.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A heterocyclic compound represented by Formula 1A or 1B below:

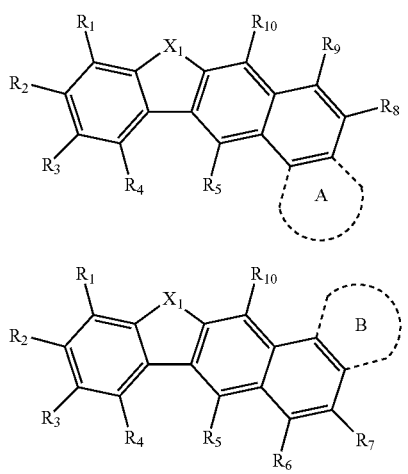

Formula 1A

Formula 1B

Wherein $X_1$ is O or S;
i) in Formula 1A, at least one of $R_5$ and $R_8$ to $R_{10}$ are a substituent represented by $-(Ar_1)_a-(Ar_{11})$ (where $Ar_{11}$ is not hydrogen when a is zero) the remaining substituents being hydrogen; or
ii) in Formula 1B, at least one of $R_5$ to $R_7$, and $R_{10}$ are a substituent represented by $-(Ar_1)_a-(Ar_{11})$ (where $Ar_{11}$ is not hydrogen when a=0) the remaining substituents being hydrogen;
the A ring and B ring are each independently selected from among:
i) cyclopropane, cyclobutane, cyclopentane, cyclohexane, cycloheptane, cyclooxane, cyclopentene, cyclopentadiene, cyclohexene, cyclohexadiene, cycloheptadiene, pyrrole, pyrazole, benzene, furan, thiophene, pyridine, pyrazine, pyrimidine, pyridazine, naphthalene, anthracene, fluorene, pyrrolizine, indolizine, isoindole, indole, indazole, purine, quinolizine, isoquinoline, quinoline, phthalazine, naphthyridin, quinoxaline, quinazoline, cinnoline, carbazole, phenanthridine, acridine, phenazine, benzofuran, benzothiophene, dibenzofuran, and dibenzothiophene; and
ii) cyclopropane, cyclobutane, cyclopentane, cyclohexane, cycloheptane, cyclooxane, cyclopentene, cyclopentadiene, cyclohexene, cyclohexadiene, cycloheptadiene, pyrrole, pyrazole, benzene, furan, thiophene, pyridine, pyrazine, pyrimidine, pyridazine, naphthalene, anthracene, fluorene, pyrrolizine, indolizine, isoindole, indole, indazole, purine, quinolizine, isoquinoline, quinoline, phthalazine, naphthyridin, quinoxaline, quinazoline, cinnoline, carbazole, phenanthridine, acridine, phenazine, benzofuran, benzothiophene, dibenzofuran, and dibenzothiophene that are substituted with at least one substituent selected from among deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a C1-C20 alkyl group, and a C1-C20 alkoxy group; a C1-C20 alkyl group and a C1-C20 alkoxy group that are substituted with at least one of deuterium, halogen, a hydroxyl group, a cyano group, a nitro group, an amino group, an amidino group, a hydrazine group, a hydrazone group, a carboxylic group or a salt thereof, a sulfonic acid group or a salt thereof, and a phosphoric acid group or a salt thereof; a C6-C20 aryl group, a C6-C20 aryloxy group, a C6-C20 arylthio group, and a C2-C20 heteroaryl group; a C6-C20 aryl group, a C6-C20 aryloxy group, a C6-C20 arylthio group, and a C2-C20 heteroaryl group that are substituted with at least one of deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a C1-C20 alkyl group, a C1-C20 alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; $-N(Q11)(Q12)$; and $-Si(Q13)(Q14)(Q15)$ (where Q11 and Q12 are each independently a C6-C20 aryl group, or a C2-C20 heteroaryl group; and Q13 to Q15 are each independently a C1-C20 alkyl group, a C1-C20 alkoxy group, a C6-C20 aryl group, or a C2-C20 heteroaryl group);
$Ar_1$ is selected from among $-O-$, $-S-$, a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a $C_2$-$C_{10}$ heterocycloalkenylene group, a substituted or unsubstituted $C_6$-$C_{60}$ arylene group, and a substituted or unsubstituted $C_2$-$C_{60}$ heteroarylene group;
$Ar_{11}$ is selected from among deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a substituted $C_1$-$C_{60}$ alkyl group, an unsubstituted $C_2$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a $C_2$-$C_{10}$ heterocycloalkenyl group, a substituted or unsubstituted $C_6$-$C_{60}$ aryl group, a substituted or unsubstituted $C_2$-$C_{60}$ heteroaryl group, $-N(Q_1)(Q_2)$, and $-Si(Q_3)(Q_4)(Q_5)$ (where $Q_1$ and $Q_2$ are each independently selected from among a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a $C_2$-$C_{10}$ heterocycloalkenyl group, a substituted or unsubstituted $C_6$-$C_{60}$ aryl group, and a substituted or unsubstituted $C_2$-$C_{60}$ heteroaryl group; and $Q_3$ to $Q_5$ are each independently selected from among hydrogen, deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted C$_2$-C$_{10}$ heterocycloalkenyl group, a substituted or unsubstituted C$_6$-C$_{60}$ aryl group, and a substituted or unsubstituted C$_2$-C$_{60}$ heteroaryl group); and a is an integer from 0 to 5.

2. The heterocyclic compound of claim 1, wherein the A ring and the B ring are each independently selected from among:

i) benzene, pyridine, pyrazine, pyrimidine, pyridazine, naphthalene, fluorene, indole, isoquinoline, quinoline, carbazole, dibenzofuran, and dibenzothiophene; and ii) benzene, pyridine, pyrazine, pyrimidine, pyridazine, naphthalene, fluorene, indole, isoquinoline, quinoline, carbazole, dibenzofuran, and dibenzothiophene that are substituted with at least one of deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a C$_1$-C$_{20}$ alkyl group, and a C$_1$-C$_{20}$ alkoxy group; a C$_1$-C$_{20}$ alkyl group and a C$_1$-C$_{20}$ alkoxy group that are substituted with at least one of deuterium, halogen, a hydroxyl group, a cyano group, a nitro group, an amino group, an amidino group, a hydrazine group, a hydrazone group, a carboxylic group or a salt thereof, a sulfonic acid group or a salt thereof, and a phosphoric acid group or a salt thereof; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group that are substituted with at least one of deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a C$_1$-C$_{20}$ alkyl group, a C$_1$-C$_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and —N(Q$_{11}$)(Q$_{12}$) (where Q$_{11}$ and Q$_{12}$ are each independently, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or isoquinolyl group).

3. A heterocyclic compound represented by one of Formulae 1A-1 to 1A-14, and 1B-1 to 1B-14 below:

Formula 1A-1

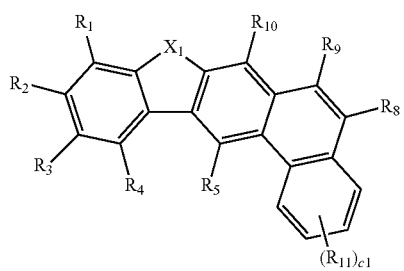

Formula 1A-2

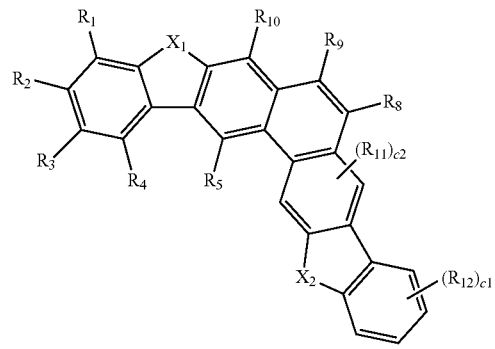

Formula 1A-3

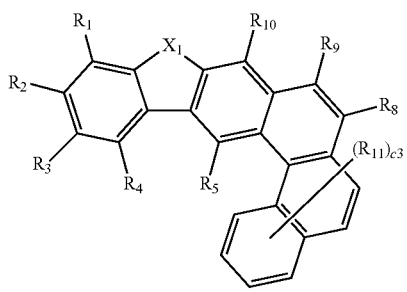

Formula 1A-4

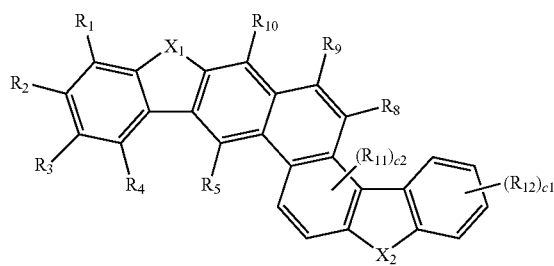

Formula 1A-5

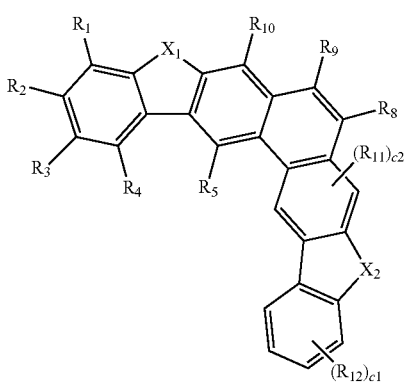

Formula 1A-6

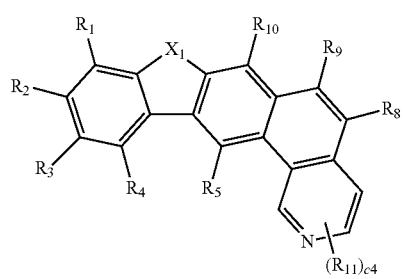

Formula 1A-7
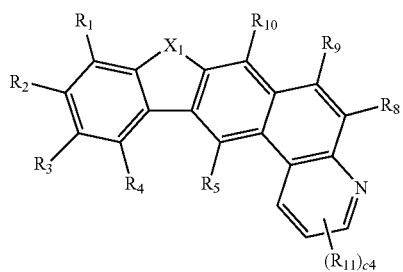
Formula 1A-8
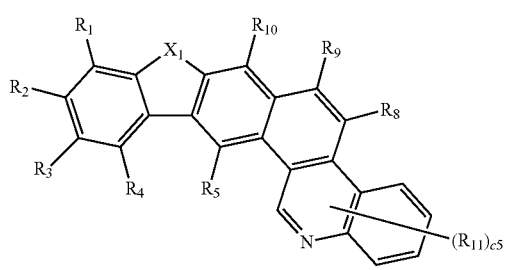
Formula 1A-9
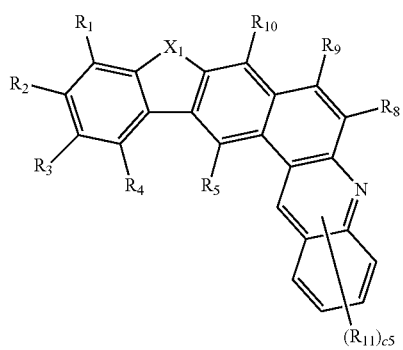
Formula 1A-10
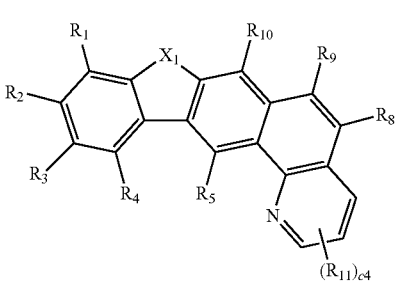
Formula 1A-11
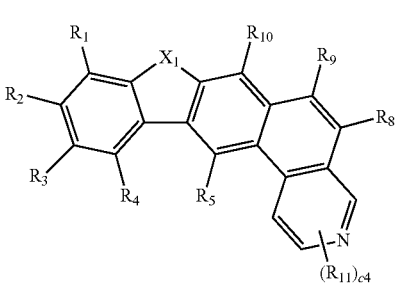
Formula 1A-12
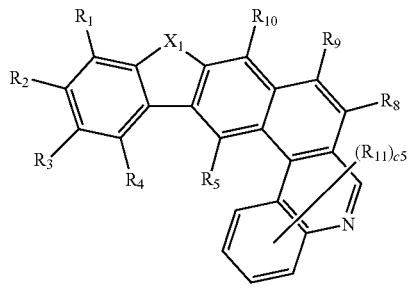
Formula 1A-13
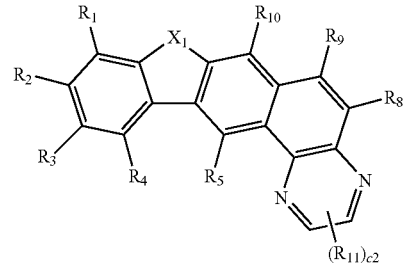
Formula 1A-14
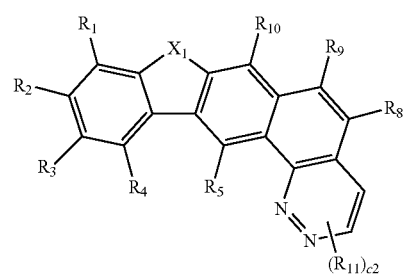
Formula 1B-1
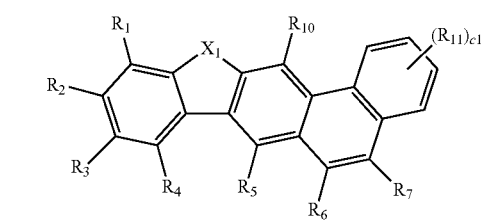
Formula 1B-2
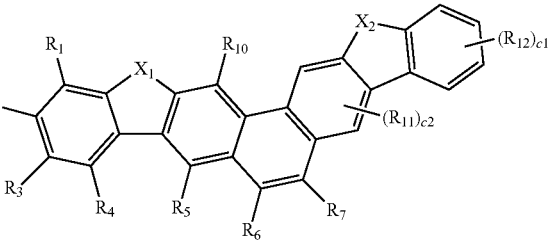
Formula 1B-3
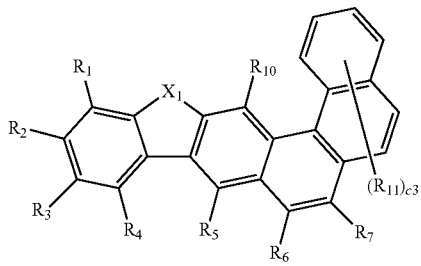

Formula 1B-4
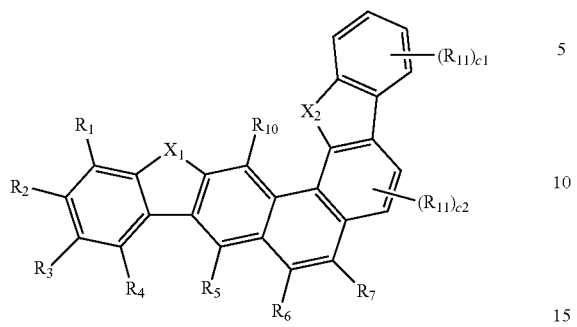

Formula 1B-5
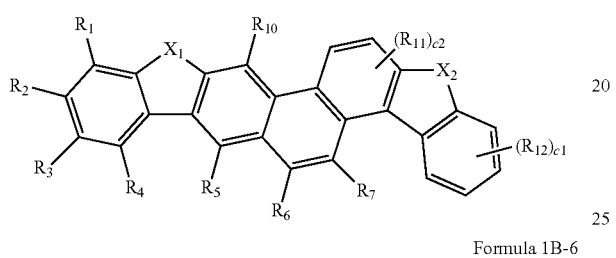

Formula 1B-6
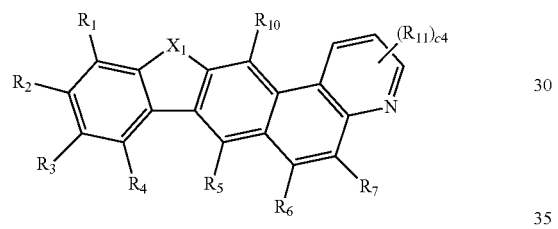

Formula 1B-7
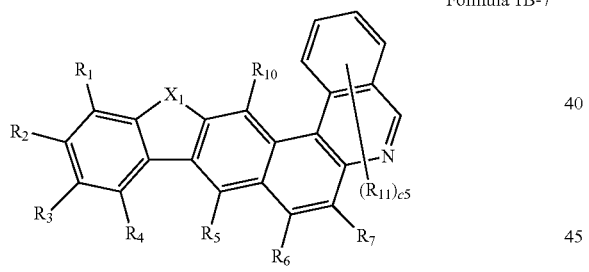

Formula 1B-8
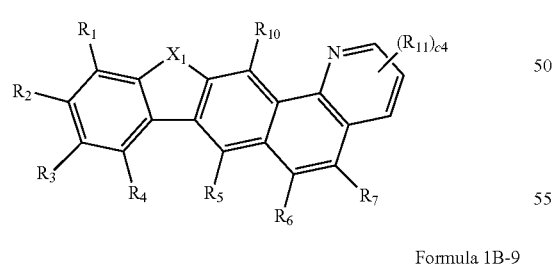

Formula 1B-9
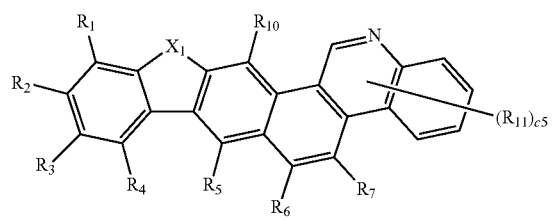

Formula 1B-10
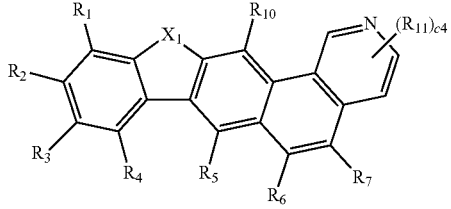

Formula 1B-11

Formula 1B-12

Formula 1B-13

Formula 1B-14 wherein $X_1$ is O or S;
i) in Formulae 1A-1 to 1A-14, at least one of $R_1$ to $R_5$, and $R_5$ to $R_{10}$ are a substituent represented by —$(Ar_1)_a$—$(Ar_{11})$ (where $Ar_{11}$ is not hydrogen when a is zero) the remaining substituents being hydrogen; or
ii) in Formulae 1B-1 to 1B-14, at least one of $R_1$ to $R_7$, and $R_{10}$ are a substituent represented by —$(Ar_1)_a$—$(Ar_{11})$ (where $Ar_{11}$ is not hydrogen when a=0) the remaining substituents being hydrogen;
$X_2$ is O, S, $C(R_{21})(R_{22})$, or $N(R_{23})$;
$R_{11}$, $R_{12}$, and $R_{21}$ to $R_{23}$ are each independently selected from among hydrogen, deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group; a $C_1$-$C_{60}$ alkyl group, a $C_2$-$C_{60}$ alkenyl group, a $C_2$-$C_{60}$ alkynyl group, and a $C_1$-$C_{60}$ alkoxy group that are substituted with at least one of deuterium, halogen, a hydroxyl group, a cyano group, a nitro group, an amino group, an amidino group, a hydrazine group, a hydrazone group, a carboxylic group or a salt thereof, a sulfonic acid group or a salt thereof, and a phosphoric acid group or a salt thereof; a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group; a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group that are substituted with at least one of deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; —N($Q_{11}$)($Q_{12}$); and —Si($Q_{13}$)($Q_{14}$)($Q_{15}$) (where $Q_{11}$ and $Q_{12}$ are each independently a $C_6$-$C_{60}$ aryl group, or a $C_2$-$C_{60}$ heteroaryl group; and $Q_{13}$ to $Q_{15}$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group);

$Ar_1$ is selected from among —O—, —S—, a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a $C_2$-$C_{10}$ heterocycloalkenylene group, a substituted or unsubstituted $C_6$-$C_{60}$ arylene group, and a substituted or unsubstituted $C_2$-$C_{60}$ heteroarylene group;

$Ar_{11}$ is selected from among deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a substituted $C_1$-$C_{60}$ alkyl group, an unsubstituted $C_2$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a $C_2$-$C_{10}$ heterocycloalkenyl group, a substituted or unsubstituted $C_6$-$C_{60}$ aryl group, a substituted or unsubstituted $C_2$-$C_{60}$ heteroaryl group, —N($Q_1$)($Q_2$), and —Si($Q_3$)($Q_4$)($Q_5$) (where $Q_1$ and $Q_2$ are each independently selected from among a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a $C_2$-$C_{10}$ heterocycloalkenyl group, a substituted or unsubstituted $C_6$-$C_{60}$ aryl group, and a substituted or unsubstituted $C_2$-$C_{60}$ heteroaryl group; and $Q_3$ to $Q_5$ are each independently selected from among hydrogen, deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, and a substituted or unsubstituted $C_2$-$C_{60}$ heteroaryl group);

a is an integer from 0 to 5;
c1 is an integer from 1 to 4;
c2 is 1 or 2;
c3 is an integer from 1 to 6;
c4 is an integer from 1 to 3; and
c5 is an integer from 1 to 5.

4. The heterocyclic compound of claim 1, wherein $Ar_1$ is a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted spiro-fluorenylene group, a substituted or unsubstituted phenalenylene group, a substituted or unsubstituted phenanthrenylene group, a substituted or unsubstituted anthrylene group, a substituted or unsubstituted fluoranthenylene group, a substituted or unsubstituted triphenylenylene group, a substituted or unsubstituted pyrenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted imidazolylene group, a substituted or unsubstituted pyrazolylene group, a substituted or unsubstituted pyridinylene group, a substituted or unsubstituted pyrazinylene group, a substituted or unsubstituted pyrimidinylene group, a substituted or unsubstituted pyridazinylene group, a substituted or unsubstituted isoindolylene group, a substituted or unsubstituted indolylene group, a substituted or unsubstituted indazolylene group, a substituted or unsubstituted purinylene group, a substituted or unsubstituted quinolinylene group, a substituted or unsubstituted benzoquinolinylene group, a substituted or unsubstituted phthalazinylene group, a substituted or unsubstituted naphthyridinylene group, a substituted or unsubstituted quinoxalinylene group, a substituted or unsubstituted quinazolinylene group, a substituted or unsubstituted cinnolinylene group, a substituted or unsubstituted carbazolylene group, a substituted or unsubstituted phenanthridinylene group, a substituted or unsubstituted acridinylene group, a substituted or unsubstituted phenanthrolinylene group, a substituted or unsubstituted phenazinylene group, a substituted or unsubstituted benzoxazolylene group, a substituted or unsubstituted benzoimidazolylene group, a substituted or unsubstituted furanylene group, a substituted or unsubstituted benzofuranylene group, a substituted or unsubstituted thiophenylene group, a substituted or unsubstituted benzothiophenylene group, a substituted or unsubstituted thiazolylene group, a substituted or unsubstituted isothiazolylene group, a substituted or unsubstituted benzothiazolylene group, a substituted or unsubstituted isoxazolylene group, a substituted or unsubstituted oxazolylene group, a substituted or unsubstituted triazolylene group, a substituted or unsubstituted tetrazolylene group, a substituted or unsubstituted oxadiazolylene group, a substituted or unsubstituted triazinylene group, a substituted or unsubstituted benzooxazolylene group, a substituted or unsubstituted dibenzofuranylene group, a substituted or unsubstituted dibenzothiophenylene group, or a benzocarbazolyl group.

5. The heterocyclic compound of claim 1, wherein $Ar_1$ is selected from among:
   i) a phenylene group, a naphthylene group, a fluorenylene group, a pyridinylene group, a pyrazinylene group, a pyrimidinylene group, a pyridazinylene group, a quinolinylene group, a carbazolylene group, a triazinylene group, a dibenzofuranylene group, and a dibenzothiophenylene group; and
   ii) a phenylene group, a naphthylene group, a fluorenylene group, a pyridinylene group, a pyrazinylene group, a pyrimidinylene group, a pyridazinylene group, a quinolinylene group, a carbazolylene group, a triazinylene group, a dibenzofuranylene group, and a dibenzothiophenylene group that are substituted with at least one of deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group.

6. The heterocyclic compound of claim 1, wherein $Ar_1$ is a group represented by one of Formulae 2-1 to 2-5 below:

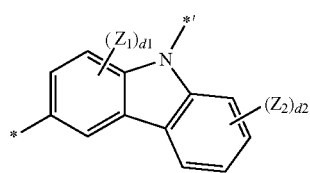
Formula 2-1

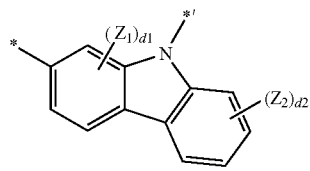
Formula 2-2

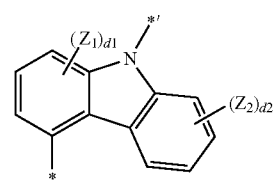
Formula 2-3

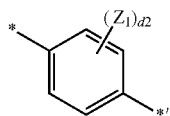
Formula 2-4

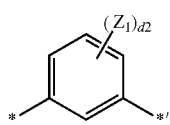
Formula 2-5 wherein $Z_1$ and $Z_2$ are each independently selected from among hydrogen, deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group;

$d_1$ is an integer from 1 to 3;
$d_2$ is an integer from 1 to 4;
* indicates a binding site with a core in Formula 1, or a binding site with another $Ar_1$ adjacent to the core in Formula 1; and
*' indicates a binding site with another $Ar_1$ spaced from the core in Formula 1, or a binding site with $Ar_{11}$.

7. A heterocyclic compound represented by Formula 1A or 1B below:

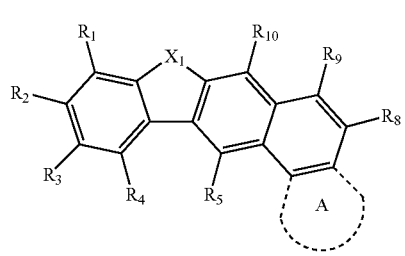
Formula 1A

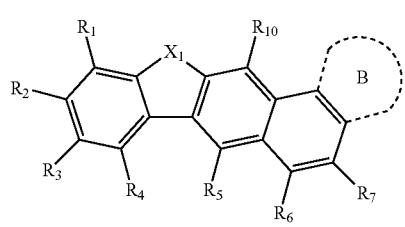
Formula 1B wherein $X_1$ is O or S;
i) in Formulae 1A, at least one of $R_1$ to $R_5$, and $R_5$ to $R_{10}$ are a substituent represented by —$(Ar_1)_a$—$(Ar_{11})$ (where $Ar_{11}$ is not hydrogen when a is zero) the remaining being hydrogen; or
ii) in Formulae 1B, at least one of $R_1$ to $R_7$, and $R_{10}$ are a substituent represented by —$(Ar_1)_a$—$(Ar_{11})$ (where $Ar_{11}$ is not hydrogen when a=0) the remaining being hydrogen;

the A ring and B ring are each independently selected from among:
i) cyclopropane, cyclobutane, cyclopentane, cyclohexane, cycloheptane, cyclooxane, cyclopentene, cyclopentadiene, cyclohexene, cyclohexadiene, cycloheptadiene, pyrrole, pyrazole, benzene, furan, thiophene, pyridine, pyrazine, pyrimidine, pyridazine, naphthalene, anthracene, fluorene, pyrrolizine, indolizine, isoindole, indole, indazole, purine, quinolizine, isoquinoline, quinoline, phthalazine, naphthyridin, quinoxaline, quinazoline, cinnoline, carbazole, phenanthridine, acridine, phenazine, benzofuran, benzothiophene, dibenzofuran, and dibenzothiophene; and
ii) cyclopropane, cyclobutane, cyclopentane, cyclohexane, cycloheptane, cyclooxane, cyclopentene, cyclopentadiene, cyclohexene, cyclohexadiene, cycloheptadiene, pyrrole, pyrazole, benzene, furan, thiophene, pyridine, pyrazine, pyrimidine, pyridazine, naphthalene, anthracene, fluorene, pyrrolizine, indolizine, isoindole, indole, indazole, purine, quinolizine, isoquinoline, quinoline, phthalazine, naphthyridin, quinoxaline, quinazoline, cinnoline, carbazole, phenanthridine, acridine, phenazine, benzofuran, benzothiophene, dibenzofuran, and dibenzothiophene that are substituted with at least one substituent selected from among deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a C1-C20 alkyl group, and a C1-C20 alkoxy group; a C1-C20 alkyl group and a C1-C20 alkoxy group that are substituted with at least one of deuterium, halogen, a hydroxyl group, a cyano group, a nitro group, an amino group, an amidino group, a hydrazine group, a hydrazone group, a carboxylic group or a salt thereof, a sulfonic acid group or a salt thereof, and a phosphoric acid group or a salt thereof; a C6-C20 aryl group, a C6-C20 aryloxy group, a C6-C20 arylthio group, and a C2-C20 heteroaryl group; a C6-C20 aryl group, a C6-C20 aryloxy group, a C6-C20 arylthio group, and a C2-C20 heteroaryl group that are substituted with at least one of deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a C1-C20 alkyl group, a C1-C20 alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; —N(Q11)(Q12); and —Si(Q13)(Q14)(Q15) (where Q11 and Q12 are each independently a C6-C20 aryl group, or a C2-C20 heteroaryl group; and Q13 to Q15 are each independently a C1-C20 alkyl group, a C1-C20 alkoxy group, a C6-C20 aryl group, or a C2-C20 heteroaryl group);
$Ar_1$ is selected from among —O—, —S—, a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a $C_2$-$C_{10}$ heterocycloalkenylene group, a substituted or unsubstituted $C_6$-$C_{60}$ arylene group, and a substituted or unsubstituted $C_2$-$C_{60}$ heteroarylene group;
$Ar_{11}$ is selected from among a substituted or unsubstituted phenyl group, a substituted or unsubstituted pentalenyl group, a substituted or unsubstituted indenyl group, a substituted or unsubstituted naphthyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted fluorenyl group, a substituted or unsubstituted spiro-fluorenyl group, a substituted or unsubstituted phenalenyl group, a substituted or unsubstituted phenanthrenyl group, a substituted or unsubstituted anthryl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pyrrolyl group, a substituted or unsubstituted imidazolyl group, a substituted or unsubstituted pyrazolyl group, a substituted or unsubstituted pyridinyl group, a substituted or unsubstituted pyrazinyl group, a substituted or unsubstituted pyrimidinyl group, a substituted or unsubstituted pyridazinyl group, a substituted or unsubstituted isoindolyl group, a substituted or unsubstituted indolyl group, a substituted or unsubstituted indazolyl group, a substituted or unsubstituted purinyl group, a substituted or unsubstituted quinolinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted cinnolinyl group, a substituted or unsubstituted carbazolyl group, a substituted or unsubstituted phenanthridinyl group, a substituted or unsubstituted acridinyl group, a substituted or unsubstituted phenanthrolinyl group, a substituted or unsubstituted phenazinyl group, a substituted or unsubstituted benzooxazolyl group, a substituted or unsubstituted benzoimidazolyl group, a substituted or unsubstituted furanyl group, a substituted or unsubstituted benzofuranyl group, a substituted or unsubstituted thiophenyl group, a substituted or unsubstituted benzothiophenyl group, a substituted or unsubstituted thiazolyl group, a substituted or unsubstituted isothiazolyl group, a substituted or unsubstituted benzothiazolyl group, a substituted or unsubstituted isoxazolyl group, a substituted or unsubstituted oxazolyl group, a substituted or unsubstituted triazolyl group, a substituted or unsubstituted tetrazolyl group, a substituted or unsubstituted oxadiazolyl group, a substituted or unsubstituted triazinyl group, a substituted or unsubstituted benzooxazolyl group, a substituted or unsubstituted dibenzofuranyl group, a substituted or unsubstituted dibenzothiophenyl group, a substituted or unsubstituted benzocarbazolyl group, and —N($Q_1$)($Q_2$) (where $Q_1$ and $Q_2$ are each independently a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group); and a is an integer from 0 to 5.

8. The heterocyclic compound of claim 1, wherein $Ar_{11}$ is a group represented by one of Formulae 3-1 to 3-14 below:

Formula 3-1
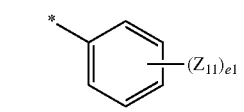

Formula 3-2
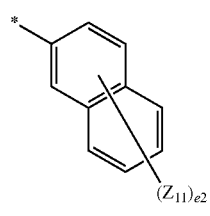

Formula 3-3
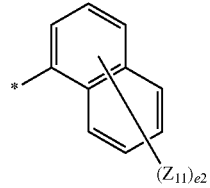

Formula 3-4
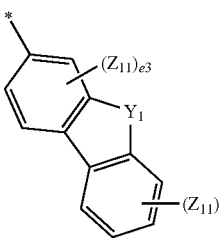

Formula 3-5
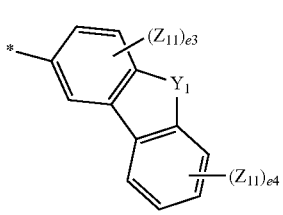

Formula 3-6
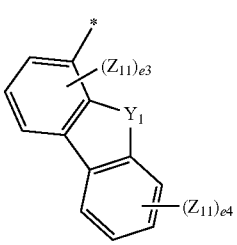

Formula 3-7
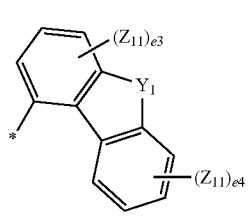

Formula 3-8
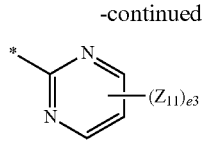

Formula 3-9
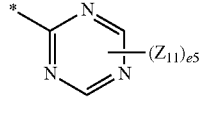

Formula 3-10
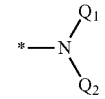

Formula 3-11
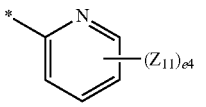

Formula 3-12
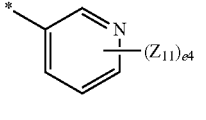

Formula 3-13
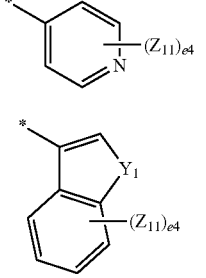

Formula 3-14 wherein $Y_1$ is O, S, $C(Z_{21})(Z_{22})$, or $N(Z_{23})$;

$Z_{11}$, and $Z_{21}$ to $Z_{23}$ are each independently selected from among hydrogen, deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group;

$Q_1$ and $Q_2$ are each independently selected from among a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group;

e1 is an integer from 1 to 5;
e2 is an integer from 1 to 7;
e3 is an integer from 1 to 3;
e4 is an integer from 1 to 4;
e5 is 1 or 2; and
* indicates a binding site with $Ar_1$.

9. The heterocyclic compound of claim 1, wherein the heterocyclic compound is a compound represented by Formula 1A-1(1), 1A-7(1), 1A-9(1), 1A-11(1), 1B-1(1), 1B-6(1), or 1B-14(1) below:

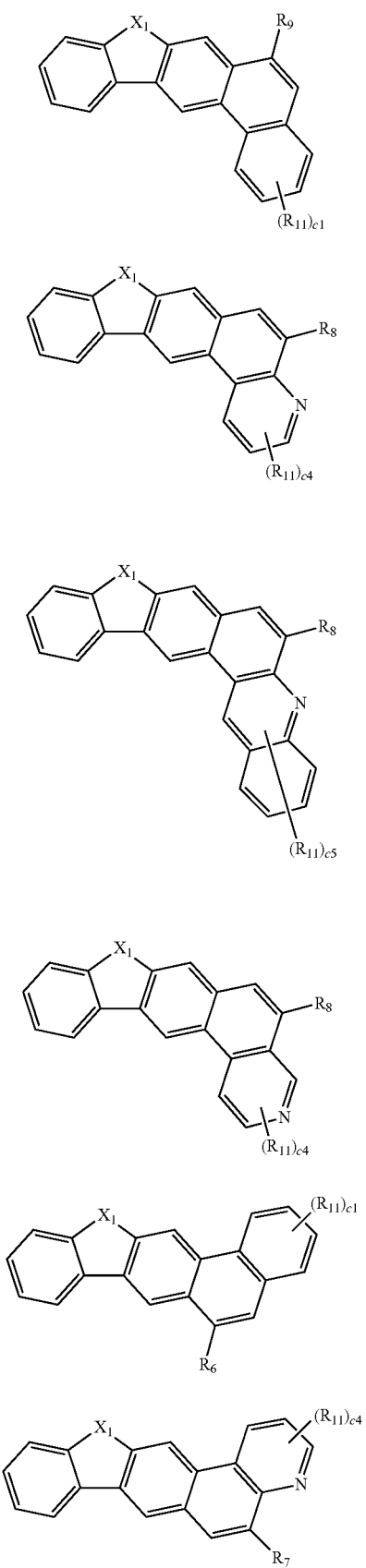

1A-1(1)
1A-7(1)
1A-9(1)
1A-11(1)
1B-1(1)
1B-6(1)

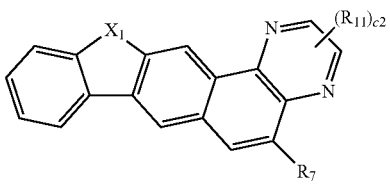

1B-14(1)

wherein, in Formulae 1A-1(1), 1A-7(1), 1A-9(1), 1A-11(1), 1B-1(1), 1B-6(1), and 1B-14(1), $X_1$ is O or S;

$R_{11}$ is each independently selected from among hydrogen, deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group; a $C_1$-$C_{60}$ alkyl group, a $C_2$-$C_{60}$ alkenyl group, a $C_2$-$C_{60}$ alkynyl group, and a $C_1$-$C_{60}$ alkoxy group that are substituted with at least one of deuterium, halogen, a hydroxyl group, a cyano group, a nitro group, an amino group, an amidino group, a hydrazine group, a hydrazone group, a carboxylic group or a salt thereof, a sulfonic acid group or a salt thereof, and a phosphoric acid group or a salt thereof; a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group; a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group that are substituted with at least one of deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; —N($Q_{11}$)($Q_{12}$); and —Si($Q_{13}$)($Q_{14}$)($Q_{15}$) (where $Q_{11}$, and $Q_{12}$ are each independently a $C_6$-$C_{60}$ aryl group, or a $C_2$-$C_{60}$ heteroaryl group; and $Q_{13}$ to $Q_{15}$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group);

c1 is an integer from 1 to 4;

c2 is 1 or 2;

c4 is an integer from 1 to 3;

c5 is an integer from 1 to 5; and $R_6$ to $R_9$ are each independently a substituent represented by —(Ar$_1$)$_a$—(Ar$_{11}$), wherein Ar$_1$ is a group represented by one of Formulae 2-1 to 2-5, a is an integer from 0 to 3, and Ar$_{11}$ is a group represented by one of Formulae 3-1 to 3-14:

Formula 2-1
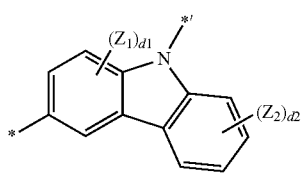
Formula 2-2
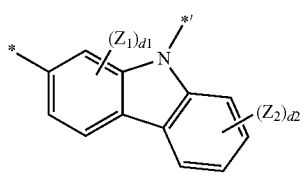
Formula 2-3
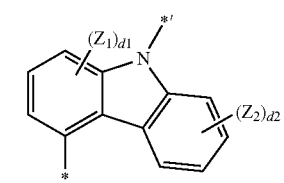
Formula 2-4
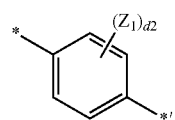
Formula 2-5
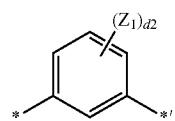
Formula 3-1
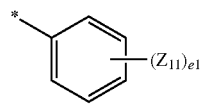
Formula 3-2
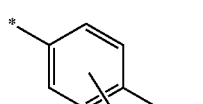
Formula 3-3
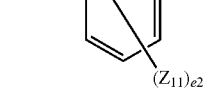
Formula 3-4
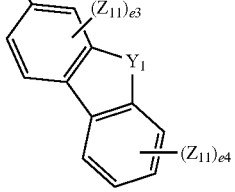
Formula 3-5
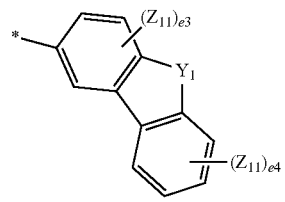
Formula 3-6
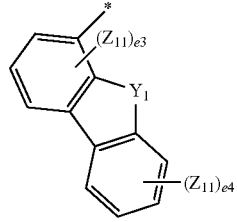
Formula 3-7
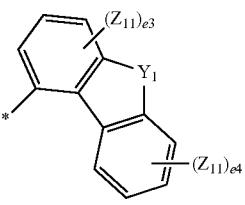
Formula 3-8
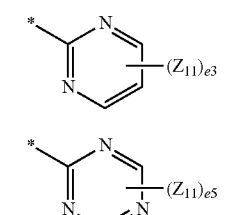
Formula 3-9
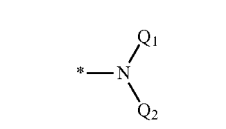
Formula 3-10
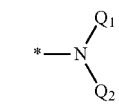
Formula 3-11
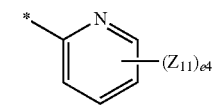
Formula 3-12
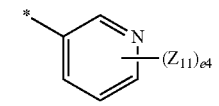
Formula 3-13
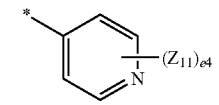
Formula 3-14
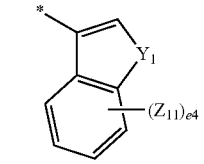
wherein, in Formulae 2-1 to 2-5, $Z_1$ and $Z_2$ are each independently selected from among hydrogen, deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group;

$d_1$ is an integer from 1 to 3;

$d_2$ is an integer from 1 to 4;

\* indicates a binding site with a core in Formulae 1A-1(1), 1A-7(1), 1A-9(1), 1A-11(1), 1B-1(1), 1B-6(1), and 1B-14(1), or a binding site with another $Ar_1$ adjacent to the core in Formulae 1A-1(1), 1A-7(1), 1A-9(1), 1A-11(1), 1B-1(1), 1B-6(1), and 1B-14(1); and \*' indicates a binding site with another $Ar_1$ spaced from the core in Formulae 1A-1(1), 1A-7(1), 1A-9(1), 1A-11(1), 1B-1(1), 1B-6(1), and 1B-14(1), or a binding site with $Ar_{11}$, and in Formulae 3-1 to 3-14, $Y_1$ is O, S, $C(Z_{21})(Z_{22})$, or $N(Z_{23})$;

$Z_{11}$, and $Z_{21}$ to $Z_{23}$ are each independently selected from among hydrogen, deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group;

$Q_1$ and $Q_2$ are each independently selected from among a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group;

e1 is an integer from 1 to 5;

e2 is an integer from 1 to 7;

e3 is an integer from 1 to 3;

e4 is an integer from 1 to 4; and e5 is 1 or 2.

10. The heterocyclic compound of claim 1, wherein the heterocyclic compound is a compound represented by Formula 1A-HTL1 or Formula 1B-HTL1 below:

Formula 1A-HTL1

Formula 1B-HTL1

Wherein $X_1$ is O, or S;

the A ring and B ring are each independently selected from among:

i) benzene, pyridine, pyrazine, pyrimidine, pyridazine, naphthalene, fluorene, indole, isoquinoline, quinoline, carbazole, dibenzofuran, and dibenzothiophene; and ii) benzene, pyridine, pyrazine, pyrimidine, pyridazine, naphthalene, fluorene, indole, isoquinoline, quinoline, carbazole, dibenzofuran, and dibenzothiophene that are substituted with at least substituent selected from among deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a $C_1$-$C_{20}$ alkyl group, and a $C_1$-$C_{20}$ alkoxy group; a $C_1$-$C_{20}$ alkyl group, and a $C_1$-$C_{60}$ alkoxy group that are substituted with at least one of deuterium, halogen, a hydroxyl group, a cyano group, a nitro group, an amino group, an amidino group, a hydrazine group, a hydrazone group, a carboxylic group or a salt thereof, a sulfonic acid group or a salt thereof, and a phosphoric acid group or a salt thereof; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group that are substituted with at least one of deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and —$N(Q_{11})(Q_{12})$ (where $Q_{11}$, and $Q_{12}$ are each independently, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or isoquinolyl group);

a is an integer from 1 to 3;

$Q_1$ and $Q_2$ are each independently selected from among a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group;

$Ar_1$ is a group represented by one of Formulae 2-1 to 2-5:

Formula 2-1

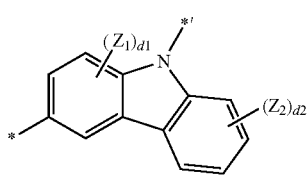

Formula 2-2

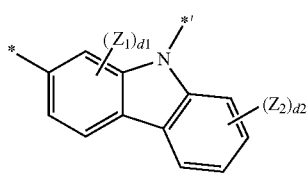

Formula 2-3

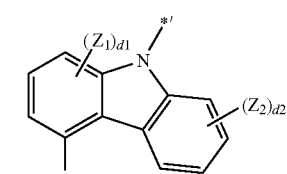

Formula 2-4

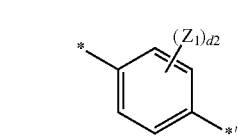

Formula 2-5

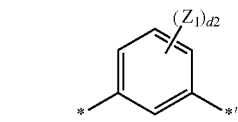

wherein, in Formulae 2-1 to 2-5, $Z_1$ and $Z_2$ are each independently selected from among hydrogen, deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group;

$d_1$ is an integer from 1 to 3; and $d_2$ is an integer from 1 to 4;

* indicates a binding site with a core in Formula 1A-HTL1 or Formula 1B-HTL1, or a binding site with another $Ar_1$ adjacent to the core in Formula 1A-HTL1 or Formula 1B-HTL1; and

*' indicates a binding site with another $Ar_1$ spaced from the core in Formula 1A-HTL1 or Formula 1B-HTL1.

11. The heterocyclic compound of claim 1, wherein the heterocyclic compound is a compound represented by Formula 1A-H1, 1A-H2, 1A-H3, 1B-H1, 1B-H2, or 1B-H3:

Formula 1A-H1

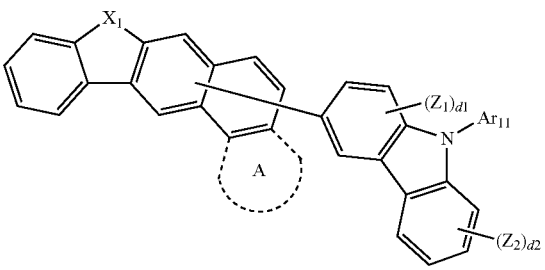

Formula 1A-H2

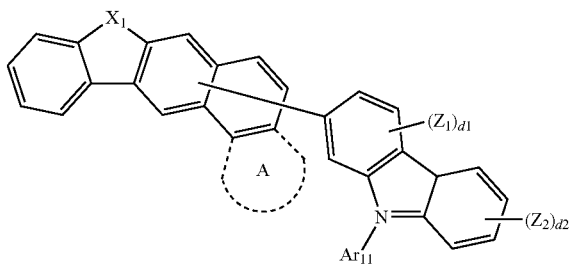

Formula 1A-H3

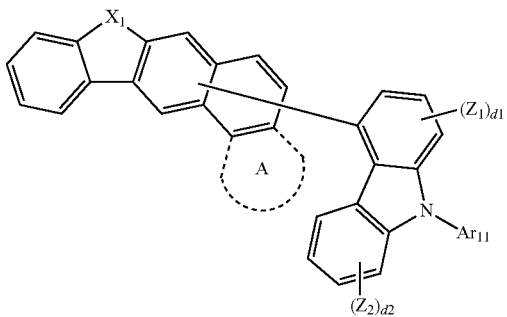

Formula 1B-H1

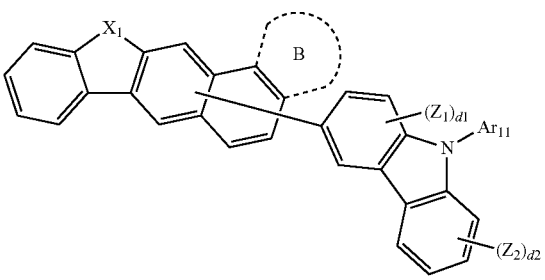

Formula 1B-H2

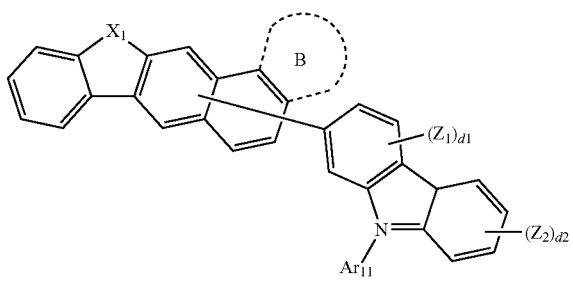

-continued

Formula 1B-H3

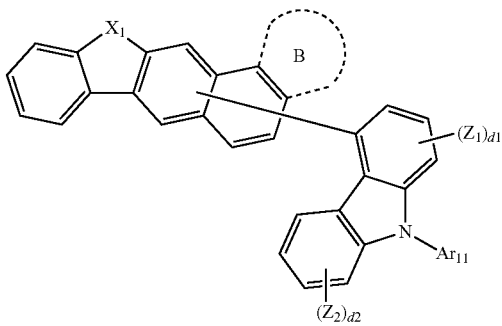

wherein, $X_1$ is O, or S;

the A ring and B ring are each independently selected from among:

i) benzene, pyridine, pyrazine, pyrimidine, pyridazine, naphthalene, fluorene, indole, isoquinoline, quinoline, carbazole, dibenzofuran, and dibenzothiophene; and ii) benzene, pyridine, pyrazine, pyrimidine, pyridazine, naphthalene, fluorene, indole, isoquinoline, quinoline, carbazole, dibenzofuran, and dibenzothiophene that are substituted with at least one substituent selected from among deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a $C_1$-$C_{20}$ alkyl group, and a $C_1$-$C_{20}$ alkoxy group; a $C_1$-$C_{20}$ alkyl group, and a $C_1$-$C_{20}$ alkoxy group that are substituted with at least one of deuterium, halogen, a hydroxyl group, a cyano group, a nitro group, an amino group, an amidino group, a hydrazine group, a hydrazone group, a carboxylic group or a salt thereof, a sulfonic acid group or a salt thereof, and a phosphoric acid group or a salt thereof; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group that are substituted with at least one of deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and —N($Q_{11}$)($Q_{12}$) (where $Q_{11}$, and $Q_{12}$ are each independently phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group);

$Z_1$ and $Z_2$ are each independently selected from among hydrogen, deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group;

$d_1$, is an integer from 1 to 3;

$d_2$ is an integer from 1 to 4; and $Ar_{11}$ is a group represented by one of Formulae 3-1 to 3-14:

Formula 3-1

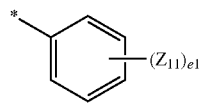

Formula 3-2

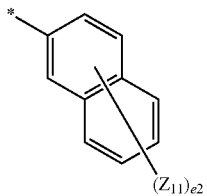

Formula 3-3

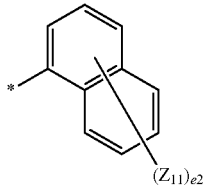

Formula 3-4

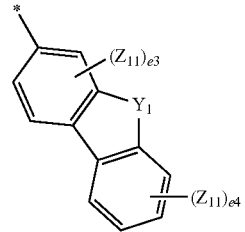

Formula 3-5

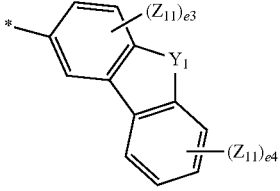

-continued

Formula 3-6
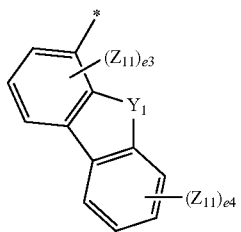

Formula 3-7
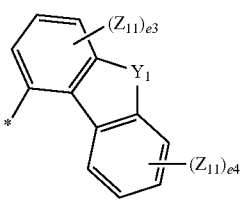

Formula 3-8
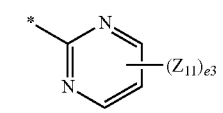

Formula 3-9
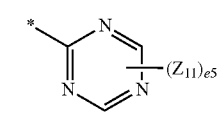

Formula 3-10
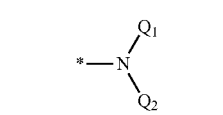

Formula 3-11
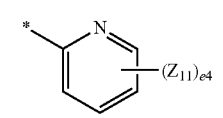

Formula 3-12
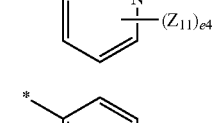

Formula 3-13
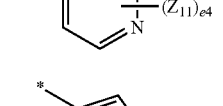

Formula 3-14
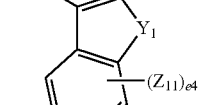

wherein, in Formulae 3-1 to 3-14, $Y_1$ is O, S, $C(Z_{21})(Z_{22})$, or $N(Z_{23})$;

$Z_{11}$, and $Z_{21}$ to $Z_{23}$ are each independently selected from among hydrogen, deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group;

$Q_1$ and $Q_2$ are each independently selected from among a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group;

e1 is an integer from 1 to 5;

e2 is an integer from 1 to 7;

e3 is an integer from 1 to 3;

e4 is an integer from 1 to 4; and e5 is 1 or 2.

12. The heterocyclic compound of claim 1, wherein the heterocyclic compound is one of Compounds 1 to 74, and 101 to 170 below:

1
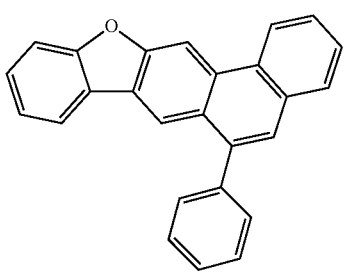

2
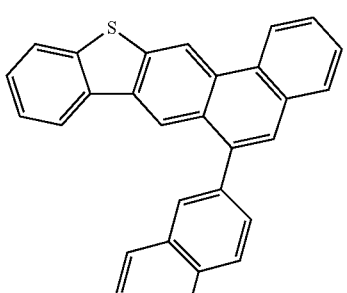

3
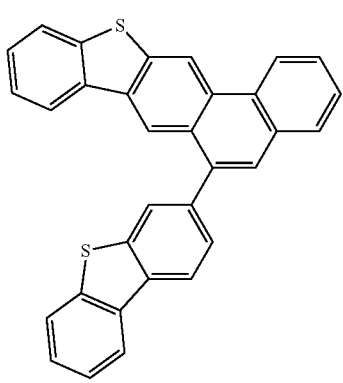

4
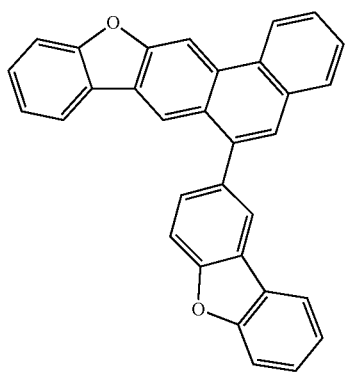
5
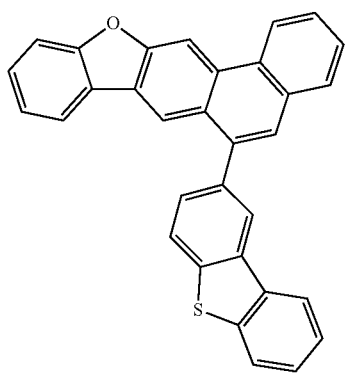
6
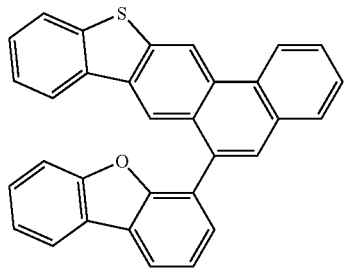
7
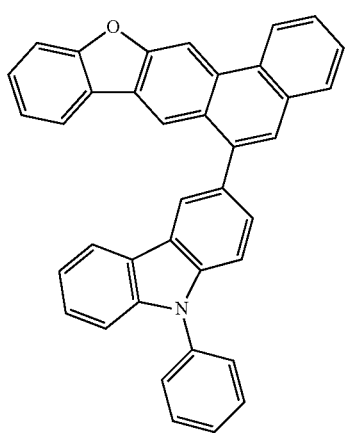
8
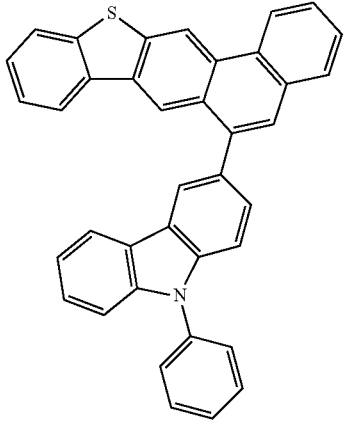
9
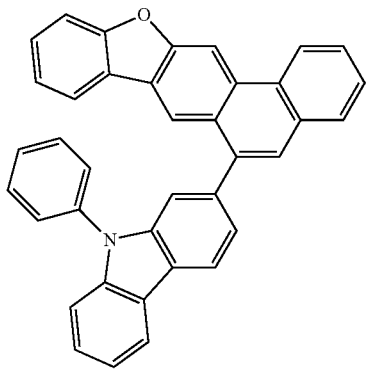
10
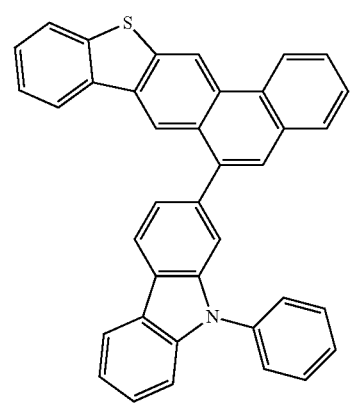

161
-continued
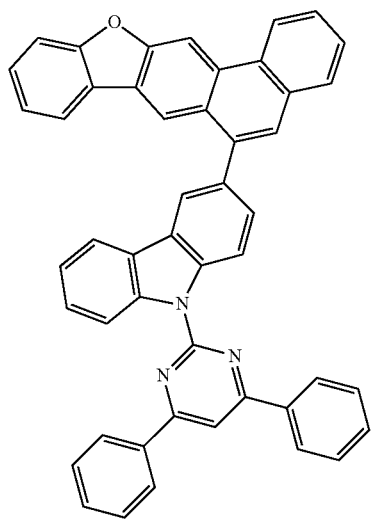
11
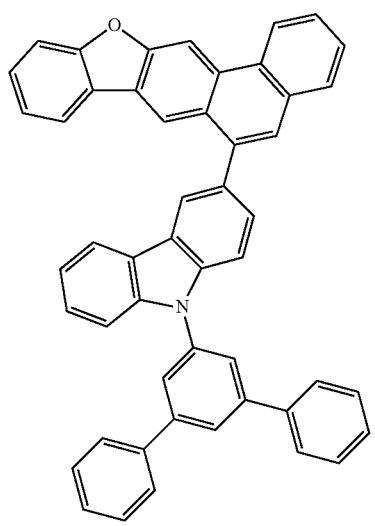
12
162
-continued
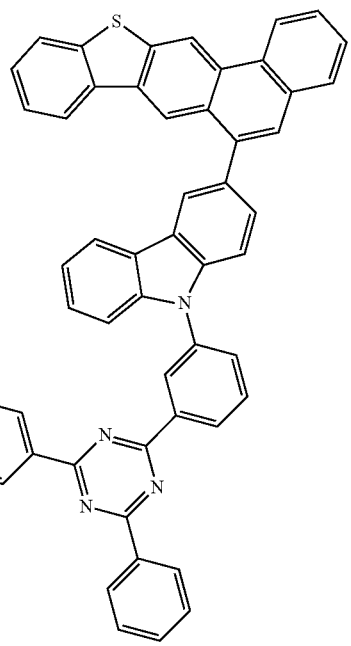
13
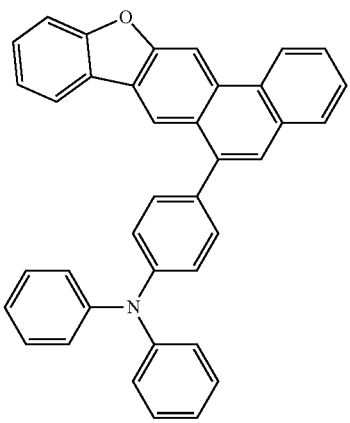
14
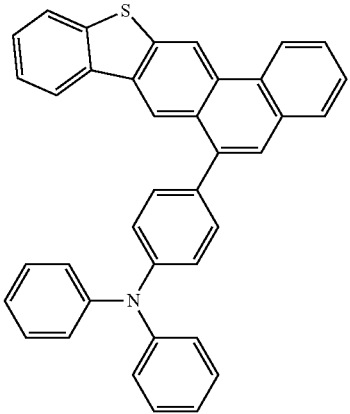
15

163
-continued
16
17
18
19
20
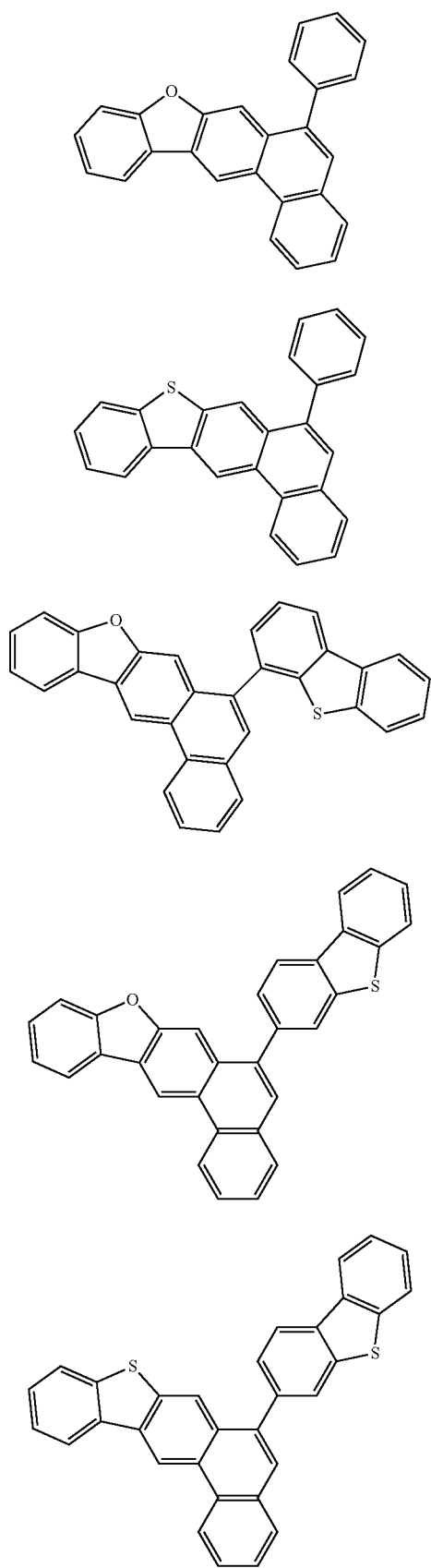
164
-continued
21
22
23
24
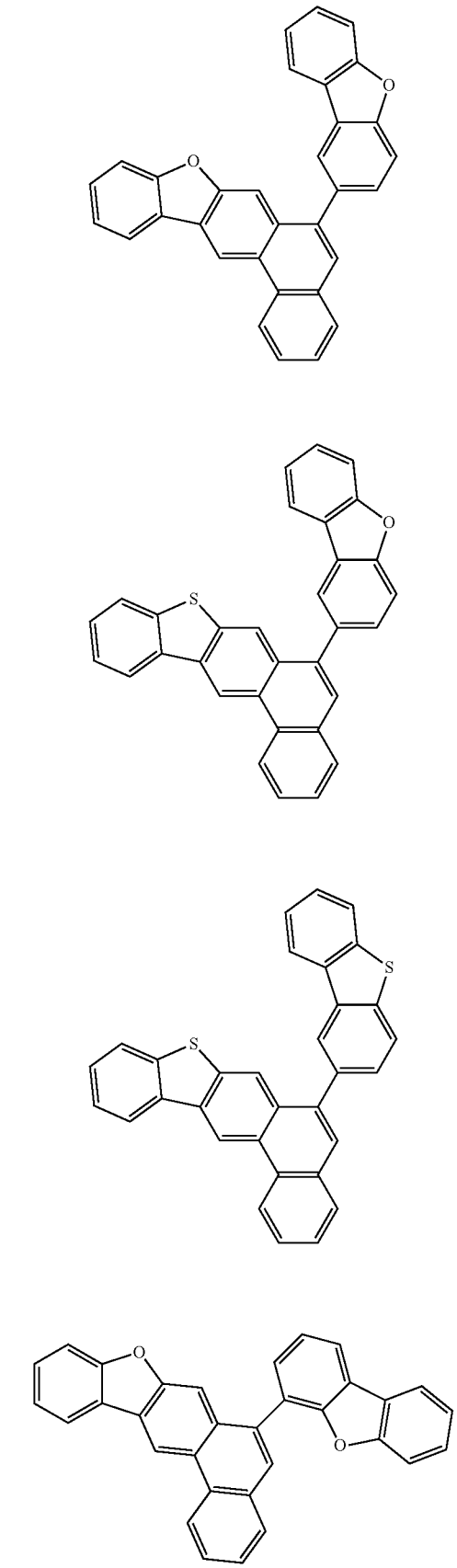

165
-continued
25
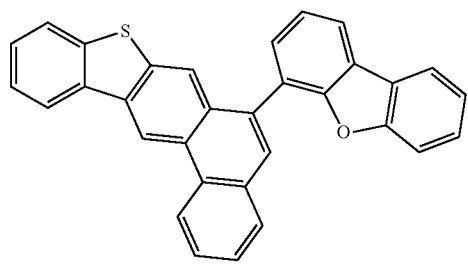
26
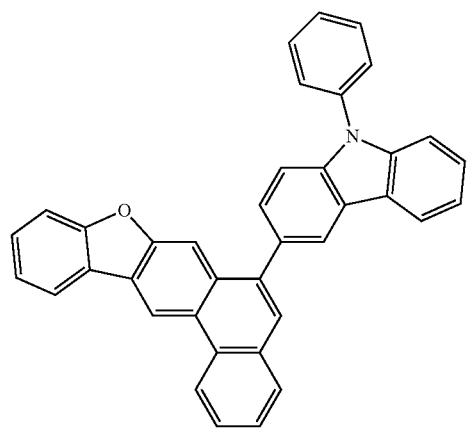
27
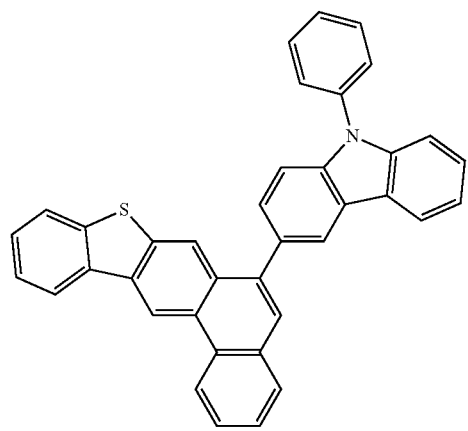
28
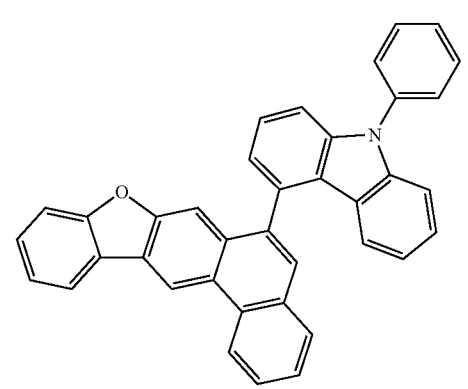
166
-continued
29
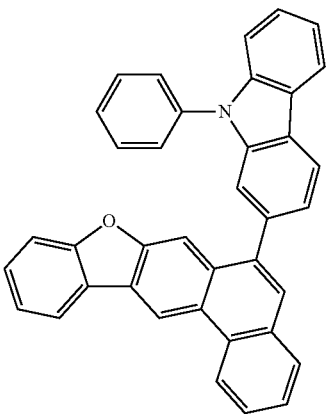
30
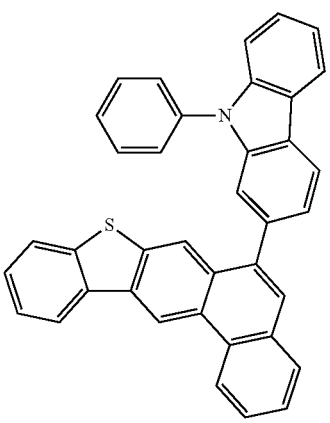
31
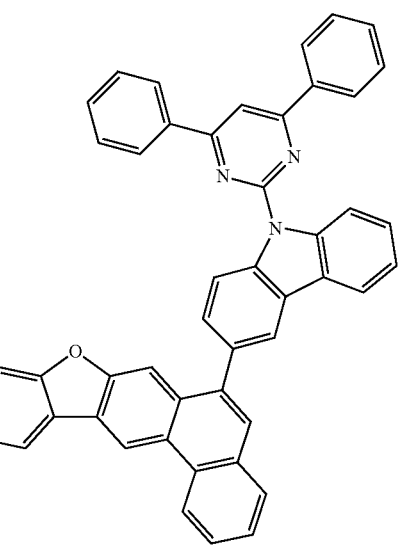

32
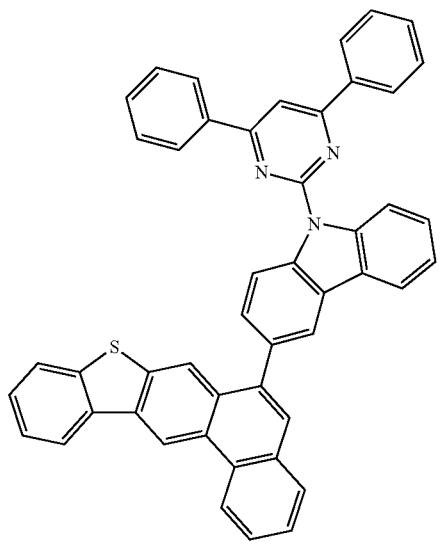
33
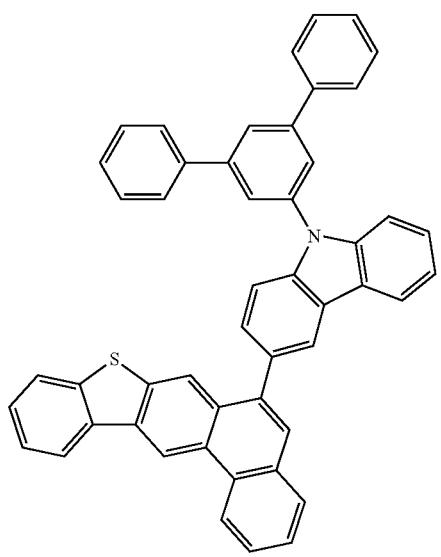
34
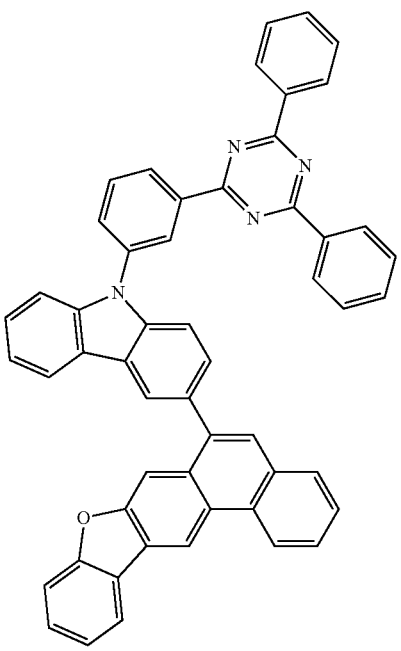
35
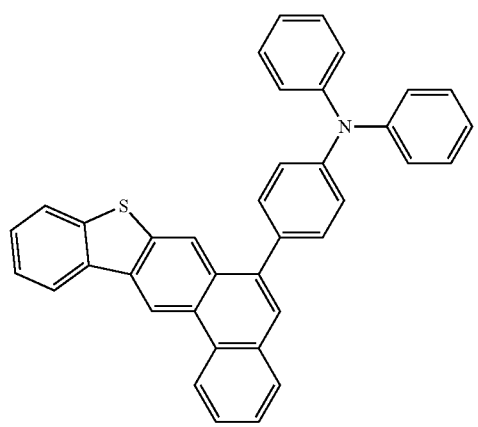
36
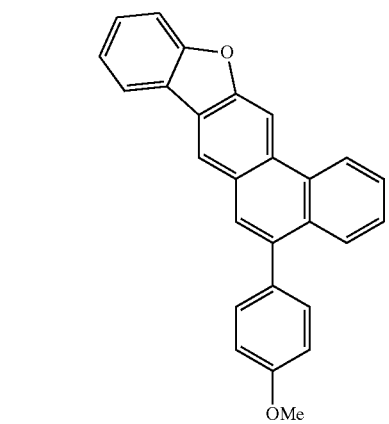

37
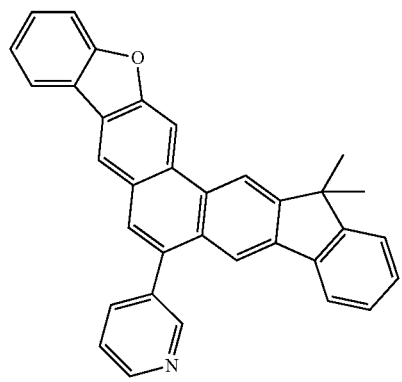
38
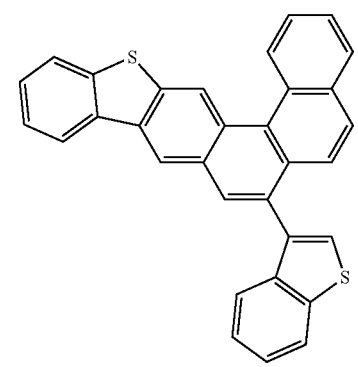
39
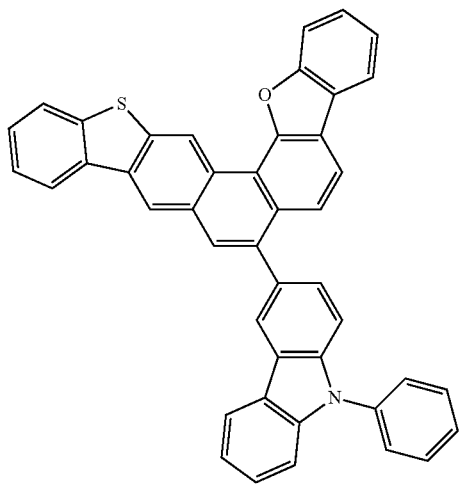
40
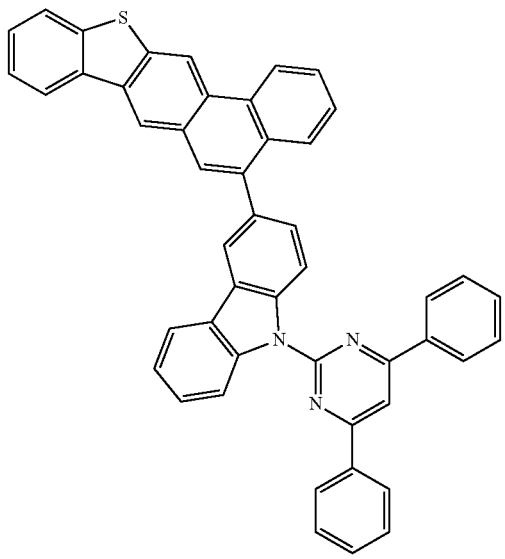
41
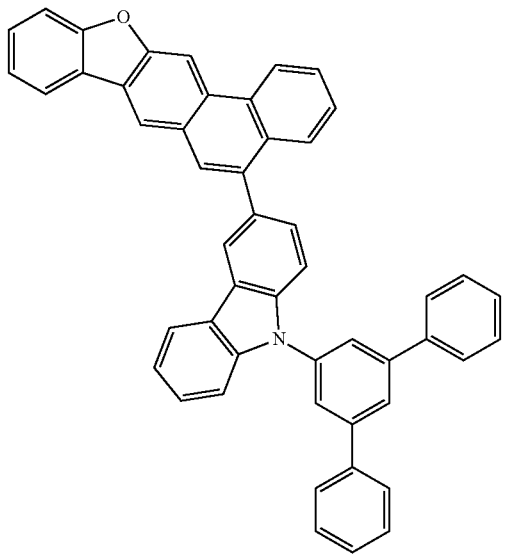
42
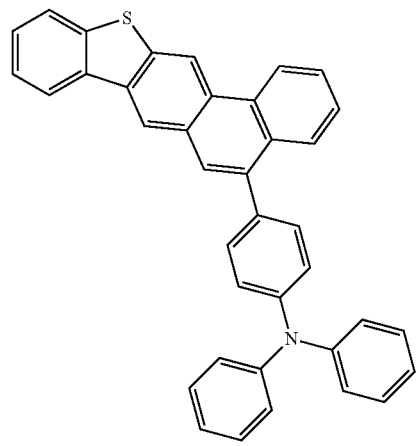

43
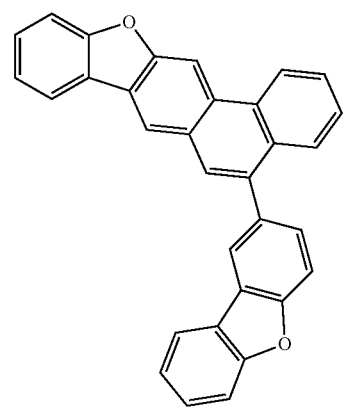
44
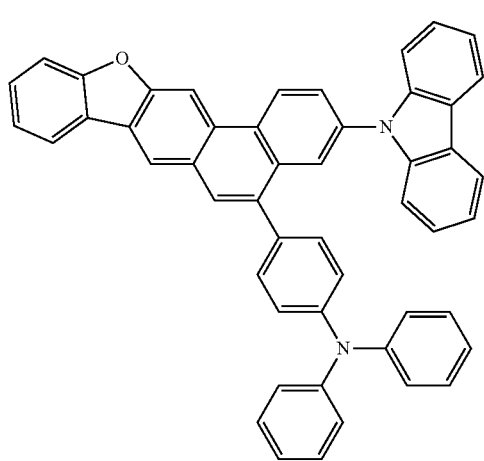
45
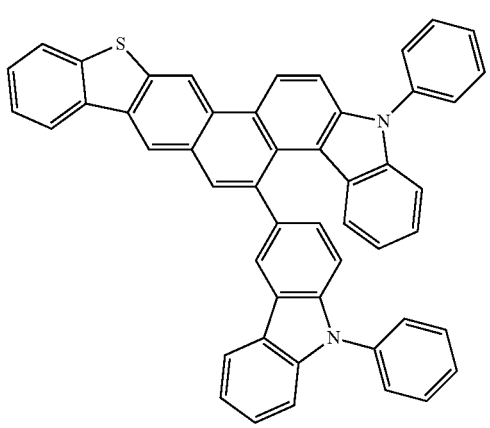
46
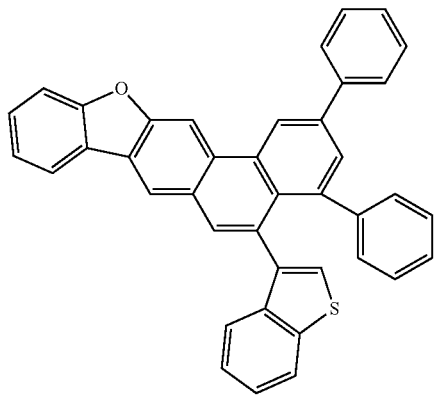
47
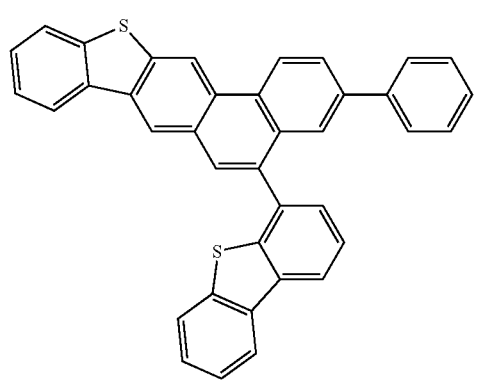
48
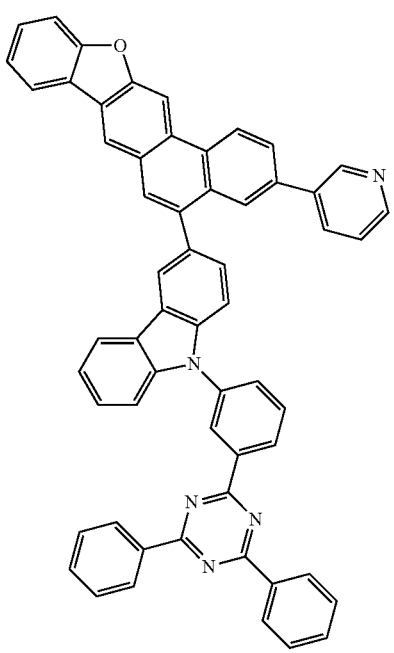

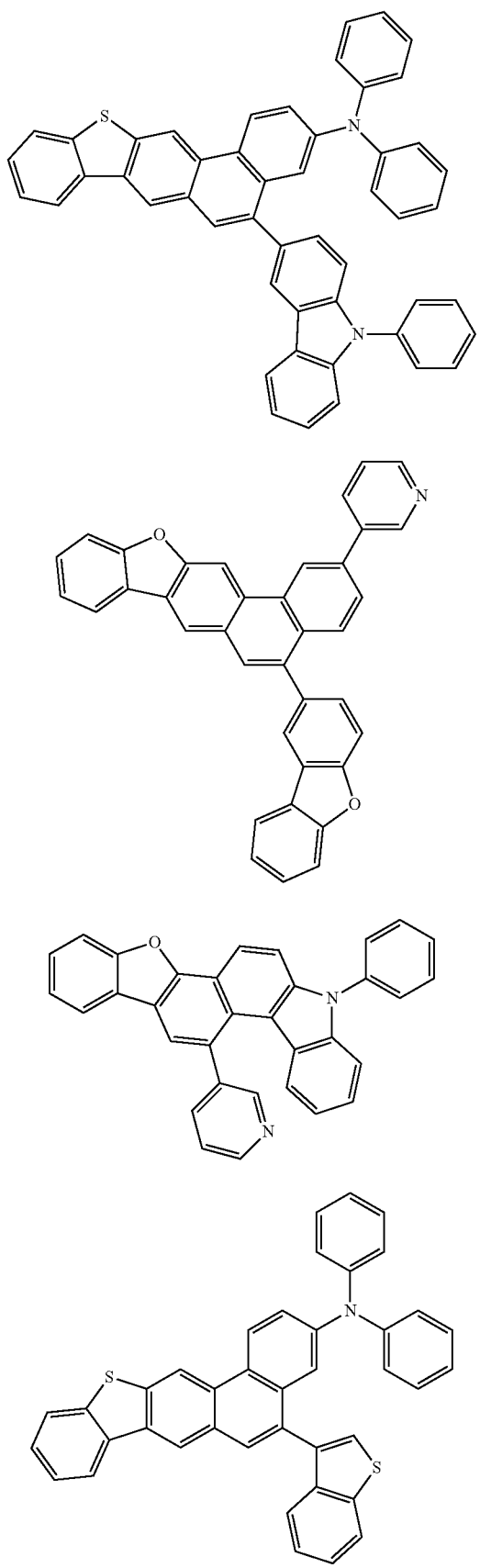
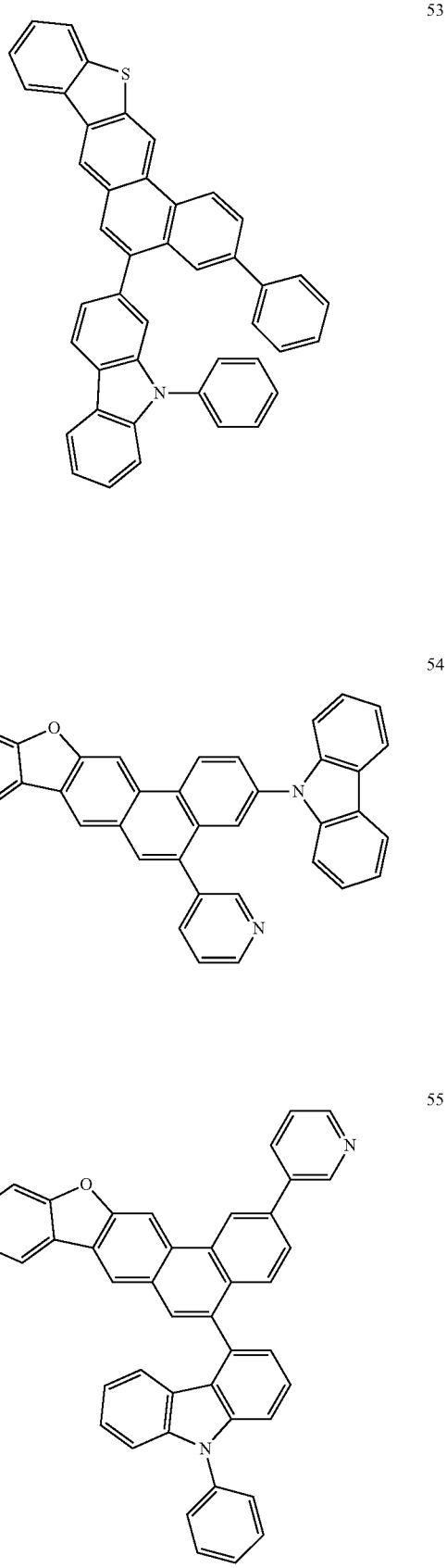

56
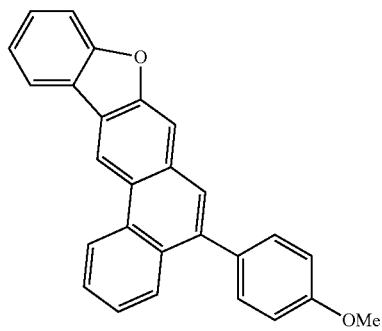
57
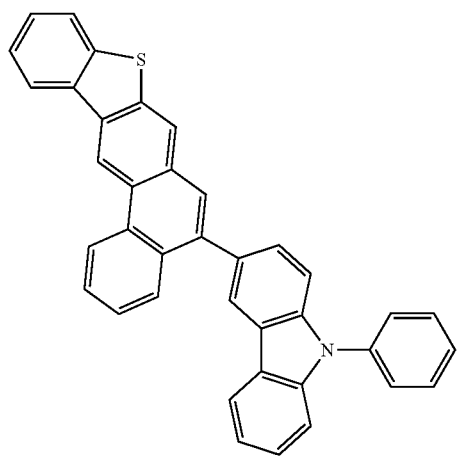
58
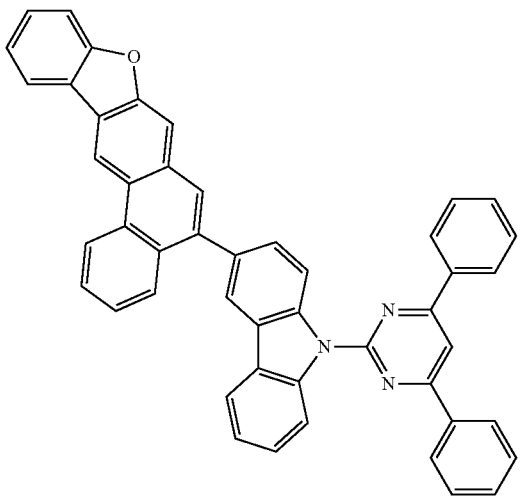
59
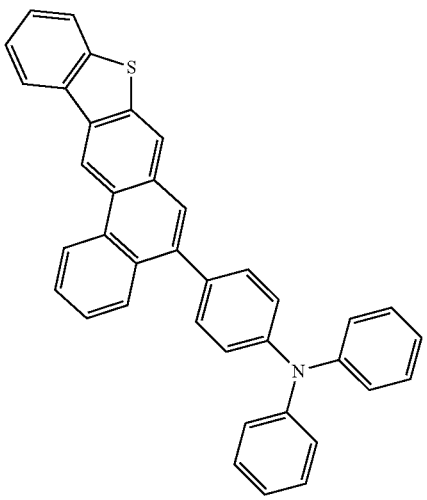
60
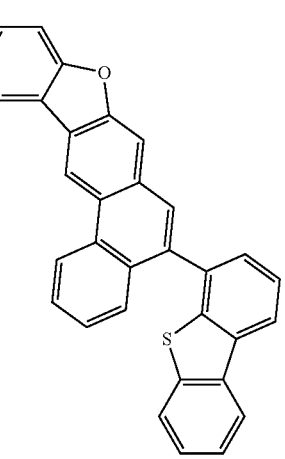
61
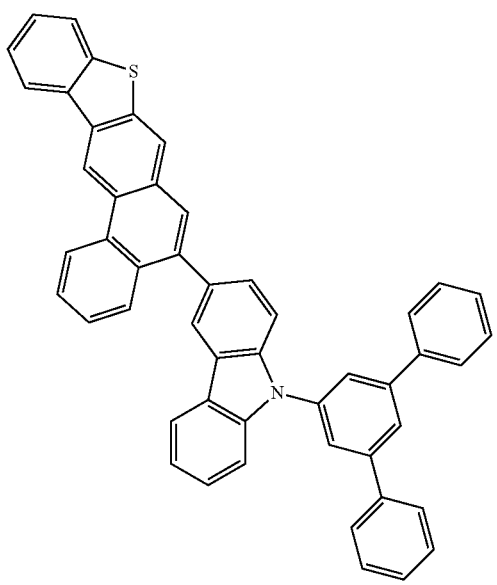

-continued
62
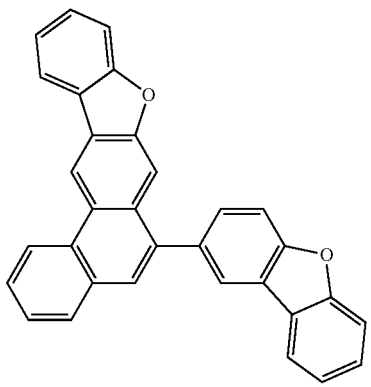
63
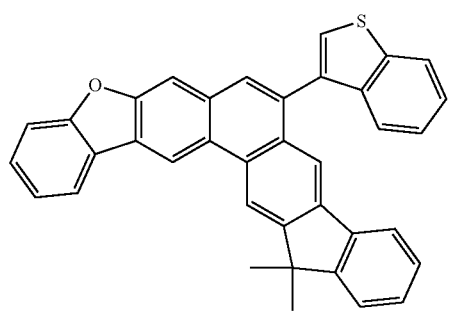
64
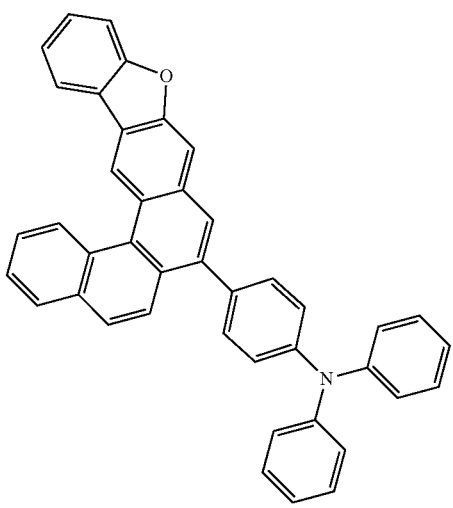
-continued
65
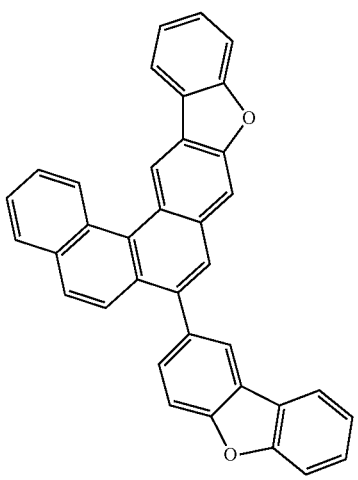
66
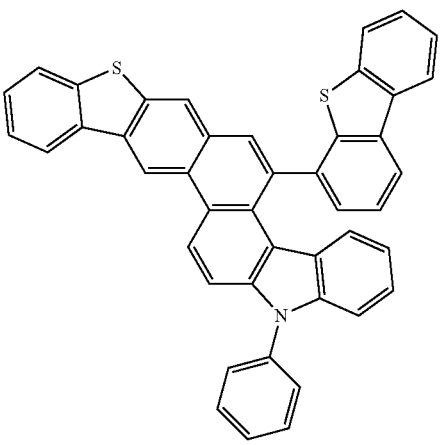
67

68
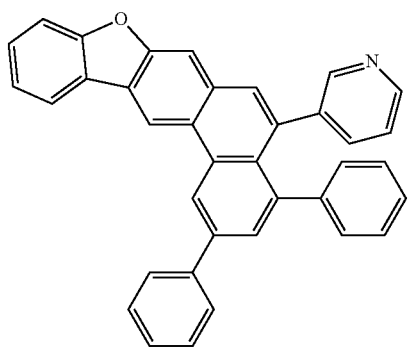
69
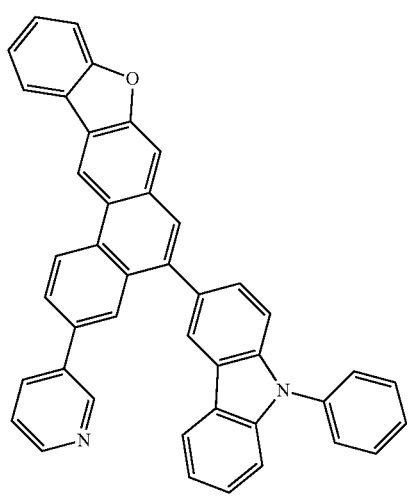
70
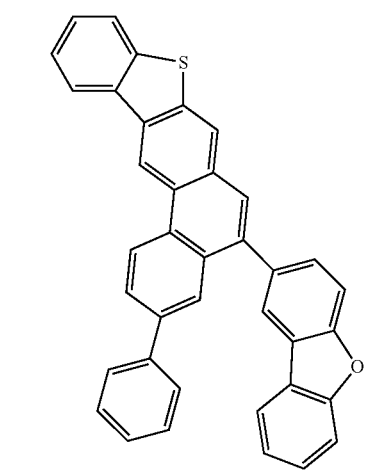
71
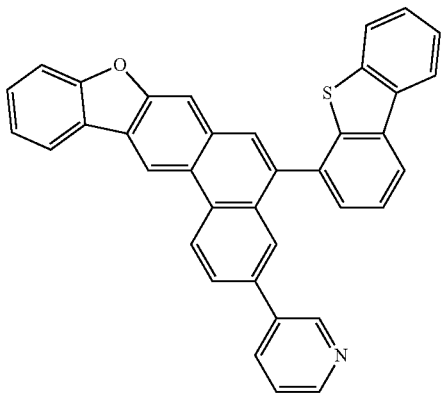
72
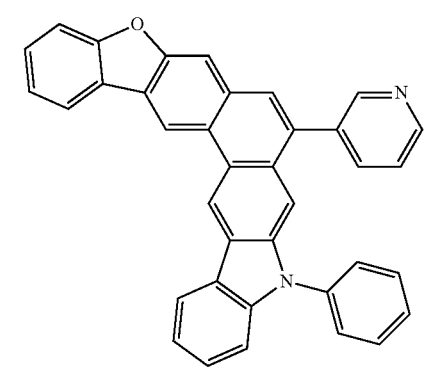
73
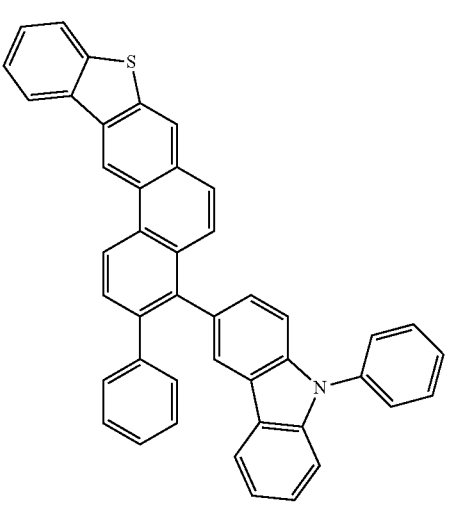
74
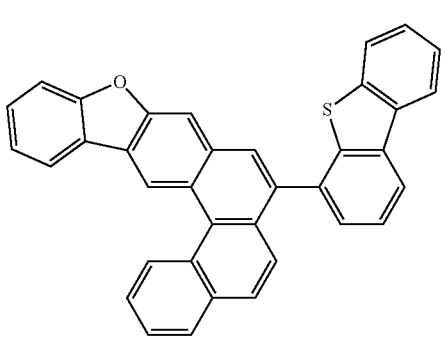

181
-continued
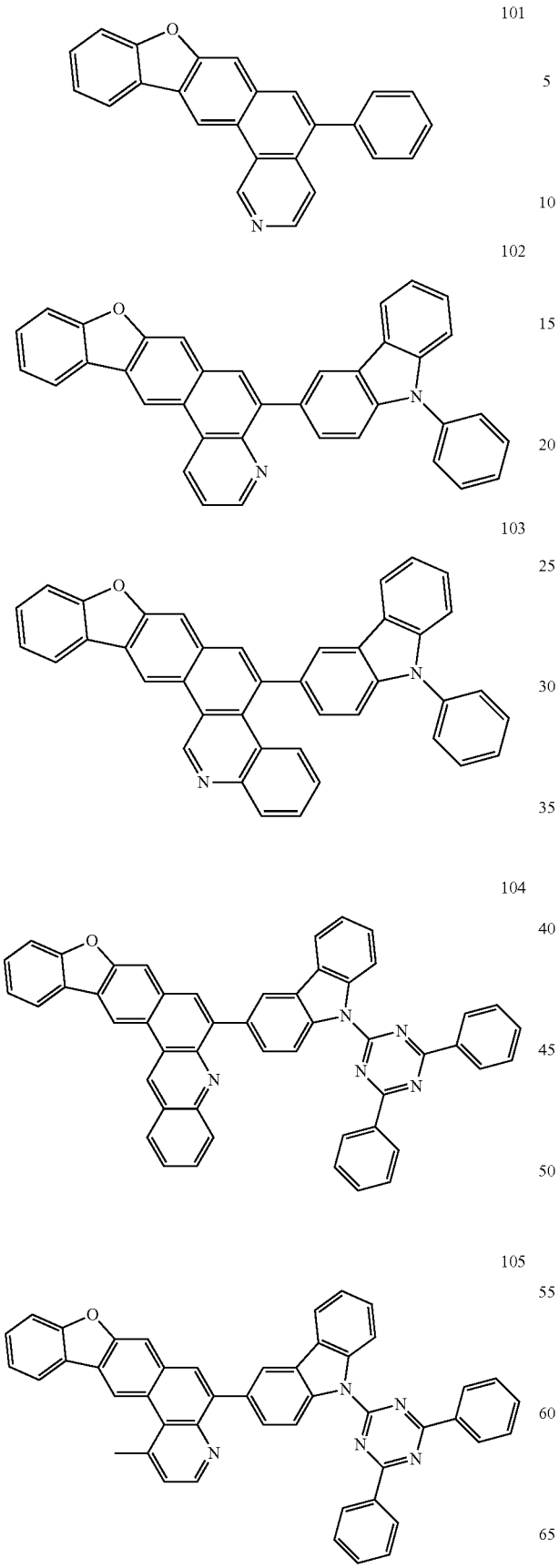
182
-continued
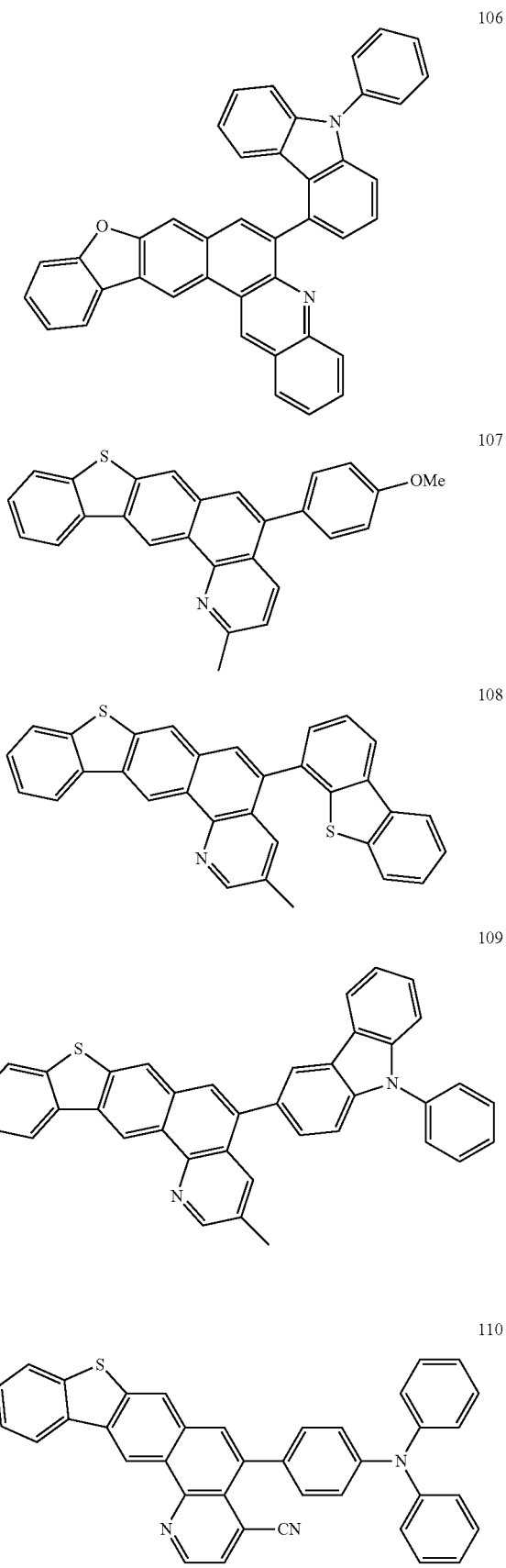

183
-continued
111
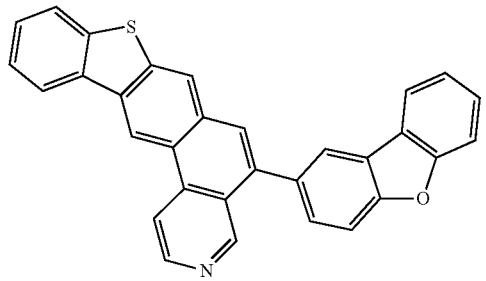
112
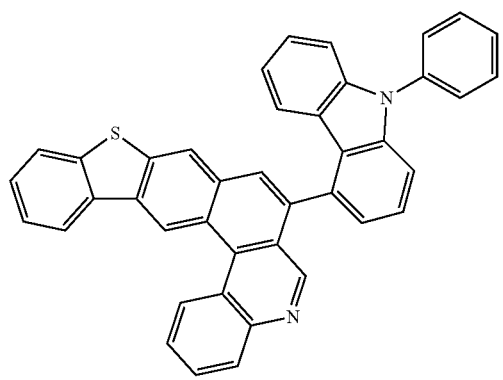
113
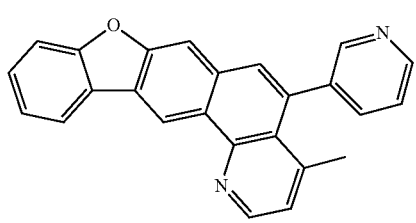
114
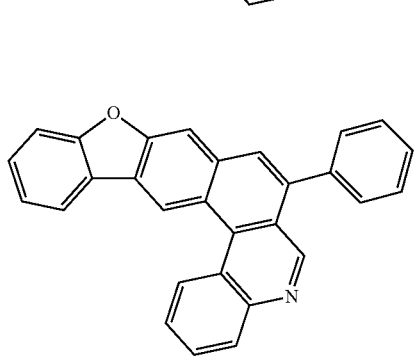
115
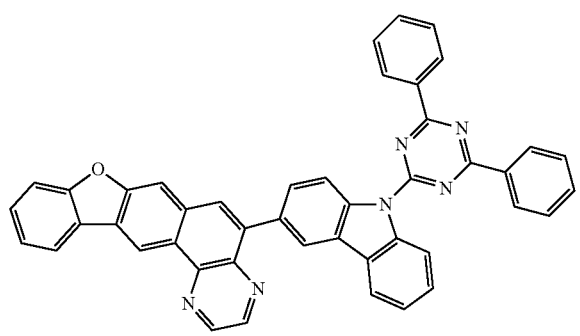
184
-continued
116
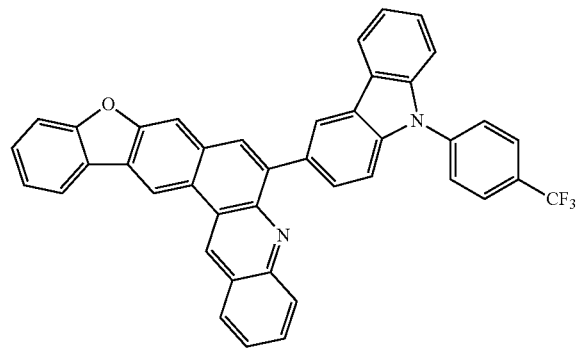
117
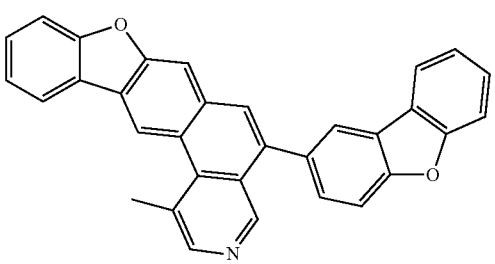
118
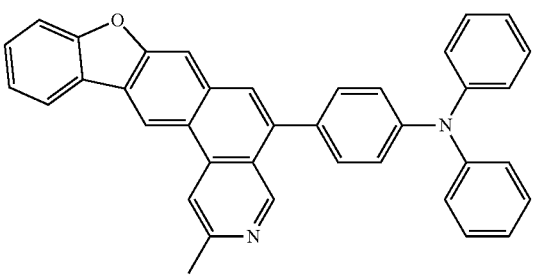
119
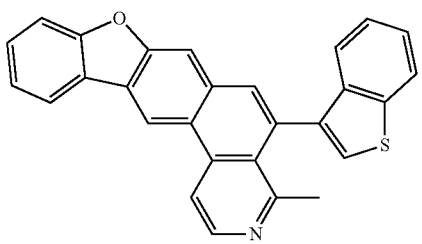
120
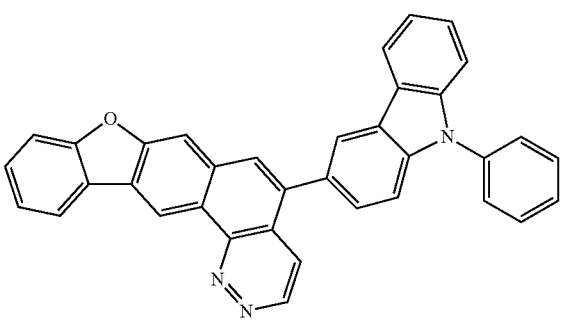

-continued
121
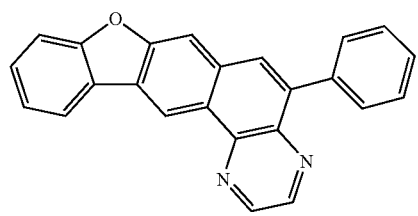
122
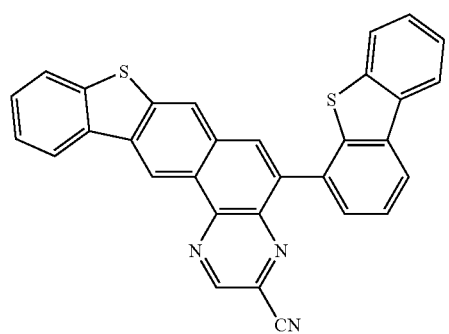
123
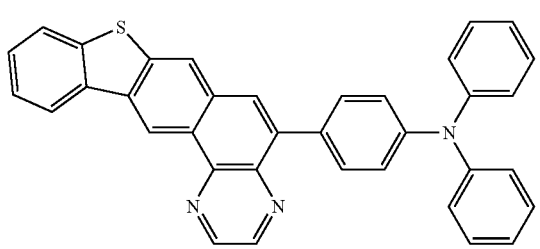
124
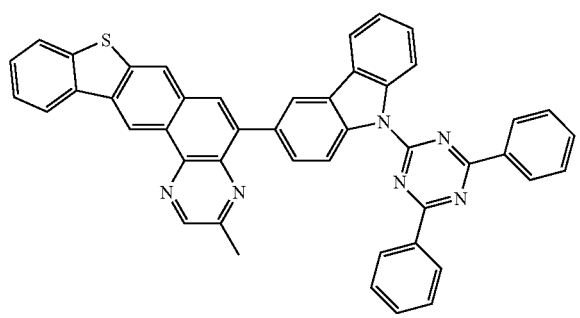
125
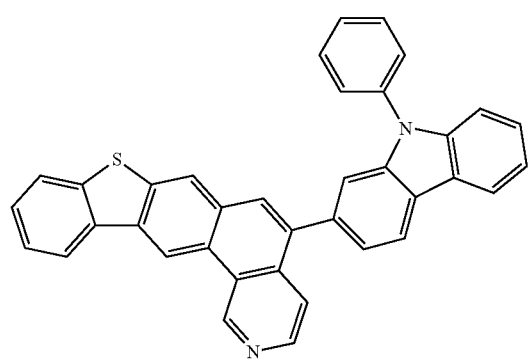
126
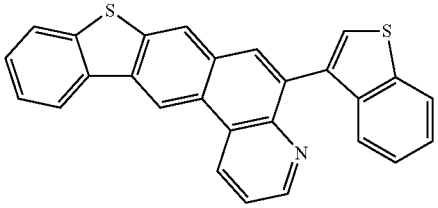
127
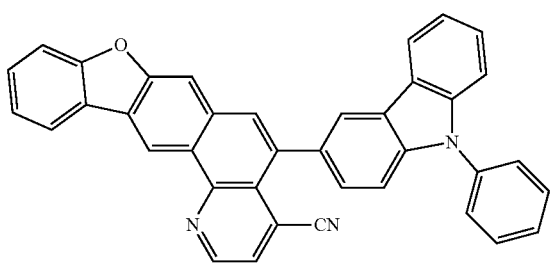
128
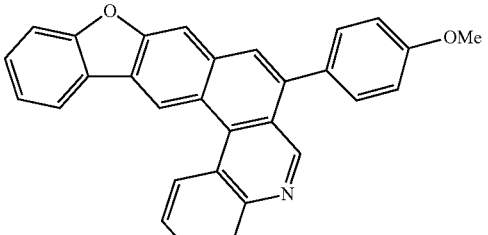
129
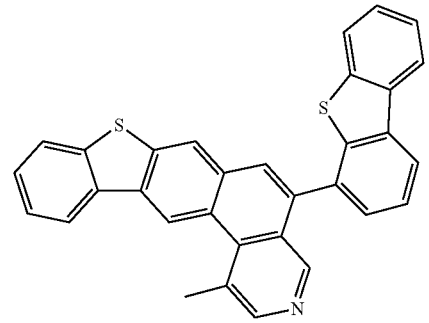
130
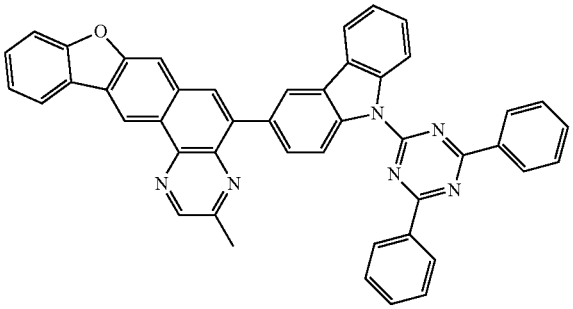

-continued
131
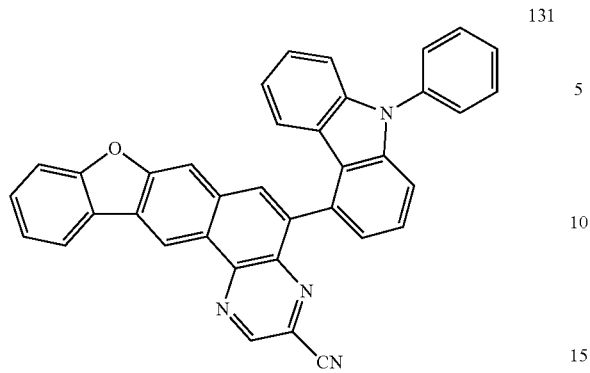
132
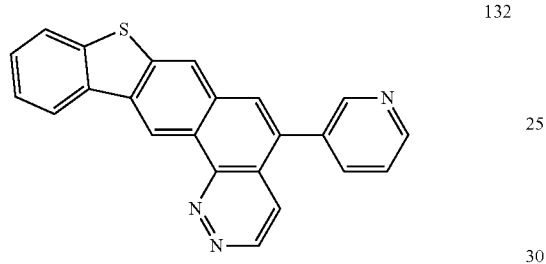
133
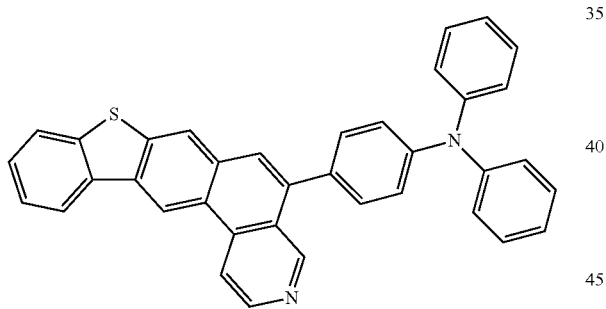
134
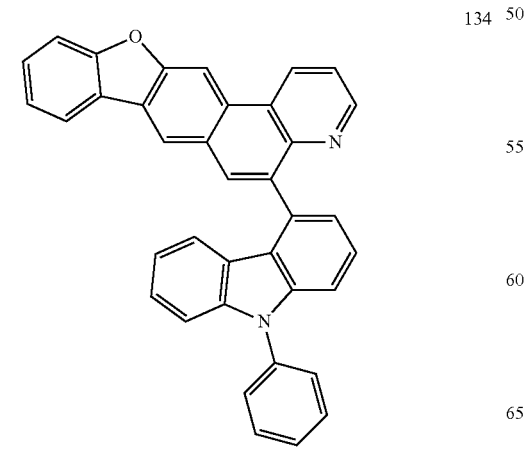
-continued
135
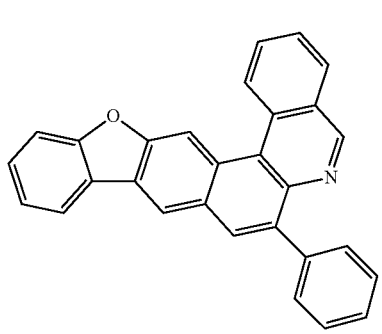
136
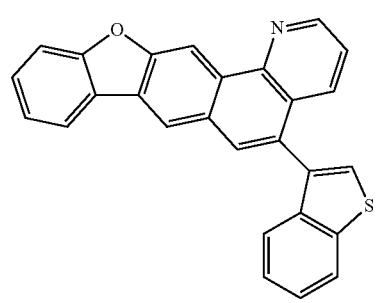
137
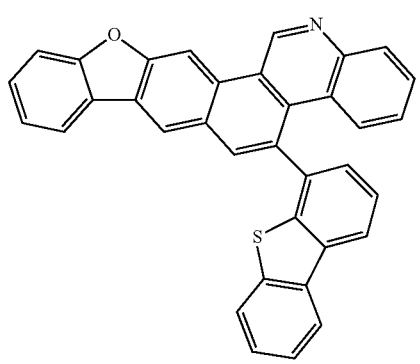
138
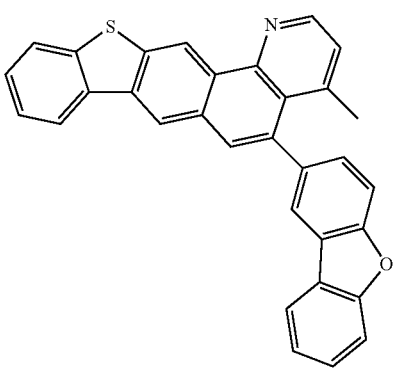

139
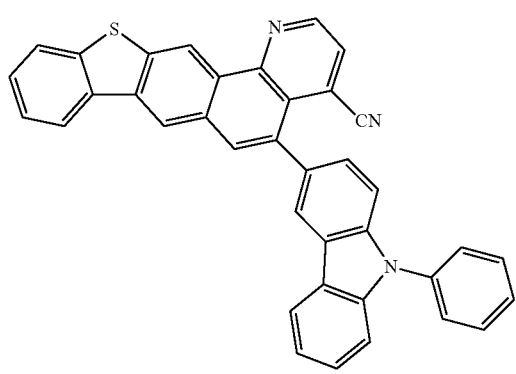
140
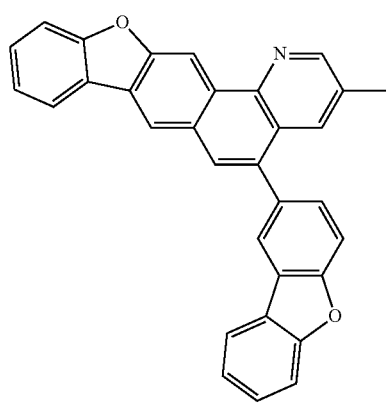
141
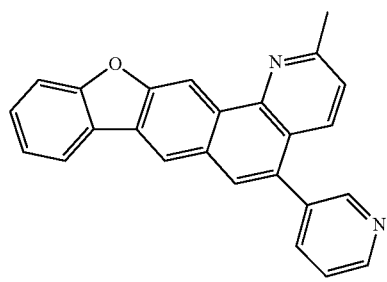
142
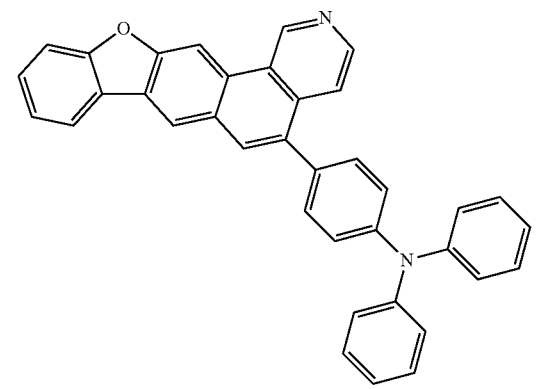
143
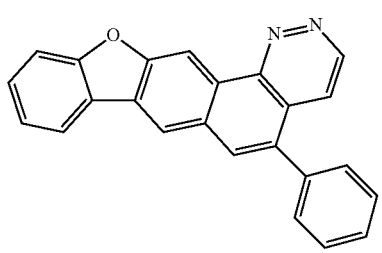
144
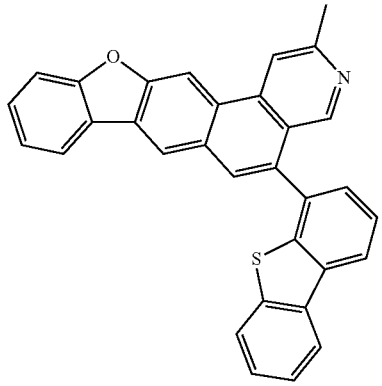
145
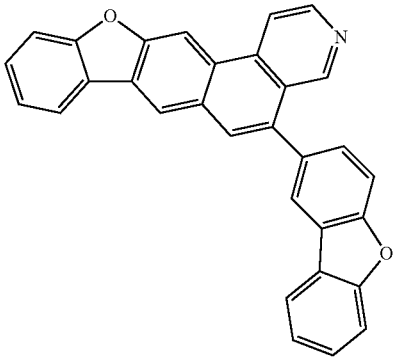
146
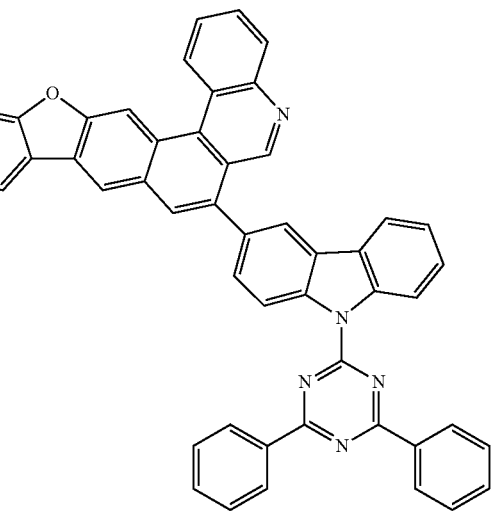

-continued
147
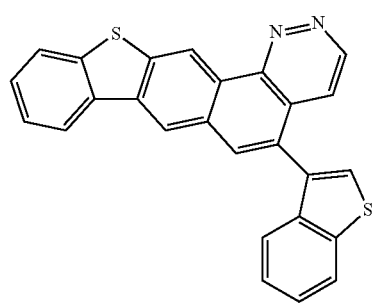
148
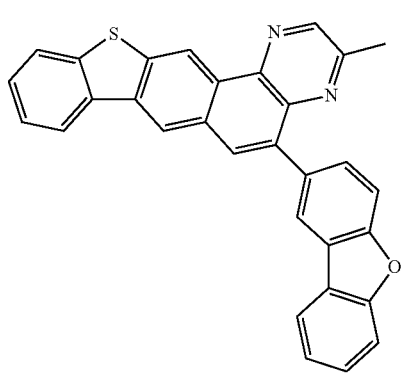
149
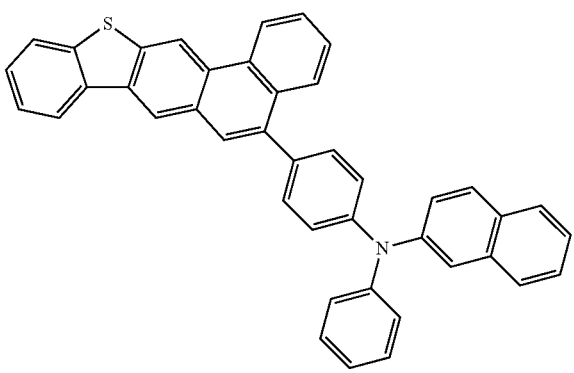
150
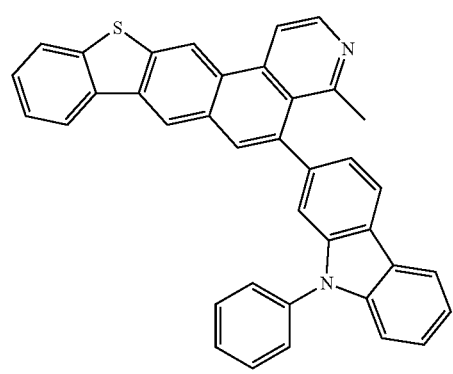
-continued
151
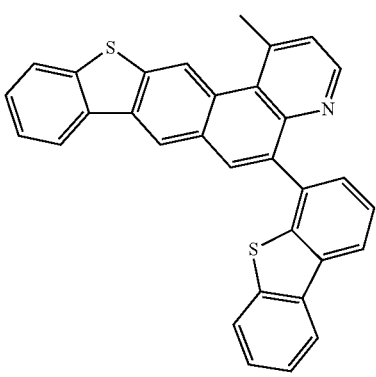
152
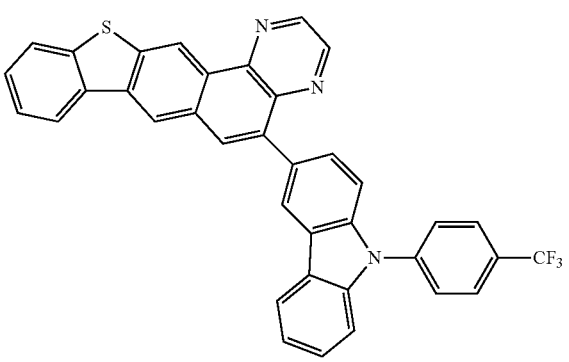
153
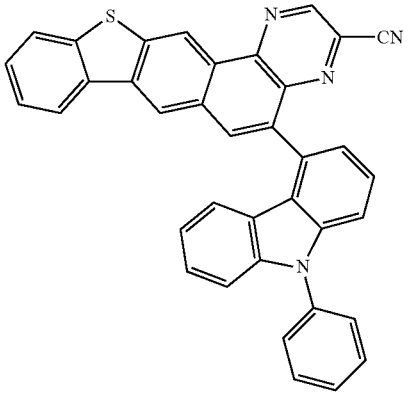
154
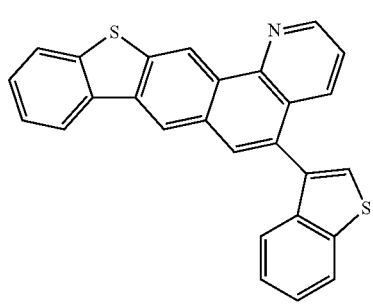

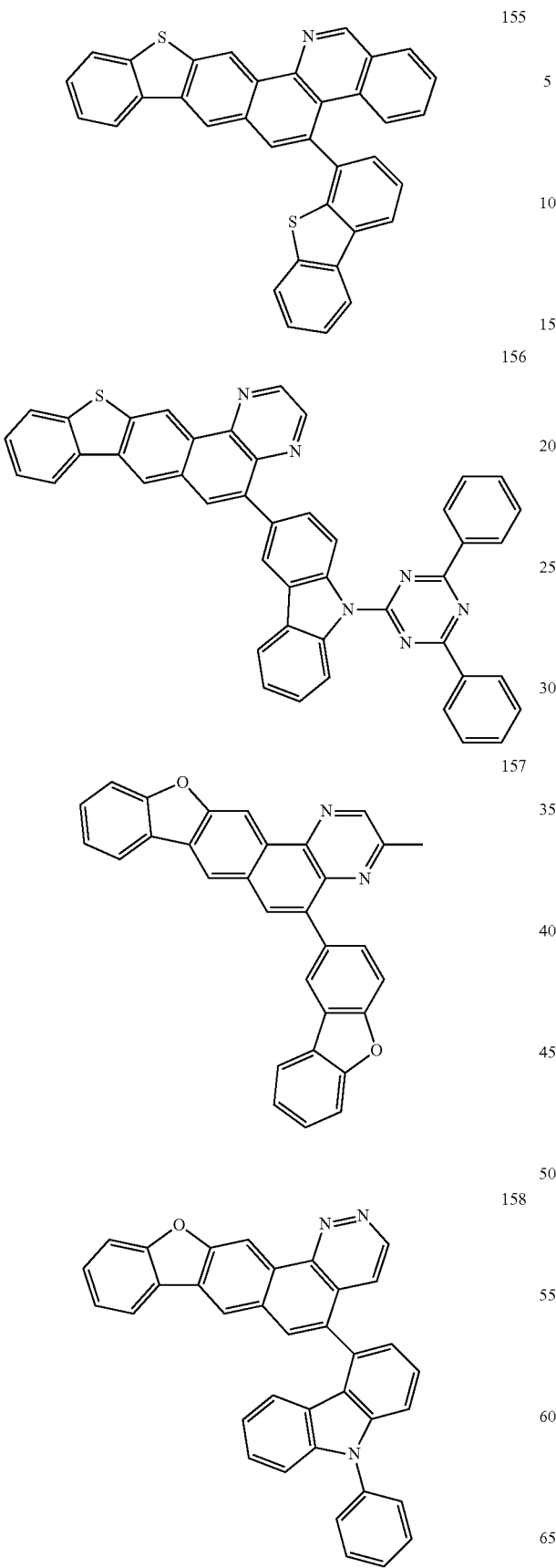
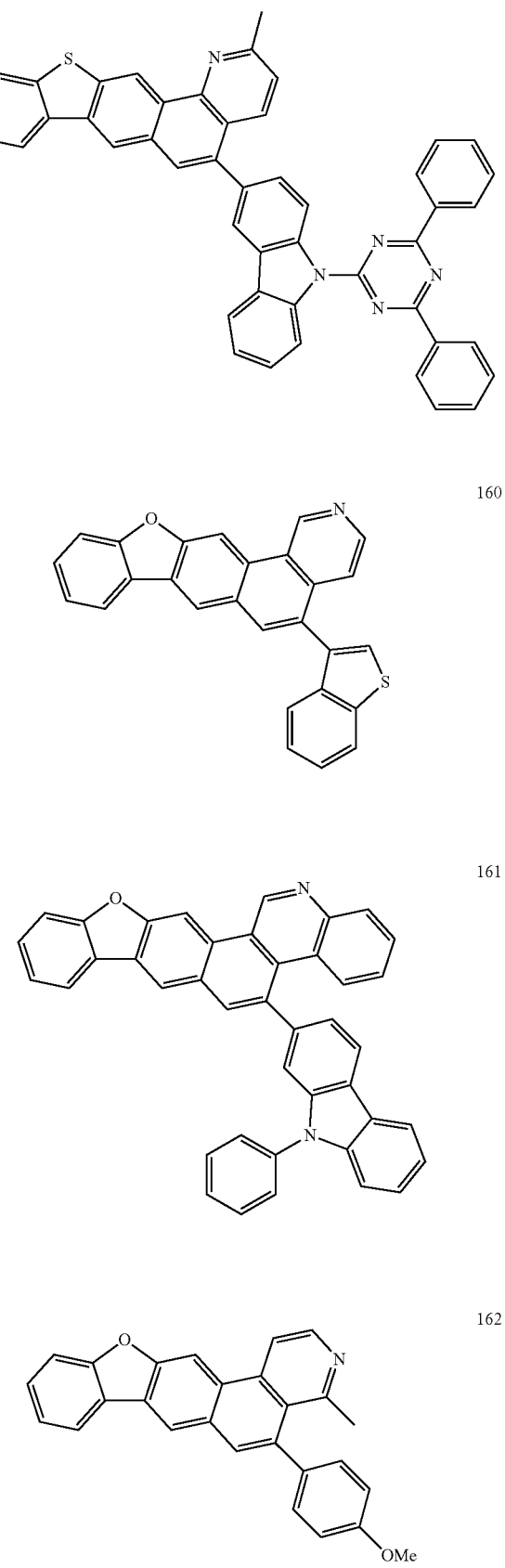

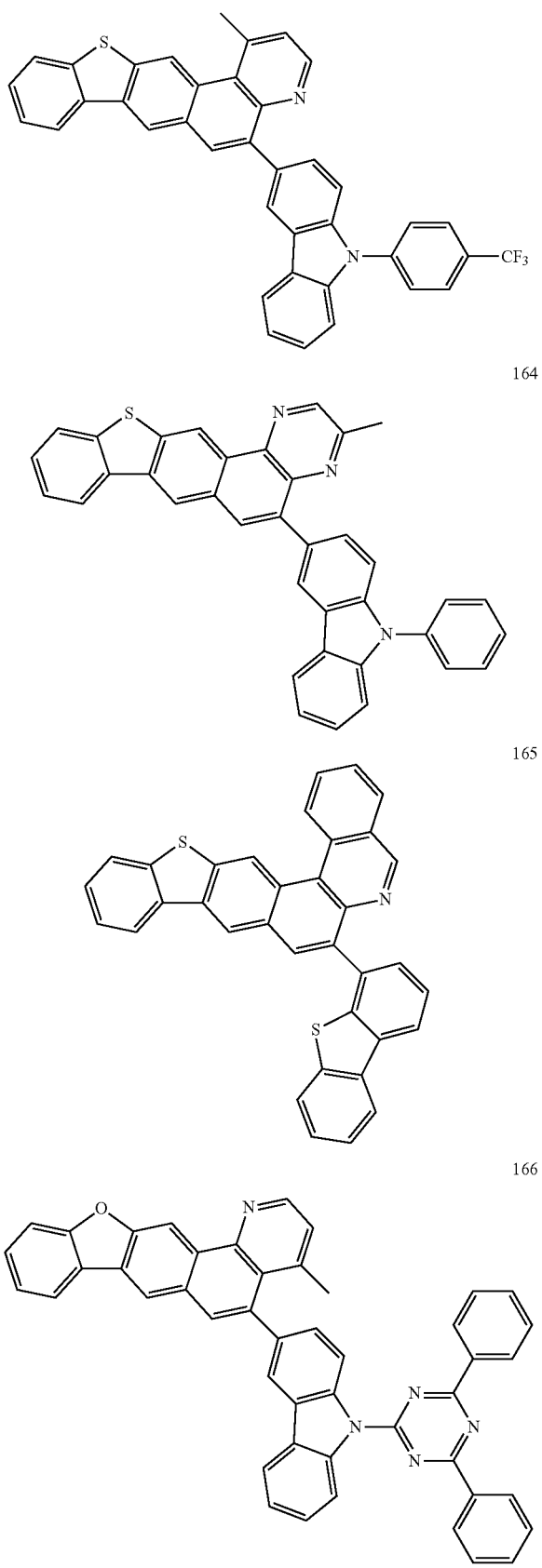
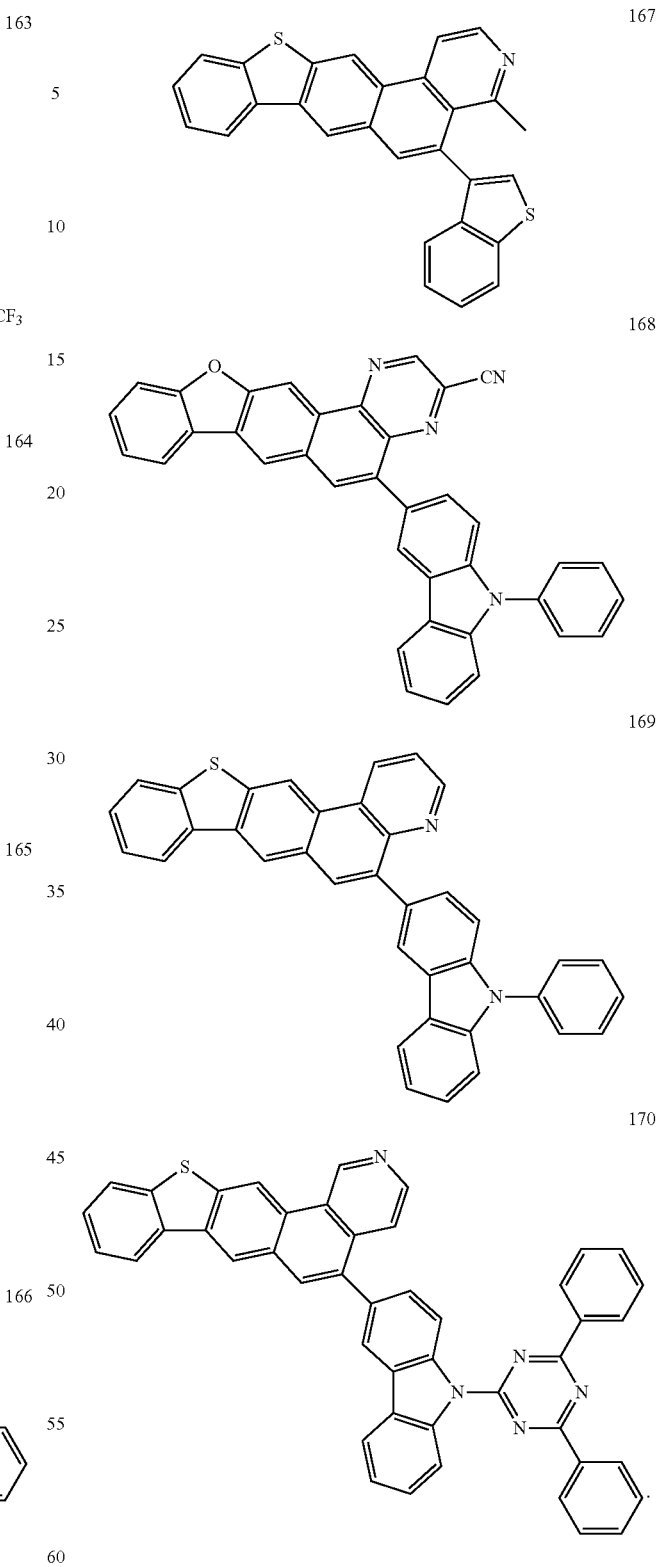
13. The heterocyclic compound of claim 1, wherein at least one substituent of the substituted $C_3$-$C_{10}$ cycloalkylene group, the substituted $C_2$-$C_{10}$ heterocycloalkylene group, the substituted $C_3$-$C_{10}$ cycloalkenylene group, the substituted $C_2$-$C_{10}$ heterocycloalkenylene group, the substituted $C_6$-$C_{60}$ arylene group, the substituted $C_2$-$C_{60}$ heteroarylene group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_2$-$C_{60}$ heteroaryl group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_6$-$C_{60}$ aryloxy group, and the substituted $C_6$-$C_{60}$ arylthio group is selected from among deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group; a $C_1$-$C_{60}$ alkyl group, a $C_2$-$C_{60}$ alkenyl group, a $C_2$-$C_{60}$ alkynyl group, and a $C_1$-$C_{60}$ alkoxy group; a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group that are substituted with at least one of deuterium, halogen, a hydroxyl group, a cyano group, a nitro group, an amino group, an amidino group, a hydrazine group, a hydrazone group, a carboxylic group or a salt thereof, a sulfonic acid group or a salt thereof, and a phosphoric acid group or a salt thereof; a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group that are substituted with at least one of deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and —N($Q_{11}$)($Q_{12}$); and —Si($Q_{13}$)($Q_{14}$)($Q_{15}$) (where $Q_{11}$, and $Q_{12}$ are each independently a $C_6$-$C_{60}$ aryl group, or a $C_2$-$C_{60}$ heteroaryl group; and $Q_{13}$ to $Q_{15}$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group).

14. An organic light-emitting device comprising: a first electrode; a second electrode disposed opposite to the first electrode; and an organic layer disposed between the first electrode and the second electrode and comprising an emission layer, wherein the organic layer comprises at least one of the heterocyclic compounds of claim 1.

15. The organic light-emitting device of claim 14, wherein the organic layer comprises: i) at least one layer of a hole injection layer, a hole transport layer, a functional layer having both hole injection and hole transport capabilities, a buffer layer, an electron blocking layer between the first electrode and the emission layer; and ii) at least one layer of a hole blocking layer, an electron transport layer, and an electron injection layer between the emission layer and the second electrode.

16. The organic light-emitting device of claim 15, wherein the organic layer comprises a hole transport layer between the first electrode and the emission layer, and the hole transport layer comprises the heterocyclic compound.

17. The organic light-emitting device of claim 16, wherein the heterocyclic compound in the hole transport layer is represented by Formula 1A-HTL1 or Formula 1B-HTL1:

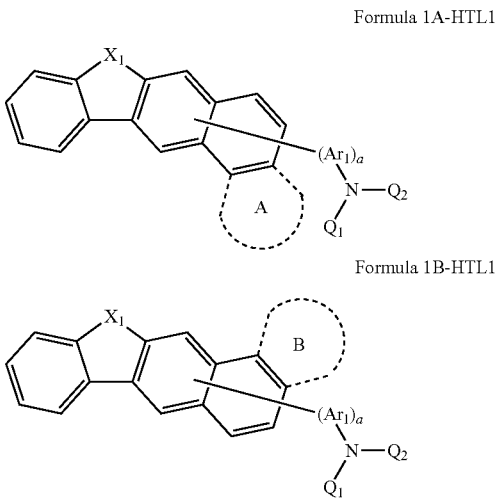

wherein in Formulae 1A-HTL1 and 1B-HTL1,
$X_1$ is O, or S;
the A ring and B ring are each independently selected from among:
i) benzene, pyridine, pyrazine, pyrimidine, pyridazine, naphthalene, fluorene, indole, isoquinoline, quinoline, carbazole, dibenzofuran, and dibenzothiophene; and
ii) benzene, pyridine, pyrazine, pyrimidine, pyridazine, naphthalene, fluorene, indole, isoquinoline, quinoline, carbazole, dibenzofuran, and dibenzothiophene that are substituted with at least one substituent selected from among deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a $C_1$-$C_{20}$ alkyl group, and a $C_1$-$C_{20}$ alkoxy group; a $C_1$-$C_{20}$ alkyl group, and a $C_1$-$C_{60}$ alkoxy group that are substituted with at least one of deuterium, halogen, a hydroxyl group, a cyano group, a nitro group, an amino group, an amidino group, a hydrazine group, a hydrazone group, a carboxylic group or a salt thereof, a sulfonic acid group or a salt thereof, and a phosphoric acid group or a salt thereof; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group that are substituted with at least one of deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and —N(Q₁₁)(Q₁₂) (where Q₁₁ and Q₁₂ are each independently phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group);

a is an integer from 1 to 3;

$Q_1$ and $Q_2$ are each independently selected from among a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and $Ar_1$ is a group represented by one of Formulae 2-1 to 2-5 below:

Formula 2-1

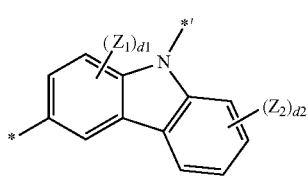

Formula 2-2

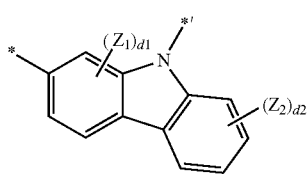

Formula 2-3

Formula 2-4

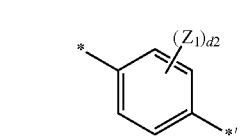

Formula 2-5

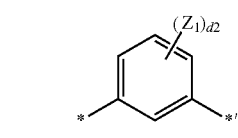

wherein, in Formulae 2-1 to 2-5, $Z_1$ and $Z_2$ are each independently selected from among hydrogen, deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group;

$d_1$ is an integer from 1 to 3; and $d_2$ is an integer from 1 to 4.

18. The organic light-emitting device of claim 14, wherein the emission layer comprises the heterocyclic compound.

19. The organic light-emitting device of claim 18, wherein the heterocyclic compound in the emission layer serves as a host, and the emission layer further comprises a dopant.

20. The organic light-emitting device of claim 18, wherein the heterocyclic compound in the emission layer is represented by Formula 1A-H1, 1A-H2, 1A-H3, 1B-H1, 1B-H2, or 1B-H3 below:

Formula 1A-H1

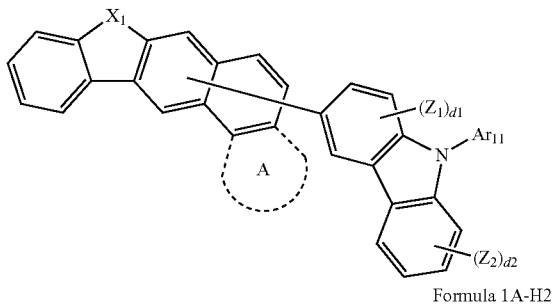

Formula 1A-H2

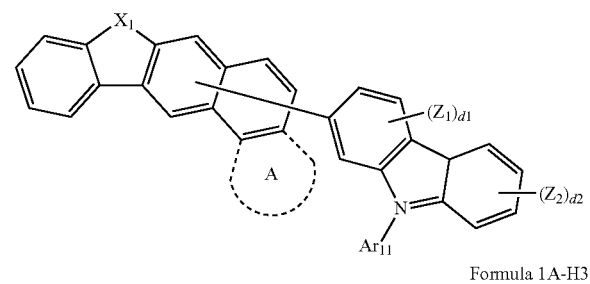

Formula 1A-H3

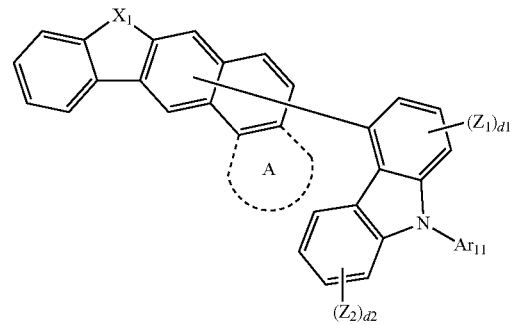

Formula 1B-H1

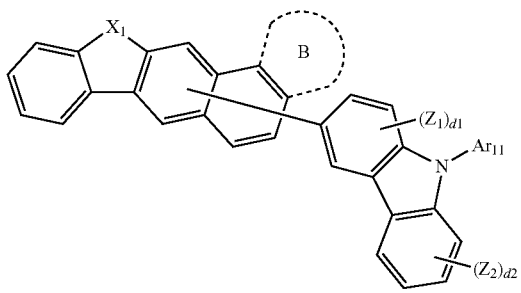

-continued

Formula 1B-H2

Formula 1B-H3 wherein, in Formulae 1A-H1, 1A-H2, 1A-H3, 1B-H1, 1B-H2, and 1B-H3, $X_1$ is O, or S;

the A ring and B ring are each independently, i) benzene, pyridine, pyrazine, pyrimidine, pyridazine, naphthalene, fluorene, indole, isoquinoline, quinoline, carbazole, dibenzofuran, and dibenzothiophene; and ii) benzene, pyridine, pyrazine, pyrimidine, pyridazine, naphthalene, fluorene, indole, isoquinoline, quinoline, carbazole, dibenzofuran, and dibenzothiophene that are substituted with at least one substituent selected from among deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a $C_1$-$C_{20}$ alkyl group, and a $C_1$-$C_{20}$ alkoxy group; a $C_1$-$C_{20}$ alkyl group, and a $C_1$-$C_{60}$ alkoxy group that are substituted with at least one of deuterium, halogen, a hydroxyl group, a cyano group, a nitro group, an amino group, an amidino group, a hydrazine group, a hydrazone group, a carboxylic group or a salt thereof, a sulfonic acid group or a salt thereof, and a phosphoric acid group or a salt thereof; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolyl group, and an isoquinolyl group that are substituted with at least one of deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; and —N($Q_{11}$)($Q_{12}$) (where $Q_{11}$, and $Q_{12}$ are each independently, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group);

$Z_1$ and $Z_2$ are each independently selected from among hydrogen, deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group;

$d_1$ is an integer from 1 to 3;

$d_2$ is an integer from 1 to 4; and $Ar_{11}$ is a group represented by one of Formulae 3-1 to 3-14:

Formula 3-1

Formula 3-2

Formula 3-3

Formula 3-4

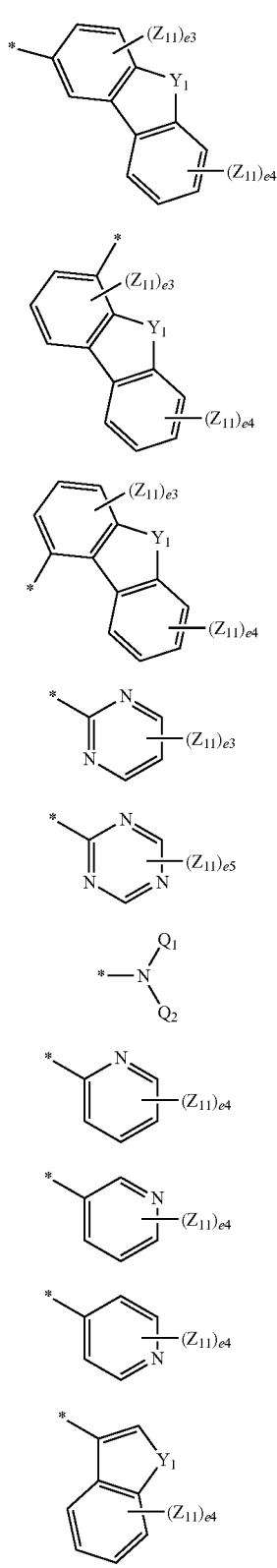

wherein, in Formulae 3-1 to 3-14,
$Y_1$ is O, S, $C(Z_{21})(Z_{22})$, or $N(Z_{23})$;
$Z_{11}$, and $Z_{21}$ to $Z_{23}$ are each independently selected from among hydrogen, deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group;

$Q_1$ and $Q_2$ are each independently selected from among a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group;

e1 is an integer from 1 to 5;
e2 is an integer from 1 to 7;
e3 is an integer from 1 to 3;
e4 is an integer from 1 to 4; and
e5 is 1 or 2.

21. The organic light-emitting device of claim 19, wherein the dopant in the emission layer comprises an organometallic compound including at least one of iridium (Ir), platinum (Pt), osmium (Os), titanium (Ti), zirconium (Zr), hafnium (Hf), europium (Eu), terbium (Tb), and thulium (Tm).

22. An organic light-emitting device comprising: a first electrode; a second electrode disposed opposite to the first electrode; and an organic layer disposed between the first electrode and the second electrode and comprising an emission layer, wherein the organic layer comprises at least one of the heterocyclic compounds represented by Formula 1A or 1B below:

Formula 1A

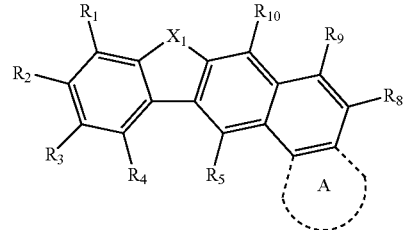

Formula 1B

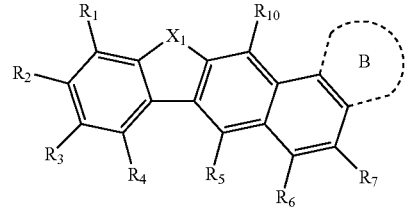

wherein $X_1$ is O or S;
i) in Formula 1A, at least one of $R_1$ to $R_5$, and $R_5$ to $R_{10}$ are a substituent represented by —$(Ar_1)_a$—$(Ar_{11})$ (where $Ar_{11}$ is not hydrogen when a is zero), the remaining substituents being hydrogen; or
ii) in Formula 1B, at least one of $R_1$ to $R_7$, and $R_{10}$ are a substituent represented by —$(Ar_1)_a$—$(Ar_{11})$ (where $Ar_{11}$ is not hydrogen when a=0), the remaining substituents being hydrogen;

the A ring and B ring are each independently selected from among:
i) cyclopropane, cyclobutane, cyclopentane, cyclohexane, cycloheptane, cyclooxane, cyclopentene, cyclopentadiene, cyclohexene, cyclohexadiene, cycloheptadiene, pyrrole, pyrazole, benzene, furan, thiophene, pyridine, pyrazine, pyrimidine, pyridazine, naphthalene, anthracene, fluorene, pyrrolizine, indolizine, isoindole, indole, indazole, purine, quinolizine, isoquinoline, quinoline, phthalazine, naphthyridin, quinoxaline, quinazoline, cinnoline, carbazole, phenanthridine, acridine, phenazine, benzofuran, benzothiophene, dibenzofuran, and dibenzothiophene; and
ii) cyclopropane, cyclobutane, cyclopentane, cyclohexane, cycloheptane, cyclooxane, cyclopentene, cyclopentadiene, cyclohexene, cyclohexadiene, cycloheptadiene, pyrrole, pyrazole, benzene, furan, thiophene, pyridine, pyrazine, pyrimidine, pyridazine, naphthalene, anthracene, fluorene, pyrrolizine, indolizine, isoindole, indole, indazole, purine, quinolizine, isoquinoline, quinoline, phthalazine, naphthyridin, quinoxaline, quinazoline, cinnoline, carbazole, phenanthridine, acridine, phenazine, benzofuran, benzothiophene, dibenzofuran, and dibenzothiophene that is substituted with at least one substituent selected from among deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a C1-C20 alkyl group, and a C1-C20 alkoxy group; a C1-C20 alkyl group and a C1-C20 alkoxy group that are substituted with at least one of deuterium, halogen, a hydroxyl group, a cyano group, a nitro group, an amino group, an amidino group, a hydrazine group, a hydrazone group, a carboxylic group or a salt thereof, a sulfonic acid group or a salt thereof, and a phosphoric acid group or a salt thereof; a C6-C20 aryl group, a C6-C20 aryloxy group, a C6-C20 arylthio group, and a C2-C20 heteroaryl group; a C6-C20 aryl group, a C6-C20 aryloxy group, a C6-C20 arylthio group, and a C2-C20 heteroaryl group that are substituted with at least one of deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a C1-C20 alkyl group, a C1-C20 alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, and an isoquinolyl group; —N(Q11)(Q12); and —Si(Q13)(Q14)(Q15) (where Q11 and Q12 are each independently a C6-C20 aryl group, or a C2-C20 heteroaryl group; and Q13 to Q15 are each independently a C1-C20 alkyl group, a C1-C20 alkoxy group, a C6-C20 aryl group, or a C2-C20 heteroaryl group);

$Ar_1$ is selected from among —O—, —S—, a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a $C_2$-$C_{10}$ heterocycloalkenylene group, a substituted or unsubstituted $C_6$-$C_{60}$ arylene group, and a substituted or unsubstituted $C_2$-$C_{60}$ heteroarylene group;

$Ar_{11}$ is selected from among deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a substituted $C_1$-$C_{60}$ alkyl group, unsubstituted $C_2$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a $C_2$-$C_{10}$ heterocycloalkenyl group, a substituted or unsubstituted $C_6$-$C_{60}$ aryl group, a substituted or unsubstituted $C_2$-$C_{60}$ heteroaryl group, —N($Q_1$)($Q_2$), and —Si($Q_3$)($Q_4$)($Q_5$) (where $Q_1$ and $Q_2$ are each independently selected from among a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a $C_2$-$C_{10}$ heterocycloalkenyl group, a substituted or unsubstituted $C_6$-$C_{60}$ aryl group, and a substituted or unsubstituted $C_2$-$C_{60}$ heteroaryl group; and $Q_3$ to $Q_5$ are each independently selected from among hydrogen, deuterium, halogen, a hydroxyl group, a cyano group, a nitro group, an amino group, an amidino group, a hydrazine group, a hydrazone group, a carboxylic group or a salt thereof, a sulfonic acid group or a salt thereof, a phosphoric acid group or a salt thereof, a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, and a substituted or unsubstituted $C_2$-$C_{60}$ heteroaryl group); and a is an integer from 0 to 5.

* * * * *